(12) United States Patent
Jung et al.

(10) Patent No.: US 12,557,544 B2
(45) Date of Patent: Feb. 17, 2026

(54) ORGANOMETALLIC COMPOUND, COMPOSITION INCLUDING SAME, ORGANIC LIGHT-EMITTING DEVICE, AND ELECTRONIC APPARATUS

(71) Applicants: Samsung Electronics Co., Ltd., Suwon-si (KR); UNIVERSITAT DE BARCELONA, Barcelona (ES)

(72) Inventors: Yongsik Jung, Seoul (KR); Laura Rodriguez Raurell, Barcelona (ES); Joao Carlos Lima, Caparica (PT); Hyeonho Choi, Suwon-si (KR); Seungyeon Kwak, Suwon-si (KR); Kyuyoung Hwang, Anyang-si (KR)

(73) Assignees: SAMSUNG ELECTRONICS CO., LTD., Gyeonggi-Do (KR); UNIVERSITAT DE BARCELONA, Barcelona (ES)

( * ) Notice: Subject to any disclaimer, the term of this patent is extended or adjusted under 35 U.S.C. 154(b) by 3 days.

(21) Appl. No.: 18/765,591

(22) Filed: Jul. 8, 2024

(65) Prior Publication Data
US 2024/0373743 A1 Nov. 7, 2024

Related U.S. Application Data

(63) Continuation of application No. 17/199,655, filed on Mar. 12, 2021, now Pat. No. 12,120,947.

(30) Foreign Application Priority Data

Dec. 3, 2020 (KR) .................. 10-2020-0167832

(51) Int. Cl.
H10K 85/30 (2023.01)
C07F 1/00 (2006.01)
(Continued)

(52) U.S. Cl.
CPC ............. H10K 85/371 (2023.02); C07F 1/00 (2013.01); C09K 11/06 (2013.01);
(Continued)

(58) Field of Classification Search
CPC .... H01L 51/0091; H01L 51/5016; C07F 1/00; C07F 1/10; C07F 1/12; C07F 9/5054;
(Continued)

(56) References Cited

U.S. PATENT DOCUMENTS 8,530,685 B1 * 9/2013 Sista .................... H10K 85/371
257/40
10,797,249 B2 10/2020 Lee et al.
(Continued)

FOREIGN PATENT DOCUMENTS

CN 102286009 A 12/2011

OTHER PUBLICATIONS

Blanco et al. "Gold(I), phosphanes, and alkynyls: The perfect allies in the search for luminescent compounds." Eur. J. Inorg. Chem. 2018. p. 2762-2767. (Year: 2018).*

Primary Examiner — Michael H. Wilson
(74) Attorney, Agent, or Firm — CANTOR COLBURN LLP

(57) ABSTRACT

An organometallic compound represented by Formula 1

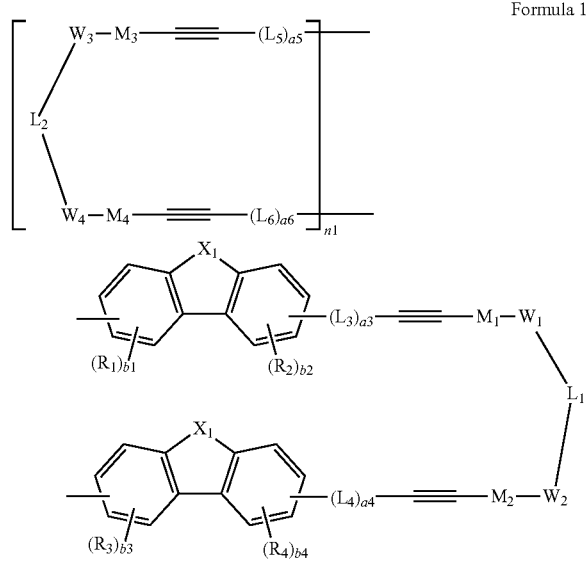

wherein, $M_1$ to $M_4$ are each independently a first-row transition metal, a second-row transition metal, or a third-row transition metal; $X_1$ and $X_2$ are each independently $C(R_5)(R_6)$, $Si(R_5)(R_6)$, $N(R_5)$, O, S, Se, or Te; $W_1$ to $W_4$ are each independently $N(R_7)(R_8)$, $P(R_7)(R_8)$, $S(R_7)$, a $C_5$-$C_{60}$ carbocyclic group unsubstituted or substituted with at least one $R_{10a}$, or a $C_1$-$C_{60}$ heterocyclic group unsubstituted or substituted with at least one $R_{10a}$; $L_1$ to $L_6$ are each independently a $C_1$-$C_{30}$ alkylene group unsubstituted or substituted with at least one $R_{10a}$, a $C_5$-$C_{60}$ carbocyclic group unsubstituted or substituted with at least one $R_{10a}$, or a $C_1$-$C_{60}$ heterocyclic group unsubstituted or substituted with at least one $R_{10a}$; a3 to a6 are each independently an integer from 0 to 3, and $R_1$ to $R_8$ and $R_{10a}$ in Formula 1 are as described herein.

8 Claims, 7 Drawing Sheets

(51) Int. Cl.
    *C09K 11/06*     (2006.01)
    *H10K 50/11*     (2023.01)
    *H10K 101/10*     (2023.01)

(52) U.S. Cl.
    CPC ....... *C09K 2211/1011* (2013.01); *H10K 50/11* (2023.02); *H10K 2101/10* (2023.02)

(58) Field of Classification Search
    CPC . C07F 19/00; C09K 2211/1011; C09K 11/06; H10K 85/361; H10K 85/371; H10K 85/381; H10K 50/12; H10K 50/121; H10K 50/125
    See application file for complete search history.

(56) References Cited

U.S. PATENT DOCUMENTS

| | | | |
|---|---|---|---|
| 10,873,040 B2 | 12/2020 | Jeon et al. | |
| 11,171,296 B2 | 11/2021 | Sim et al. | |
| 12,120,947 B2 * | 10/2024 | Jung | C07F 1/12 |
| 2006/0269779 A1 * | 11/2006 | Takahashi | C08F 12/14 |
| | | | 428/917 |
| 2021/0399243 A1 | 12/2021 | Jung et al. | |

* cited by examiner

ORGANOMETALLIC COMPOUND, COMPOSITION INCLUDING SAME, ORGANIC LIGHT-EMITTING DEVICE, AND ELECTRONIC APPARATUS

CROSS-REFERENCE TO RELATED APPLICATIONS

This application is a continuation application of application Ser. No. 17/199,655, filed Mar. 12, 2021, which claims priority to and the benefit of Korean Patent Application No. 10-2020-0167832 filed on Dec. 3, 2020, in the Korean Intellectual Property Office, and all the benefits accruing therefrom under 35 U.S.C. § 119, the content of which are incorporated herein in their entirety by reference.

BACKGROUND

1. Field

One or more embodiments of the present disclosure relate to an organometallic compound, a composition including the same, an organic light-emitting device, and an electronic apparatus.

2. Description of Related Art

Organic light-emitting devices are self-emissive devices that have a wide viewing angle, a high contrast ratio, a short response time, and excellent characteristics in terms of luminance, driving voltage, and response speed, and produce full-color images.

In an example, an organic light-emitting device includes an anode, a cathode, and an organic layer located between the anode and the cathode and including an emission layer. A hole transport region may be disposed between the anode and the emission layer, and an electron transport region may be located between the emission layer and the cathode. Holes provided from the anode may move toward the emission layer through the hole transport region, and electrons provided from the cathode may move toward the emission layer through the electron transport region. Carriers, such as the holes and the electrons, recombine in the emission layer to produce excitons. These excitons transition from an excited state to a ground state to thereby generate visible light.

SUMMARY

Provided are an organometallic compound, a composition including the same, an organic light-emitting device, and an electronic apparatus.

Additional aspects will be set forth in part in the description which follows and, in part, will be apparent from the description, or may be learned by practice of the presented embodiments of the disclosure.

According to an aspect, provided is an organometallic compound represented by Formula 1.

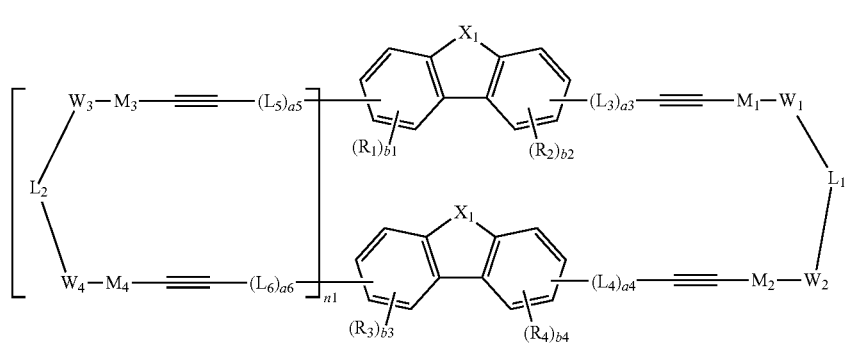

Formula 1

In Formula 1, $M_1$ to $M_4$ are each independently a first-row transition metal of the Periodic Table of Elements, a second-row transition metal of the Periodic Table of Elements, or a third-row transition metal of the Periodic Table of Elements, $X_1$ and $X_2$ are each independently $C(R_5)(R_6)$, $Si(R_5)(R_6)$, $N(R_5)$, O, S, Se, or Te, $W_1$ to $W_4$ are each independently $N(R_7)(R_8)$, $P(R_7)(R_8)$, $S(R_7)$, a $C_5$-$C_{60}$ carbocyclic group unsubstituted or substituted with at least one $R_{10a}$, or a $C_1$-$C_{60}$ heterocyclic group unsubstituted or substituted with at least one $R_{10a}$, $L_1$ to $L_6$ are each independently a $C_1$-$C_{30}$ alkylene group unsubstituted or substituted with at least one $R_{10a}$, a $C_5$-$C_{60}$ carbocyclic group unsubstituted or substituted with at least one $R_{10a}$, or a $C_1$-$C_{60}$ heterocyclic group unsubstituted or substituted with at least one $R_{10a}$, a3 to a6 are each independently an integer from 0 to 3, $R_1$ to $R_8$ are each independently hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{10}$ cycloalkyl group unsubstituted or substituted with at least one $R_{10a}$, a $C_1$-$C_{10}$ heterocycloalkyl group unsubstituted or substituted with at least one $R_{10a}$, a $C_3$-$C_{10}$ cycloalkenyl group unsubstituted or substituted with at least one $R_{10a}$, a $C_1$-$C_{10}$ heterocycloalkenyl group unsubstituted or substituted with at least one $R_{10a}$, a $C_6$-$C_{60}$ aryl group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, a $C_7$-$C_{60}$ arylalkyl group unsubstituted or substituted with at least one $R_{10a}$, a $C_1$-$C_{60}$ heteroaryl group unsubstituted or substituted with at least one $R_{10a}$, a $C_1$-$C_{60}$ heteroaryloxy group unsubstituted or substituted with at least one $R_{10a}$, a $C_1$-$C_{60}$ heteroarylthio group unsubstituted or substituted with at least one $R_{10a}$, a $C_2$-$C_{60}$ heteroarylalkyl group unsubstituted or substituted with at least one $R_{10a}$, a $C_2$-$C_{60}$ alkylheteroaryl group unsubstituted or substituted with at least one $R_{10a}$, a monovalent non-aromatic condensed polycyclic group unsubstituted or substituted with at least one $R_{10a}$, a monovalent non-aromatic condensed heteropolycyclic group unsubstituted or substituted with at least one $R_{10a}$, —Si($Q_1$)($Q_2$)($Q_3$), —Ge($Q_1$)($Q_2$)($Q_3$), —N($Q_4$)($Q_5$), —B($Q_6$)($Q_7$), —P(=O)($Q_8$)($Q_9$), or —P($Q_8$)($Q_9$), $R_7$ and $R_8$ are optionally connected to each other to form a $C_5$-$C_{60}$ carbocyclic group unsubstituted or substituted with at least one $R_{10a}$ or a $C_1$-$C_{60}$ heterocyclic group unsubstituted or substituted with at least one $R_{10a}$, b1 and b3 are each independently an integer from 1 to 4,
b2 and b4 are each independently an integer from 1 to 3,
n1 is 0 or 1, and
when n1 is 0, a group represented by

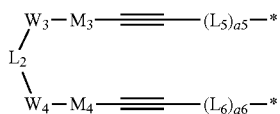

is not present, and
$R_{10a}$ is deuterium, —$CD_3$, —$CD_2H$, —$CDH_2$, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group, a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with one or more of deuterium, —$CD_3$, —$CD_2H$, —$CDH_2$, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, a monovalent non-aromatic condensed heteropolycyclic group, —Si($Q_{11}$)($Q_{12}$)($Q_{13}$), —Ge($Q_{11}$)($Q_{12}$)($Q_{13}$), —N($Q_{14}$)($Q_{15}$), B($Q_{16}$)($Q_{17}$), —P(=O)($Q_{18}$)($Q_{19}$), or —P($Q_{18}$)($Q_{19}$)

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, or a monovalent non-aromatic condensed heteropolycyclic group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, or a monovalent non-aromatic condensed heteropolycyclic group, each substituted with one or more of deuterium, —$CD_3$, —$CD_2H$, —$CDH_2$, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, a monovalent non-aromatic condensed heteropolycyclic group, —Si($Q_{21}$)($Q_{22}$)($Q_{23}$), —Ge($Q_{21}$)($Q_{22}$)($Q_{23}$), —N($Q_{24}$)($Q_{25}$), —B($Q_{26}$)($Q_{27}$), —P(=O)($Q_{28}$)($Q_{29}$), or —P($Q_{28}$)($Q_{29}$); or Si($Q_{31}$)($Q_{32}$)($Q_{33}$), —Ge($Q_{31}$)($Q_{32}$)($Q_{33}$), —N($Q_{34}$)($Q_{35}$), —B($Q_{36}$)($Q_{37}$), P(=O)($Q_{38}$)($Q_{39}$), or —P($Q_{38}$)($Q_{39}$), wherein $Q_1$ to $Q_9$, $Q_{11}$ to $Q_{19}$, $Q_{21}$ to $Q_{29}$, and $Q_{31}$ to $Q_{39}$ are each independently hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$heterocycloalkenyl group, a $C_6$-$C_{60}$ aryl group, a $C_1$-$C_{60}$ heteroaryl group, a monovalent non-aromatic condensed polycyclic group, or a monovalent non-aromatic condensed heteropolycyclic group.

According to another aspect, provided is a composition including at least one organometallic compound represented by Formula 1 as disclosed herein.

According to another aspect, provided is an organic light-emitting device including a first electrode, a second electrode, and an organic layer disposed between the first electrode and the second electrode and including an emission layer, wherein the organic layer includes at least one organometallic compound represented by Formula 1 as disclosed herein.

According to another aspect, provided is an electronic apparatus including at least one organometallic compound represented by Formula 1 as disclosed herein.

BRIEF DESCRIPTION OF THE DRAWINGS

The above and other aspects, features, and advantages of the disclosure will be more apparent from the following detailed description taken in conjunction with the accompanying drawings, in which.

DETAILED DESCRIPTION

Figure 1:
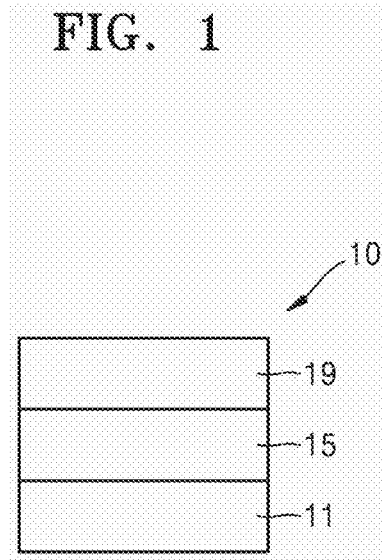
FIG. 1 is a schematic cross-sectional view of an organic light-emitting device according to one or more embodiments.

Reference will now be made in further detail to exemplary embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to further explain aspects. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly in contact with the other element or intervening elements may be present therebetween. In contrast, when an element is referred to as being "directly on" another element, there are no intervening elements present.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an," and "the" are intended to include the plural forms as well, unless the context clearly indicates otherwise.

The term "or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to a cross section illustration that is a schematic illustration of one or more idealized embodiments. As such, variations from the shapes of the illustration as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figure are schematic in nature and their shapes are not intended to illustrate the precise shape of a region and are not intended to limit the scope of the present claims.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Organometallic Compound

An organometallic compound according to one or more embodiments is represented by Formula 1:

Formula 1

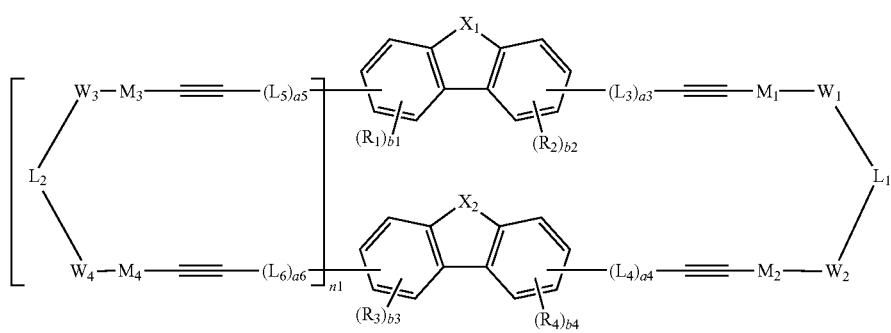

In Formula 1, $M_1$ to $M_4$ may each independently be a first-row transition metal of the Periodic Table of Elements, a second-row transition metal of the Periodic Table of Elements, and a third-row transition metal of the Periodic Table of Elements.

In one or more embodiments, $M_1$ to $M_4$ may each independently be copper (Cu), silver (Ag), or gold (Au). In one or more embodiments, $M_1$ to $M_4$ may each independently be silver (Ag) or gold (Au).

In one or more embodiments, $M_1$ to $M_4$ may each form a coordinate bond with an unshared electron pair of a triple bond and an unshared electron pair of $W_1$ to $W_4$. Accordingly, the organometallic compound represented by Formula 1 may be neutral rather than an ion pair of a cation and an anion.

In Formula 1, $X_1$ and $X_2$ may each independently be $C(R_5)(R_6)$, $Si(R_5)(R_6)$, $N(R_5)$, O, S, Se, or Te. For example, $X_1$ and $X_2$ may each independently be $C(R_5)(R_6)$, $Si(R_5)(R_6)$, $N(R_5)$, O, or S, but embodiments of the present disclosure are not limited thereto.

In Formula 1, $W_1$ to $W_4$ may each independently be $N(R_7)(R_8)$, $P(R_7)(R_8)$, $S(R_7)$, a $C_5$-$C_{60}$ carbocyclic group unsubstituted or substituted with at least one $R_{10a}$, or a $C_1$-$C_{60}$ heterocyclic group unsubstituted or substituted with at least one $R_{10a}$.

In one or more embodiments, in Formula 1, $W_1$ to $W_4$ may each independently be $N(R_7)(R_8)$, $P(R_7)(R_8)$, $S(R_7)$, or a group represented by one of Formulae 2-1 to 2-7:

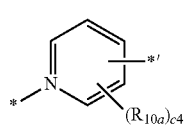
2-1

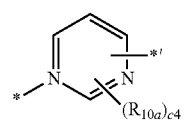
2-2

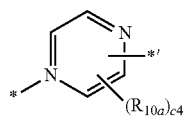
2-3

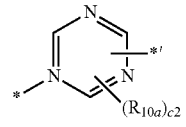
2-4

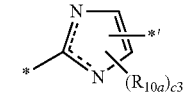
2-5

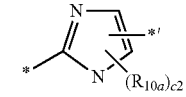
2-6

2-7

In Formulae 2-1 to 2-7,
$R_{10a}$ is the same as described in the present specification,
c2 is 1 or 2,
c3 is 1, 2, or 3,
c4 is 1, 2, 3, or 4,
* indicates a binding site to $M_1$, $M_2$, $M_3$, or $M_4$, and
*' indicates a binding site to $L_1$ or $L_2$.

In one or more embodiments, in Formula 1, $W_1$ to $W_4$ may each independently be $N(R_7)(R_8)$, $P(R_7)(R_8)$, $S(R_7)$, or a group represented by one of Formulae 2-11 to 2-18:

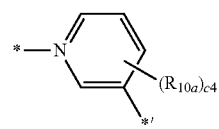
2-11

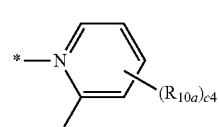
2-12

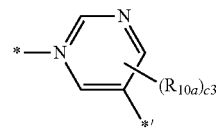
2-13

2-14

-continued

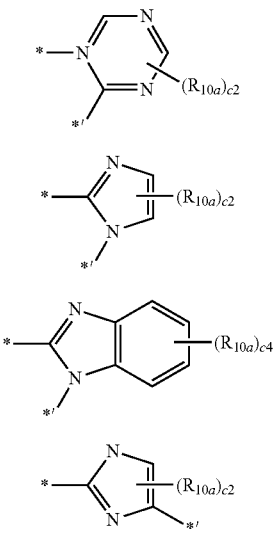

2-15

2-16

2-17

2-18

In Formulae 2-11 to 2-18,
$R_{10a}$ is the same as described in the present specification,
c2 is 1 or 2,
c3 is 1, 2, or 3,
c4 is 1, 2, 3, or 4,
* indicates a binding site to $M_1$, $M_2$, $M_3$, or $M_4$, and
*' indicates a binding site to $L_1$ or $L_2$.

In one or more embodiments, in Formula 1, $W_1$ to $W_4$ may each independently be $N(R_7)(R_8)$, $P(R_7)(R_8)$, $S(R_7)$, or a group represented by one of Formulae 2-11 to 2-18, $R_7$ and $R_8$ may each independently be:
—F or a $C_1$-$C_{10}$ alkoxy group;
a methyl group, an ethyl group, an n-propyl group, an isopropyl group, an n-butyl group, an isobutyl group, a sec-butyl group, a tert-butyl group, an n-pentyl group, an isopentyl group, a sec-pentyl group, or a tert-pentyl group, each unsubstituted or substituted with one or more of deuterium, —F, —Cl, —Br, —I, a hydroxyl group, a cyano group, a nitro group, or an amino group; and
a cyclopentyl group, a cyclohexyl group, a phenyl group, a naphthyl group, or a pyridinyl group, each unsubstituted or substituted with one or more of deuterium, —F, —Cl, —Br, —I, a hydroxyl group, a cyano group, a nitro group, an amino group, a $C_1$-$C_{20}$ alkyl group, or a $C_1$-$C_{20}$ alkoxy group.

In Formula 1, $L_1$ to $L_6$ may each independently be a $C_1$-$C_{30}$ alkylene group unsubstituted or substituted with at least one $R_{10a}$, a $C_5$-$C_{60}$ carbocyclic group unsubstituted or substituted with at least one $R_{10a}$, or a $C_1$-$C_{60}$ heterocyclic group unsubstituted or substituted with at least one $R_{10a}$.

In one or more embodiments, in Formula 1, $L_1$ and $L_2$ may each independently be a group represented by Formula 3-1 or 3-2:

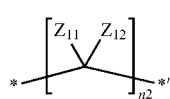

3-1

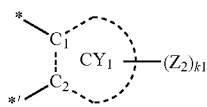

3-2

In Formula 3-1 or 3-2,
$C_1$ and $C_2$ each indicate a carbon atom,
a bond between $C_1$ and $C_2$ is a single bond or a double bond,
$CY_1$ is a $C_5$-$C_{30}$ carbocyclic group or a $C_1$-$C_{30}$ heterocyclic group,
$Z_{11}$, $Z_{12}$, and $Z_2$ are each independently hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_1$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si$(Q_1)(Q_2)(Q_3)$, —N$(Q_4)(Q_5)$, or —B$(Q_6)(Q_7)$,
$Z_{11}$ and $Z_{12}$ are optionally linked to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$,
$R_{10a}$ is the same as described in the present specification,
n2 is an integer from 1 to 10,
k1 is an integer from 1 to 10, and
* and *' each indicate a binding site to a neighboring atom.

In one or more embodiments, in Formula 3-2, $CY_1$ may be a cyclopentane group, a cyclohexane group, a cyclopentene group, a cyclohexene group, a benzene group, a naphthalene group, a 1,2,3,4-tetrahydronaphthalene group, an anthracene group, a phenanthrene group, a triphenylene group, a pyrene group, a chrysene group, a pyrrole group, a furan group, a thiophene group, a selenophene group, a silole group, a germole group, an indene group, a 2,3-dihydro-1H-indene group, an indole group, a benzofuran group, a benzothiophene group, a benzoselenophene group, a benzosilole group, a benzogermole group, a benzimidazole group, a benzoxazole group, a benzothiazole group, a benzoselenazole group, a benzoazasilole group, a fluorene group, a carbazole group, a dibenzofuran group, a dibenzothiophene group, a dibenzoselenophene group, a dibenzosilole group, a dibenzogermole group, an azafluorene group, an azacarbazole group, an azadibenzofuran group, an azadibenzothiophene group, an azadibenzoselenophene group, an azadibenzosilole group, an azadibenzogermole group, a pyridine group, a pyrimidine group, a pyrazine group, a pyridazine group, a quinoline group, an isoquinoline group, a quinoxaline group, a quinazoline group, or a phenanthroline group.

In one or more embodiments, in Formula 3-2, $CY_1$ may be a cyclohexane group, a benzene group, a naphthalene group, a 1,2,3,4-tetrahydronaphthalene group, an indene group, a 2,3-dihydro-1H-indene group, an indole group, a benzofuran group, a benzothiophene group, a benzoselenophene group, a benzosilole group, a benzimidazole group, a carbazole group, or a dibenzofuran group, but embodiments of the present disclosure are not limited thereto.

In one or more embodiments, in Formulae 3-1 and 3-2, $Z_{11}$, $Z_{12}$, and $Z_2$ may each independently be:

hydrogen, deuterium, —F, —Cl, —Br, —I, a hydroxyl group, a cyano group, a nitro group, an amino group, a $C_1$-$C_{20}$ alkyl group, or a $C_1$-$C_{20}$ alkoxy group; or a $C_1$-$C_{20}$ alkyl group or a $C_1$-$C_{20}$ alkoxy group, each substituted with at least one of deuterium, —F, —Cl, —Br, —I, a hydroxyl group, a cyano group, a nitro group, or an amino group.

In one or more embodiments, in Formulae 3-1 to 3-3, $Z_{11}$, $Z_{12}$, and $Z_2$ may each independently be:

hydrogen, deuterium, —F, —Cl, —Br, —I, a hydroxyl group, a cyano group, a nitro group, an amino group, a methyl group, an ethyl group, an n-propyl group, an isopropyl group, an n-butyl group, an isobutyl group, a sec-butyl group, a tert-butyl group, an n-pentyl group, a tert-pentyl group, a neo-pentyl group, an isopentyl group, a sec-pentyl group, a 3-pentyl group, or a sec-isopentyl group; or a methyl group, an ethyl group, an n-propyl group, an isopropyl group, an n-butyl group, an isobutyl group, a sec-butyl group, a tert-butyl group, an n-pentyl group, a tert-pentyl group, a neo-pentyl group, an isopentyl group, a sec-pentyl group, a 3-pentyl group, or a sec-isopentyl group, each substituted with at least one of deuterium, —F, —Cl, —Br, —I, a hydroxyl group, a cyano group, a nitro group, or an amino group.

In one or more embodiments, in Formula 1, $L_1$ and $L_2$ may each independently be a group represented by one or more of Formulae 3-11 to 3-22:

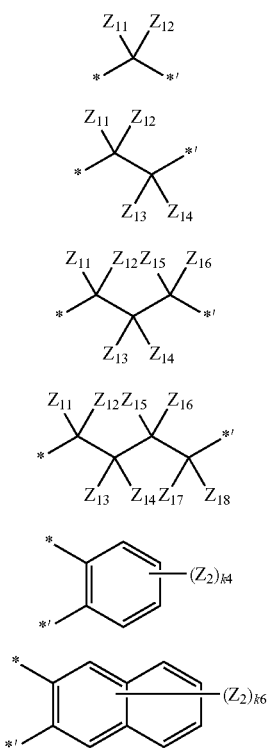

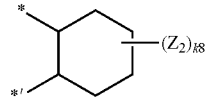

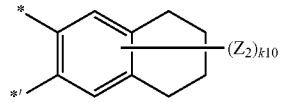

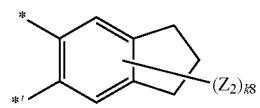

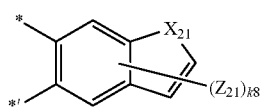

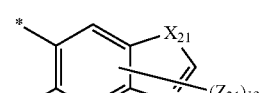

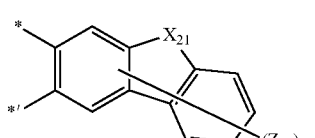

In Formulae 3-11 to 3-22, $X_{21}$ is $C(Z_{22})(Z_{23})$, $Si(Z_{22})(Z_{23})$, $N(Z_{22})$, O, S, or Se, $Z_{11}$, $Z_{12}$, and $Z_2$ are the same as described in the present specification, $Z_{13}$ to $Z_{18}$ are the same as described in connection with $Z_{11}$ provided herein, $Z_{21}$ to $Z_{23}$ are the same as described in connection with $Z_2$ provided herein, k3 is an integer from 1 to 3, k4 is an integer from 1 to 4, k6 is an integer from 1 to 6, k8 is an integer from 1 to 8, k10 is an integer from 1 to 10, and

* and *' each indicate a binding site to a neighboring atom.

In one or more embodiments, in Formula 1, $L_3$ to $L_6$ may each independently be:

a cyclopentylene group, a cyclohexylene group, a cyclopentenylene group, a cyclohexenylene group, a cycloheptenylene group, a phenylene group, a biphenylene group, a terphenylene group, a pentalenylene group, an indenylene group, a naphthylene group, an azulenylene group, a heptalenylene group, an indacenylene group, an acenaphthylene group, a fluorenylene group, a spiro-bifluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pyrrolylene group, an imidazolylene group, a pyrazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzoxazolylene group, a benzimidazolylene group, a furanylene group, a benzofuranylene group, a thiophenylene group, a benzothiophenylene group, a thiazolylene group, an isothiazolylene group, a benzothiazolylene group, an isoxazolylene group, an oxazolylene group, a triazolylene group, a tetrazolylene group, an oxadiazolylene group, a triazinylene group, a dibenzofuranylene group, a dibenzothiophenylene group, a benzocarbazolylene group, a dibenzocarbazolylene group, an imidazopyridimidinylene group, an imidazopyridinylene group, a pyridoindolylene group, a benzofuropyridinylene group, a benzothienopyridinylene group, a pyrimidoindolylene group, a benzofuropyrimidinylene group, a benzothienopyrimidinylene group, a phenoxazinylene group, a pyridobenzoxazinylene group, or a pyridobenzothiazinylene group, each unsubstituted or substituted with one or more of deuterium, —F, —Cl, —Br, —I, a hydroxyl group, a cyano group, a nitro group, an amino group, a $C_1$-$C_{60}$ alkyl group, a $C_1$-$C_{60}$ alkoxy group, a cyclopentyl group, a cyclohexyl group, a cyclopentenyl group, a cyclohexenyl group, a cycloheptenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoxazolyl group, a benzimidazolyl group, a furanyl group, a benzofuranyl group, a thiophenyl group, a benzothiophenyl group, a thiazolyl group, an isothiazolyl group, a benzothiazolyl group, an isoxazolyl group, an oxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridimidinyl group, an imidazopyridinyl group, a pyridoindolyl group, a benzofuropyridinyl group, a benzothienopyridinyl group, a pyrimidoindolyl group, a benzofuropyrimidinyl group, a benzothienopyrimidinyl group, a phenoxazinyl group, a pyridobenzoxazinyl group, or a pyridobenzothiazinyl group.

In Formula 1, a3 to a6 may each independently be an integer from 0 to 3.

When a3 is 0, $(L_3)_{a3}$ may be a single bond, when a4 is 0, $(L_4)_{a4}$ may be a single bond, when a5 is 0, $(L_5)_{a5}$ may be a single bond, and when a6 is 0, $(L_6)_{a6}$ may be a single bond.

In one or more embodiments, in Formula 1, a3 to a6 may each be 0.

In Formula 1, $R_1$ to $R_8$ may each independently be hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{10}$ cycloalkyl group unsubstituted or substituted with at least one $R_{10a}$, a $C_1$-$C_{10}$ heterocycloalkyl group unsubstituted or substituted with at least one $R_{10a}$, a $C_3$-$C_{10}$ cycloalkenyl group unsubstituted or substituted with at least one $R_{10a}$, a $C_1$-$C_{10}$ heterocycloalkenyl group unsubstituted or substituted with at least one $R_{10a}$, a $C_6$-$C_{60}$ aryl group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, a $C_7$-$C_{60}$ arylalkyl group unsubstituted or substituted with at least one $R_{10a}$, a $C_1$-$C_{60}$ heteroaryl group unsubstituted or substituted with at least one $R_{10a}$, a $C_1$-$C_{60}$ heteroaryloxy group unsubstituted or substituted with at least one $R_{10a}$, a $C_1$-$C_{60}$ heteroarylthio group unsubstituted or substituted with at least one $R_{10a}$, a $C_2$-$C_{60}$ heteroarylalkyl group unsubstituted or substituted with at least one $R_{10a}$, a $C_2$-$C_{60}$ alkylheteroaryl group unsubstituted or substituted with at least one $R_{10a}$, a monovalent non-aromatic condensed polycyclic group unsubstituted or substituted with at least one $R_{10a}$, a monovalent non-aromatic condensed heteropolycyclic group unsubstituted or substituted with at least one $R_{10a}$, —Si($Q_1$)($Q_2$)($Q_3$), —Ge($Q_1$)($Q_2$)($Q_3$), —N($Q_4$)($Q_5$), —B($Q_6$)($Q_7$), —P(=O)($Q_8$)($Q_9$), or —P($Q_8$)($Q_9$), or $R_7$ and $R_8$ may optionally be connected to each other to form a $C_5$-$C_{60}$ carbocyclic group unsubstituted or substituted with at least one $R_{10a}$ or a $C_1$-$C_{60}$ heterocyclic group unsubstituted or substituted with at least one $R_{10a}$, wherein $R_{10a}$ is as defined in this specification.

In one or more embodiments, in Formula 1, $R_1$ to $R_8$ may each independently be:

hydrogen, deuterium, —F, —Cl, —Br, —I, a hydroxyl group, a cyano group, a nitro group, or an amino group;

a $C_1$-$C_{60}$ alkyl group or a $C_1$-$C_{60}$ alkoxy group, each unsubstituted or substituted with one or more of deuterium, —F, —Cl, —Br, —I, a hydroxyl group, a cyano group, a nitro group, or an amino group;

a cyclopentyl group, a cyclohexyl group, a cyclopentenyl group, a cyclohexenyl group, a cycloheptenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoxazolyl group, a benzimidazolyl group, a furanyl group, a benzofuranyl group, a thiophenyl group, a benzothiophenyl group, a thiazolyl group, an isothiazolyl group, a benzothiazolyl group, an isoxazolyl group, an oxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridimidinyl group, an imidazopyridinyl group, a pyridoindolyl group, a benzofuropyridinyl group, a benzothienopyridinyl group, a pyrimidoindolyl group, a benzofuropyrimidinyl group, a benzothienopyrimidinyl group, a phenoxazinyl group, a pyridobenzoxazinyl group, or a pyridobenzothiazinyl group, each unsubstituted or substituted with one or more of deuterium, —F, —Cl, —Br, —I, a hydroxyl group, a cyano group, a nitro group, an amino group, a $C_1$-$C_{60}$ alkyl group, a $C_1$-$C_{60}$ alkoxy group, a cyclopentyl group, a cyclohexyl group, a cyclopentenyl group, a cyclohexenyl group, a cycloheptenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoxazolyl group, a benzimidazolyl group, a furanyl group, a benzofuranyl group, a thiophenyl group, a benzothiophenyl group, a thiazolyl group, an isothiazolyl group, a benzothiazolyl group, an isoxazolyl group, an oxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridimidinyl group, an imidazopyridinyl group, a pyridoindolyl group, a benzofuropyridinyl group, a benzothienopyridinyl group, a pyrimidoindolyl group, a benzofuropyrimidinyl group, a benzothienopyrimidinyl group, a phenoxazinyl group, a pyridobenzoxazinyl group, or a pyridobenzothiazinyl group; or —Si($Q_1$)($Q_2$)($Q_3$), —N($Q_4$)($Q_5$), or —B($Q_6$)($Q_7$), wherein $Q_1$ to $Q_7$ may each independently be hydrogen, deuterium, a $C_1$-$C_{10}$ alkyl group, a phenyl group, a biphenyl group, a naphthyl group, a fluorenyl group, a carbazolyl group, a dibenzofuranyl group, a dibenzothiophenyl group, a pyridinyl group, a pyrimidinyl group, a pyrazinyl group, or a triazinyl group.

In one or more embodiments, in Formula 1, $R_1$ to $R_8$ may each independently be:

hydrogen, deuterium, —F, a cyano group, a nitro group, —CH$_3$, —CD$_3$, —CD$_2$H, —CDH$_2$, —CF$_3$, —CF$_2$H, —CFH$_2$, a group represented by one of Formulae 9-1 to 9-26, a group represented by one of Formulae 10-1 to 10-256, —Si($Q_1$)($Q_2$)($Q_3$), —N($Q_4$)($Q_5$), or —B($Q_6$)($Q_7$), but embodiments of the present disclosure are not limited thereto:

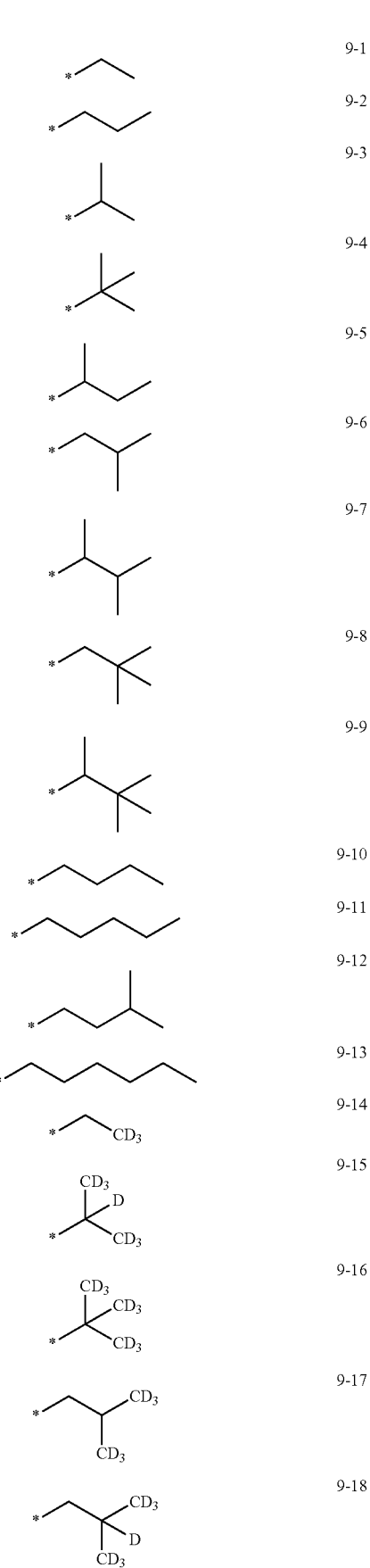

-continued
9-19 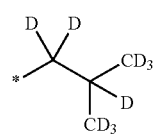
9-20 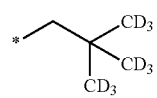
9-21 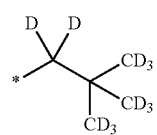
9-22 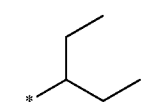
9-23 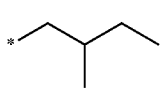
9-24 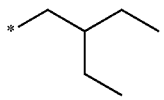
9-25 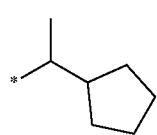
9-26 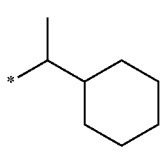
10-1 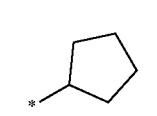
10-2 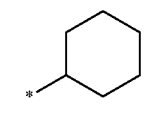
10-3 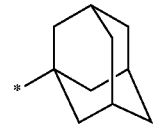
10-4 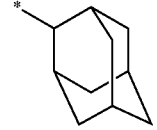
10-5 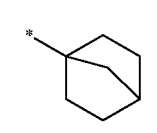
-continued
10-6 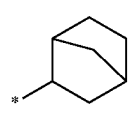
10-7 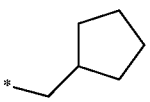
10-8 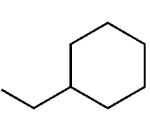
10-9 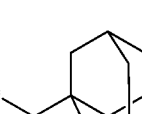
10-10 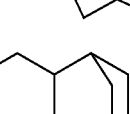
10-11 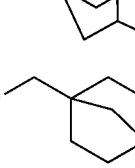
10-12 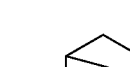
10-13 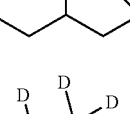
10-14 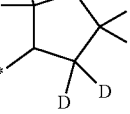
10-15 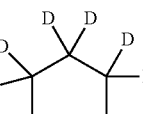
10-16 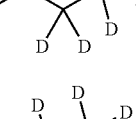

-continued
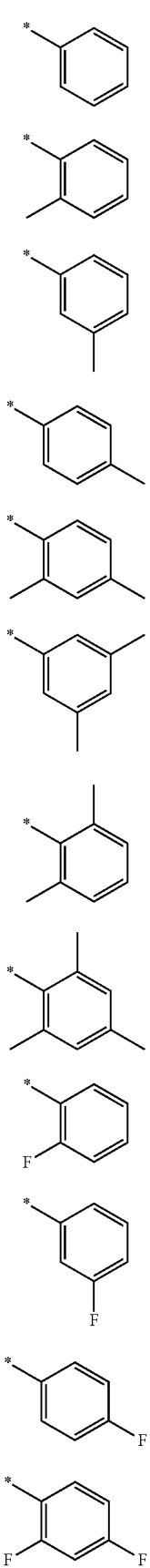
10-17
10-18
10-19
10-20
10-21
10-22
10-23
10-24
10-25
10-26
10-27
10-28
-continued
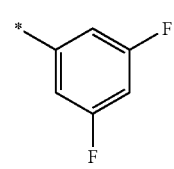
10-29
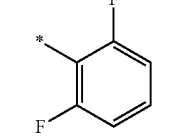
10-30
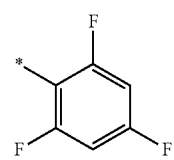
10-31
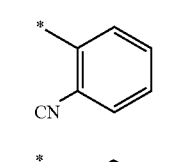
10-32
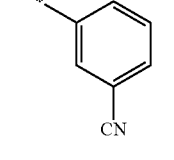
10-33
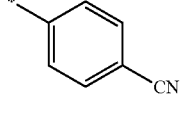
10-34
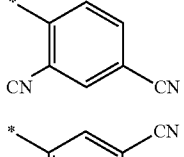
10-35
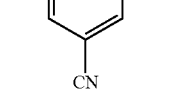
10-36
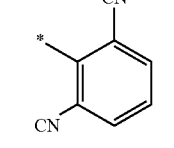
10-37
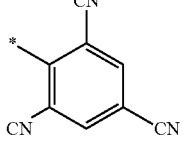
10-38
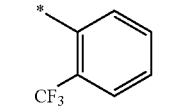
10-39

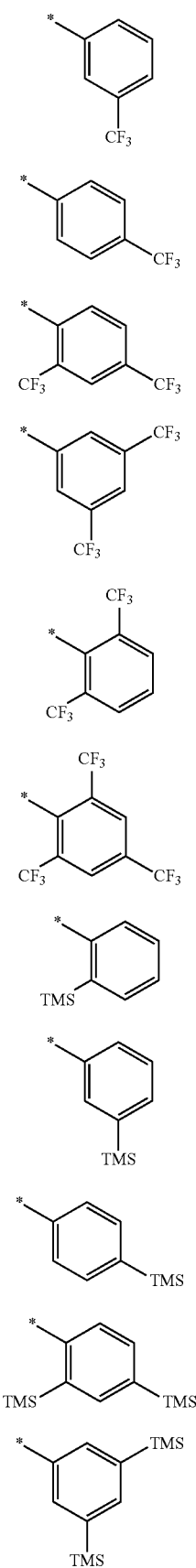
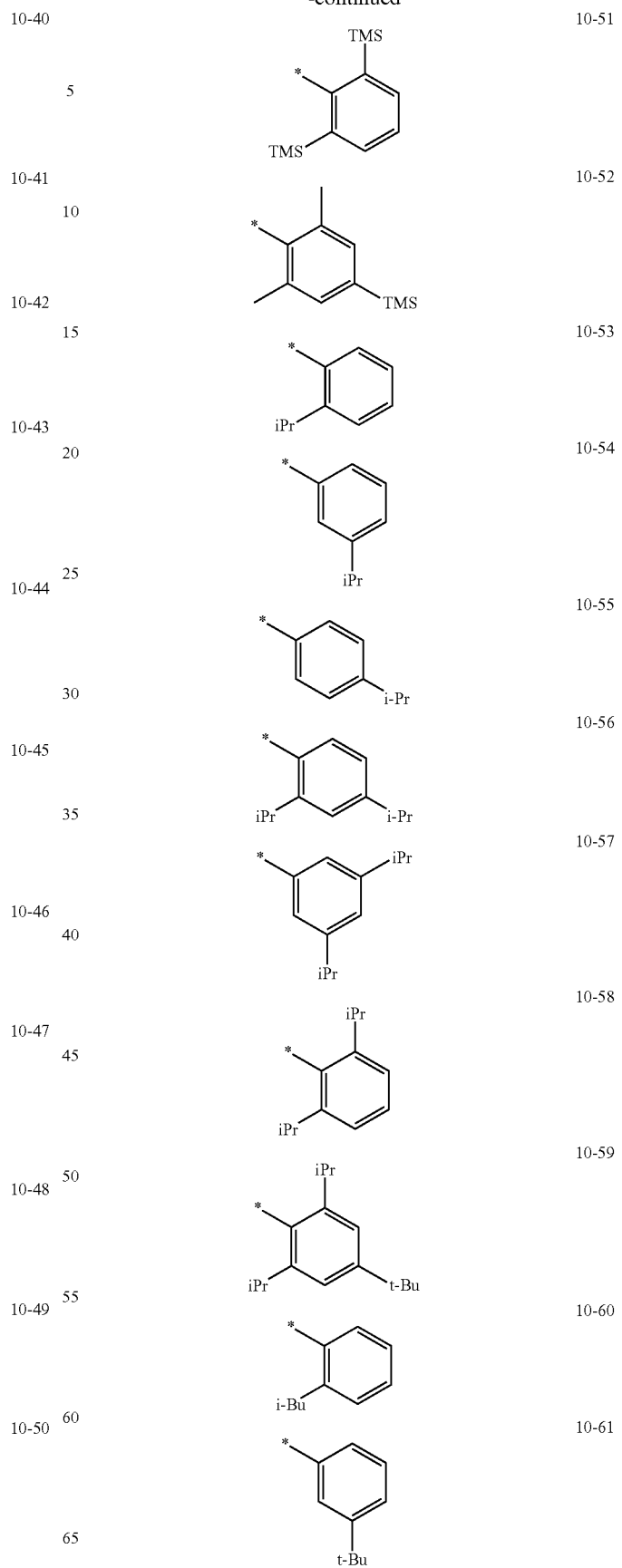

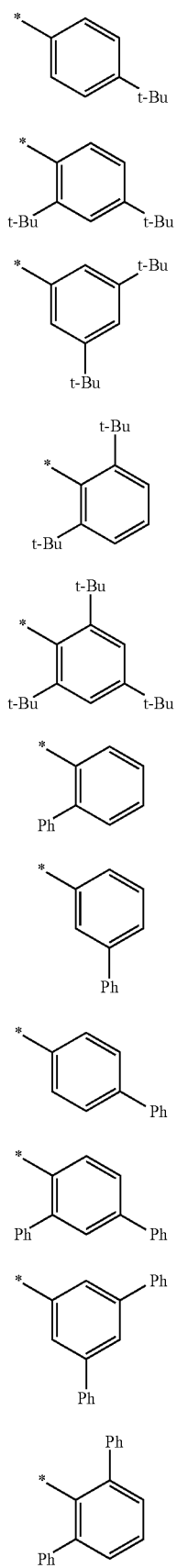
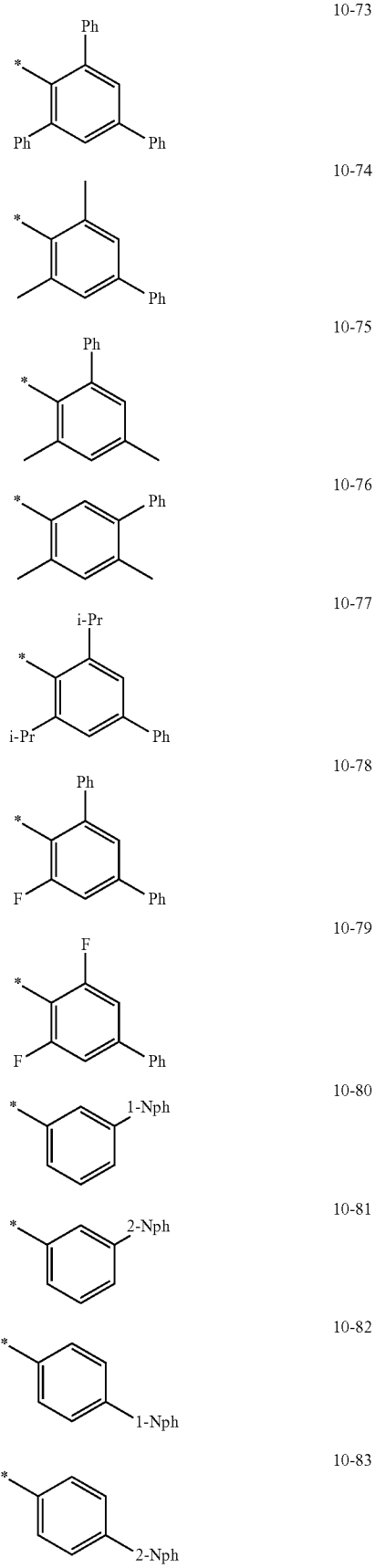

| | | | |
|---|---|---|---|
| 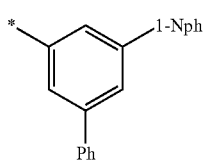 | 10-84 | 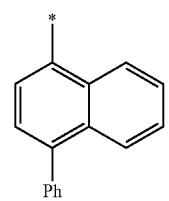 | 10-94 |
| 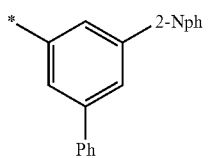 | 10-85 | 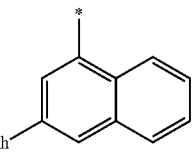 | 10-95 |
| 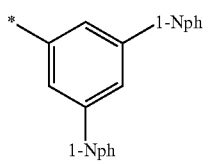 | 10-86 | 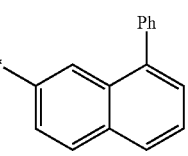 | 10-96 |
| 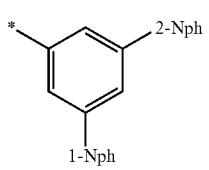 | 10-87 | 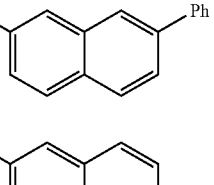 | 10-97 |
| 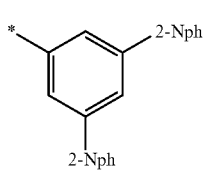 | 10-88 | 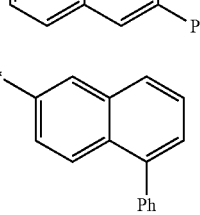 | 10-98 |
| 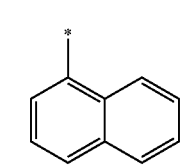 | 10-89 | 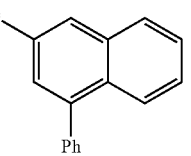 | 10-99 |
| 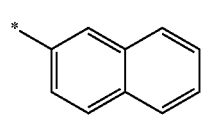 | 10-90 | 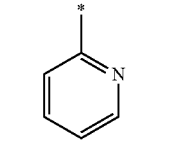 | 10-100 |
| 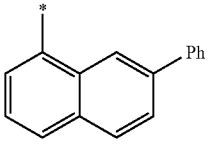 | 10-91 | 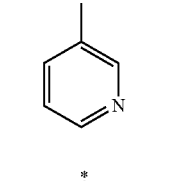 | 10-101 |
| 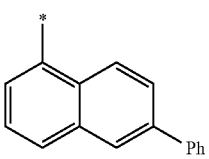 | 10-92 | 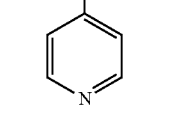 | 10-102 |
| 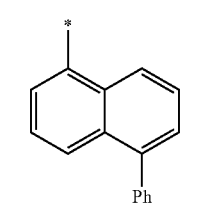 | 10-93 | | 10-103 |

10-104 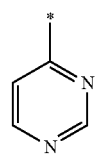
10-105 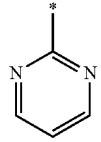
10-106 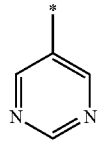
10-107 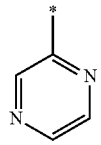
10-108 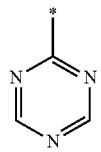
10-109 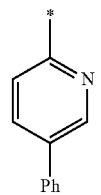
10-110 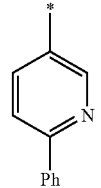
10-111 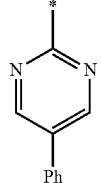
10-112 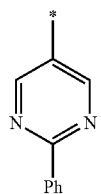
10-113 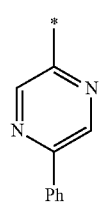
10-114 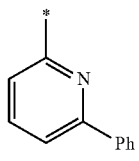
10-115 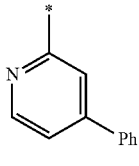
10-116 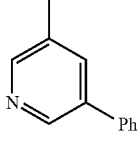
10-117 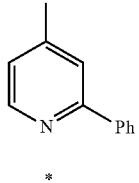
10-118 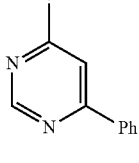
10-119 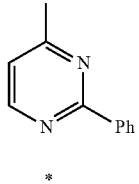
10-120 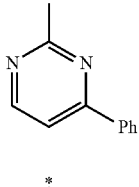
10-121 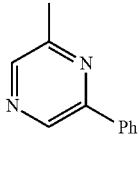

| | |
|---|---|
| 10-122 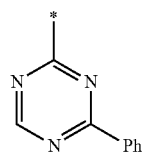 | 10-132 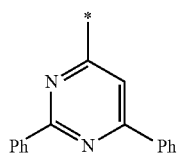 |
| 10-123 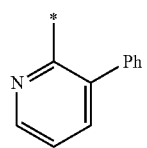 | 10-133 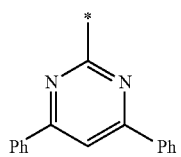 |
| 10-124 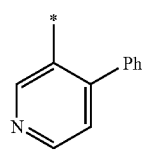 | 10-134 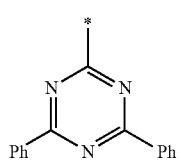 |
| 10-125 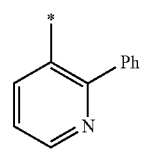 | 10-135 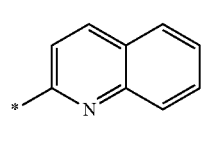 |
| 10-126 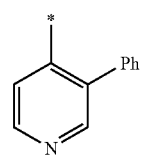 | 10-136 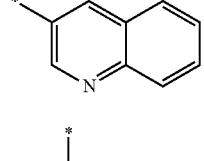 |
| 10-127 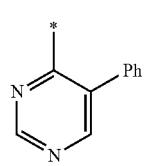 | 10-137 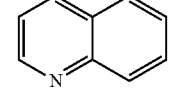 |
| 10-128 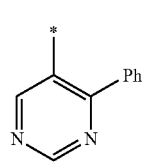 | 10-138 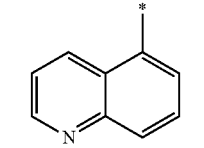 |
| 10-129 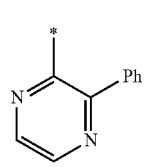 | 10-139 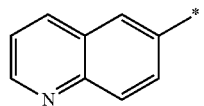 |
| 10-130 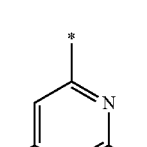 | 10-140 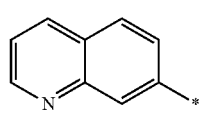 |
| 10-131 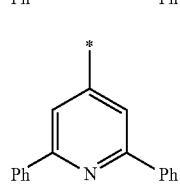 | 10-141 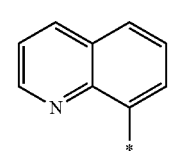 |
| | 10-142 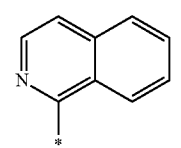 |

-continued
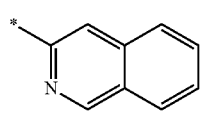
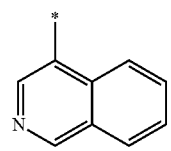
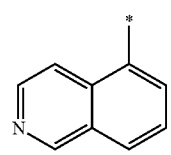
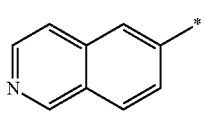
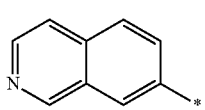
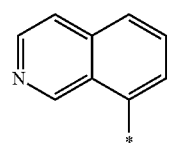
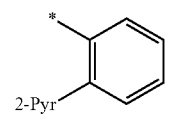
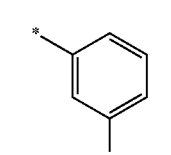
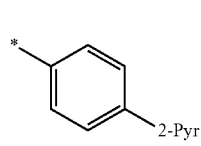
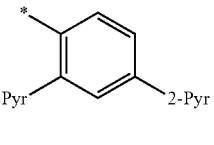
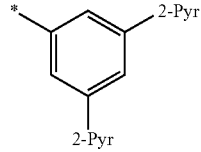
-continued
10-143
10-144
10-145
10-146
10-147
10-148
10-149
10-150
10-151
10-152
10-153
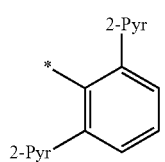 10-154
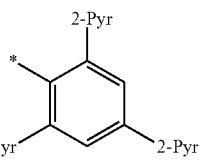 10-155
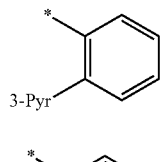 10-156
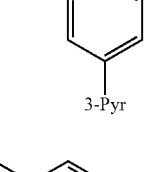 10-157
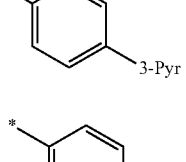 10-158
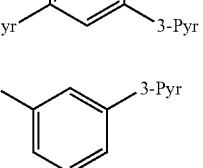 10-159
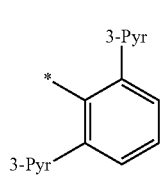 10-160
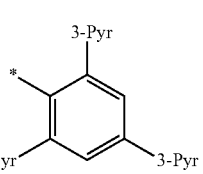 10-161
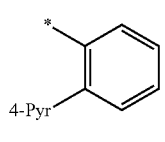 10-162
10-163

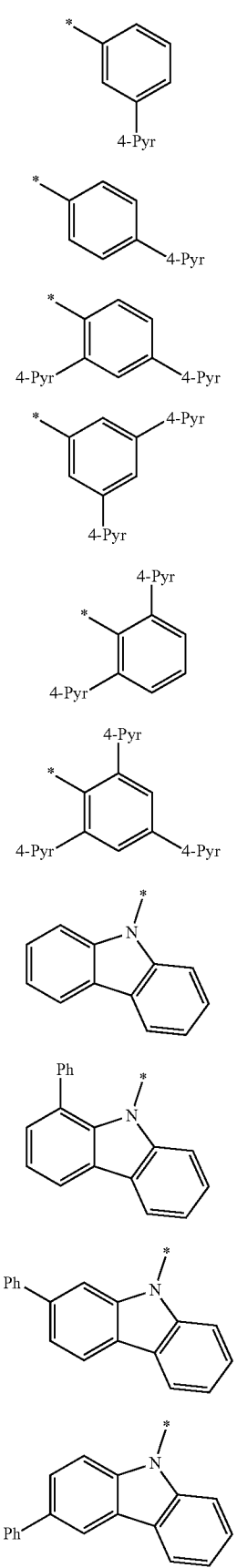

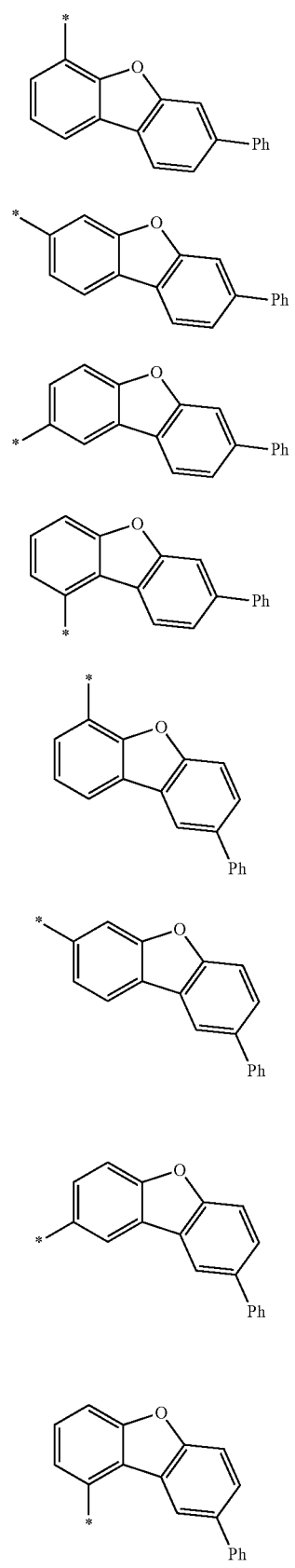
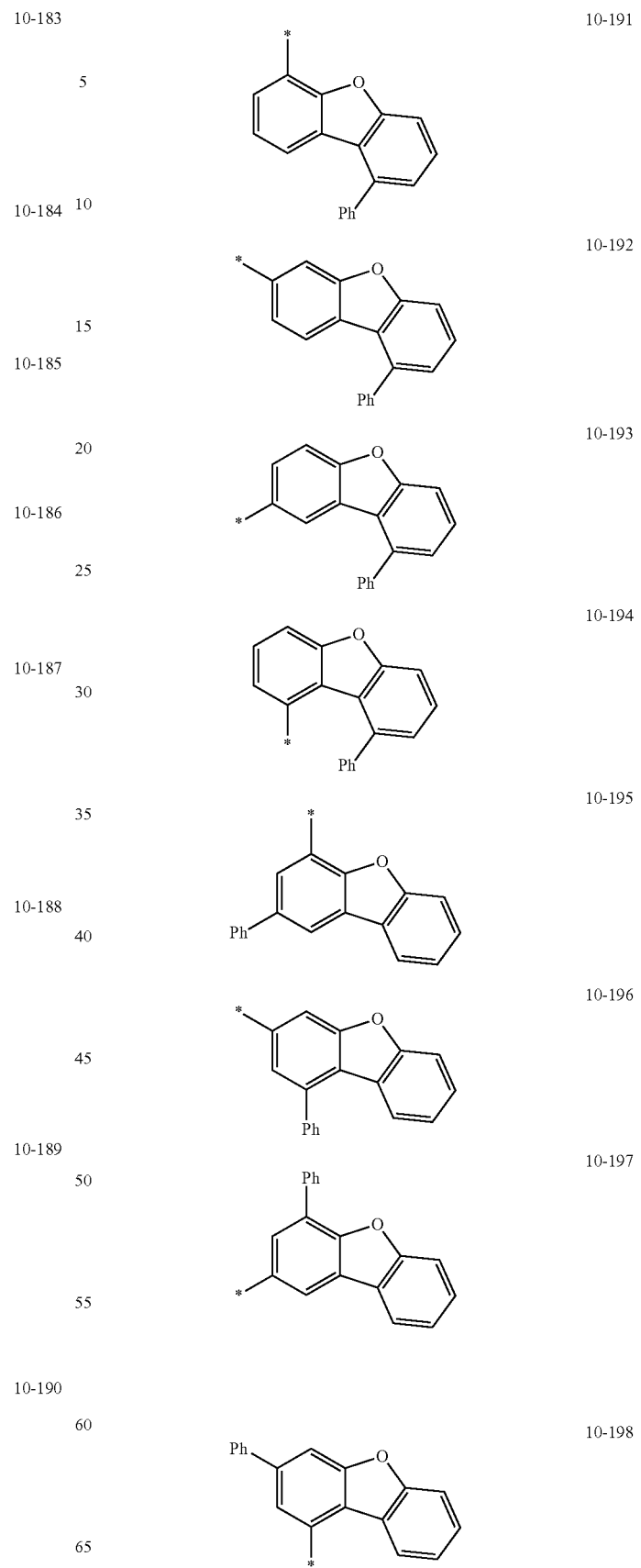

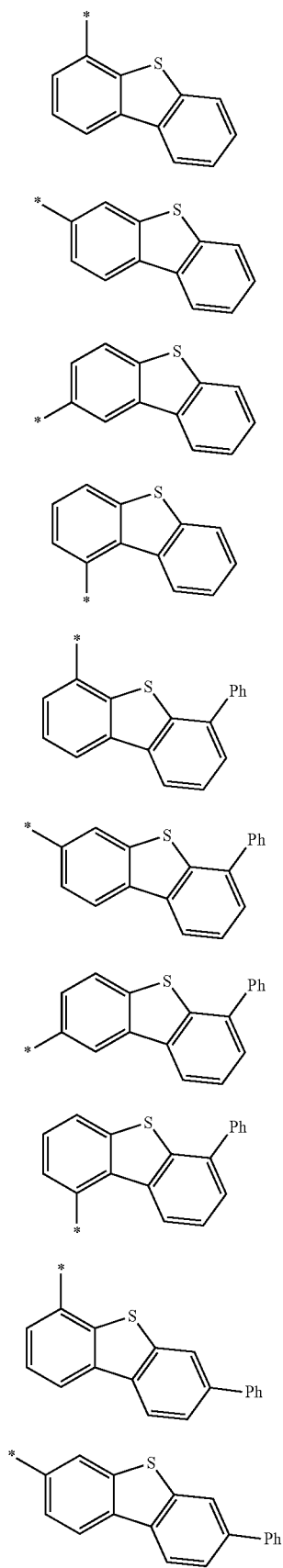
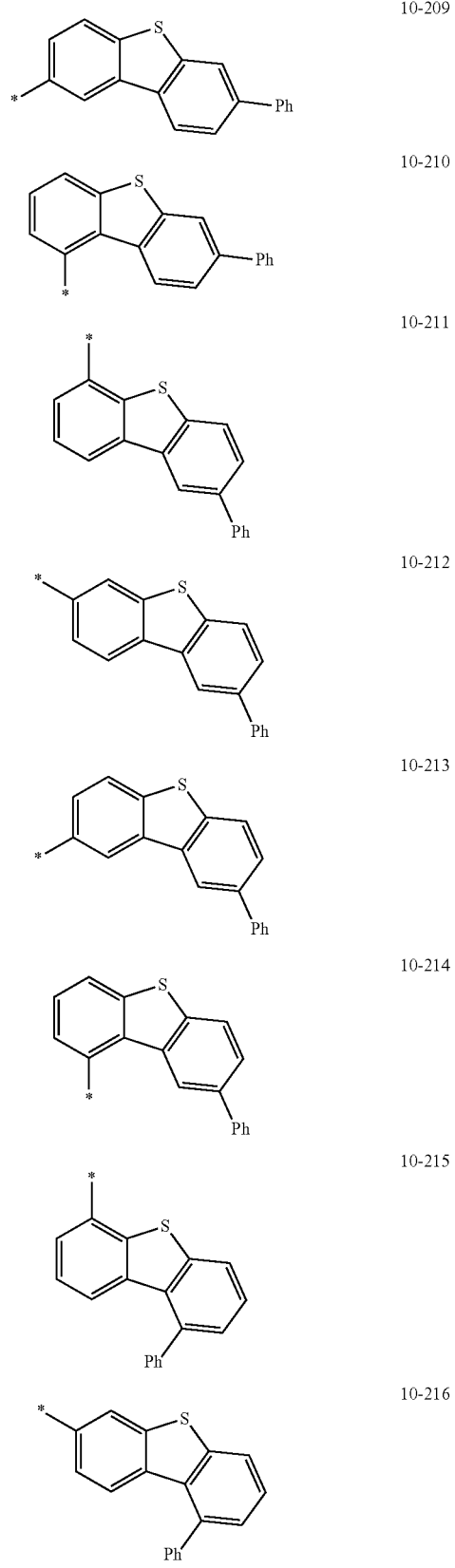

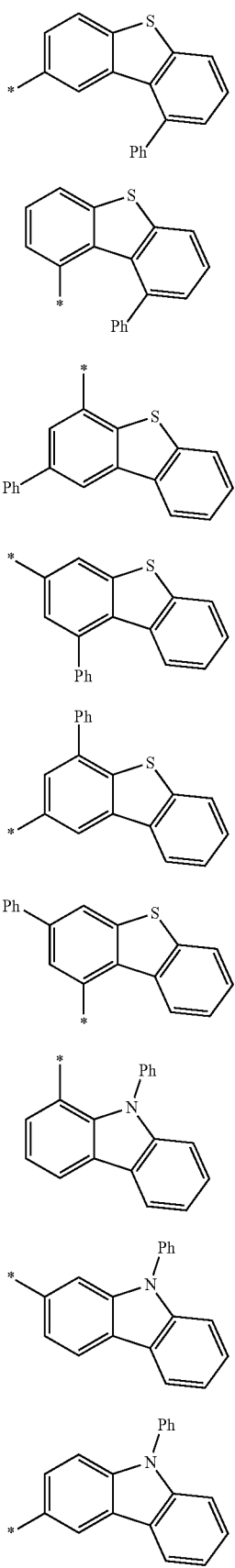
10-217
10-218
10-219
10-220
10-221
10-222
10-223
10-224
10-225
10-226
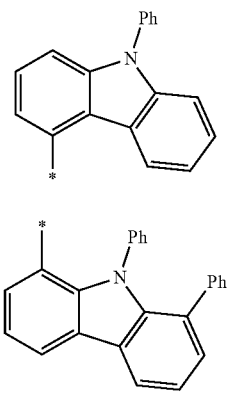
10-227
10-228
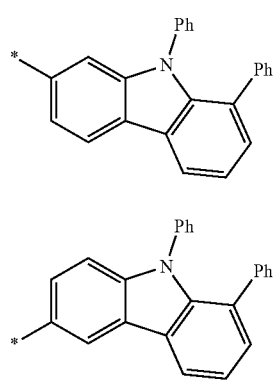
10-229
10-230
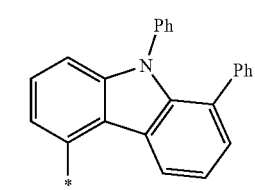
10-231
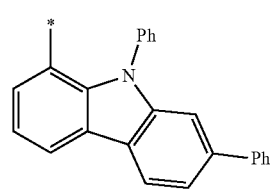
10-232
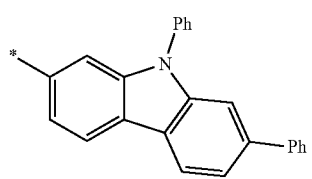
10-233
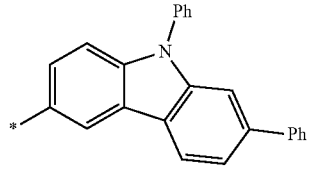

10-234
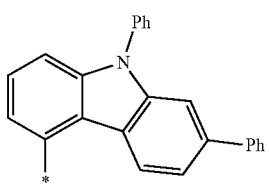
10-235
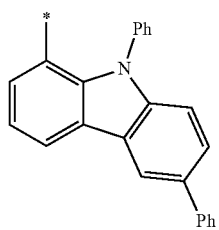
10-236
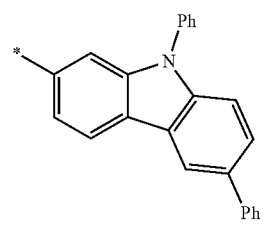
10-237
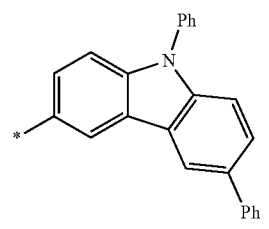
10-238
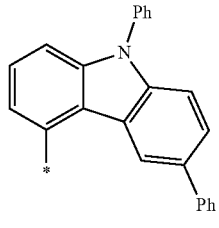
10-239
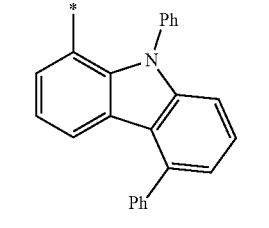
10-240
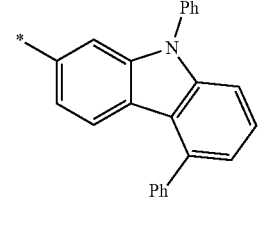
10-241
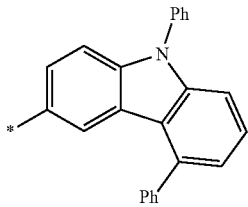
10-242
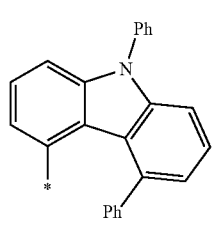
10-243
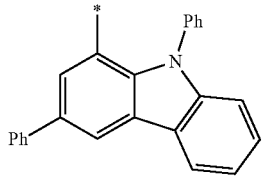
10-244
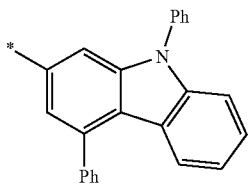
10-245
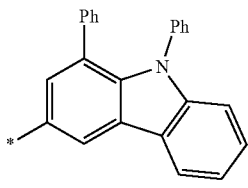
10-246
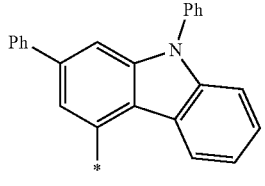
10-247
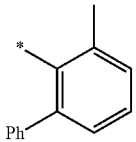
10-248
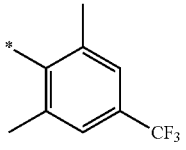
10-249
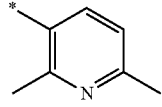

-continued

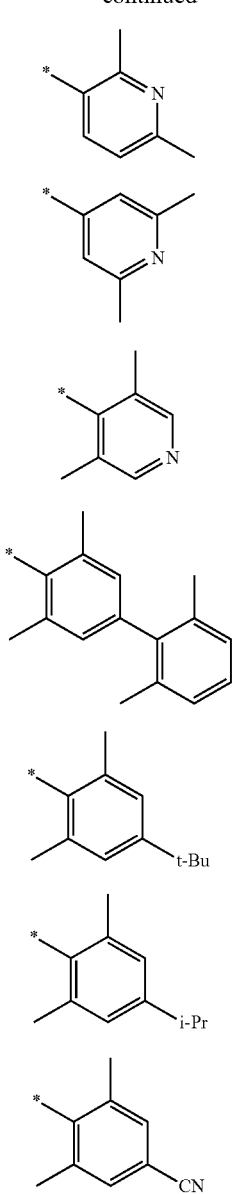

wherein $Q_1$ to $Q_7$ may each independently be:

—CH$_3$, —CD$_3$, —CD$_2$H, —CDH$_2$, —CH$_2$CH$_3$, —CH$_2$CD$_3$, —CH$_2$CD$_2$H, —CH$_2$CDH$_2$, —CHDCH$_3$, —CHDCD$_2$H, —CHDCDH$_2$, —CHDCD$_3$, —CD$_2$CH$_3$, —CD$_2$CD$_3$, —CD$_2$CD$_2$H, or —CD$_2$CDH$_2$;

an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, or a naphthyl group; or an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, or a naphthyl group, each substituted with one or more of deuterium, a $C_1$ to $C_{10}$ alkyl group, or a phenyl group, and in Formulae 9-1 to 9-26 and 10-1 to 10-256,
* indicates a binding site to a neighboring atom,
i-Pr is an isopropyl group, t-Bu is a t-butyl group,
Ph is a phenyl group,
1-Nph is a 1-naphthyl group, 2-Nph is a 2-naphthyl group,
2-Pyr is a 2-pyridyl group, 3-Pyr is a 3-pyridyl group,
4-Pyr is a 4-pyridyl group, and
TMS is a trimethylsilyl group.

In one or more embodiments, in Formula 1, $R_1$ to $R_6$ may each independently be:

hydrogen, deuterium, —F, —Cl, —Br, —I, a hydroxyl group, a cyano group, a nitro group, an amino group, or a $C_1$-$C_{10}$ alkoxy group;

a methyl group, an ethyl group, an n-propyl group, an isopropyl group, an n-butyl group, an isobutyl group, a sec-butyl group, a tert-butyl group, an n-pentyl group, an isopentyl group, a sec-pentyl group, or a tert-pentyl group, each unsubstituted or substituted with one or more of deuterium, —F, —Cl, —Br, —I, a hydroxyl group, a cyano group, a nitro group, or an amino group; or a cyclopentyl group, a cyclohexyl group, a phenyl group, a naphthyl group, or a pyridinyl group, each unsubstituted or substituted with one or more of deuterium, —F, —Cl, —Br, —I, a hydroxyl group, a cyano group, a nitro group, an amino group, a $C_1$-$C_{20}$ alkyl group, or a $C_1$-$C_{20}$ alkoxy group.

In one or more embodiments, in Formula 1, $R_7$ and $R_8$ may each independently be:

—F or a $C_1$-$C_{10}$ alkoxy group;

a methyl group, an ethyl group, an n-propyl group, an isopropyl group, an n-butyl group, an isobutyl group, a sec-butyl group, a tert-butyl group, an n-pentyl group, an isopentyl group, a sec-pentyl group, or a tert-pentyl group, each unsubstituted or substituted with one or more of deuterium, —F, —Cl, —Br, —I, a hydroxyl group, a cyano group, a nitro group, or an amino group; or a cyclopentyl group, a cyclohexyl group, a phenyl group, a naphthyl group, or a pyridinyl group, each unsubstituted or substituted with one or more of deuterium, —F, —Cl, —Br, —I, a hydroxyl group, a cyano group, a nitro group, an amino group, a $C_1$-$C_{20}$ alkyl group, or a $C_1$-$C_{20}$ alkoxy group. In Formula 1, b1 and b3 may each independently be an integer from 1 to 4, and b2 and b4 may each independently be an integer from 1 to 3. In Formula 1, n1 may be 0 or 1, and when n1 is 0, the group represented by the structure:

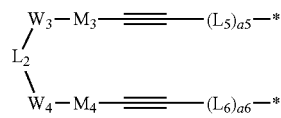

does not exist.

In one or more embodiments, in Formula 1, when n1 is 0, a group represented by

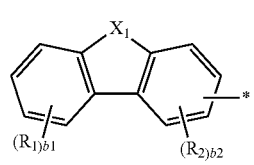

may be a group represented by one of Formulae CY1-1 to CY1-4, or a group represented by

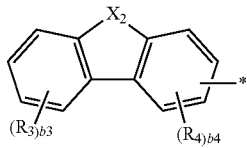

may be a group represented by one of Formulae CY2-1 to CY2-4:

CY1-1
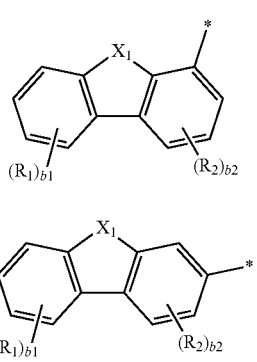

CY1-2

CY1-3
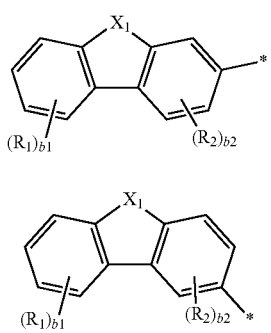

CY1-4

CY2-1
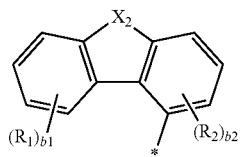

CY2-2
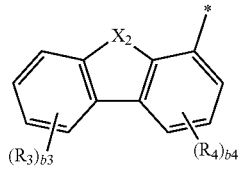

CY2-3
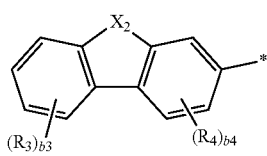

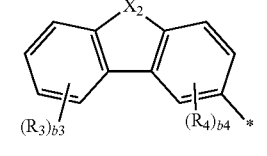
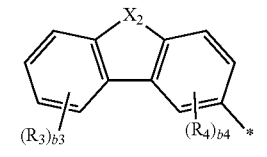

CY2-4
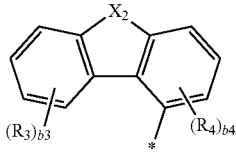

In Formulae CY1-1 to CY1-4 and CY2-1 to CY2-4,
$X_1$, $X_2$, $R_1$ to $R_4$, and b1 to b4 are the same as described in the present specification, and
*indicates a binding site to a neighboring atom.

In one or more embodiments, in Formula 1, when n1 is 1, a group represented by:

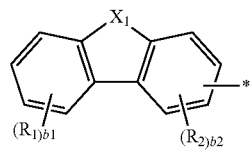

may be a group represented by one of Formulae CY1-5 to CY1-7, or a group represented by:

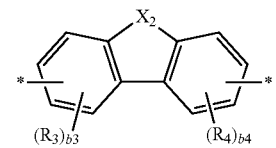

may be a group represented by one of Formulae CY2-5 to CY2-7:

CY1-5
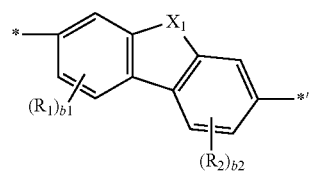

CY1-6
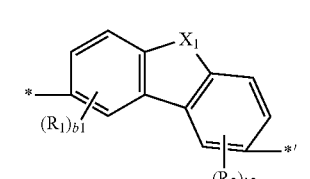

CY1-7
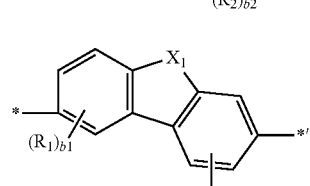

-continued

CY2-5

CY2-6

CY2-7

In Formulae CY1-5 to CY1-7 and CY2-5 to CY2-7, $X_1$, $X_2$, $R_1$ to $R_4$, b2, and b4 are the same as described in the present specification, b1 and b3 are each independently an integer from 1 to 3, and

* and *' each indicate a binding site to a neighboring atom.

In one or more embodiments, the organometallic compound may be represented by Formula 1-1 or 1-2:

Formula 1-1

Formula 1-2

In Formula 1-1 or 1-2, $W_1$ to $W_4$, $X_1$, $X_2$, $L_1$, $L_2$, $R_1$ to $R_4$, and b1 to b4 are the same as described in the present specification.

In one or more embodiments, the organometallic compound may be represented by one of Compounds 1 to 810, but embodiments of the present disclosure are not limited thereto:

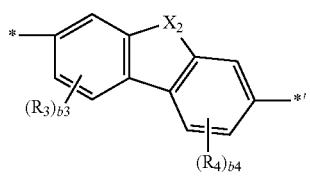

1

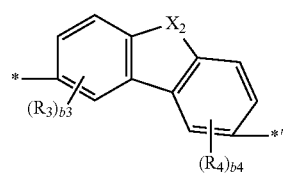

2

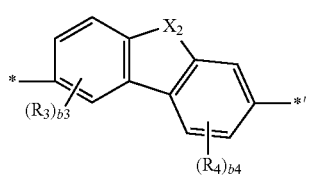

3

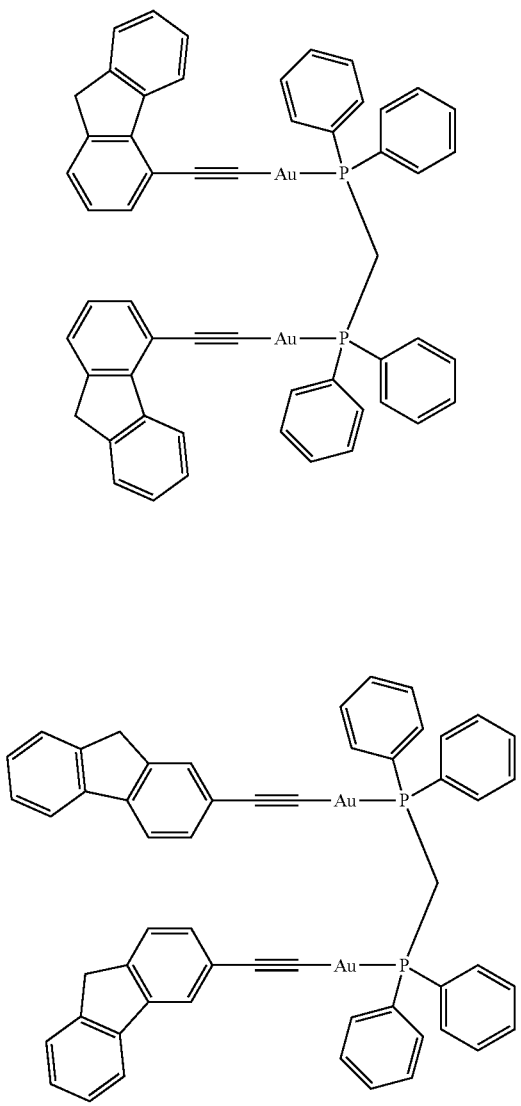
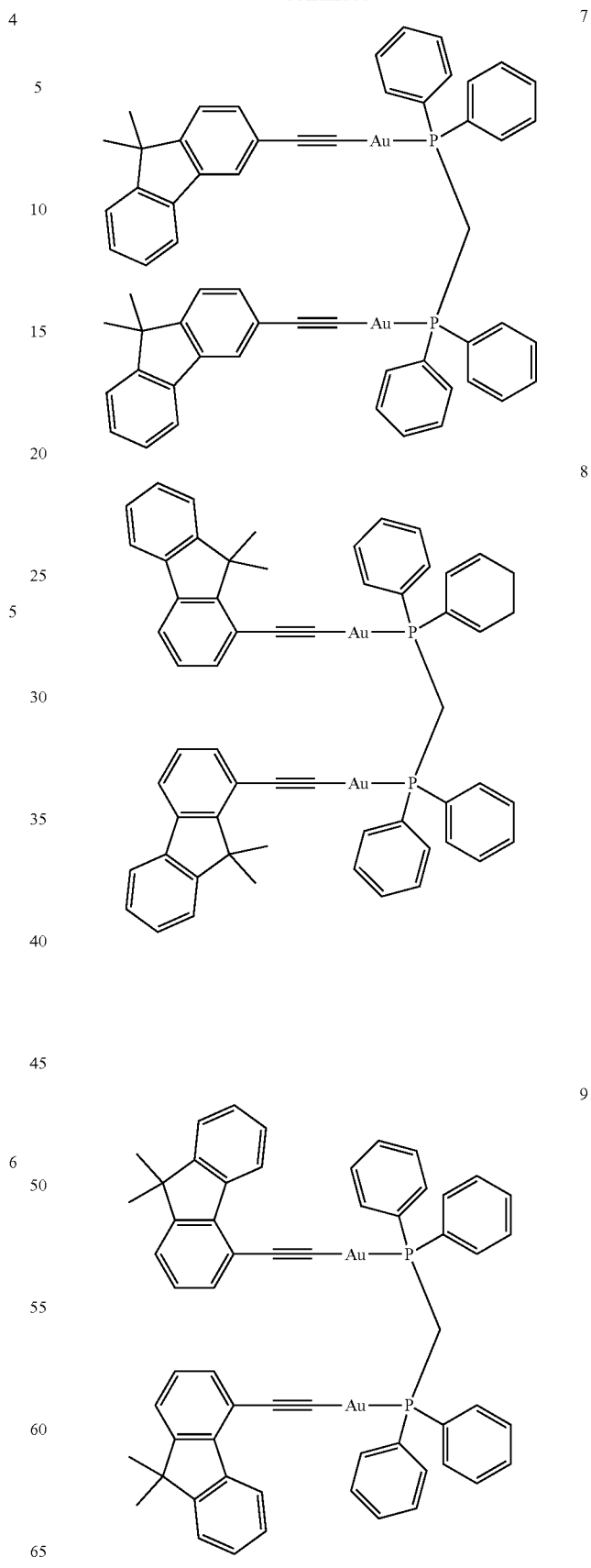

10
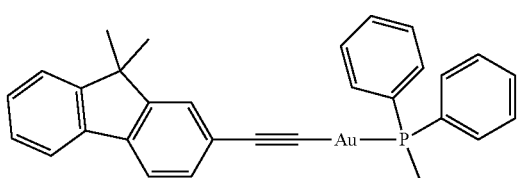
11
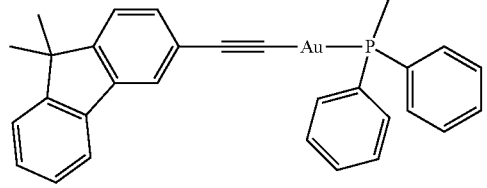
12
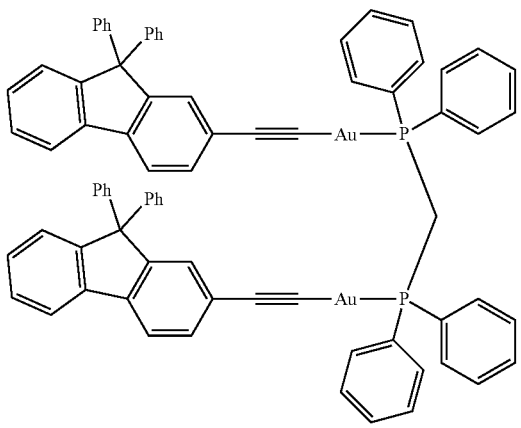
13
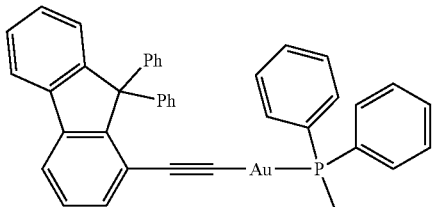
14
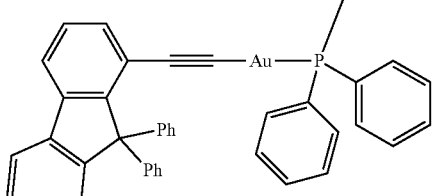
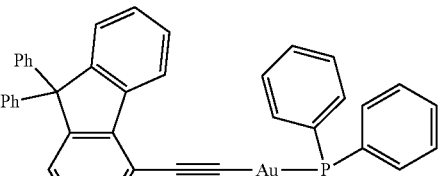
15
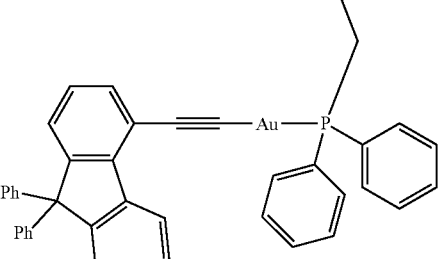

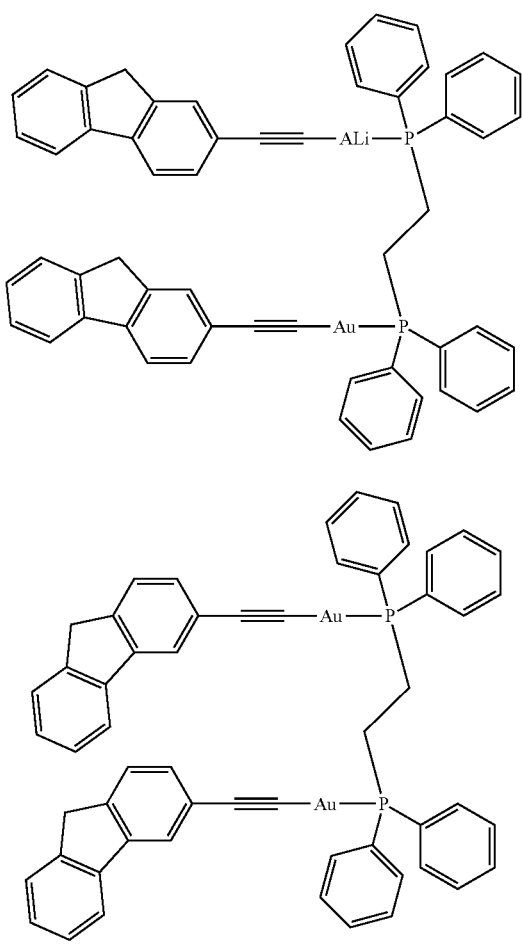
16
17
18
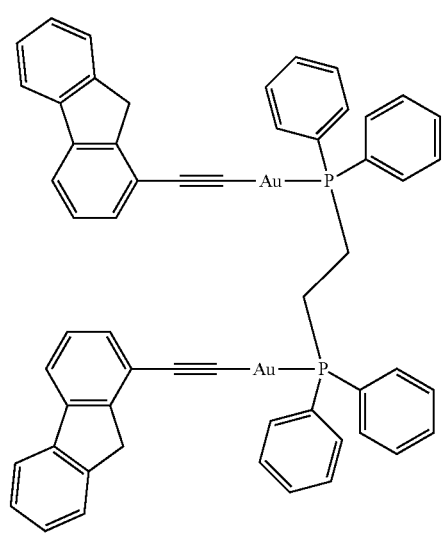
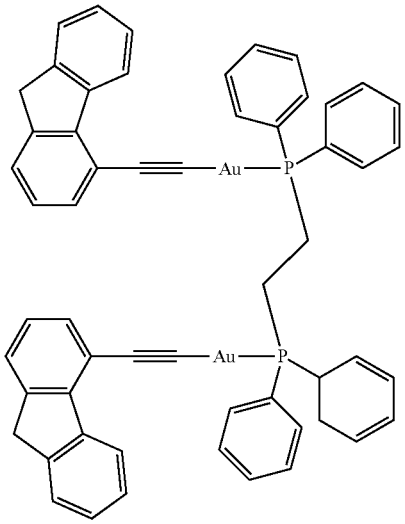
19
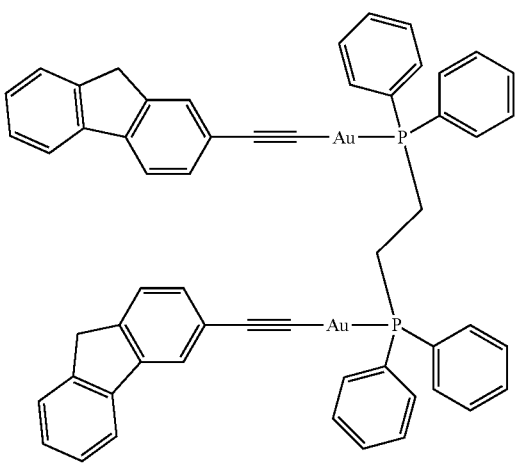
20
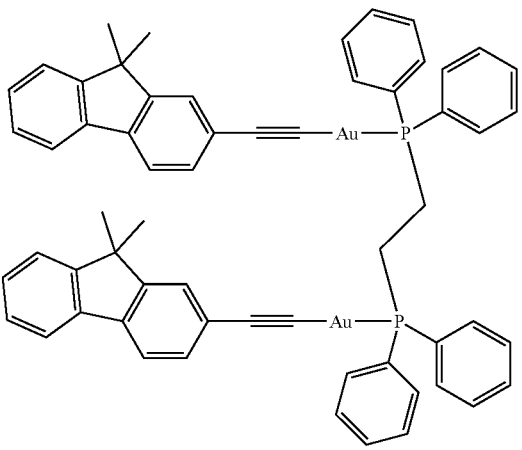
21

22
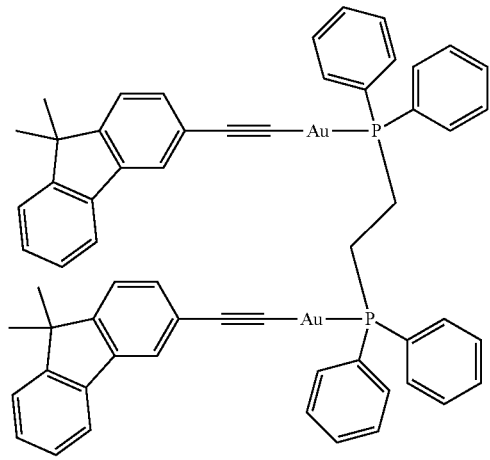
23
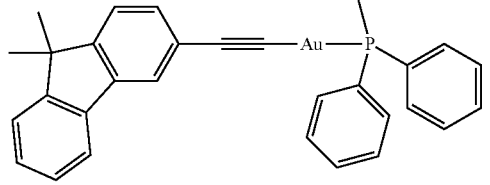
24
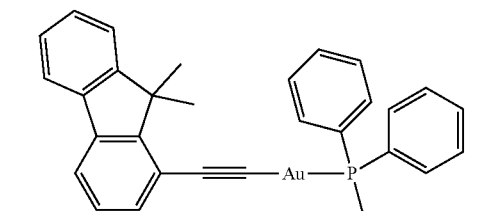
25
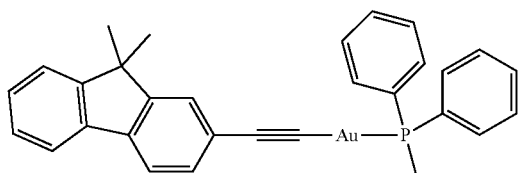
26
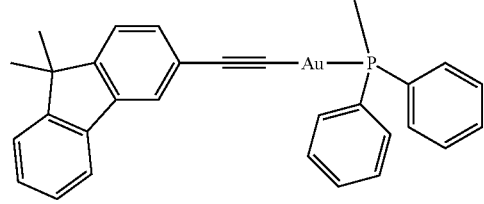
27
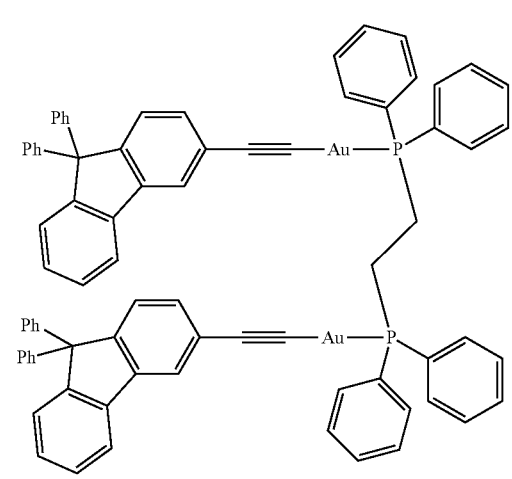

28
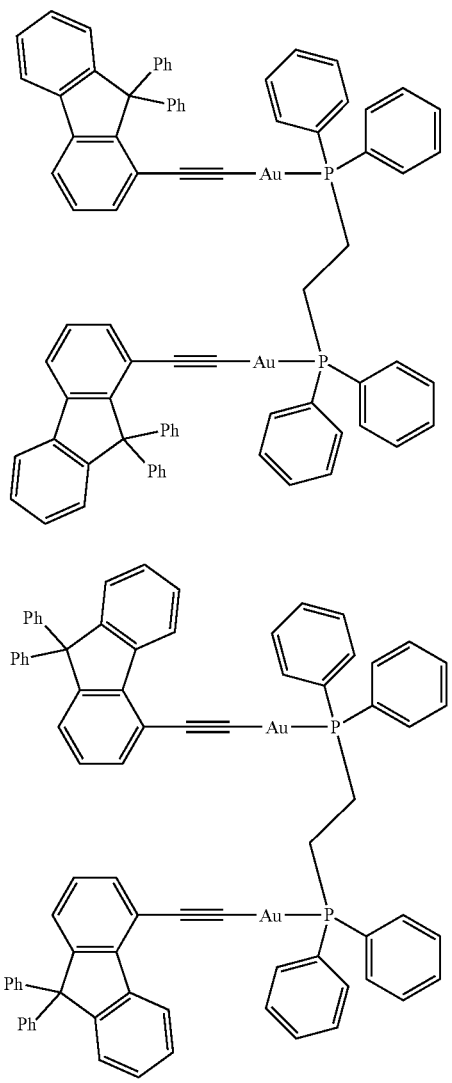
29
30
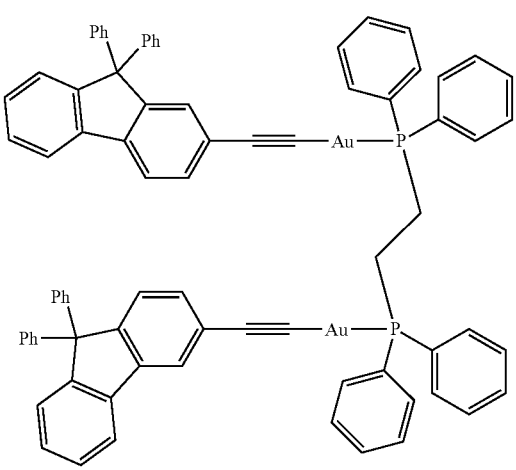
31
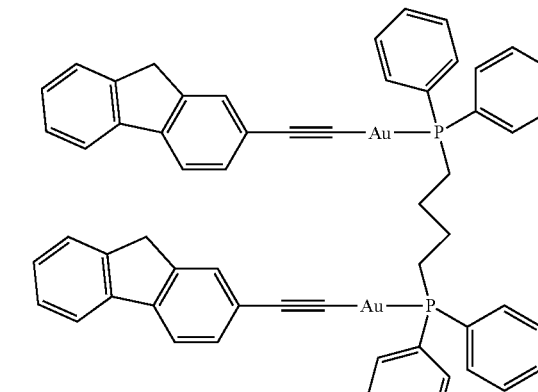
32
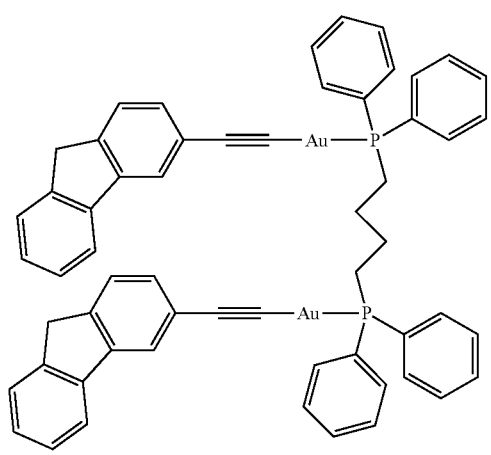
33
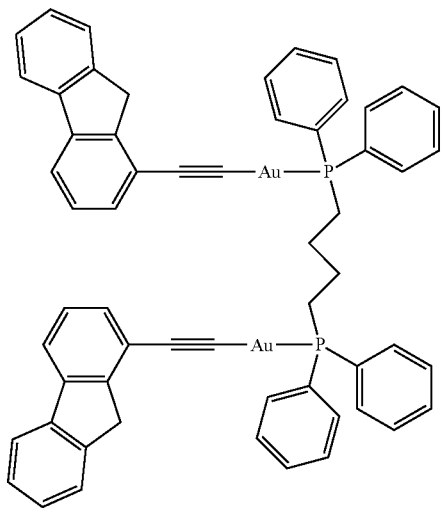

34
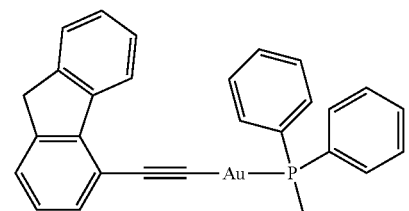
35
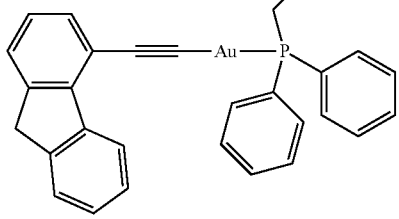
36
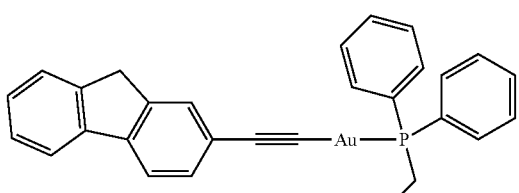
37
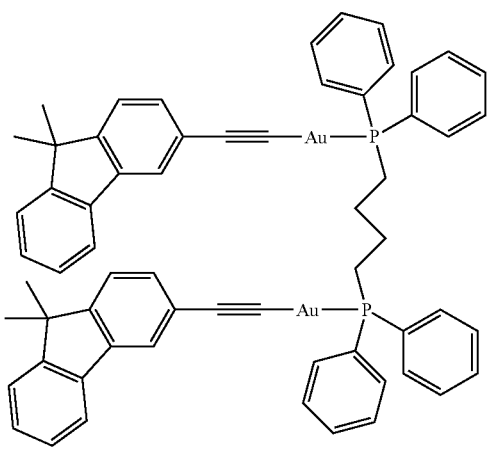
38
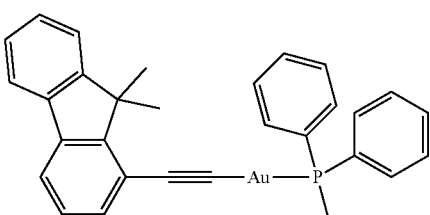
39
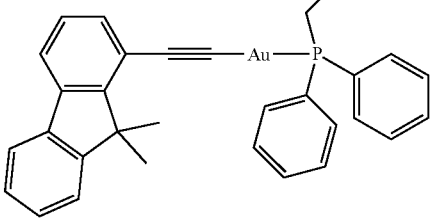

40
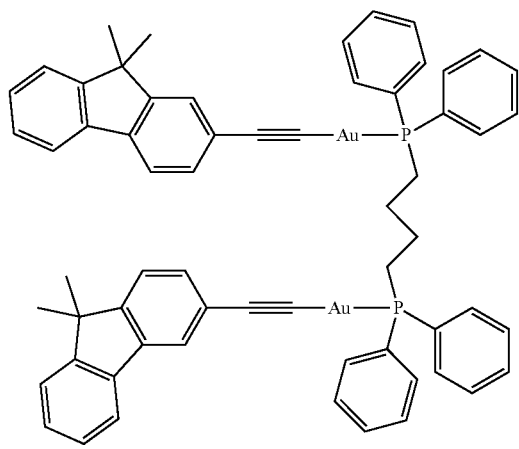
41
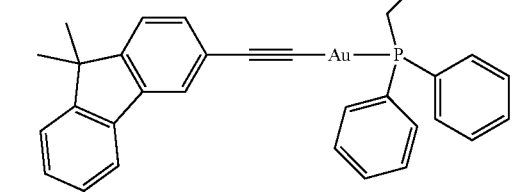
42
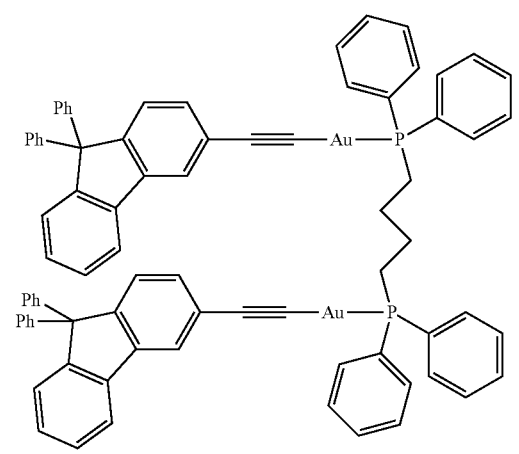
43
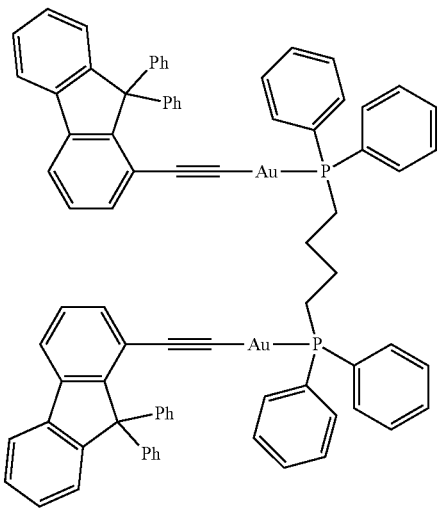
44
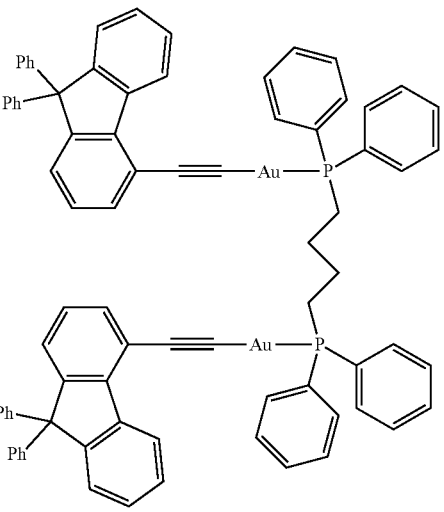
45
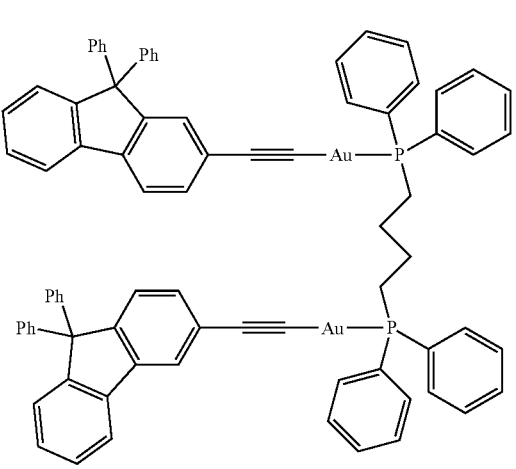

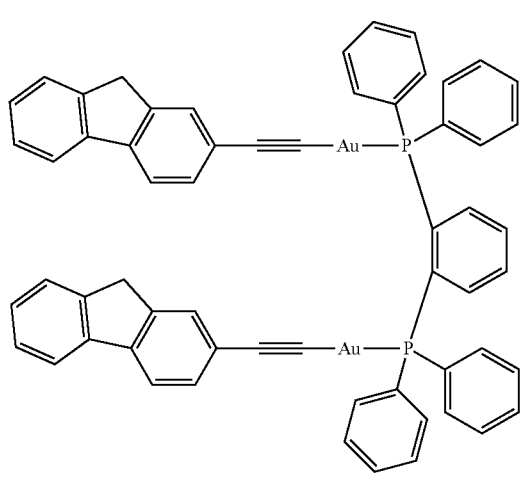
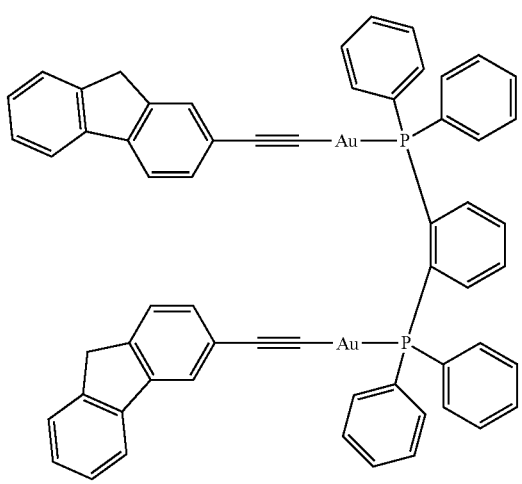
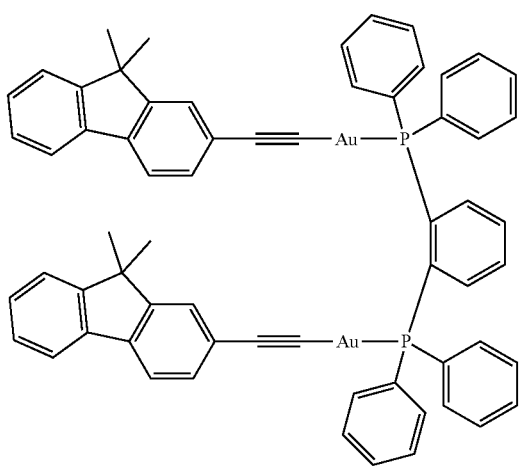
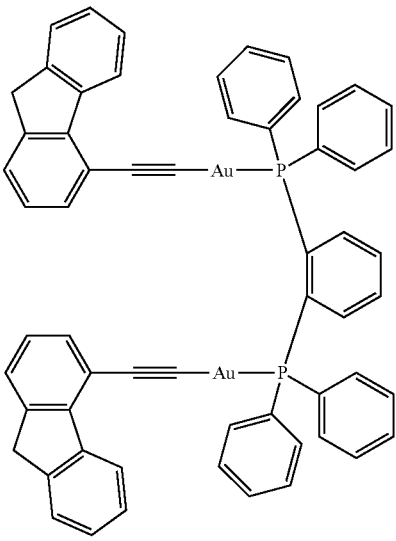

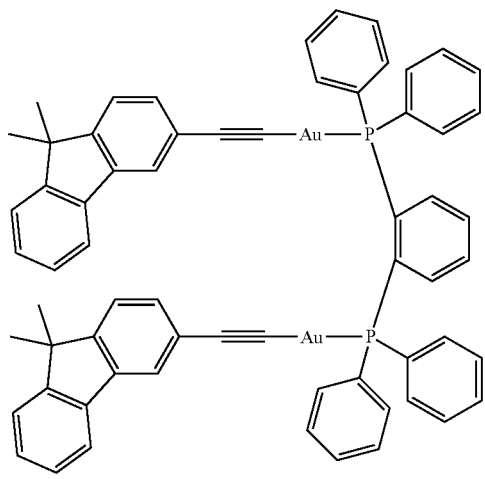
52
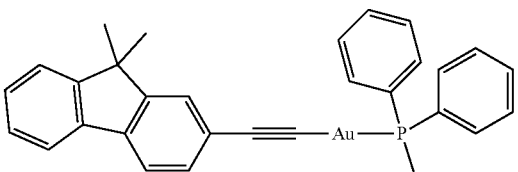
55
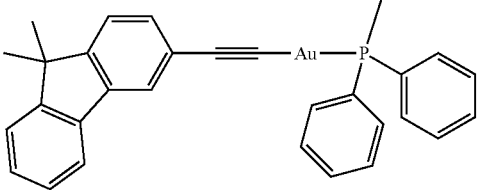
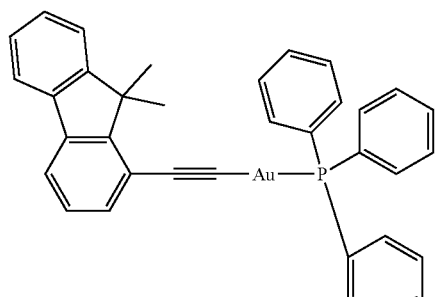
53
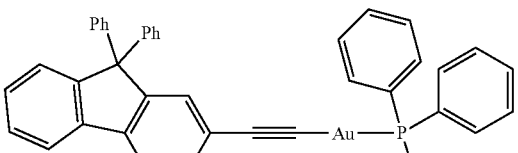
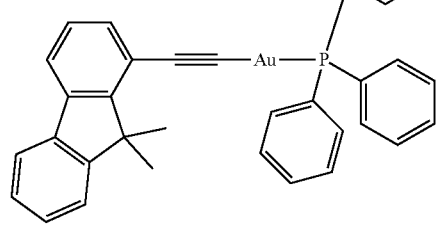
54
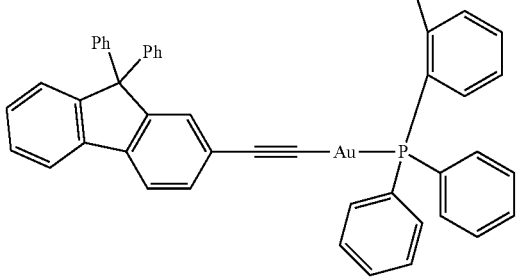
56
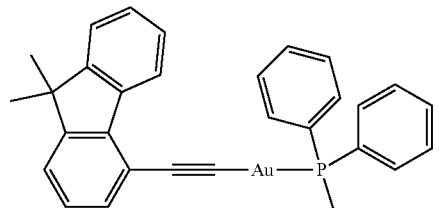
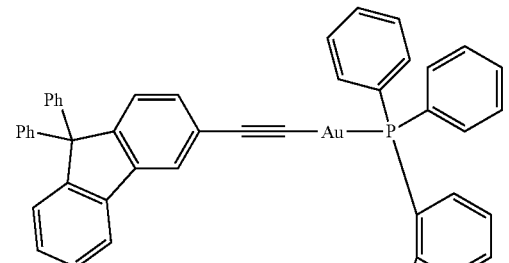
57
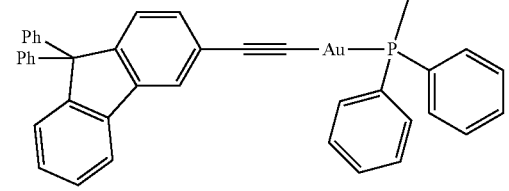

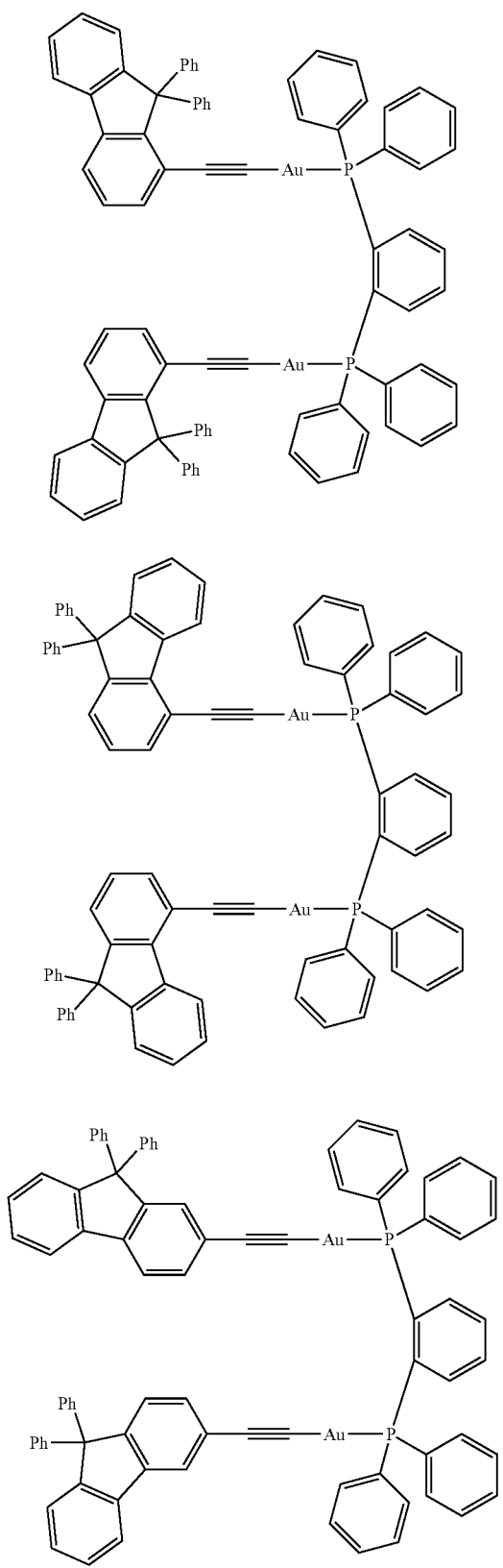
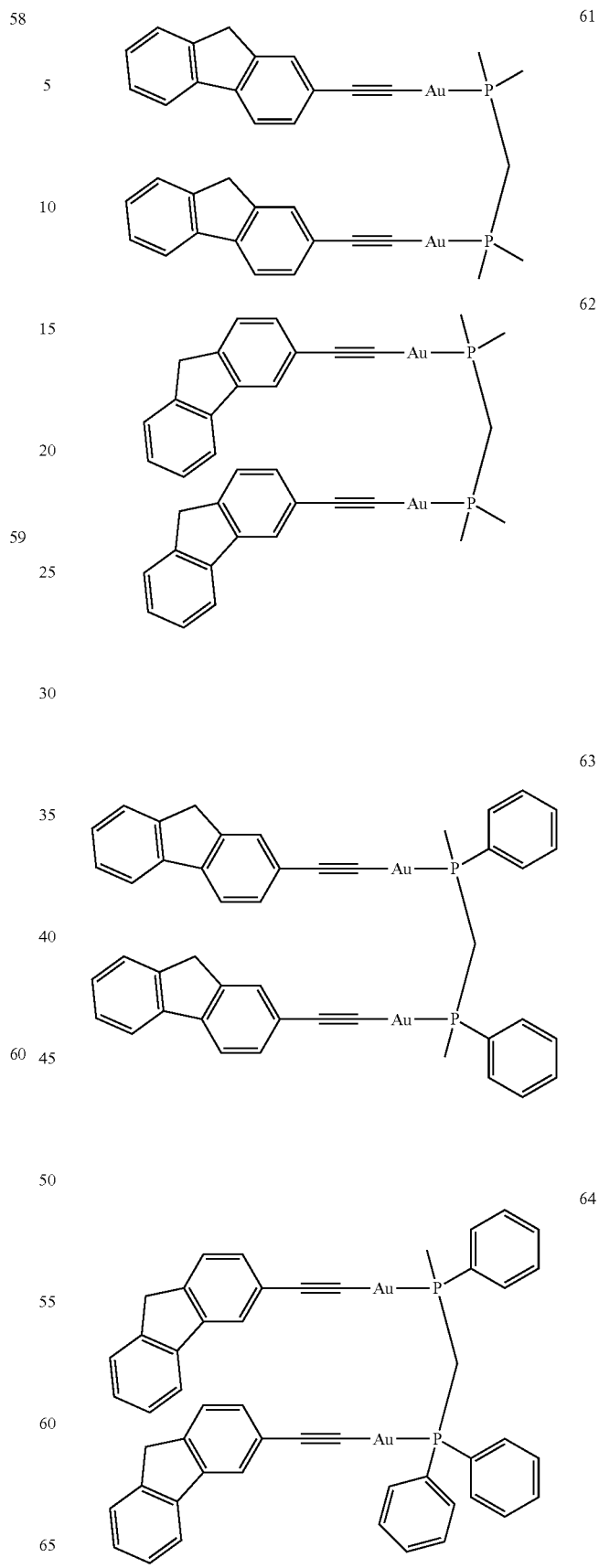

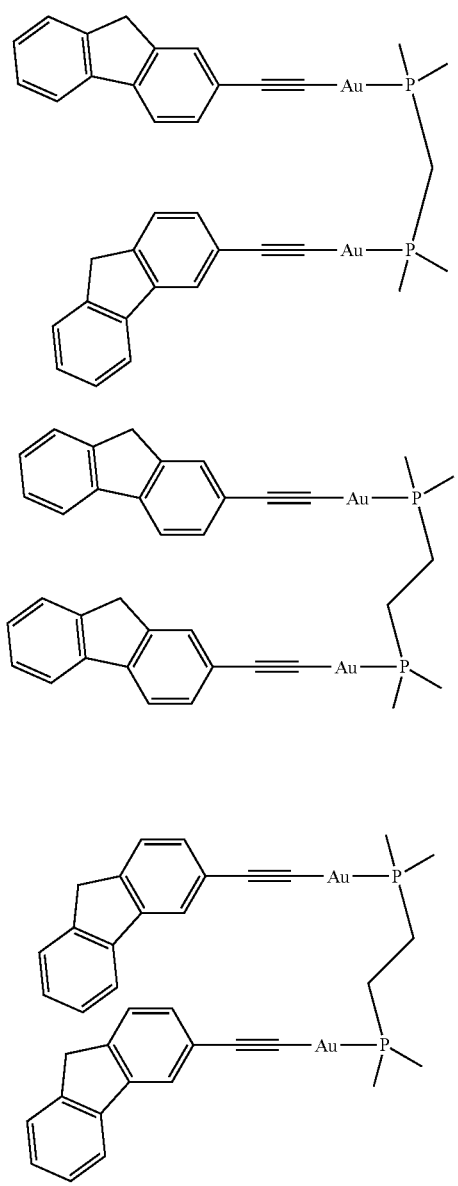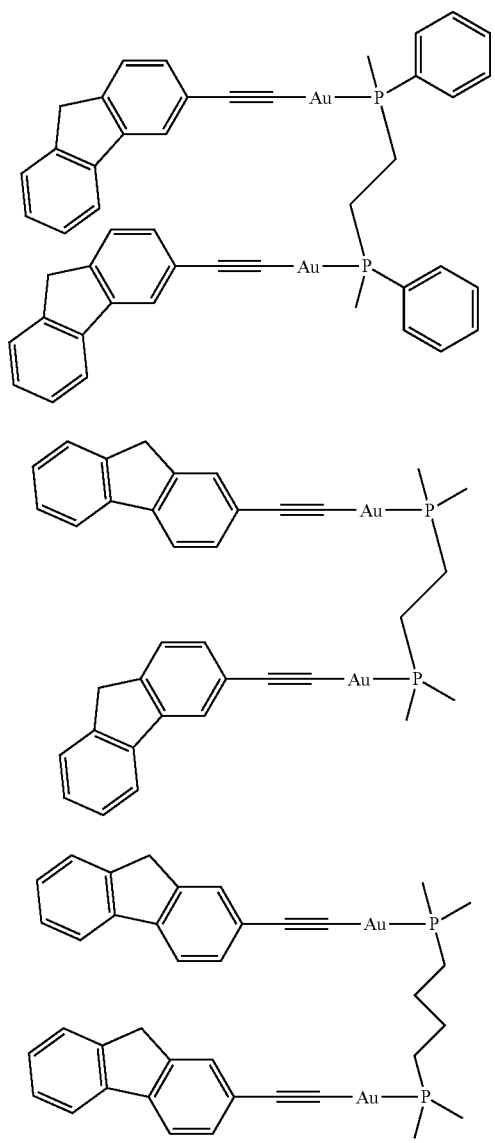

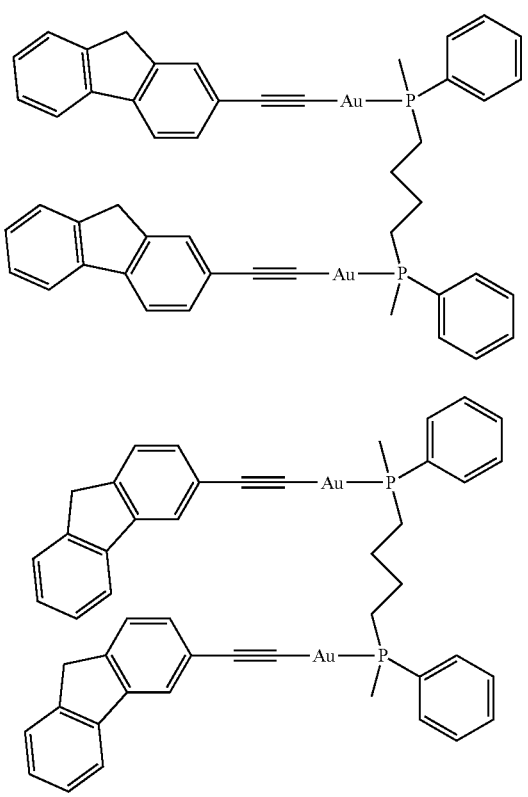
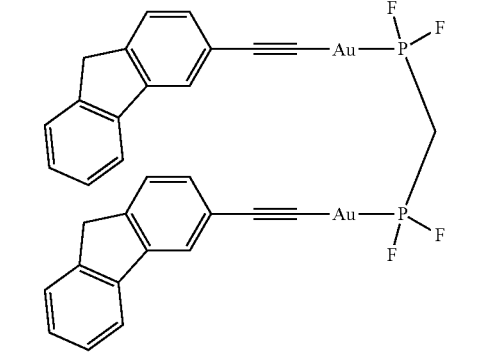
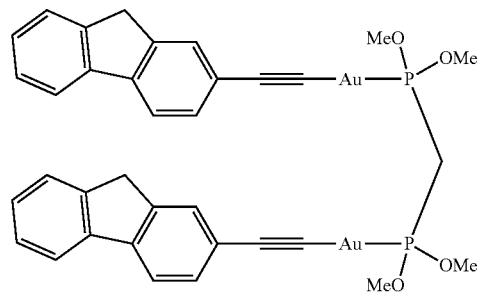

73
-continued
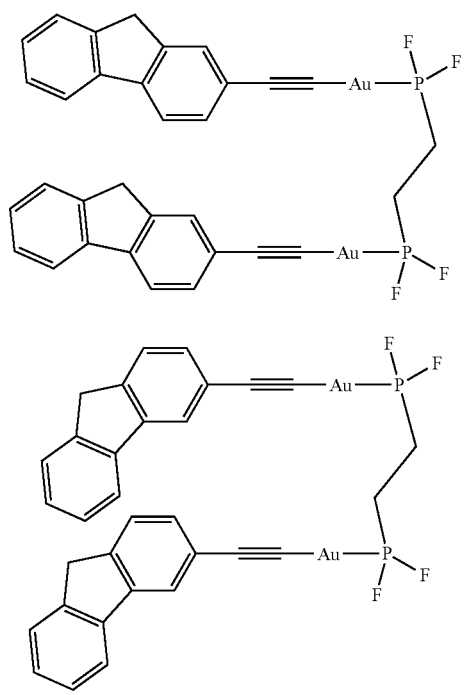
81
82
83
84
74
-continued
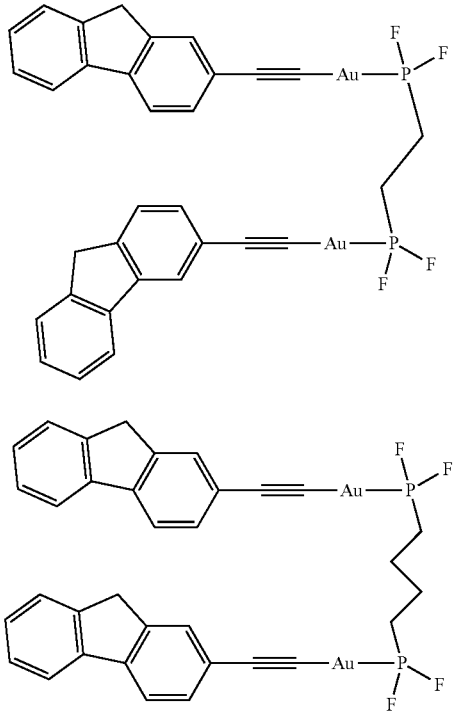
85
86
87
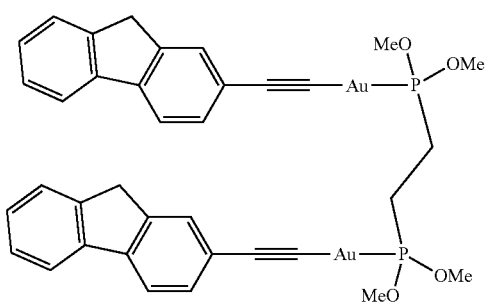
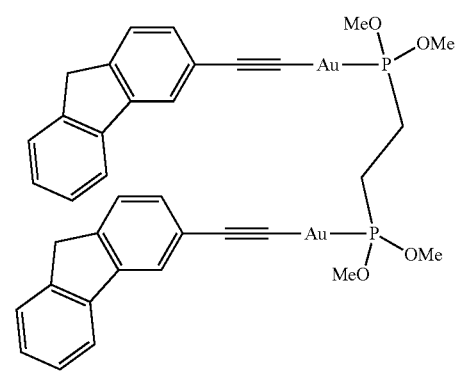
88

89
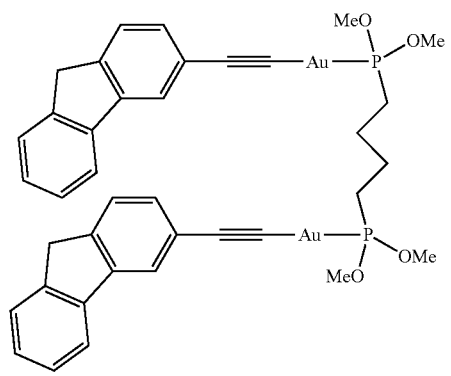
90
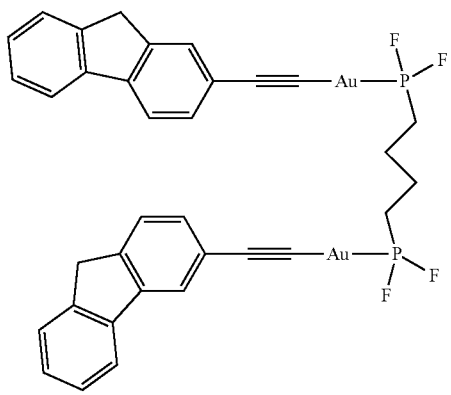
91
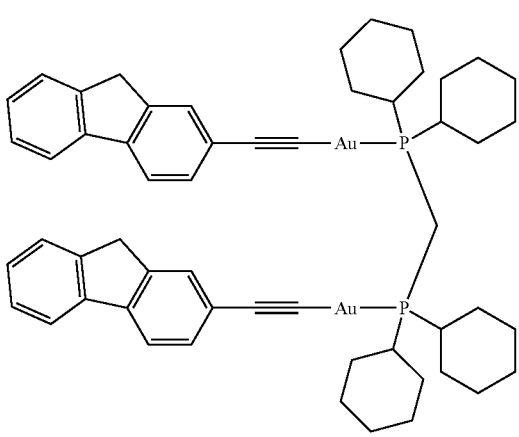
92
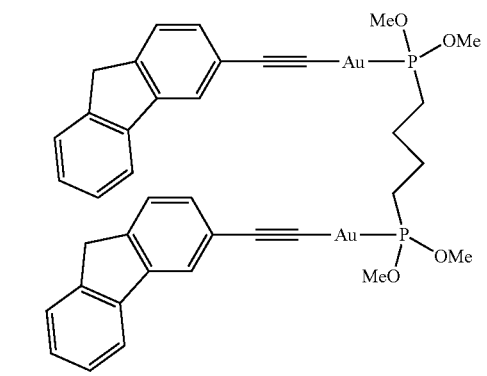
93
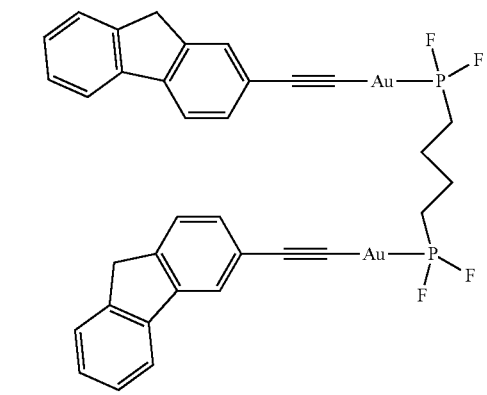
94
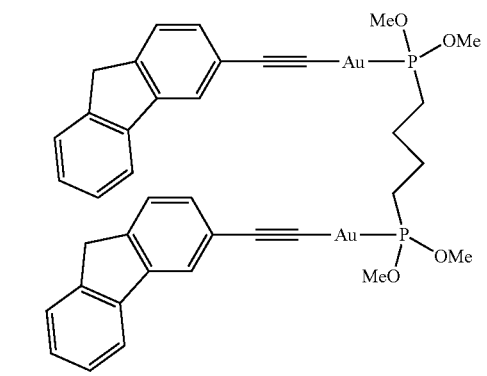
95
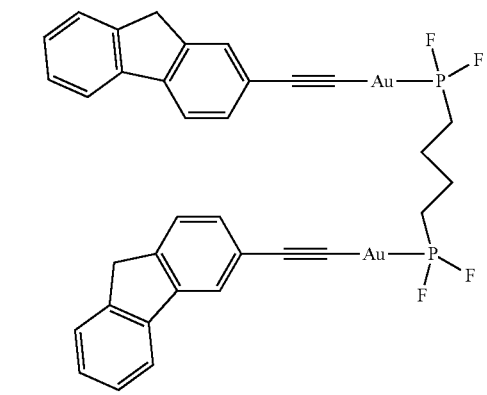

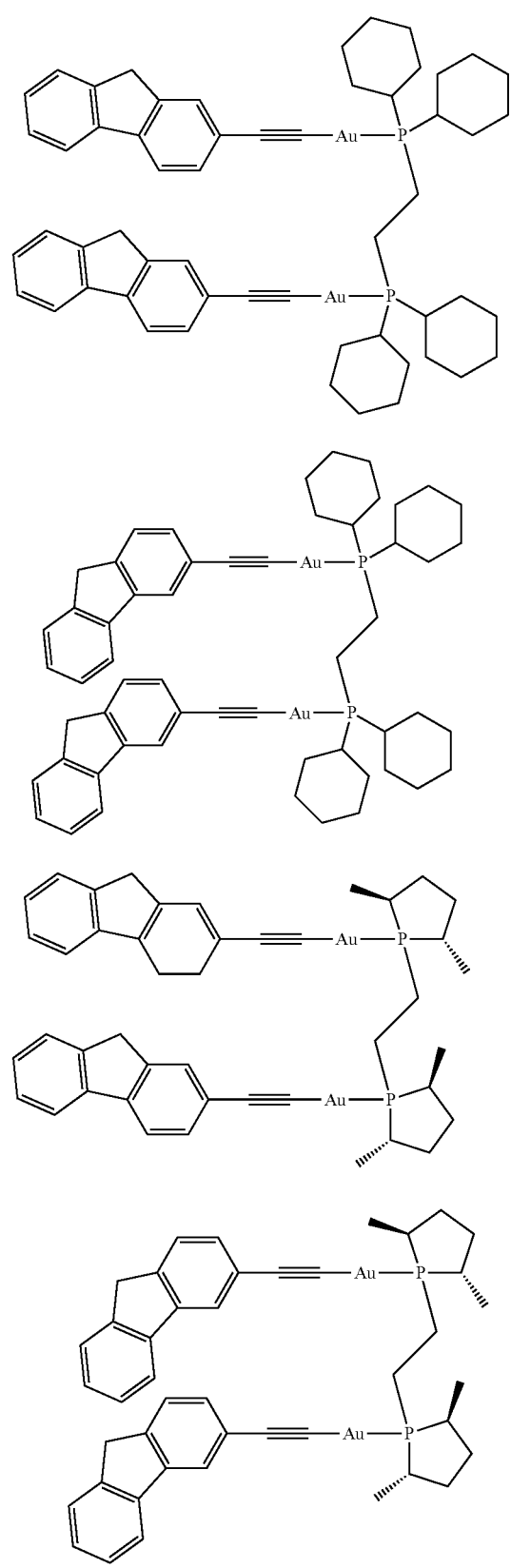
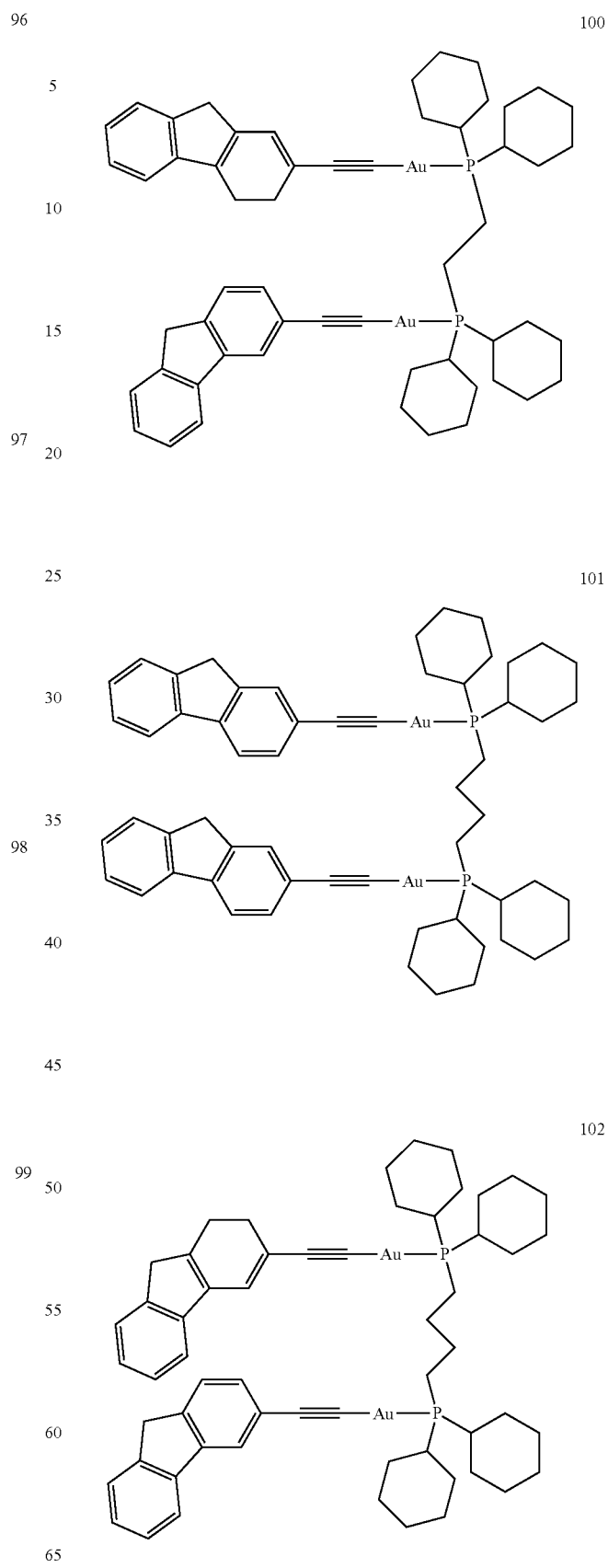

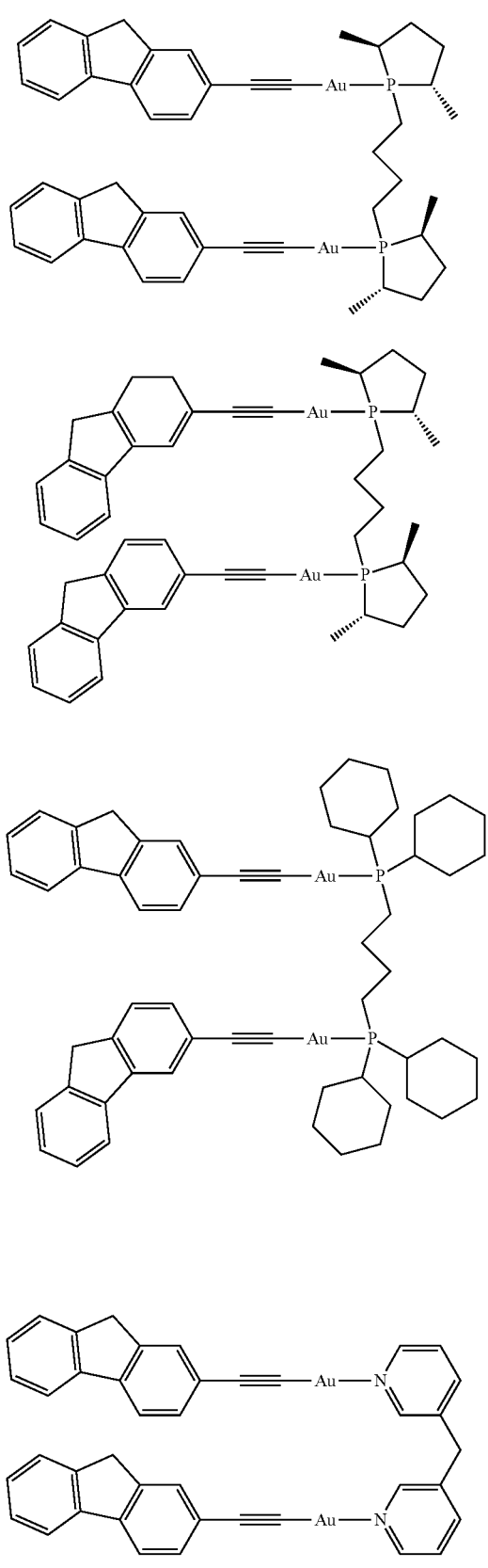
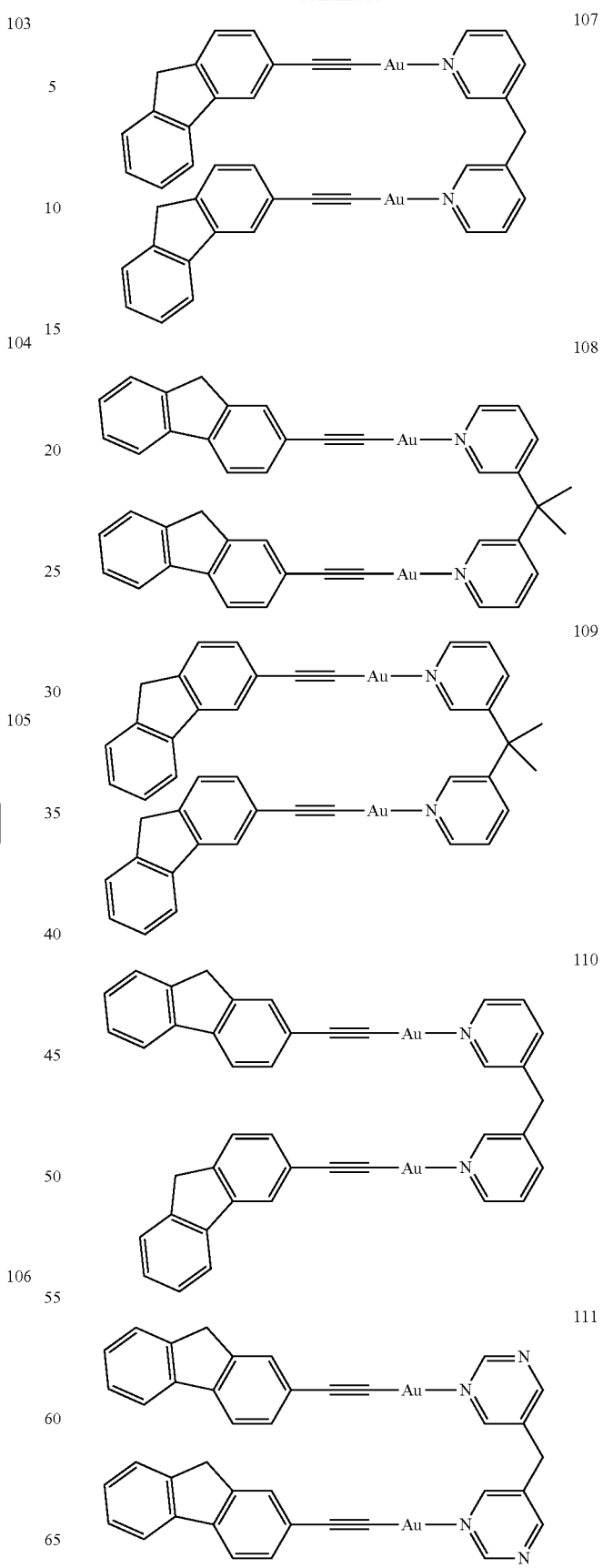

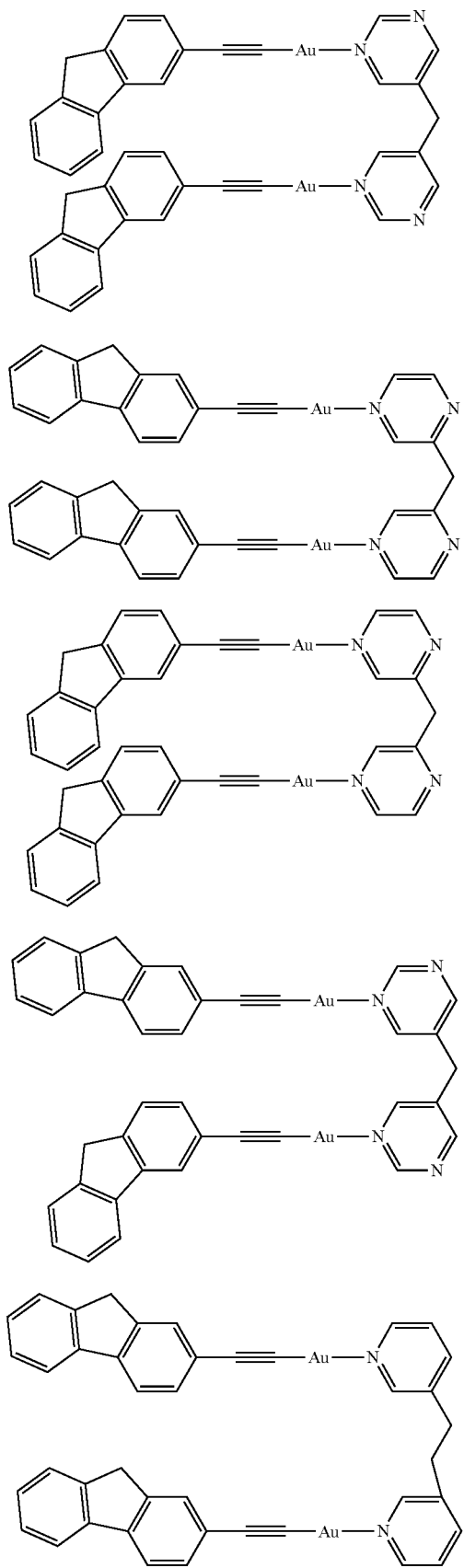
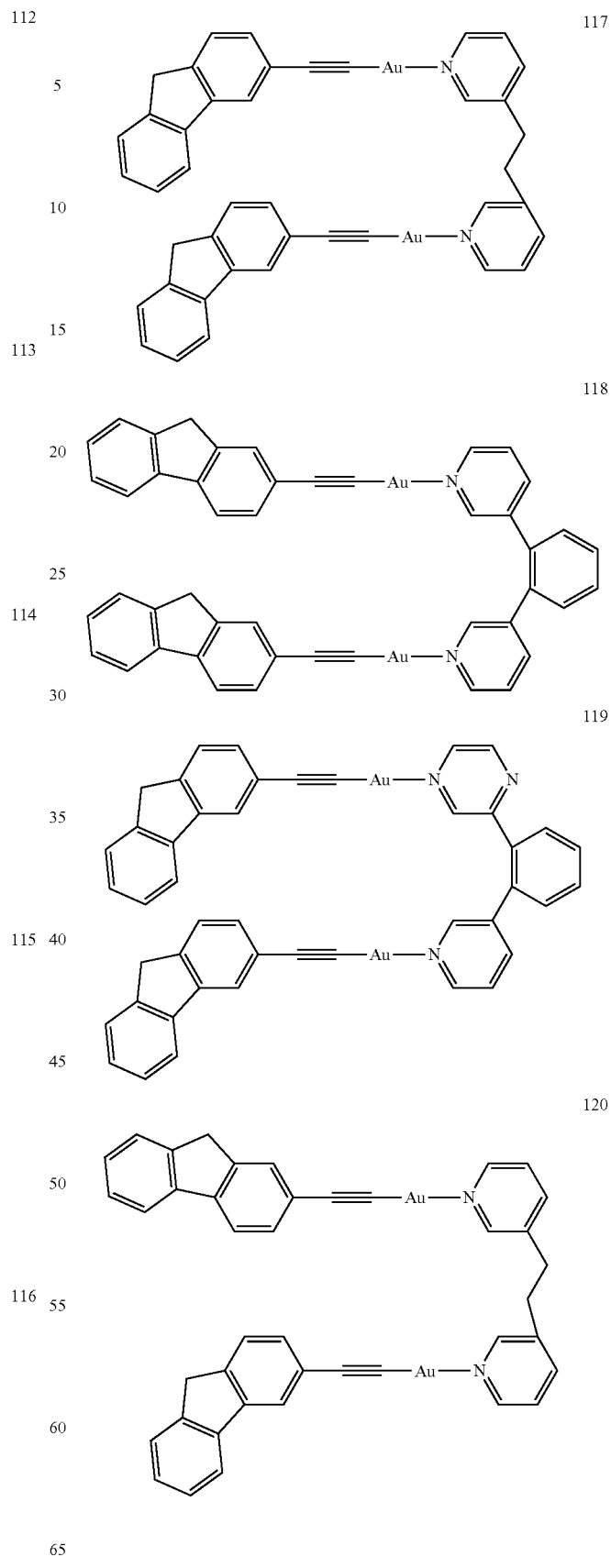

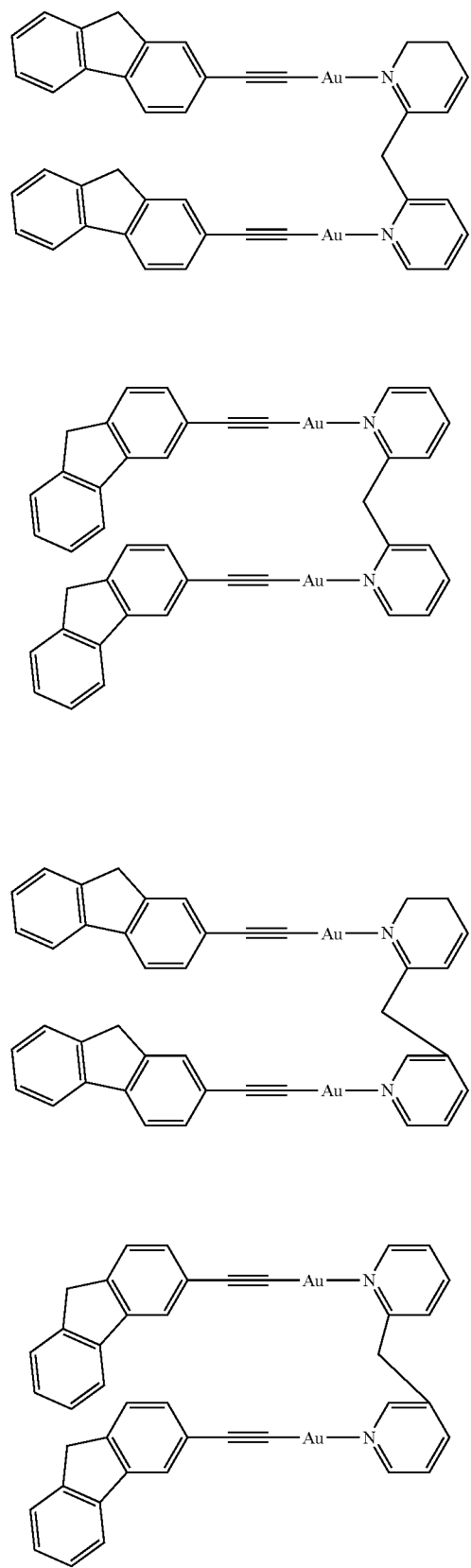
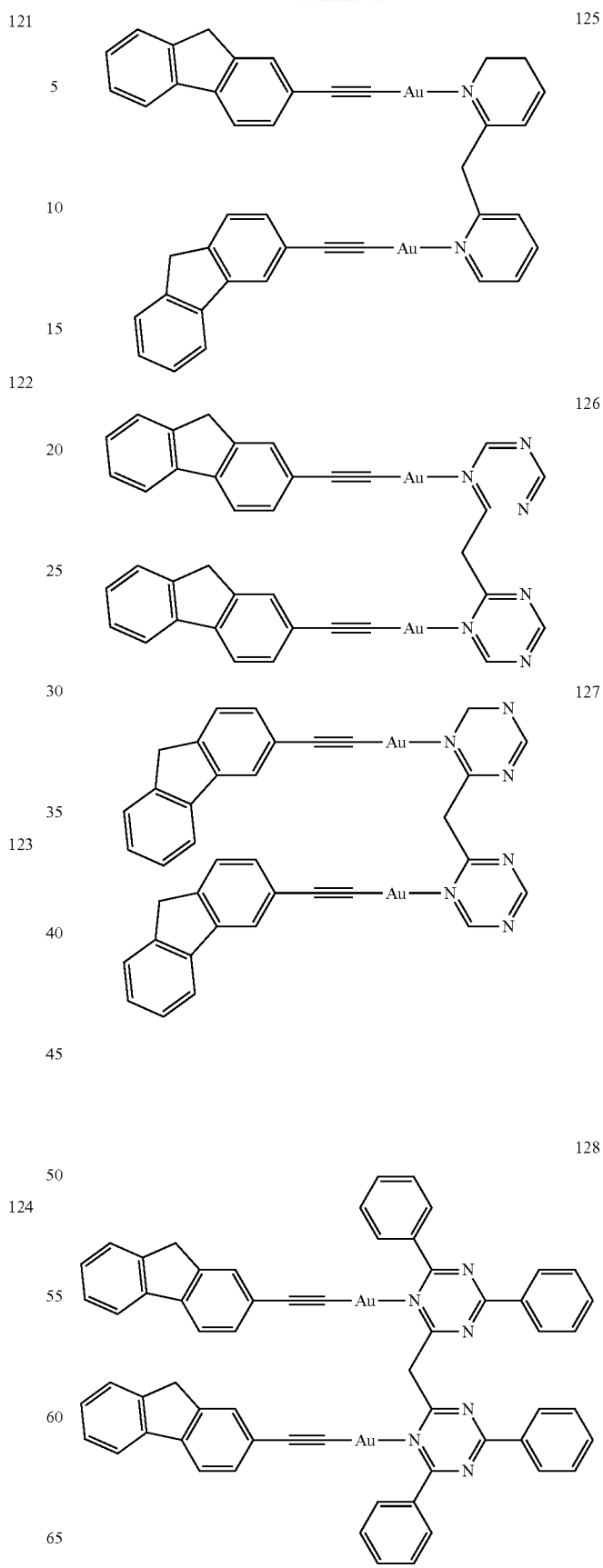

-continued
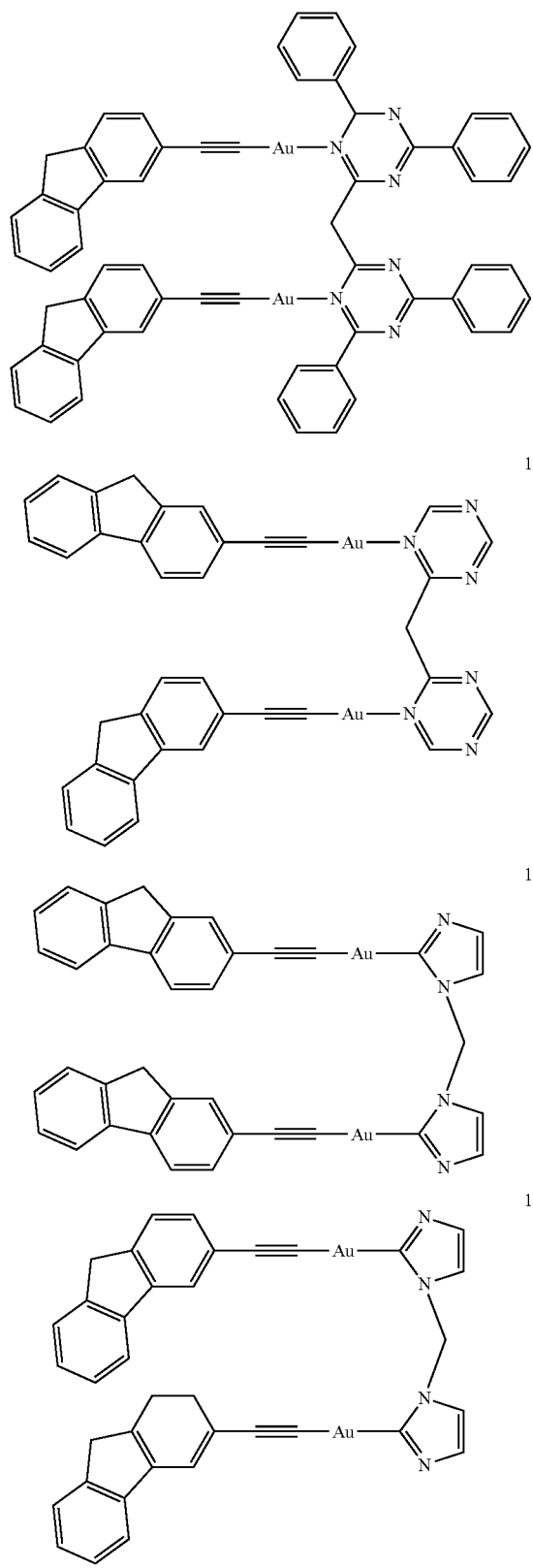
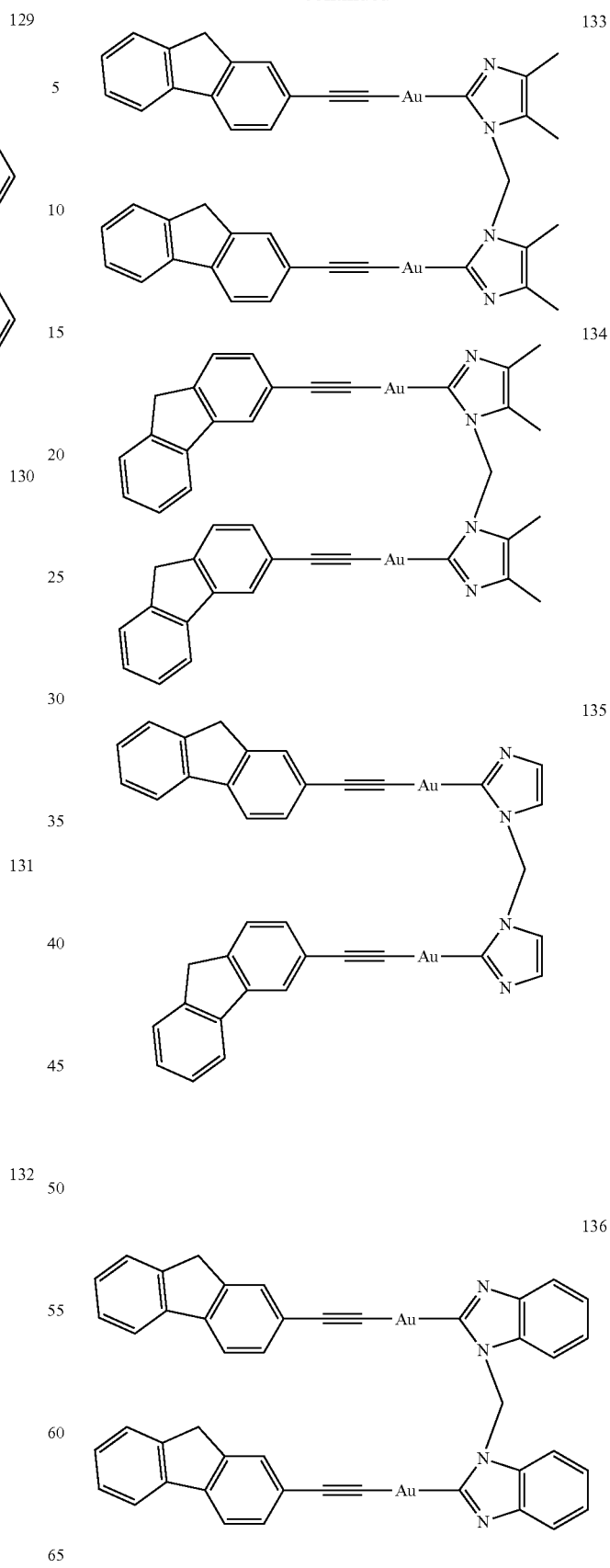

137
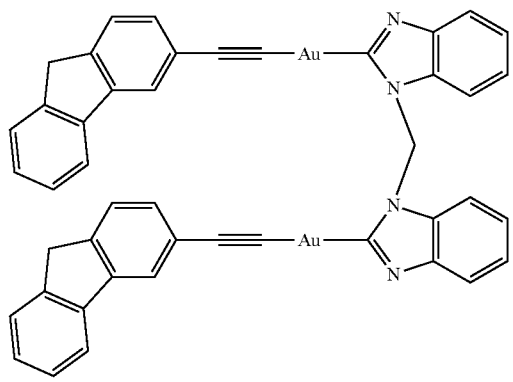
138
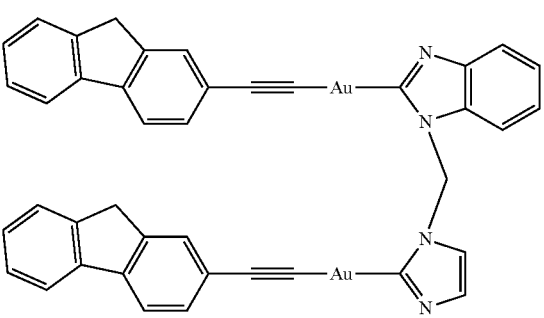
139
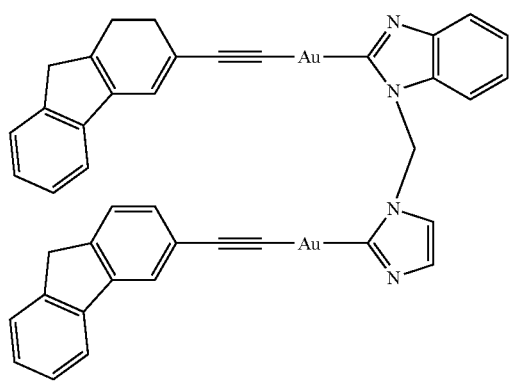
140
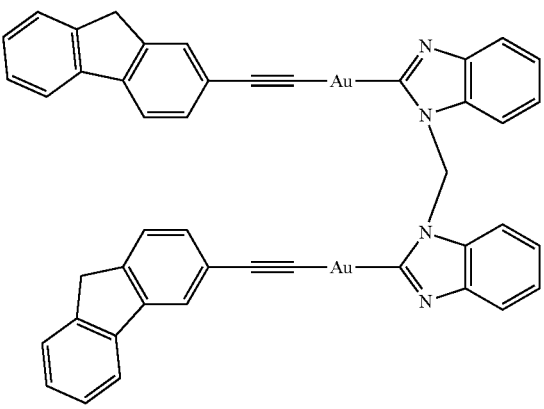
141
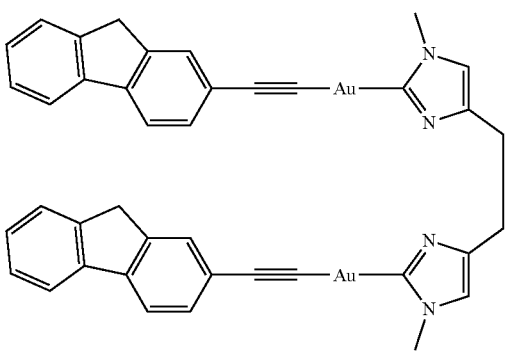
142
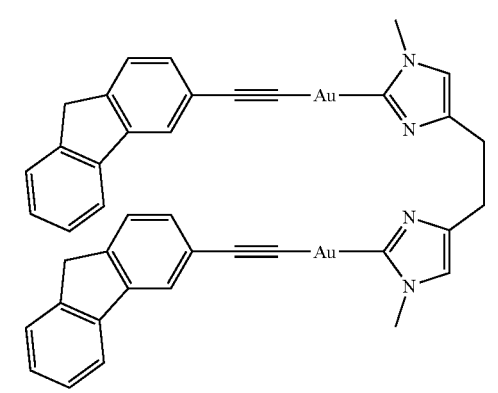
143
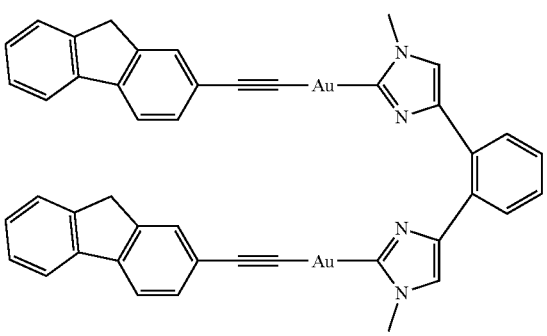
144
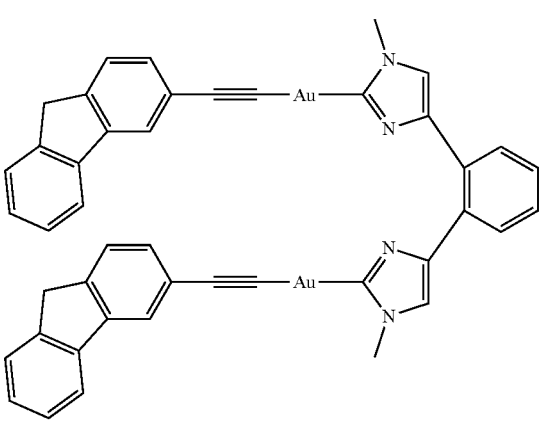

145
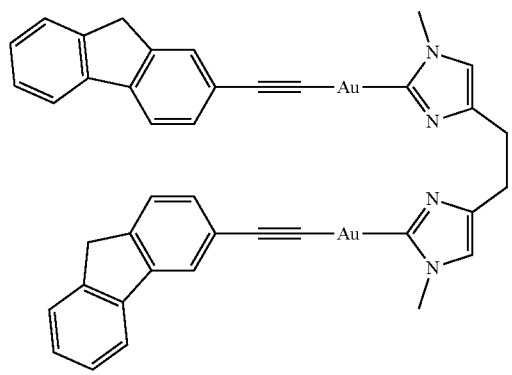
146
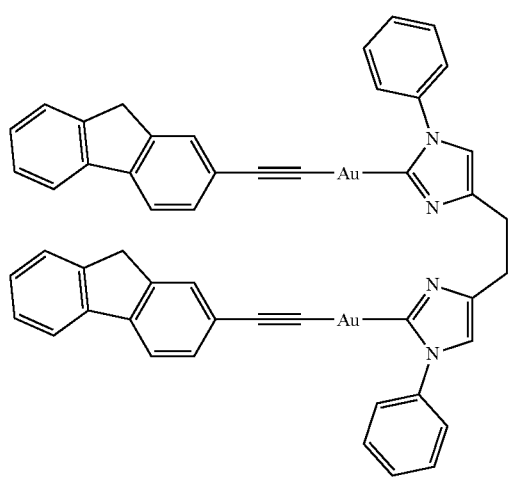
147
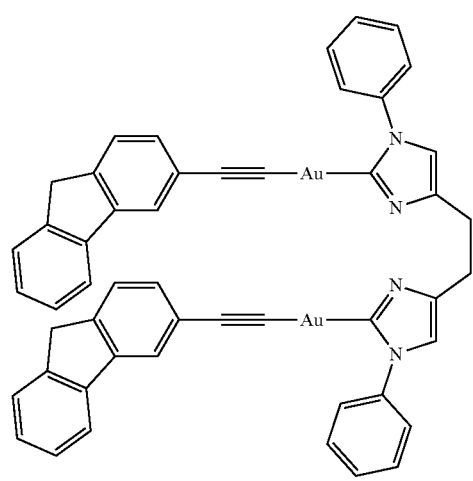
148
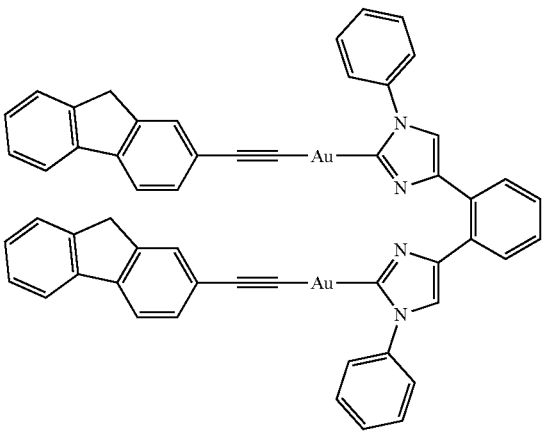
149
150

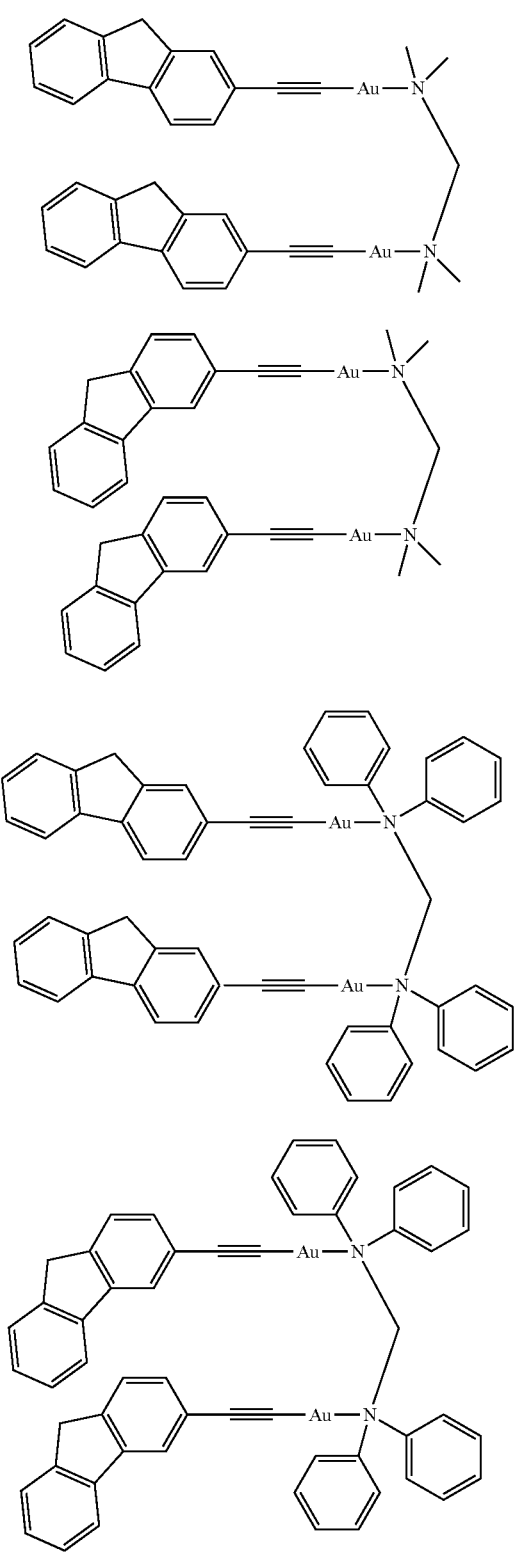
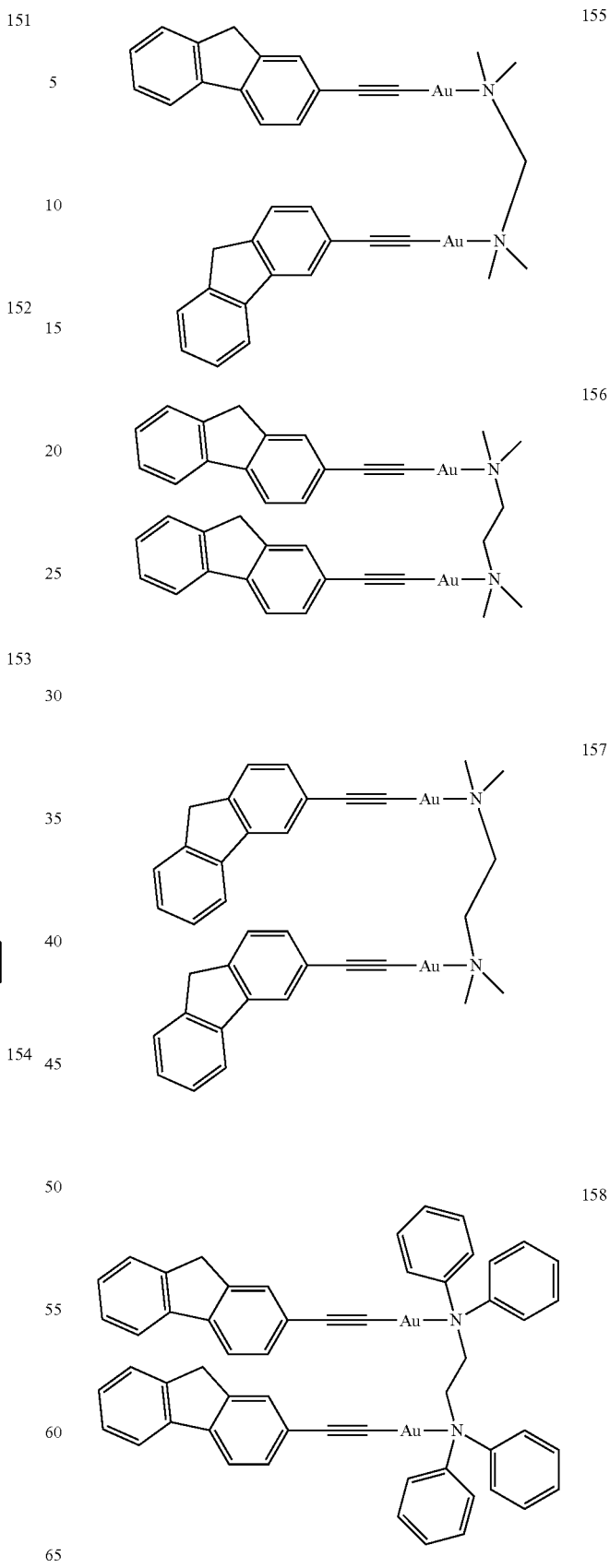

159
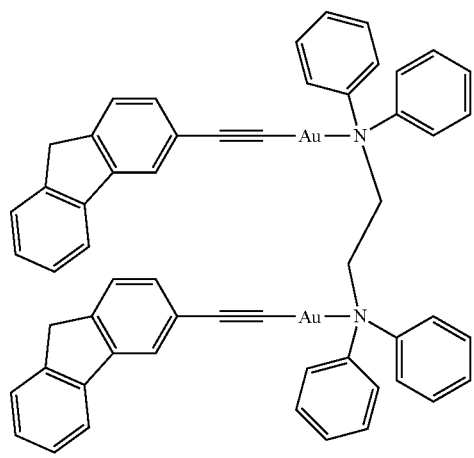
160
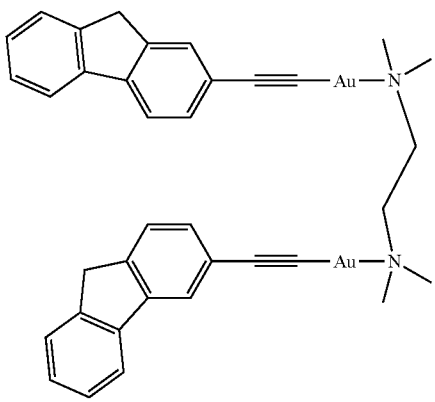
161
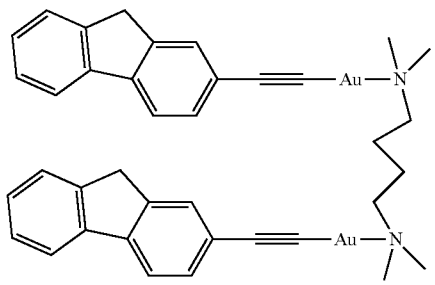
162
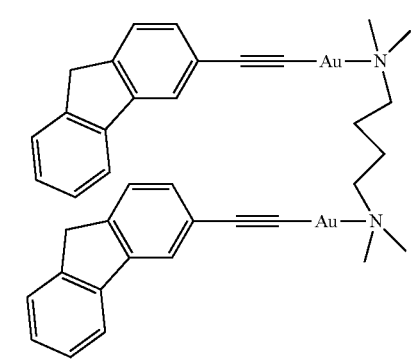
163
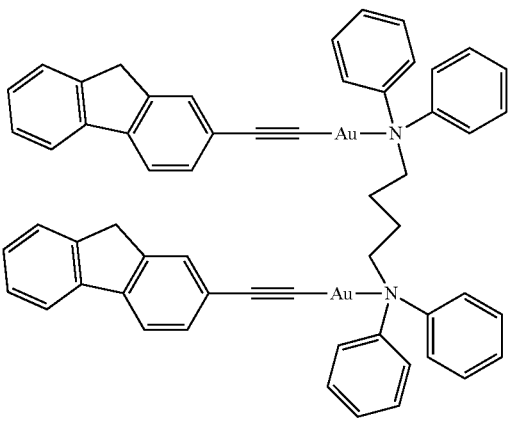
164
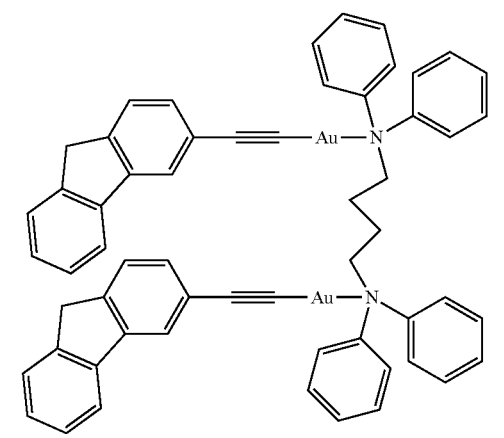
165
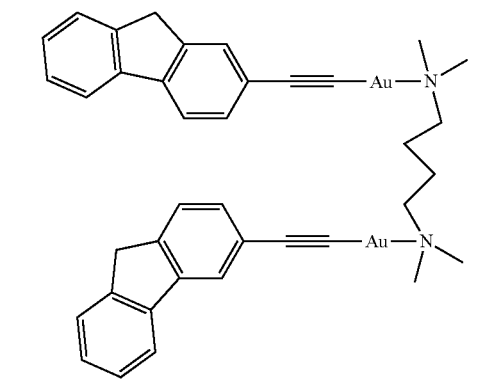
166
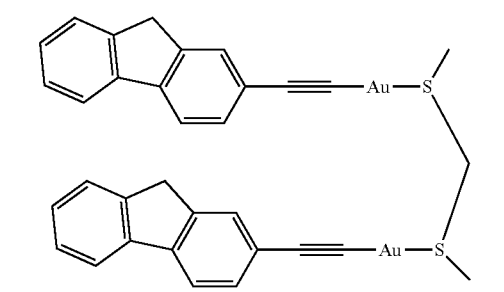

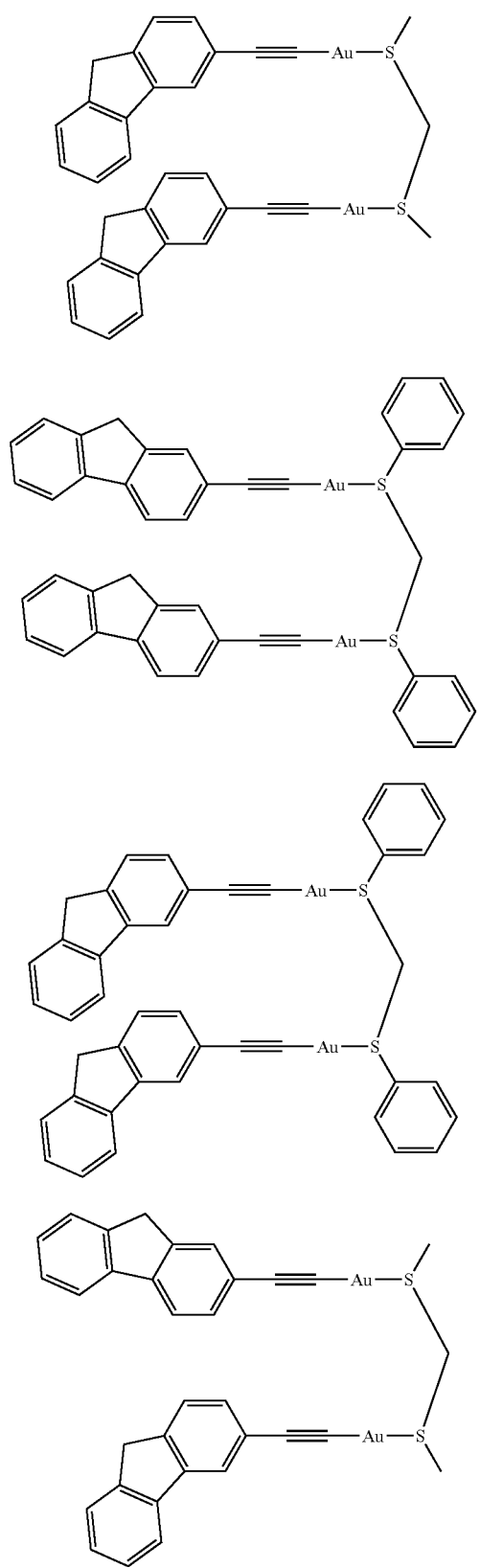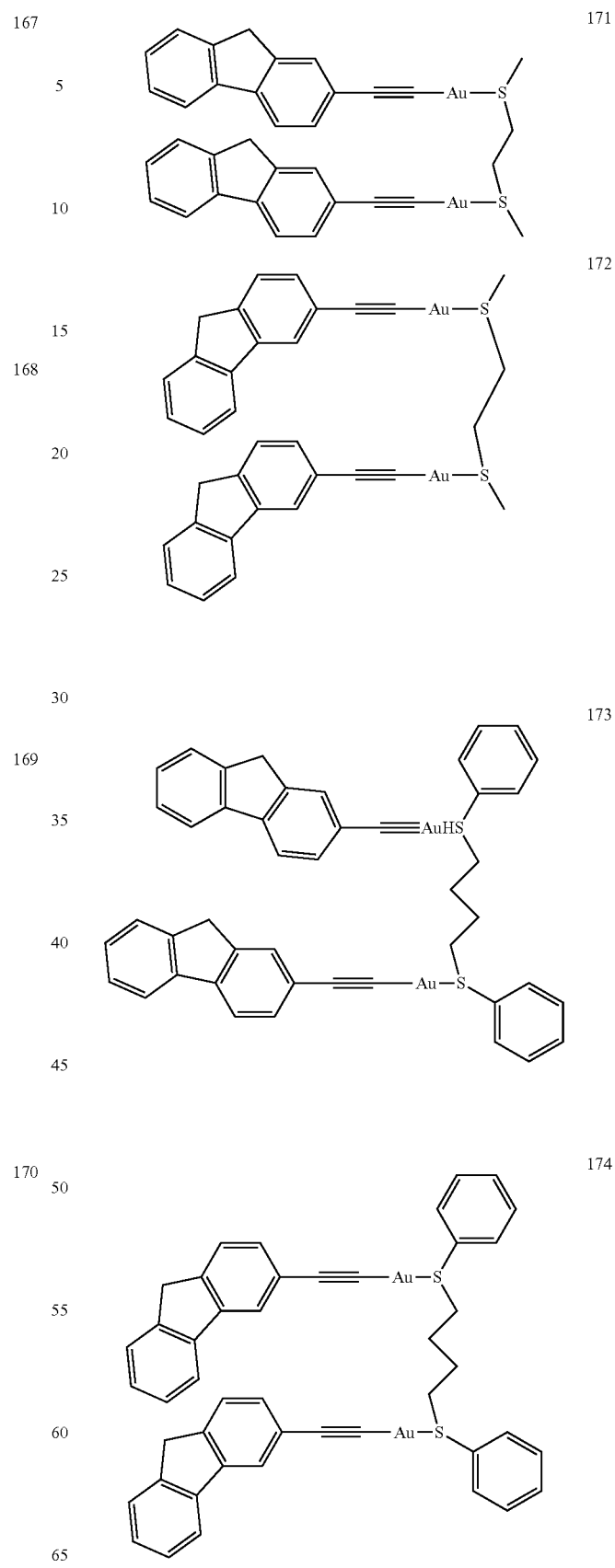

179
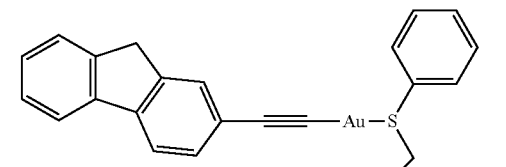
180
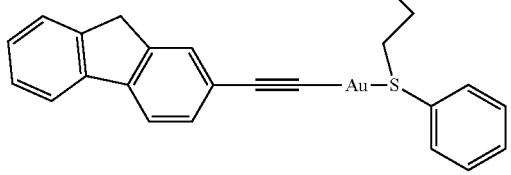
181
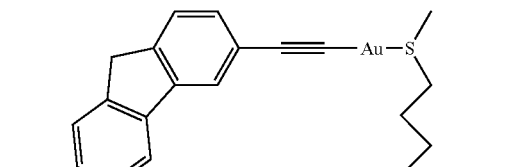
182
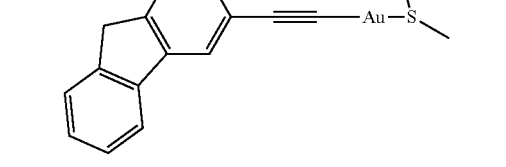
183
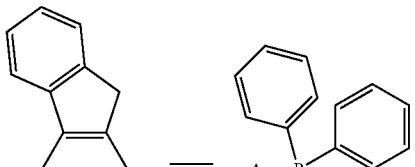
184
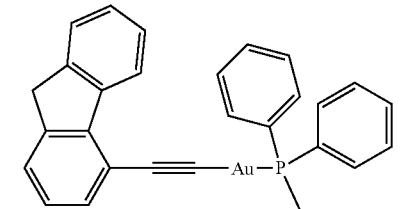
185
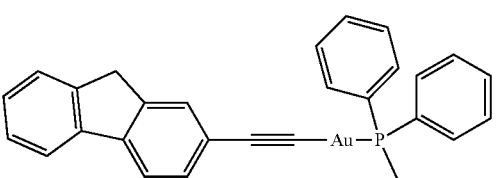

186
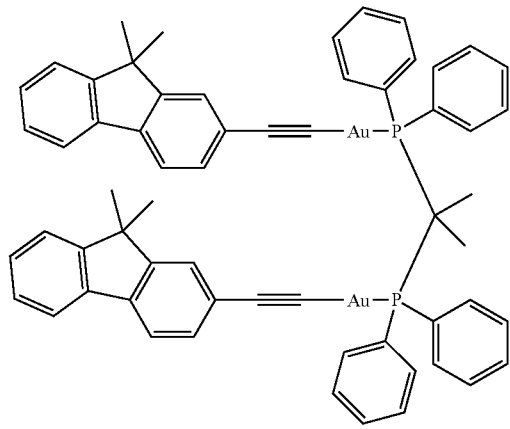
187
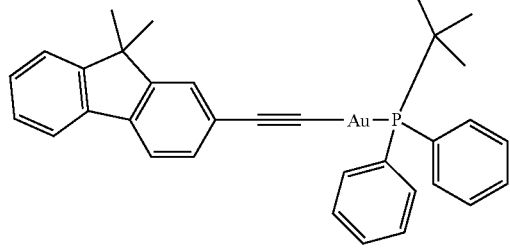
188
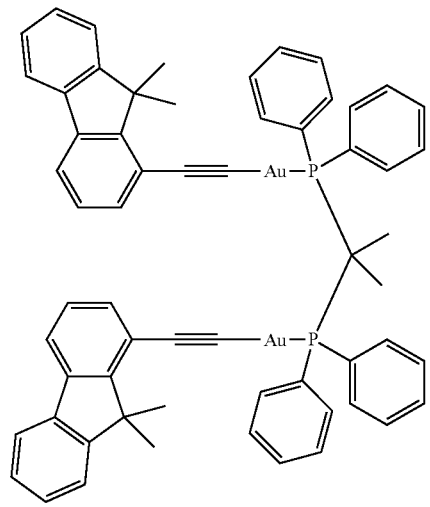
189
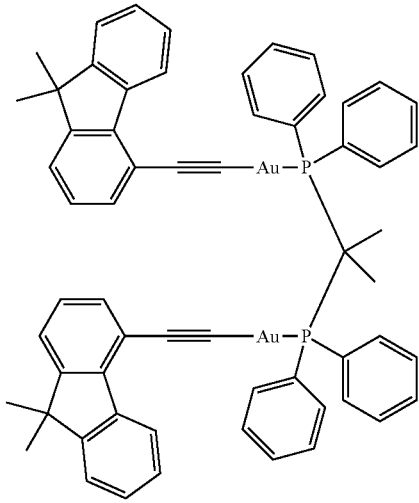
190
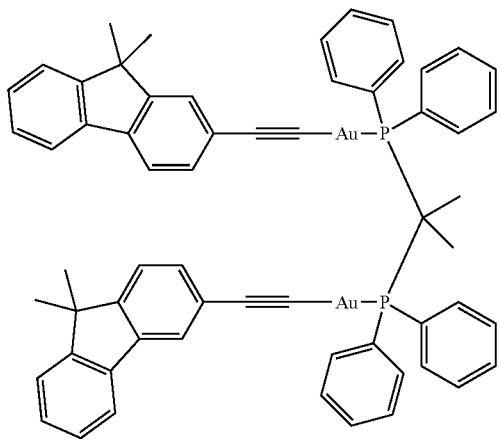
191
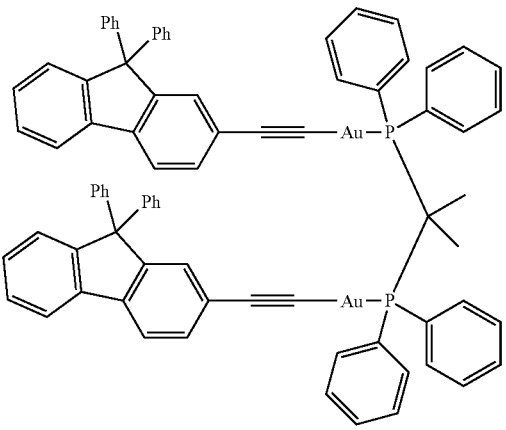

192
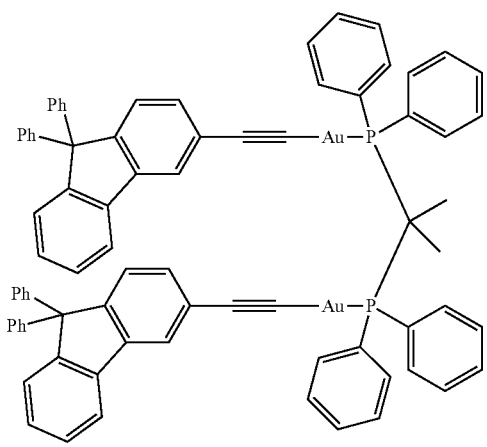
193
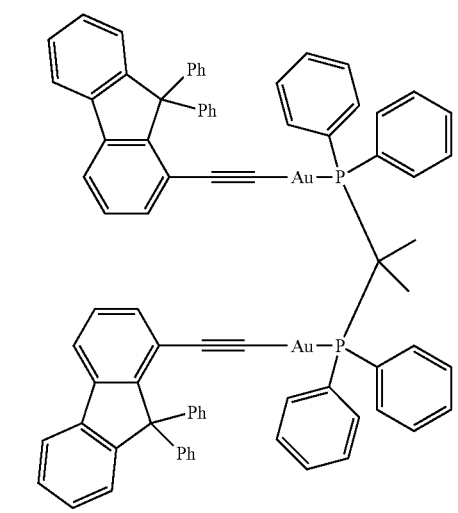
194
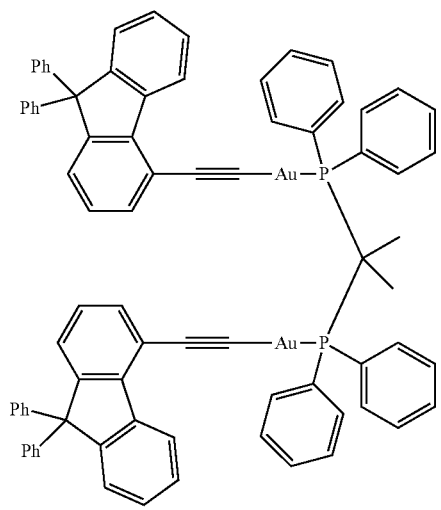
495
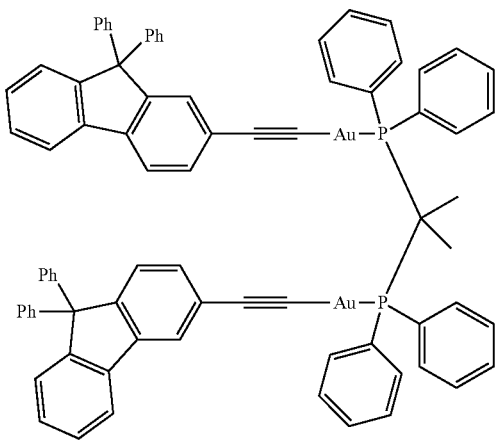
196
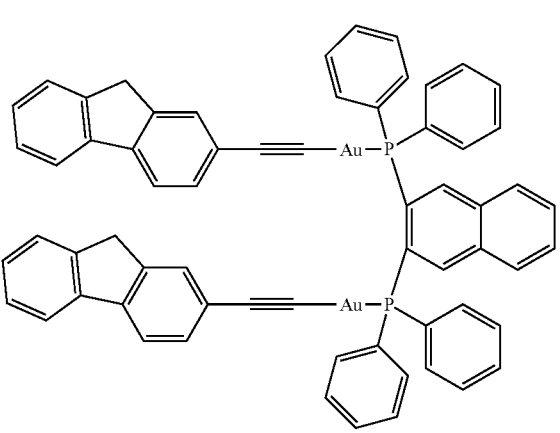
197
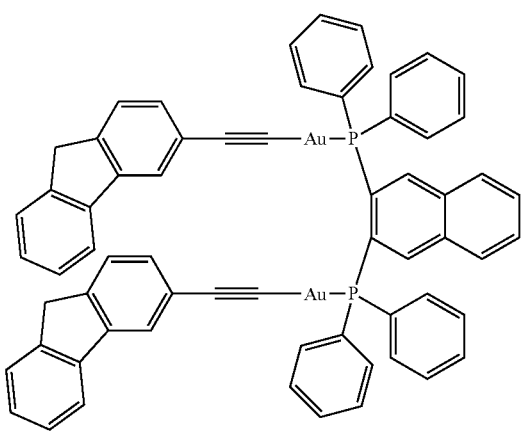

198
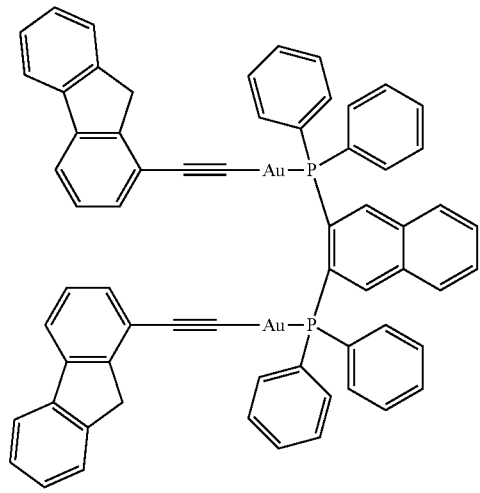
199
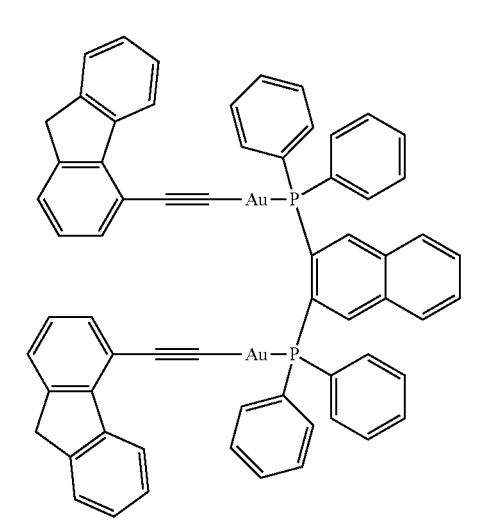
200
201
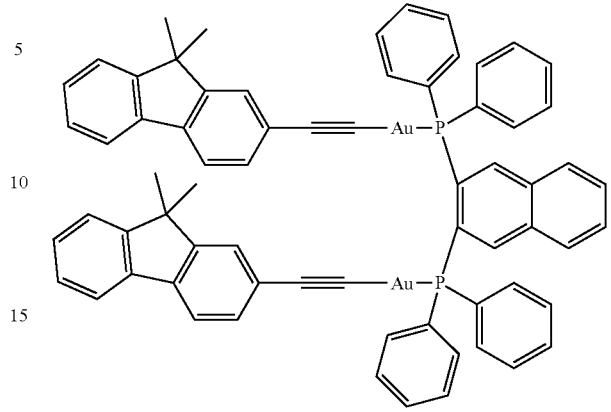
202
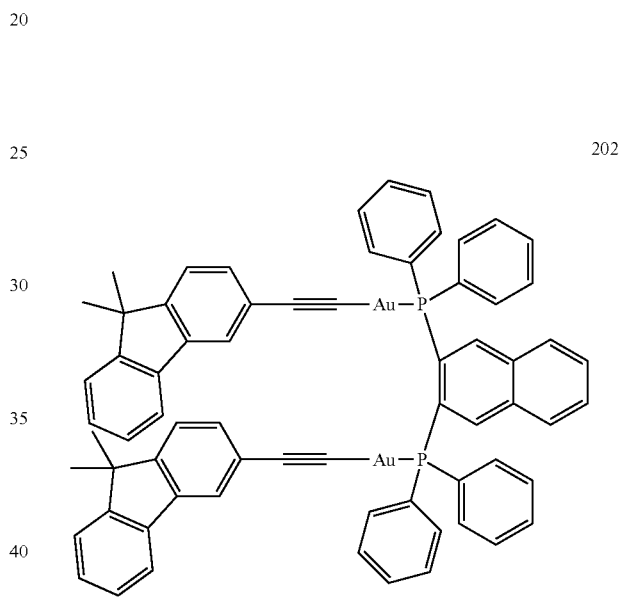
203
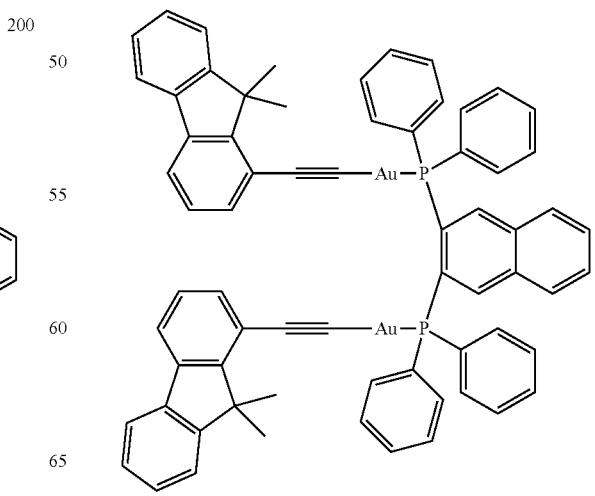

204
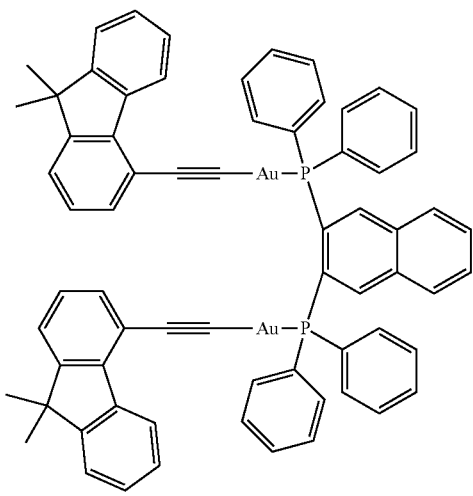
205
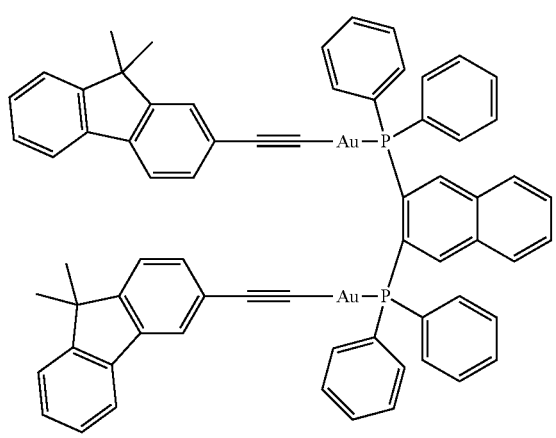
206
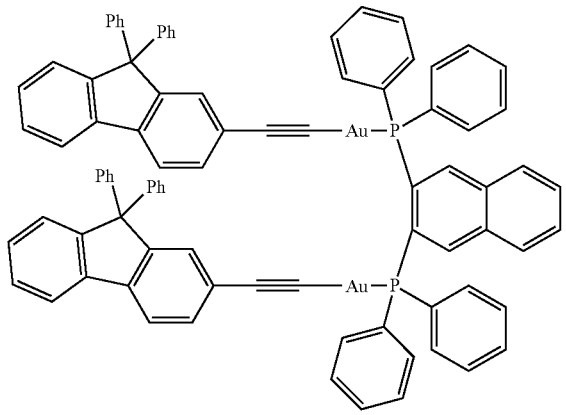
207
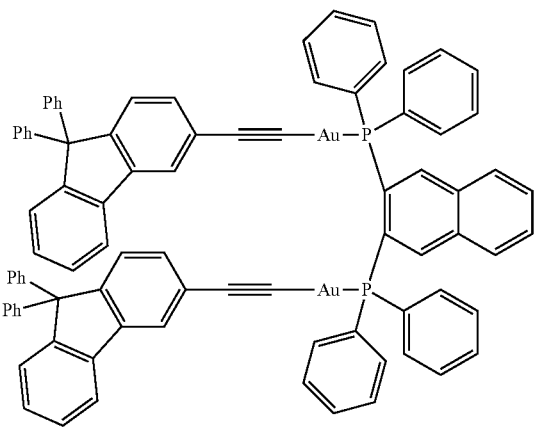
208
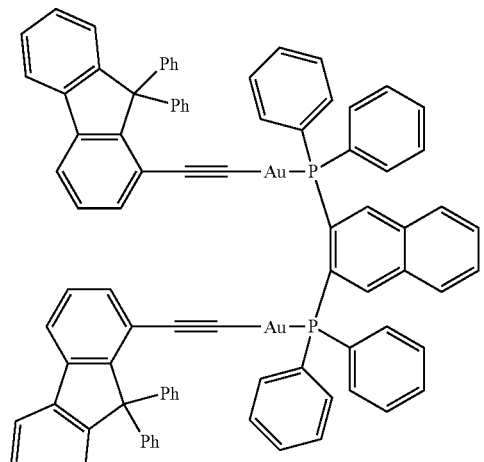
209
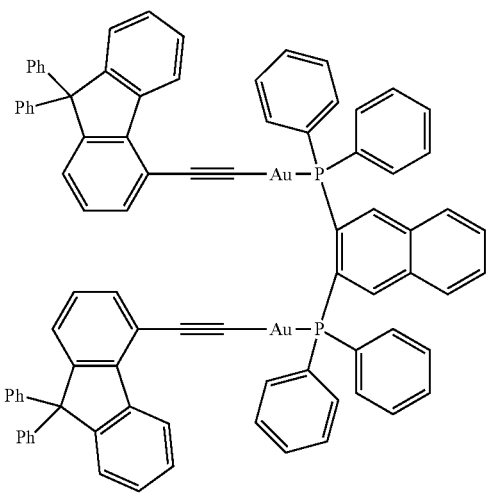

210
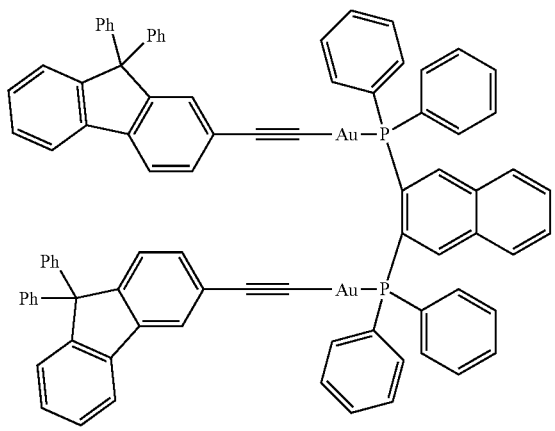
211
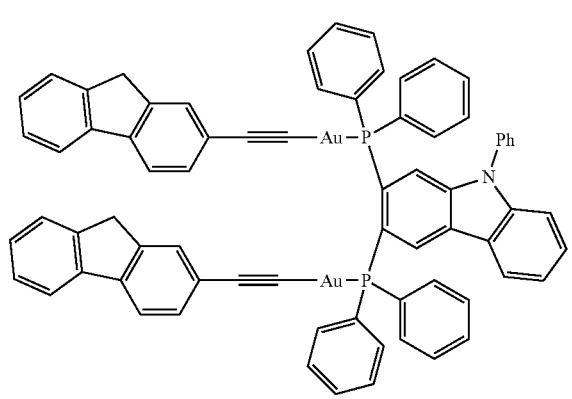
212
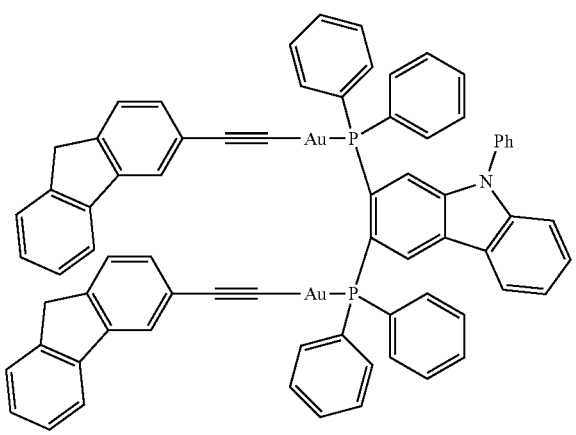
213
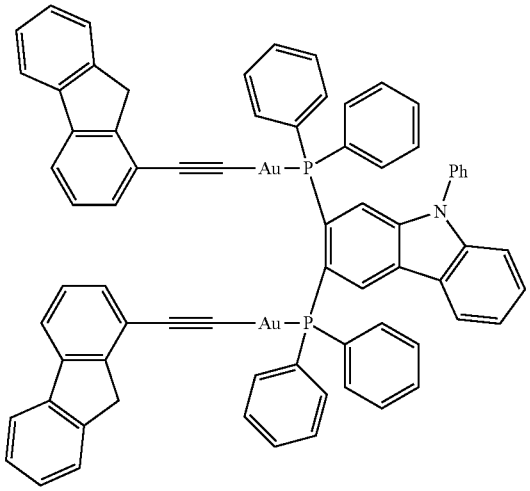
214
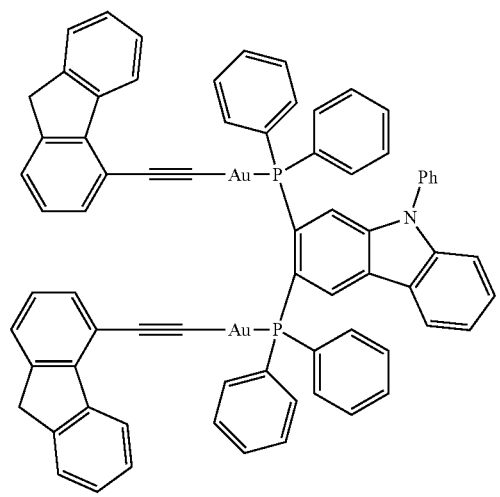
215
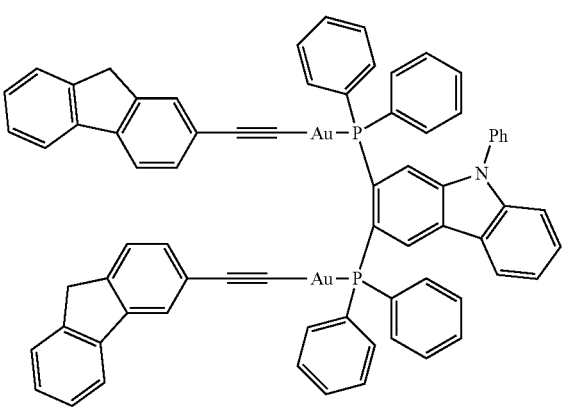

216
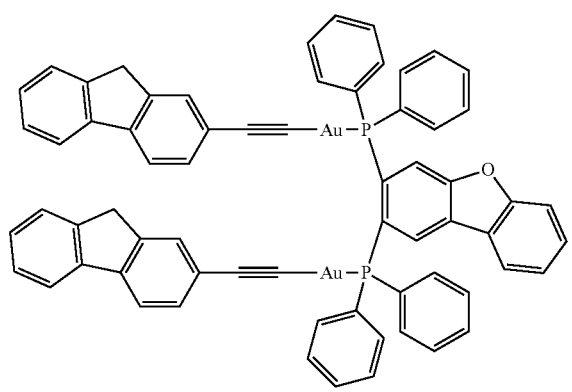
217
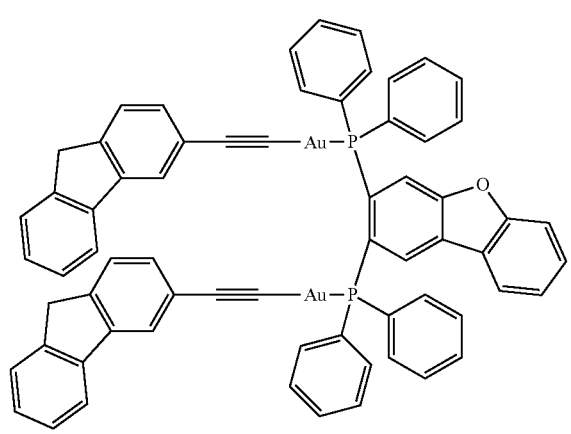
218
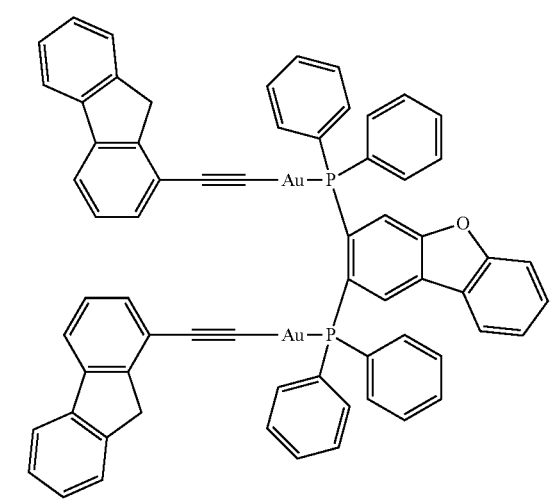
219
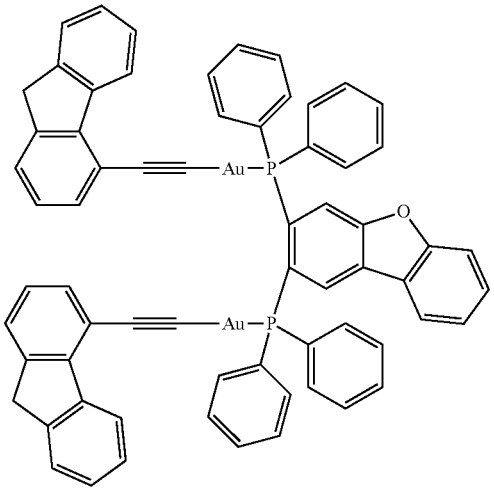
220
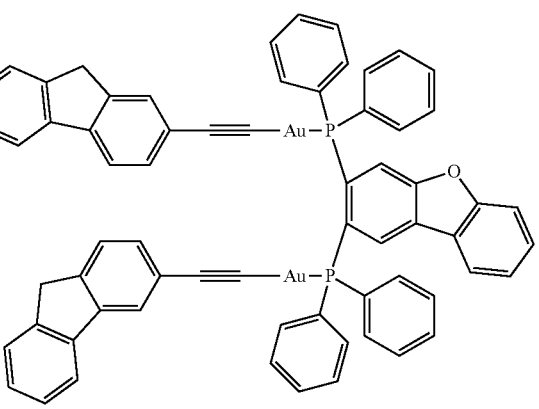
221
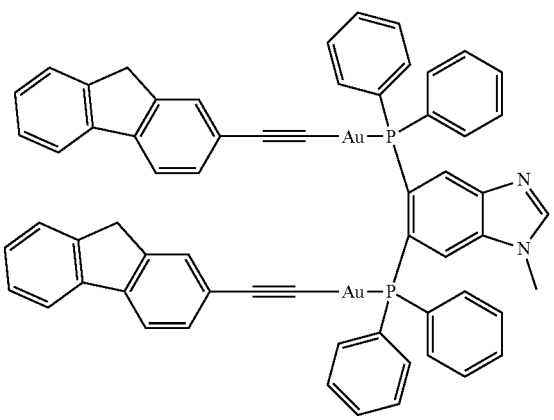

-continued
222
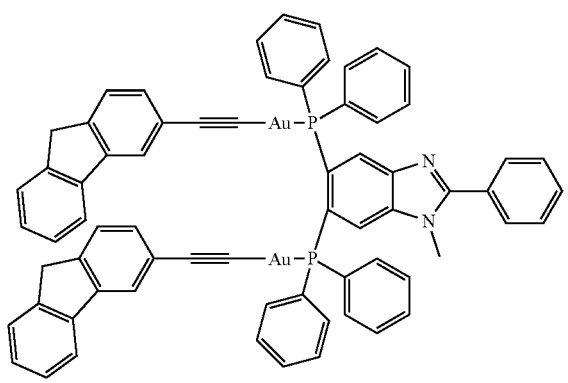
223
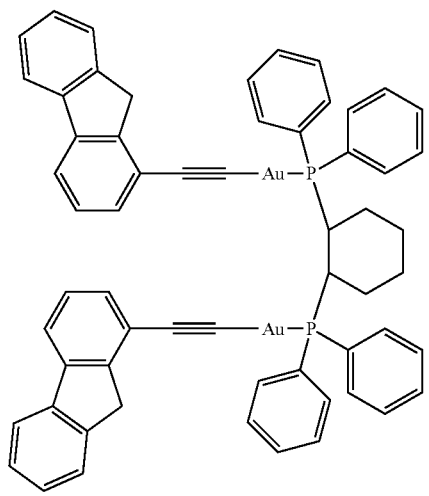
224
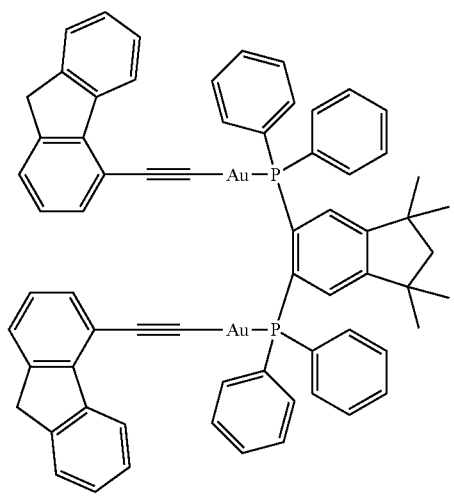
-continued
225
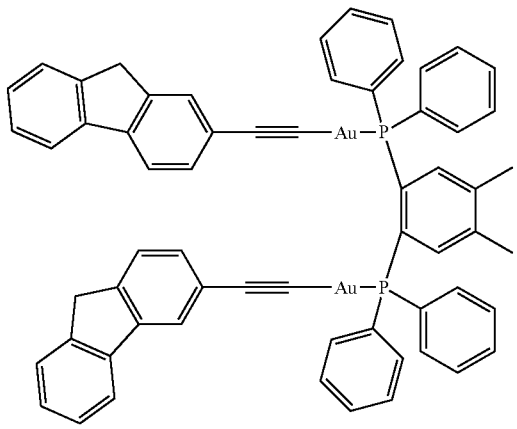
226
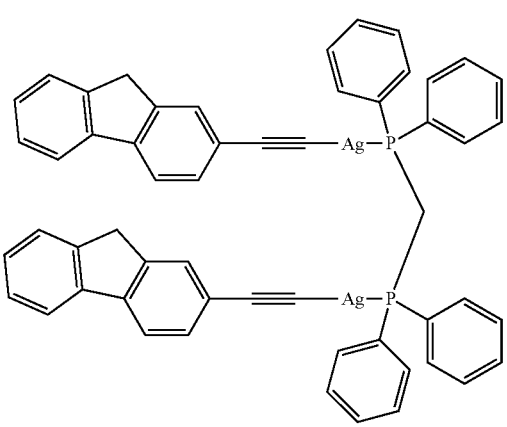
227
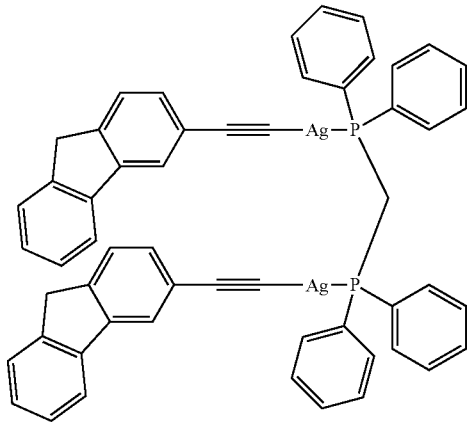

228
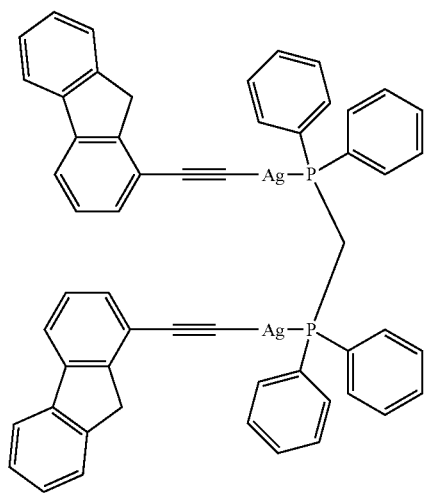
229
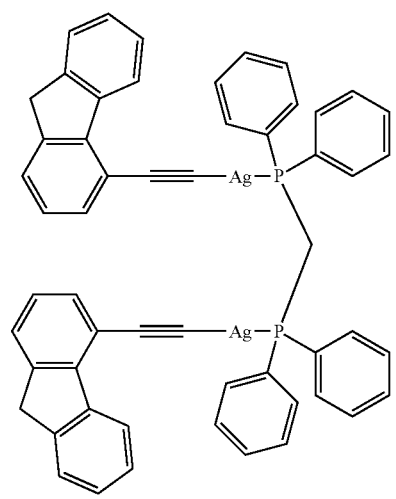
230
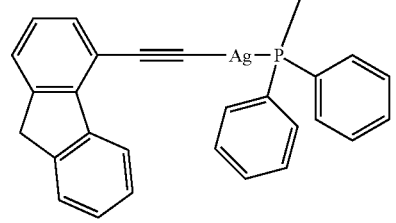
231
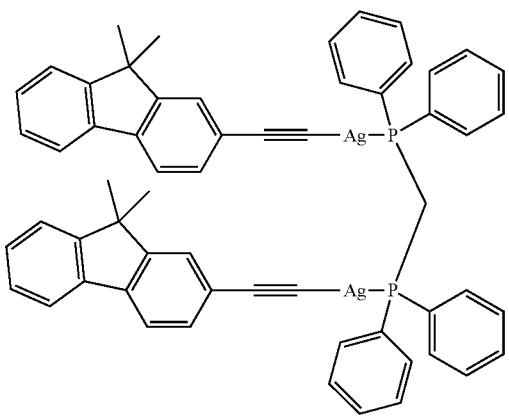
232
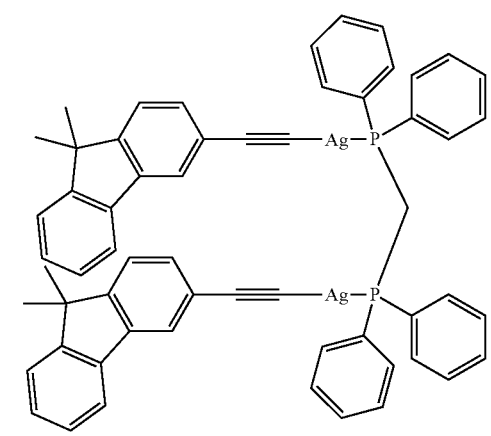
233
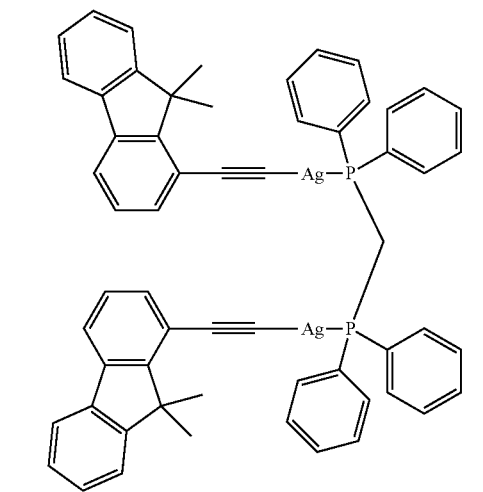

-continued
234
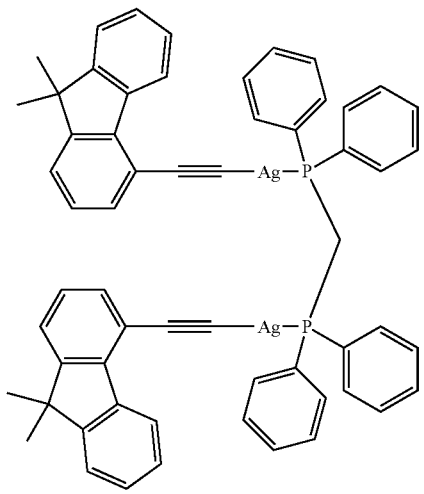
235
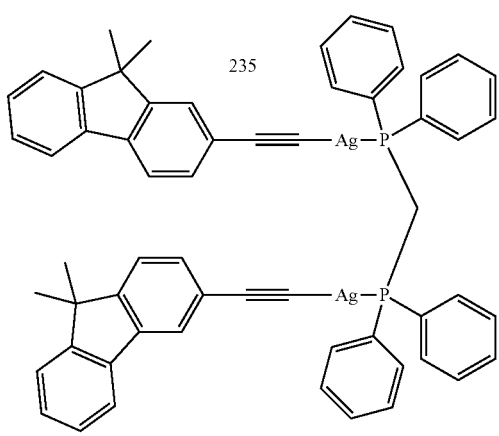
236
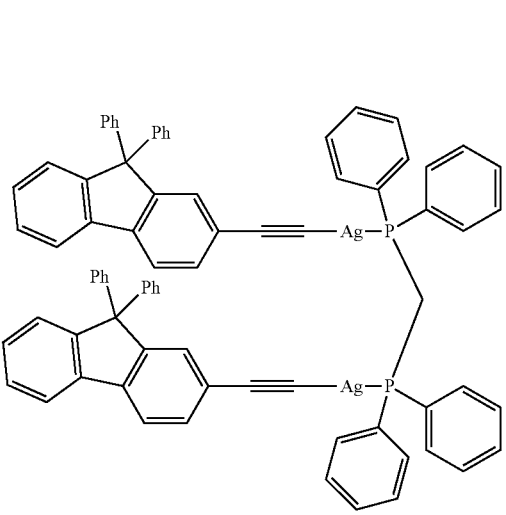
-continued
237
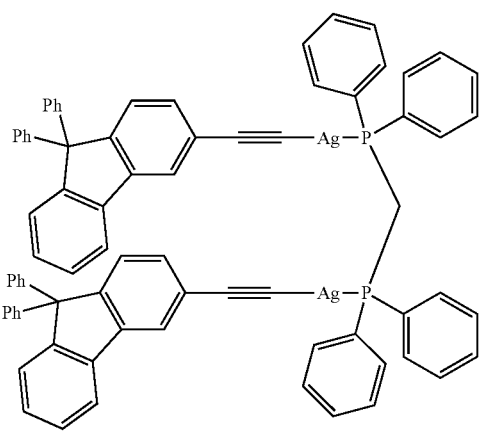
238
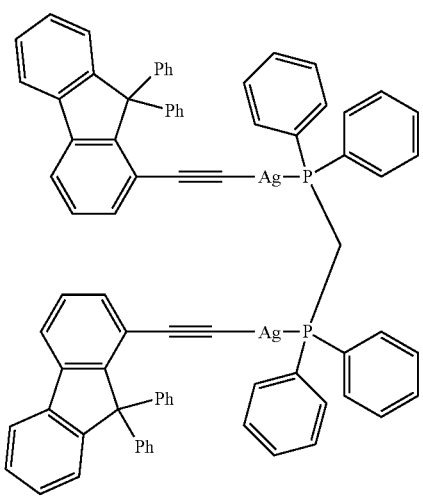
239
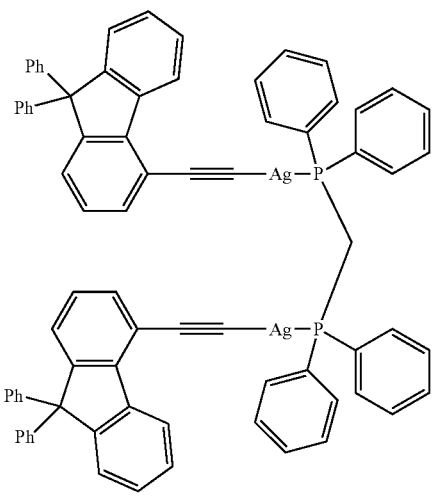

117
-continued
240
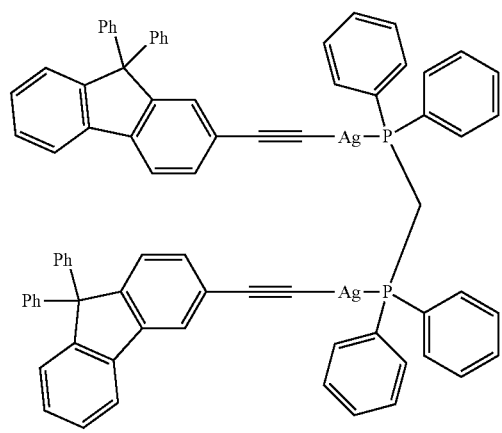
241
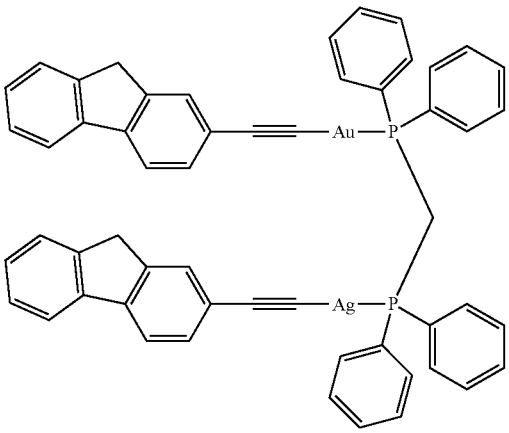
242
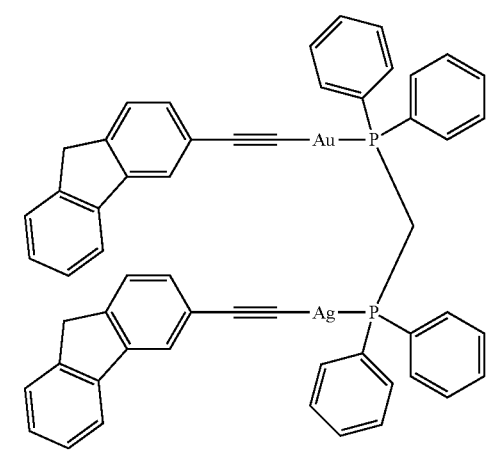
118
-continued
243
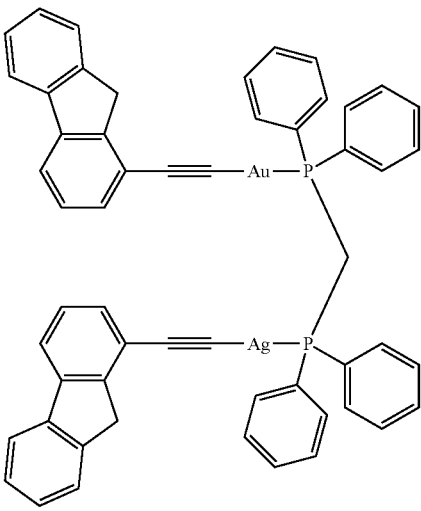
244
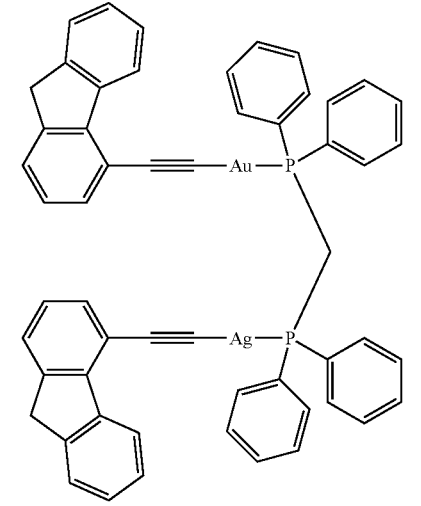
245
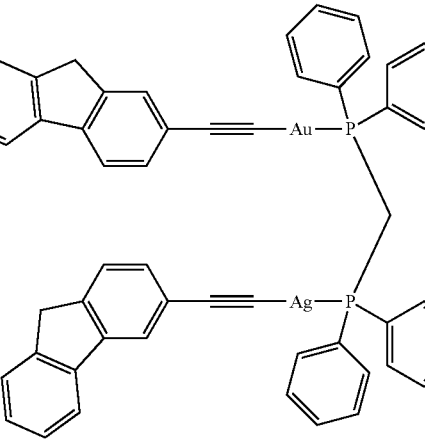

246
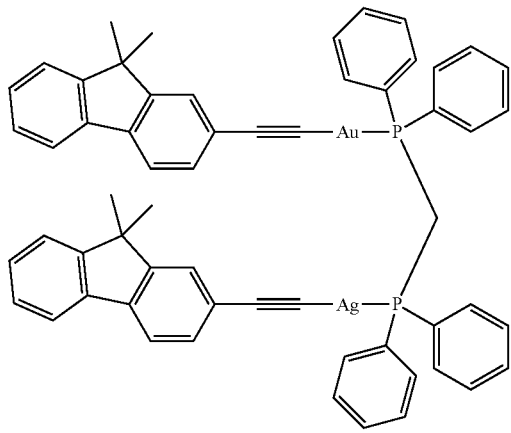
249
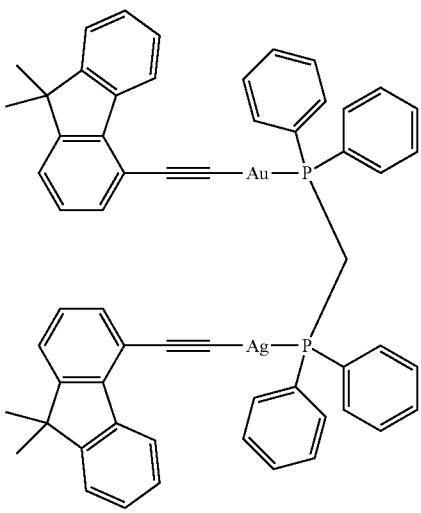
247
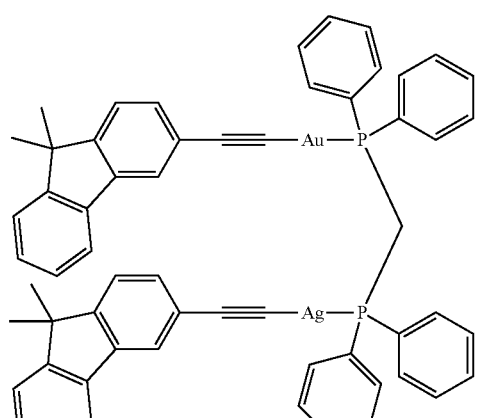
250
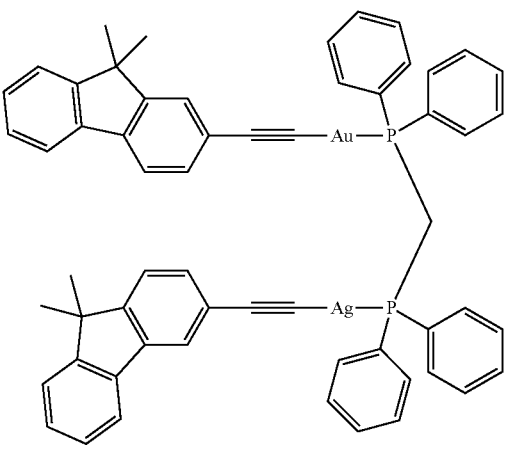
248
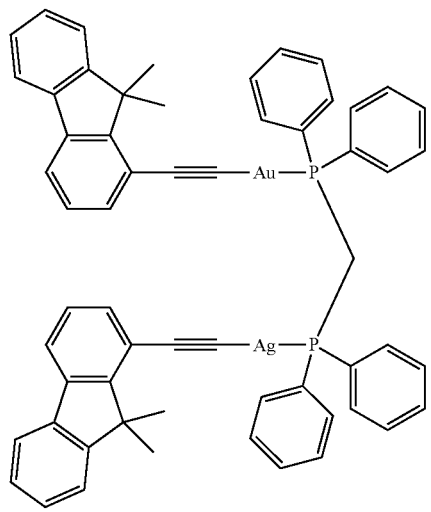
251
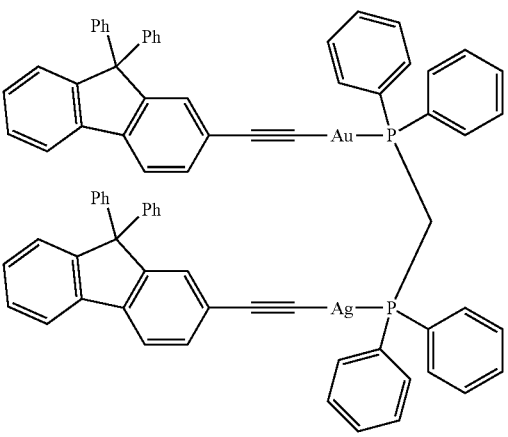

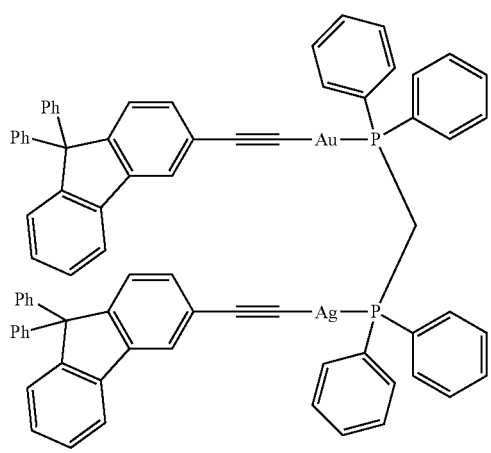
252
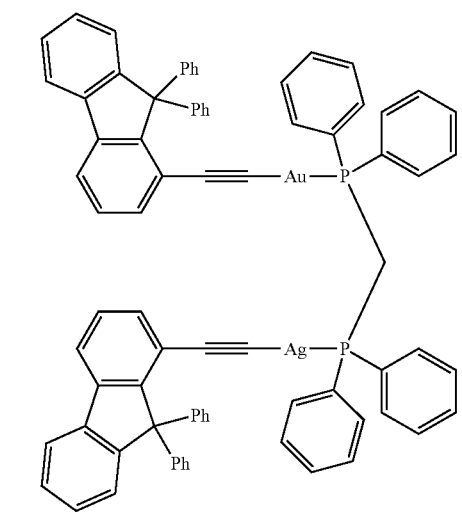
253
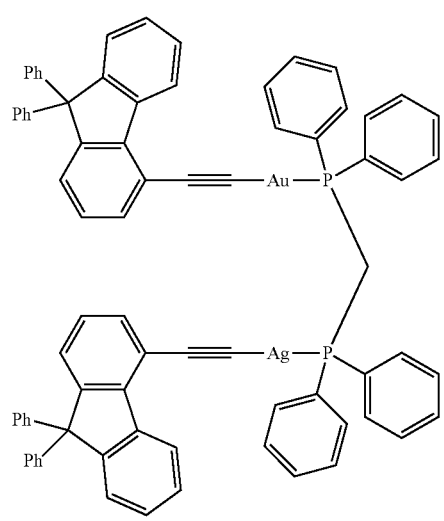
254
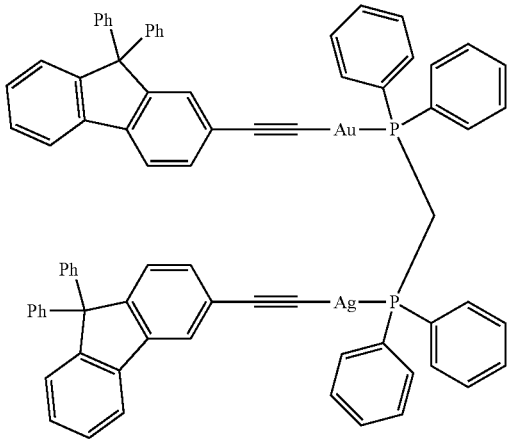
255
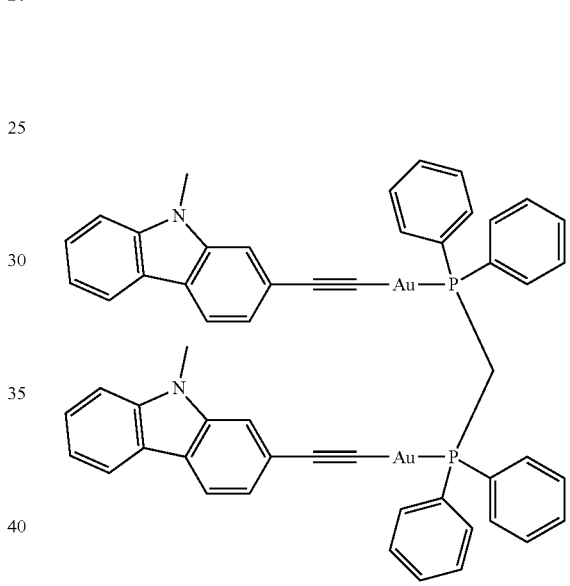
256
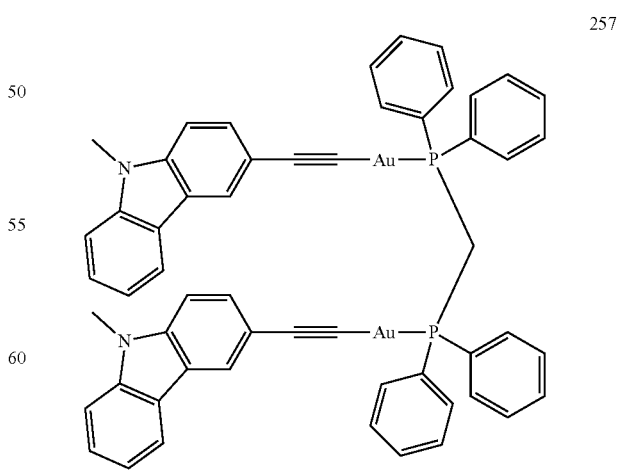
257

-continued
258
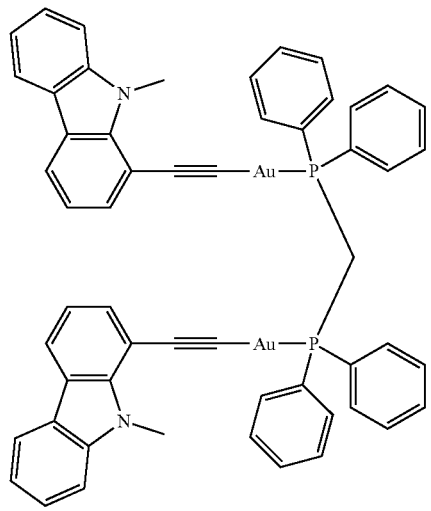
259
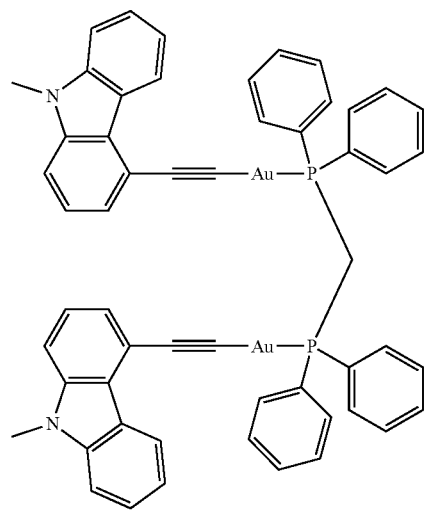
260
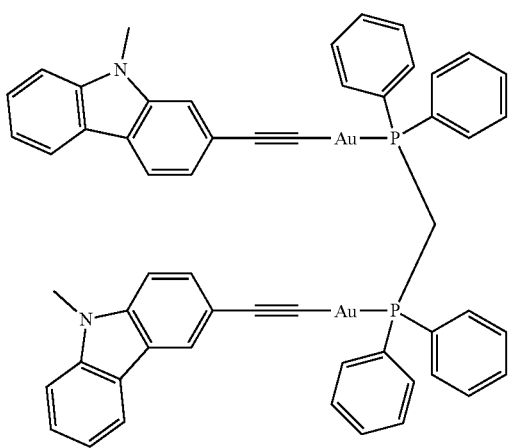
-continued
261
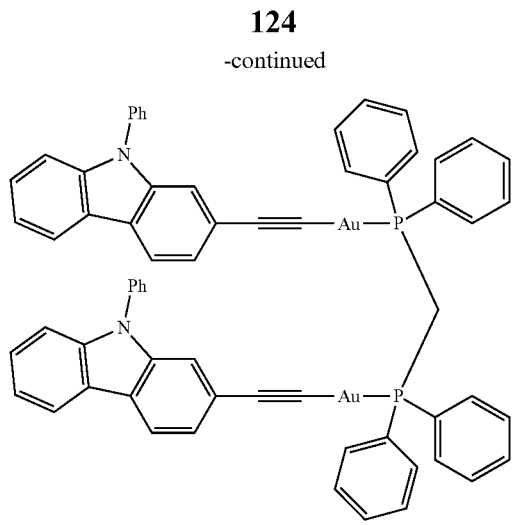
262
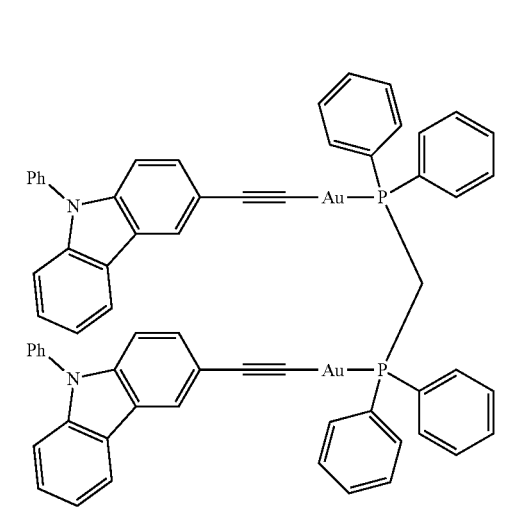
263
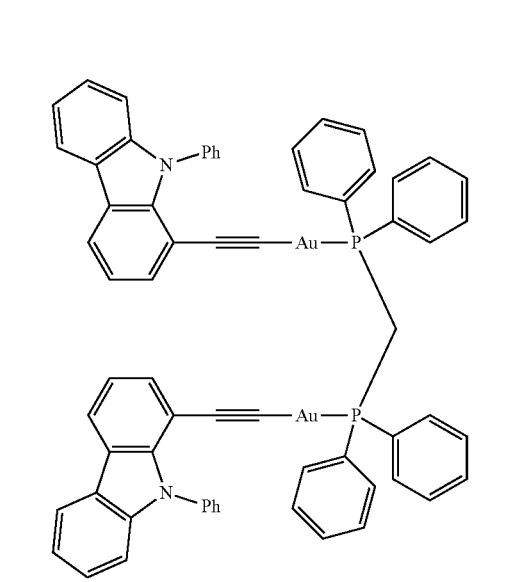

125
-continued
264
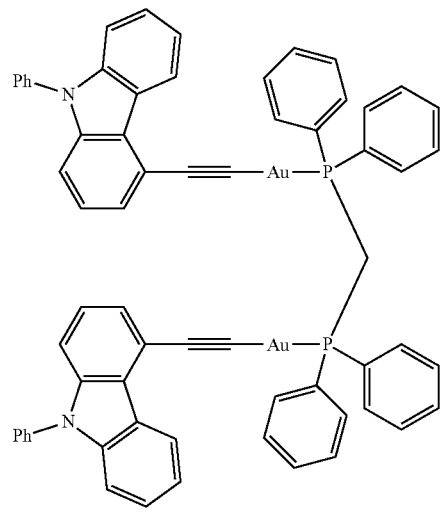
265
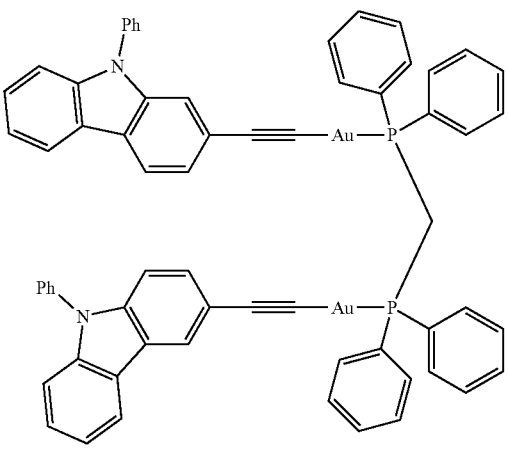
266
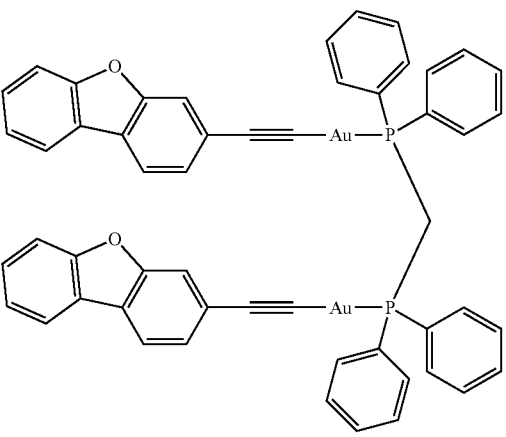
126
-continued
267
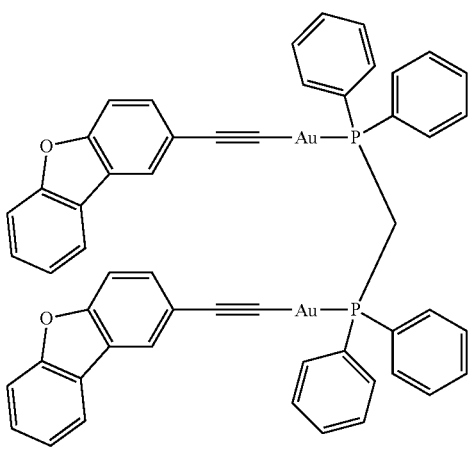
268
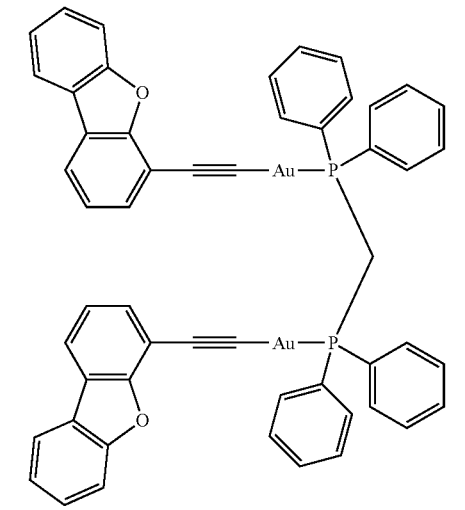
269
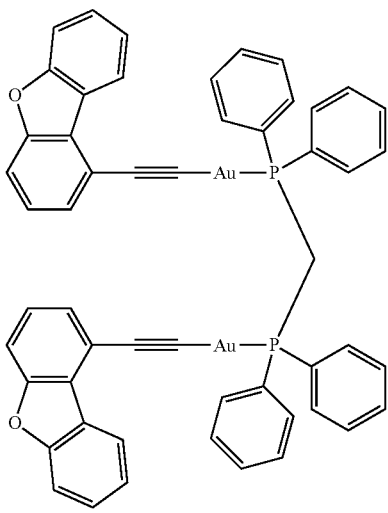

127
-continued
270
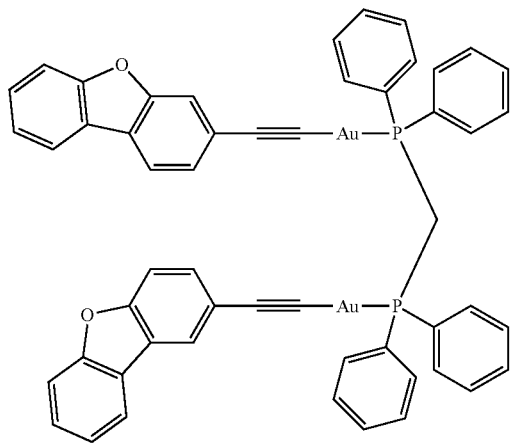
271
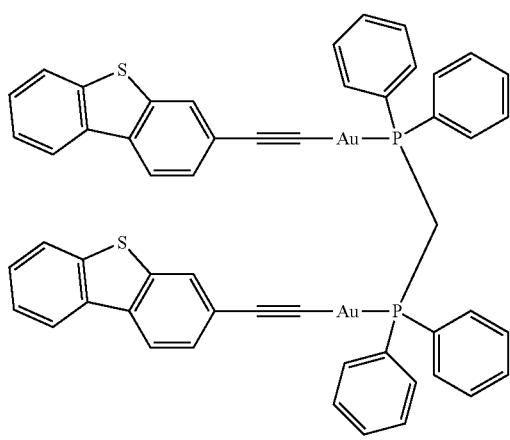
272
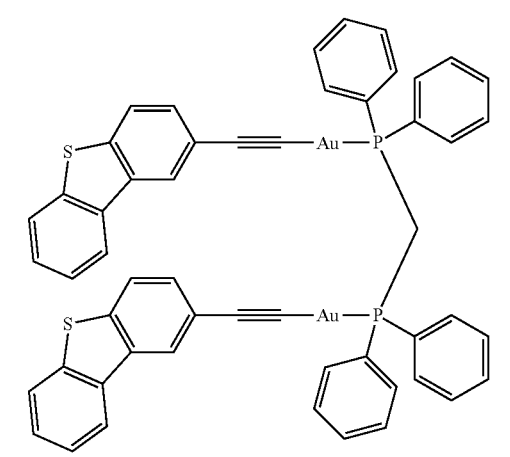
128
-continued
273
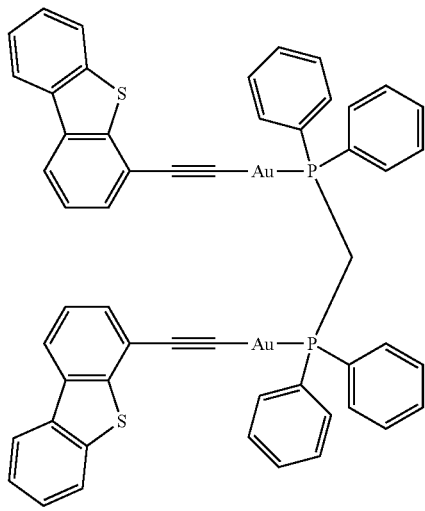
274
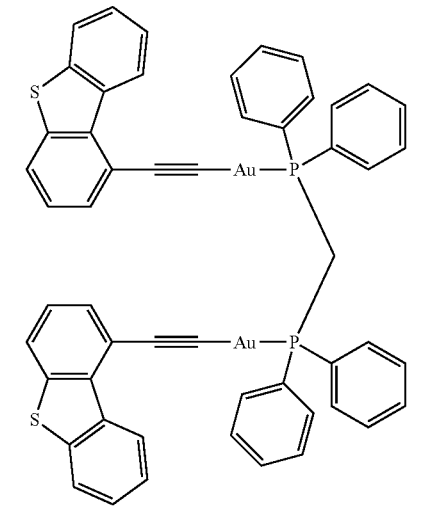
275
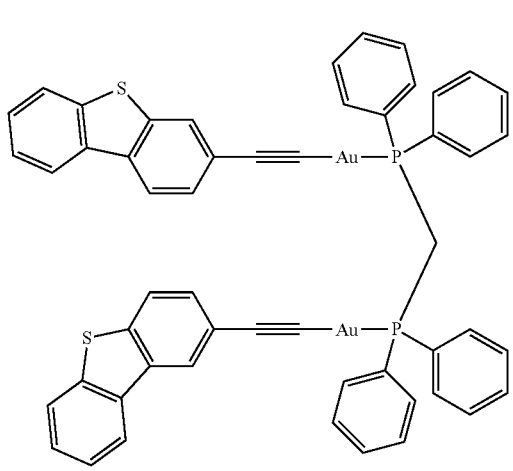

276
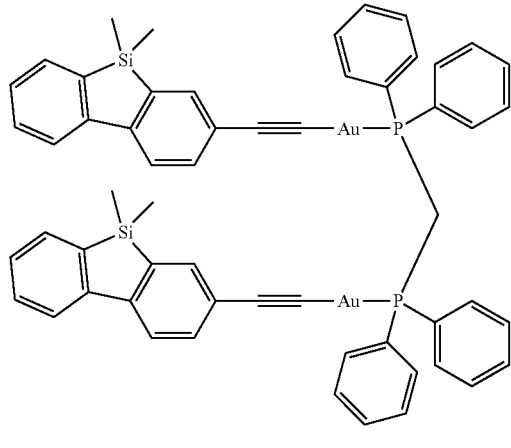
277
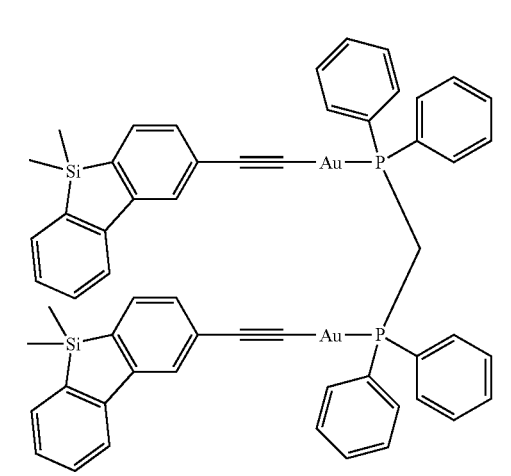
278
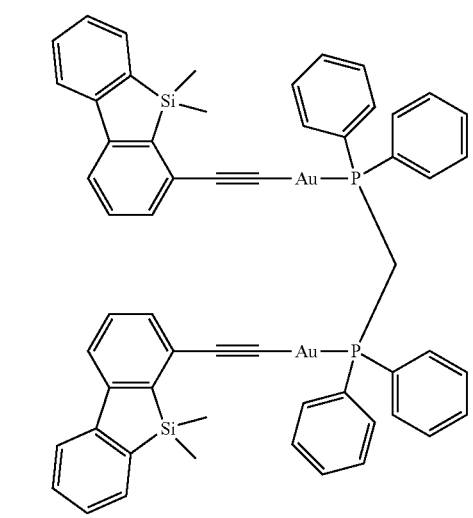
279
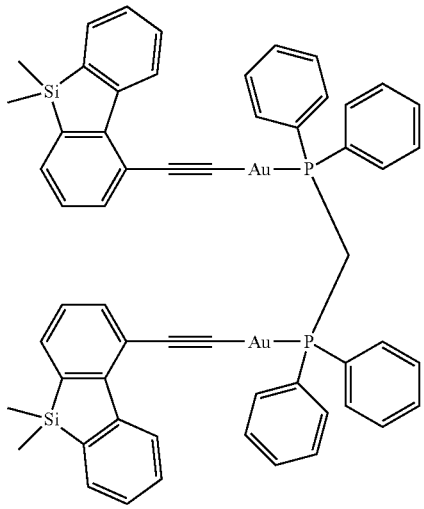
280
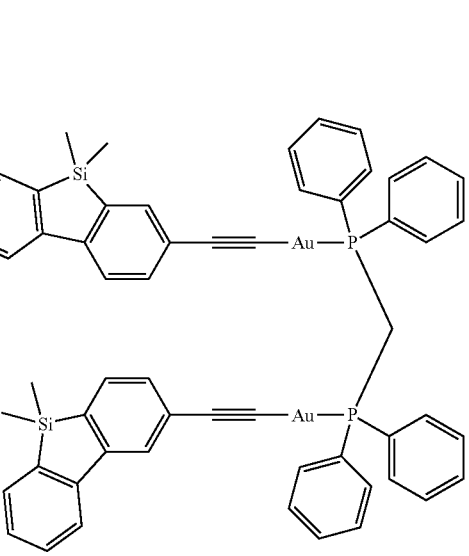
281
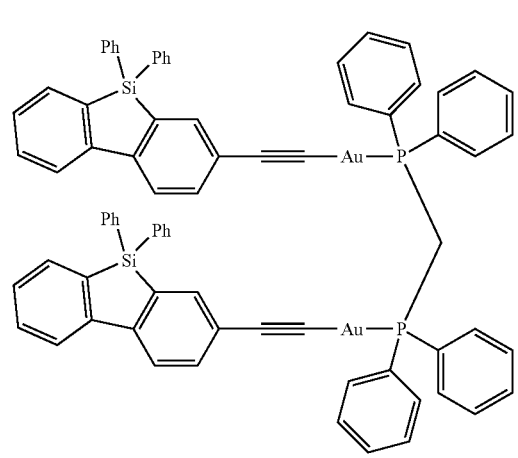

282
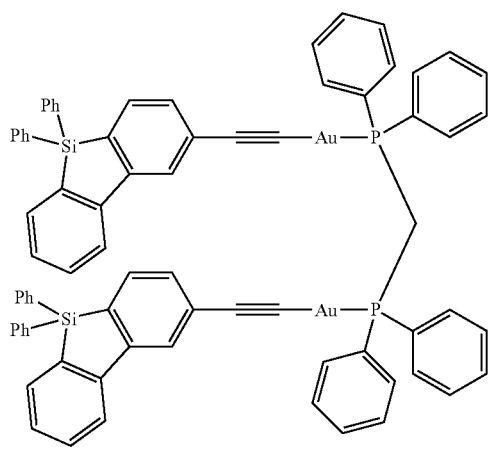
283
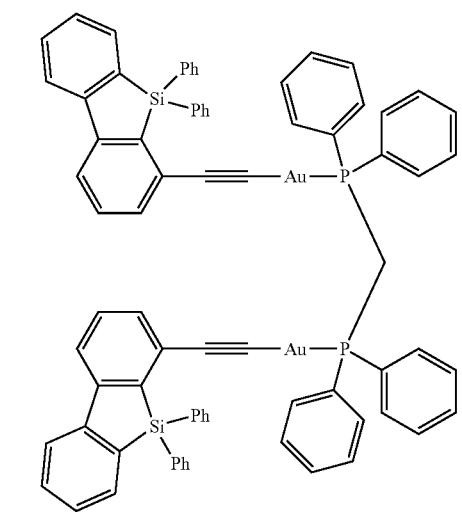
284
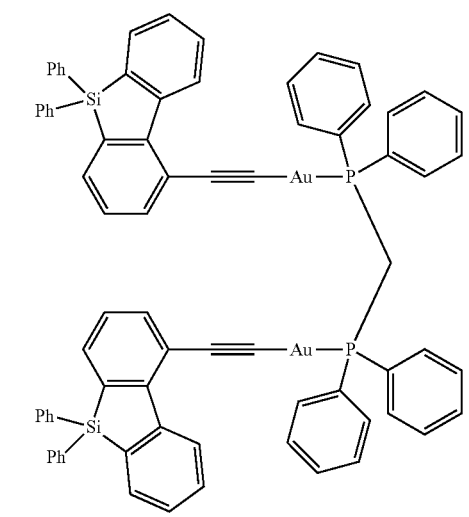
285
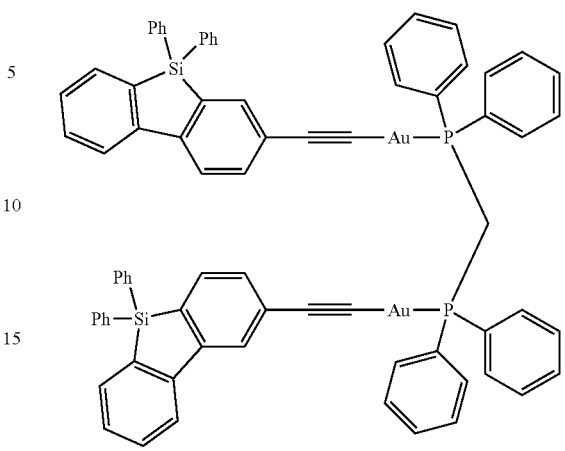
286
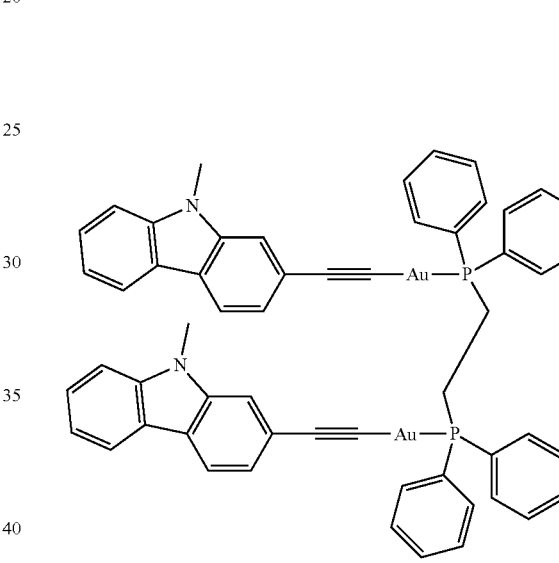
287
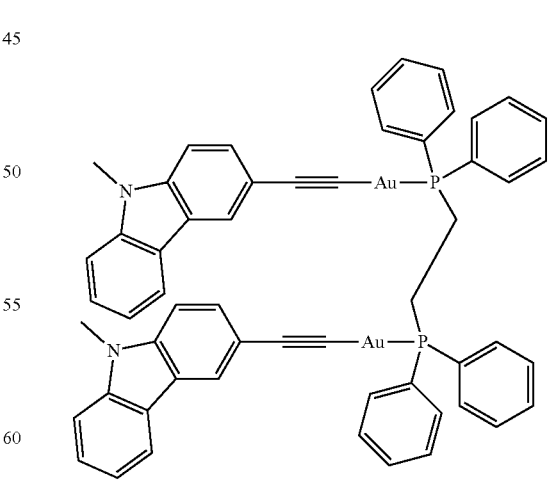

288
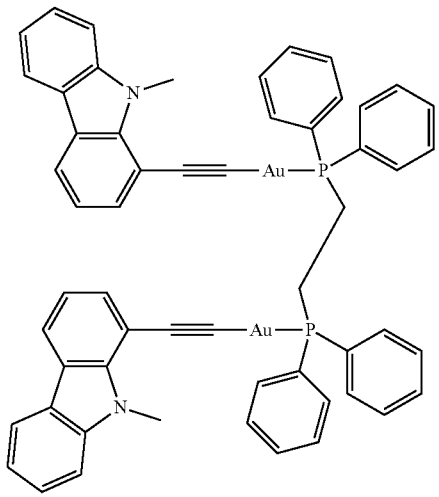
289
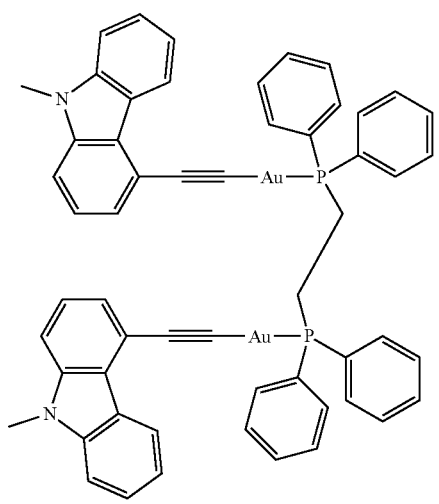
290
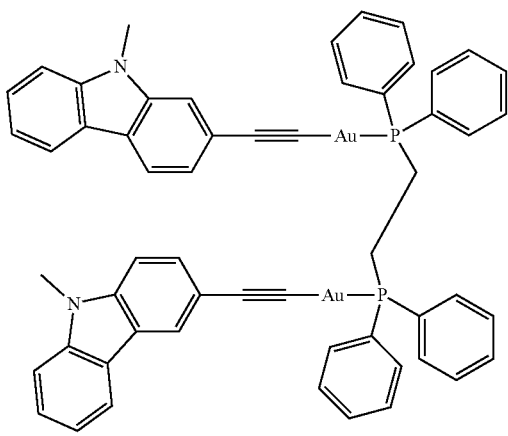
291
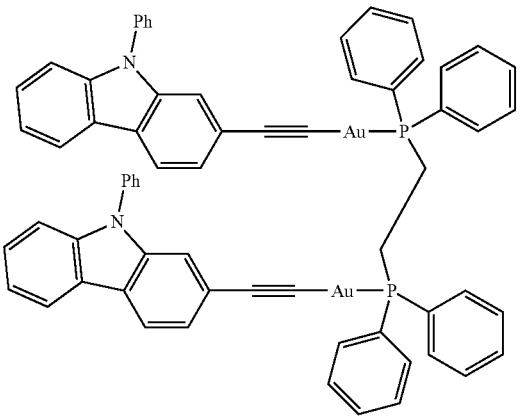
292
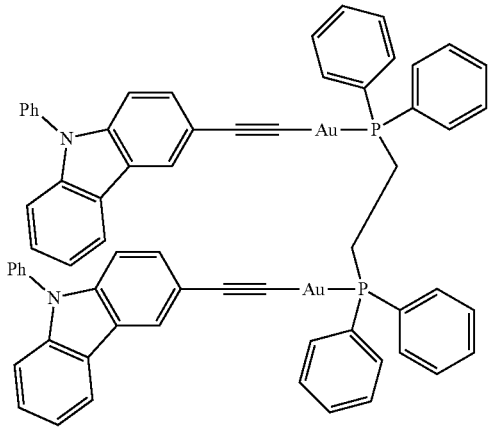
293
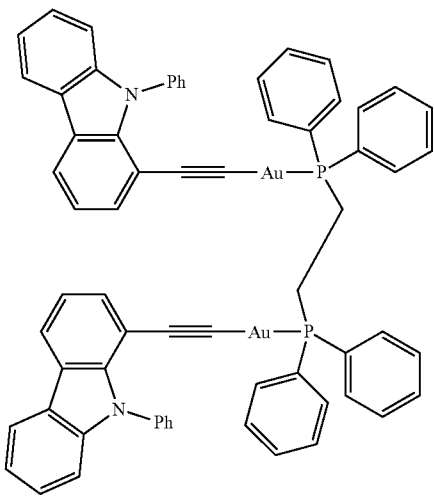

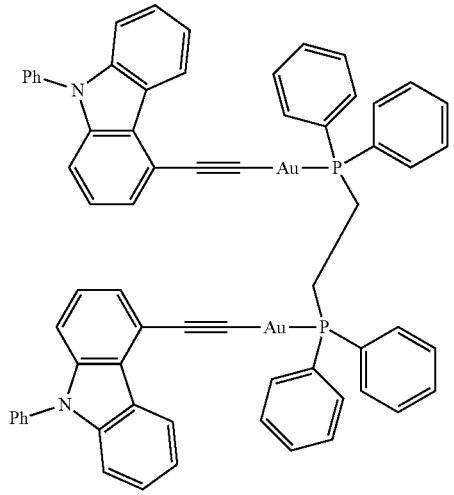
294
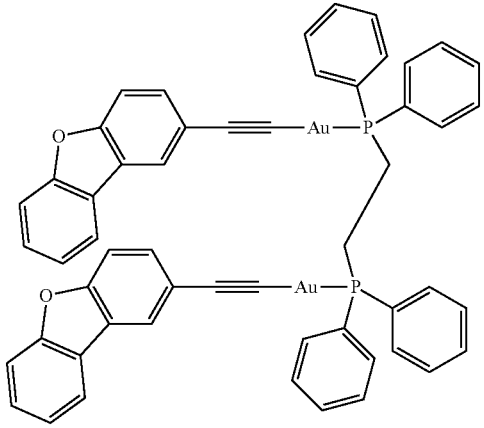
297
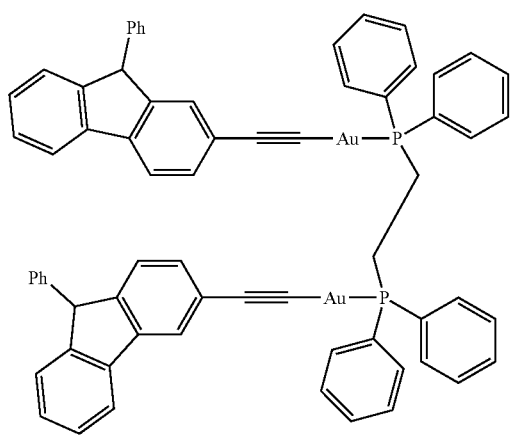
295
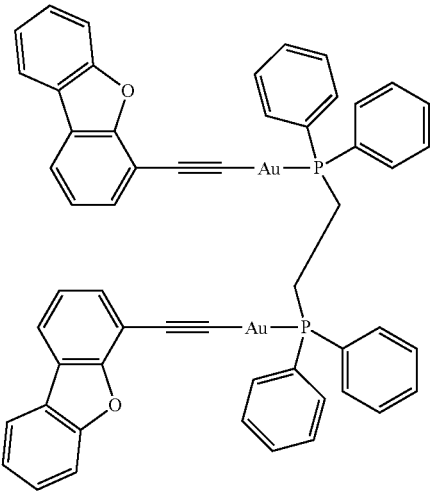
298
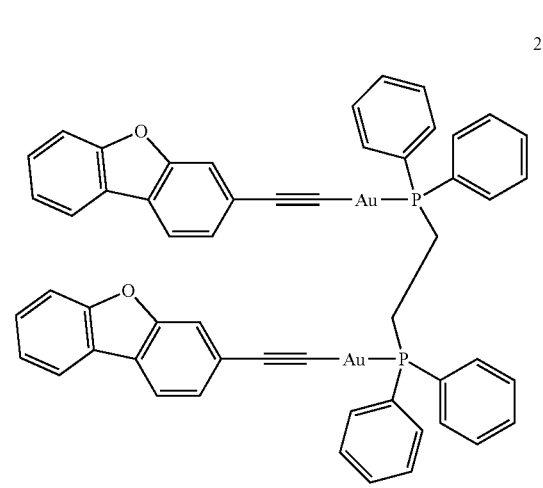
296
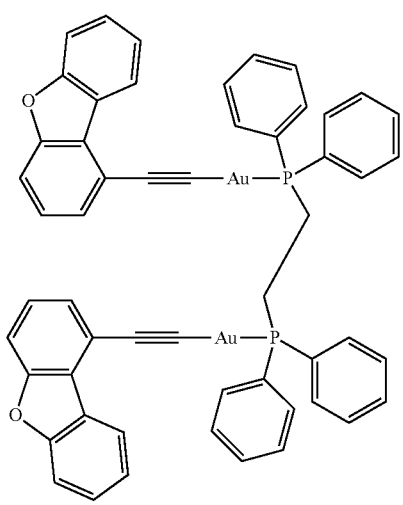
299

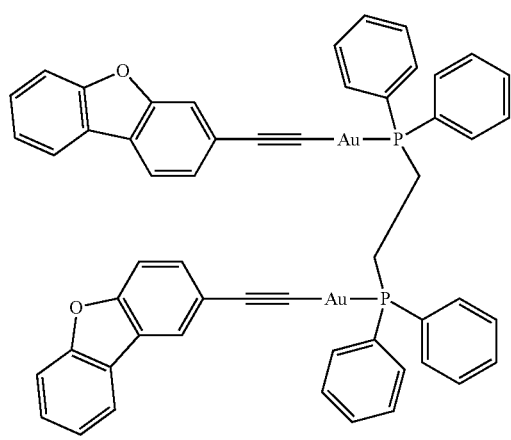
300
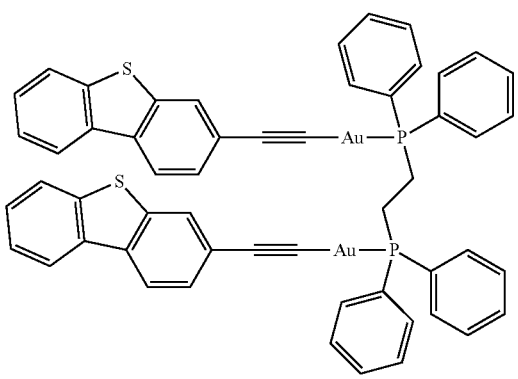
301
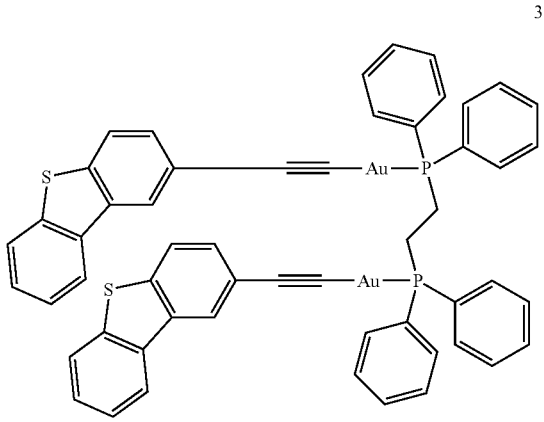
302
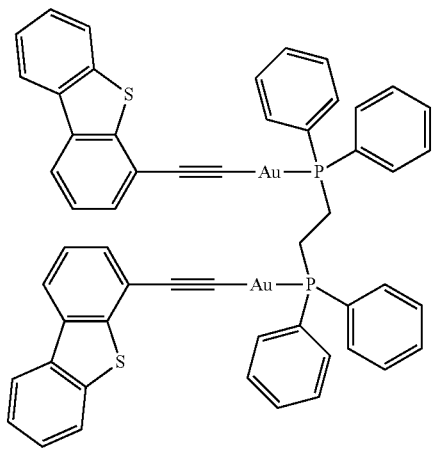
303
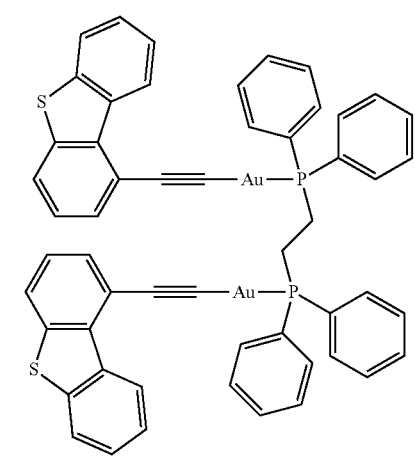
304
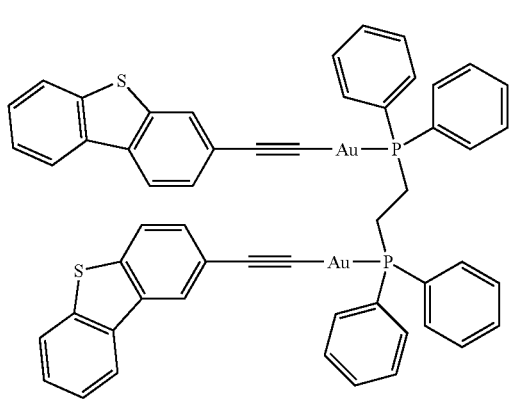
305

-continued
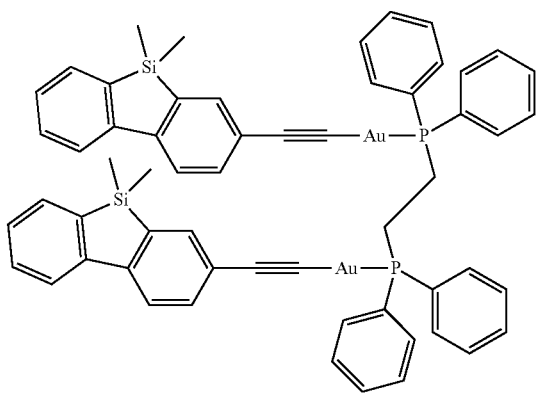
306
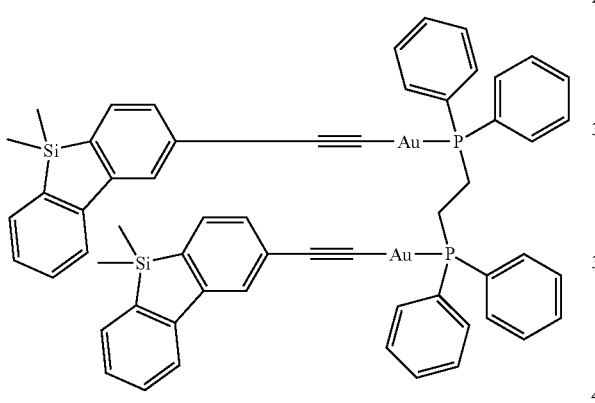
307
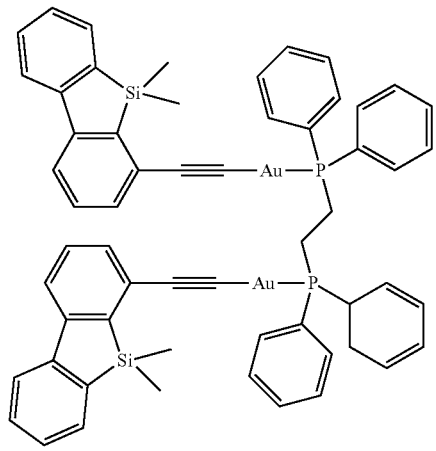
308
-continued
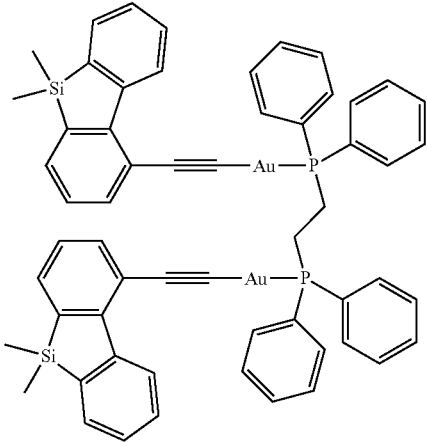
309
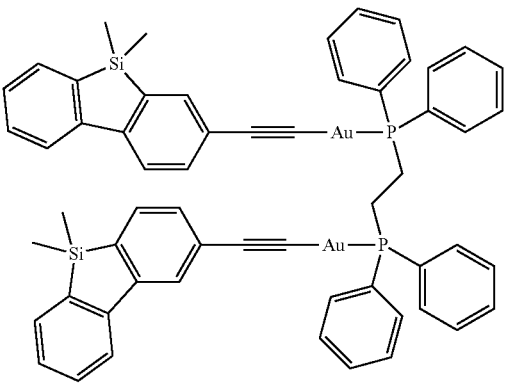
310
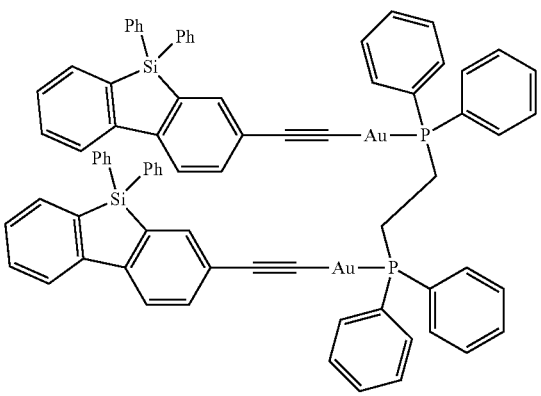
311

141
-continued
312
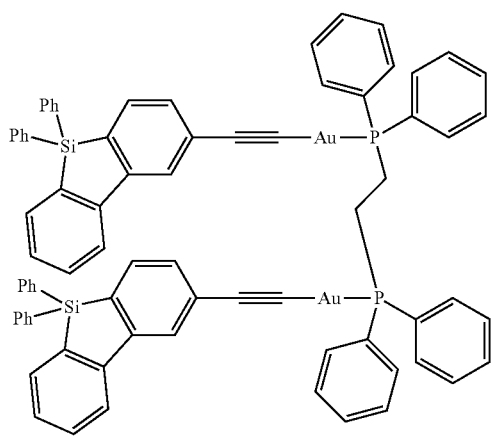
313
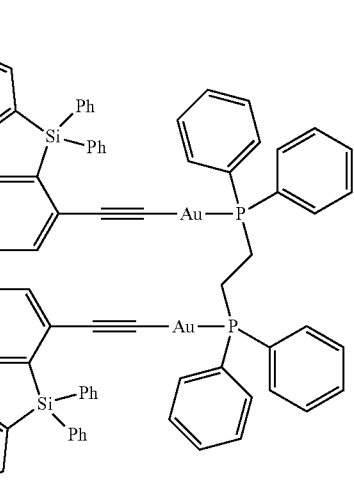
314
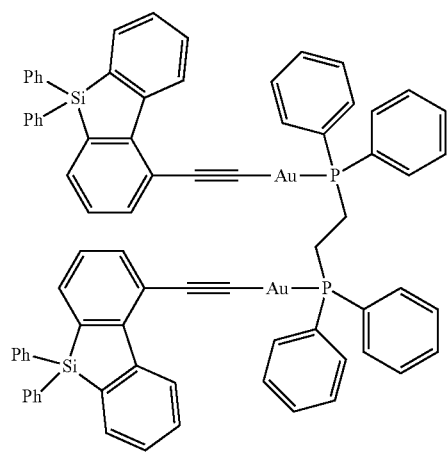
142
-continued
315
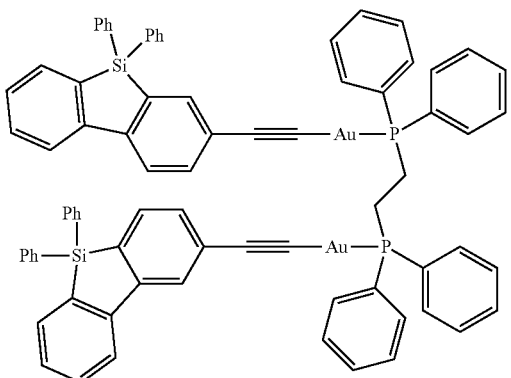
316
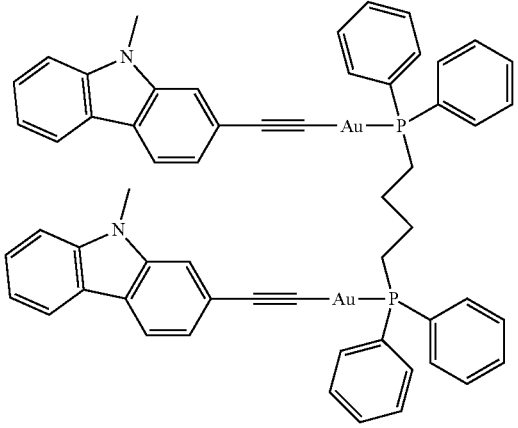
317
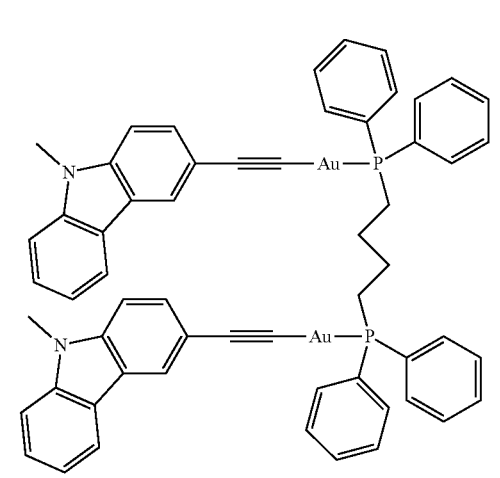

143
-continued
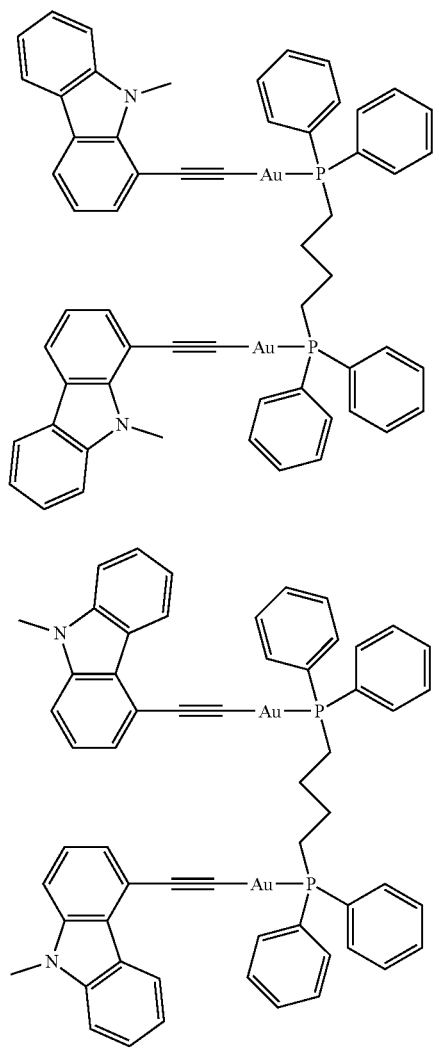
318
319
320
144
-continued
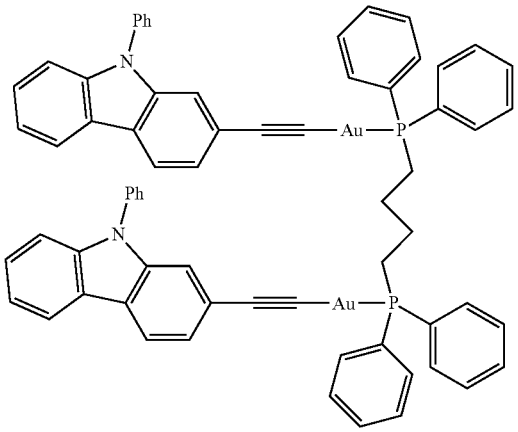
321
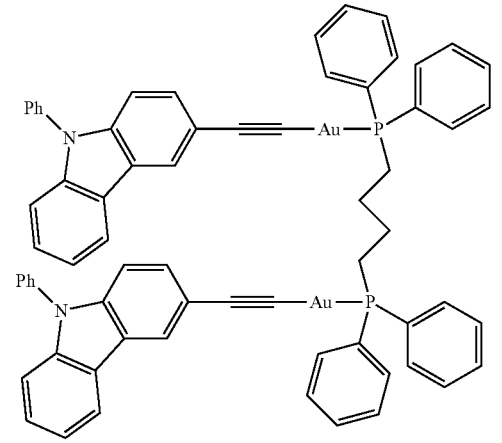
322
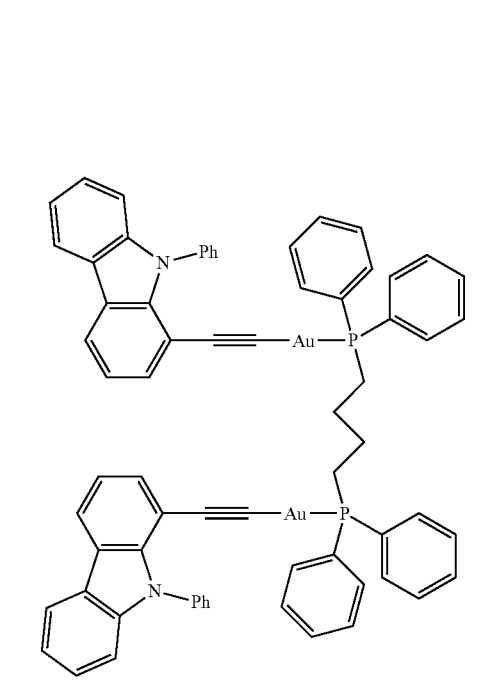
323

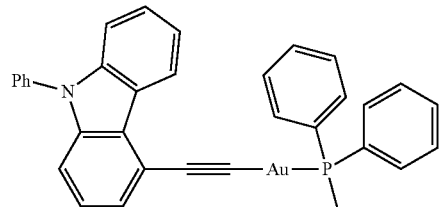
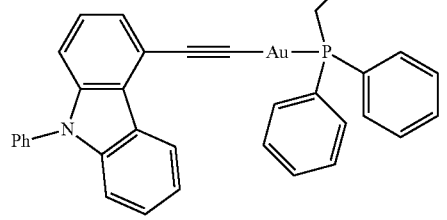
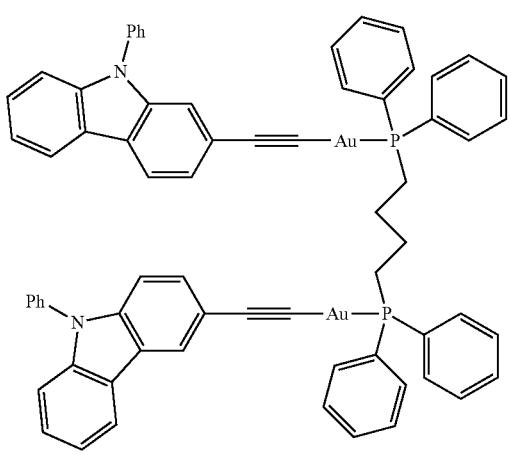
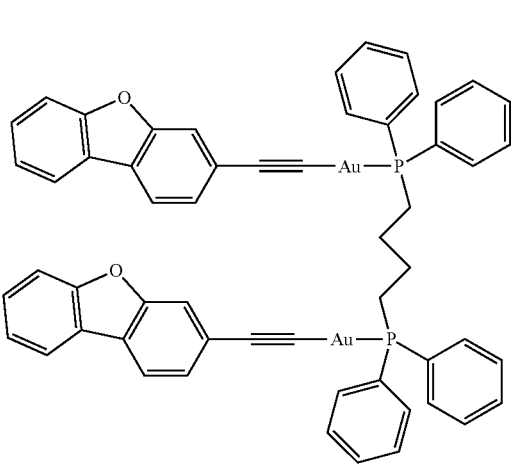
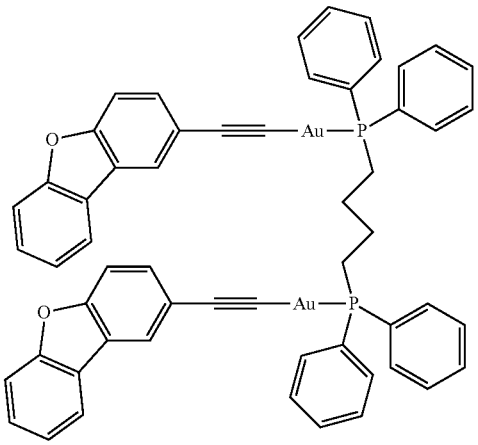
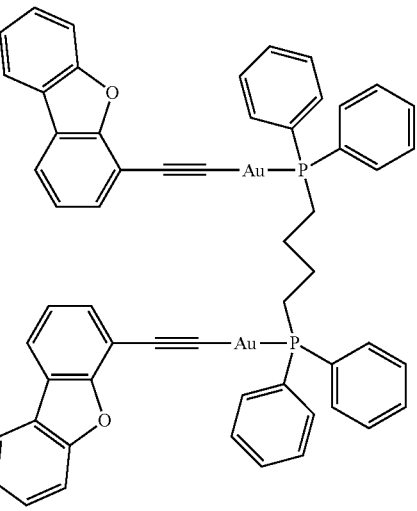
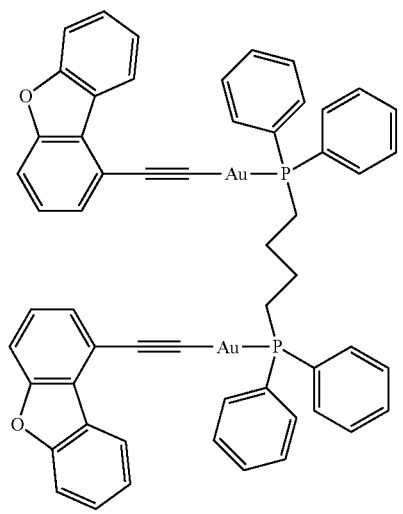

330
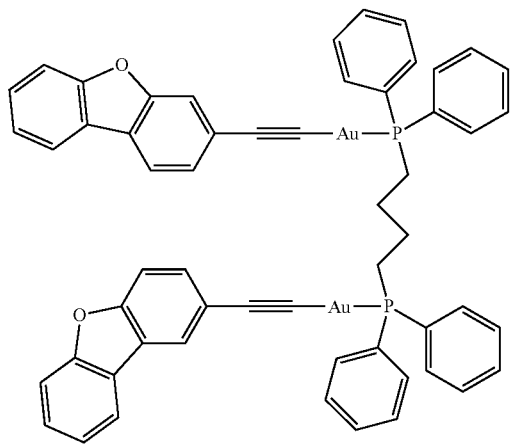
331
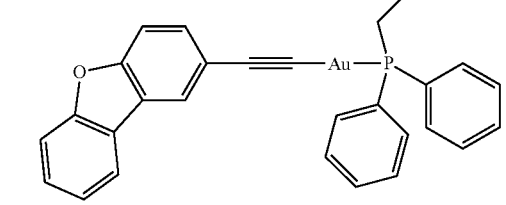
332
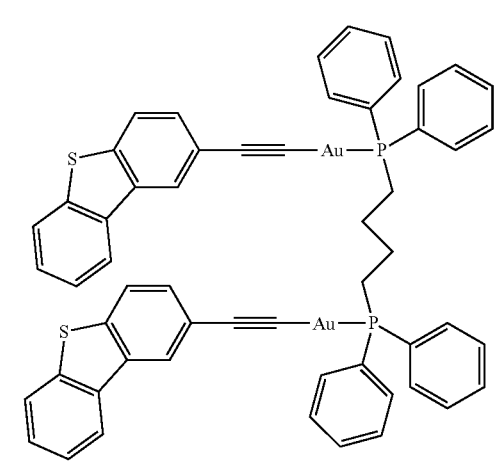
333
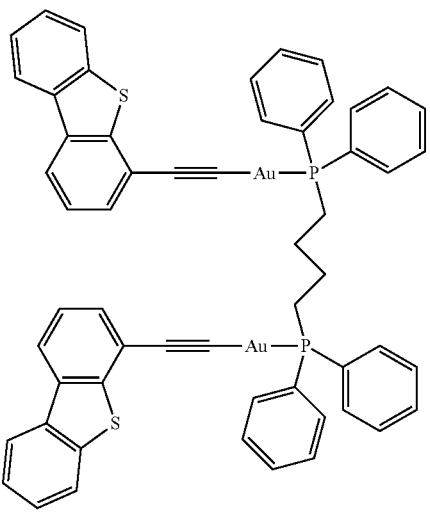
334
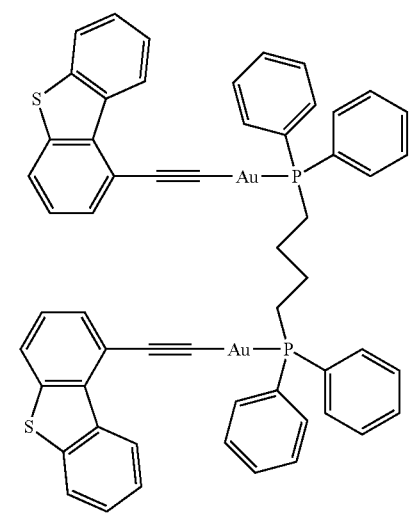
335
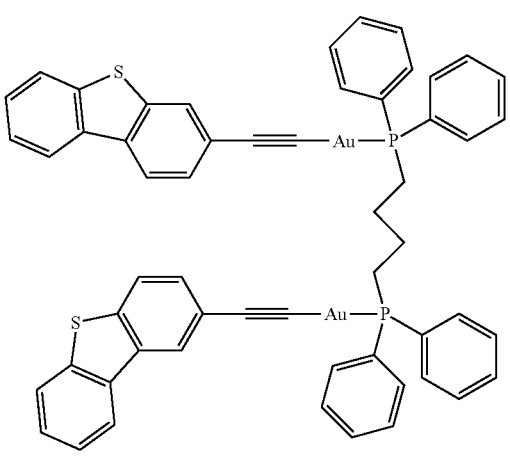

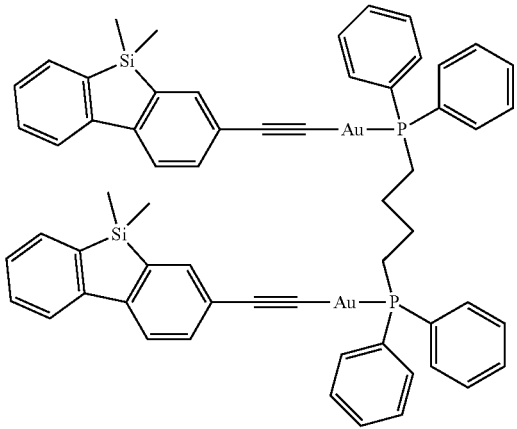
336
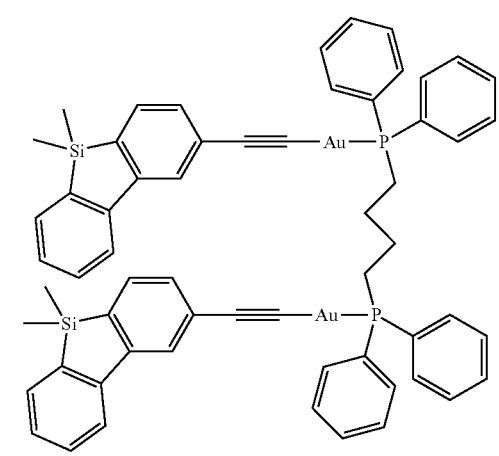
337
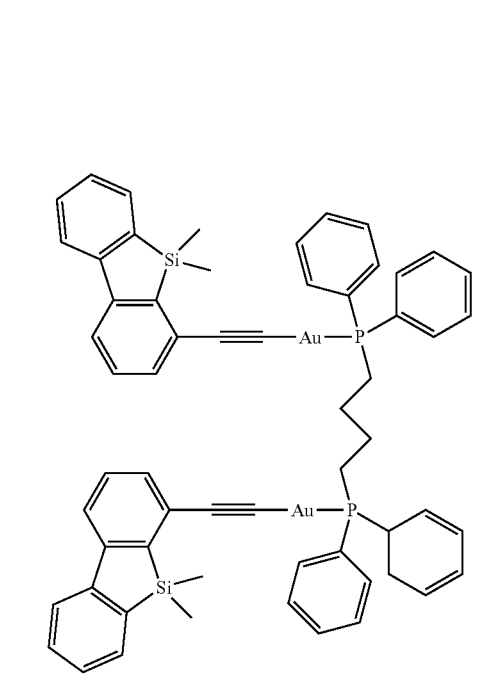
338
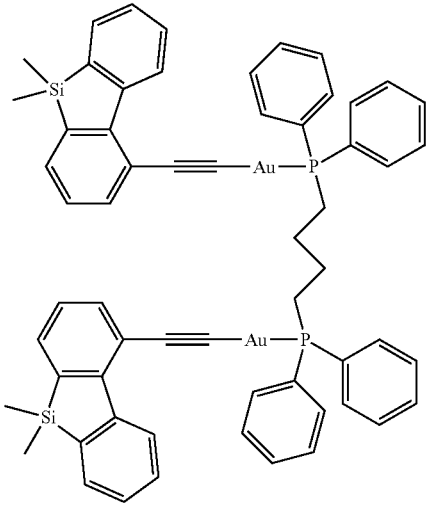
339
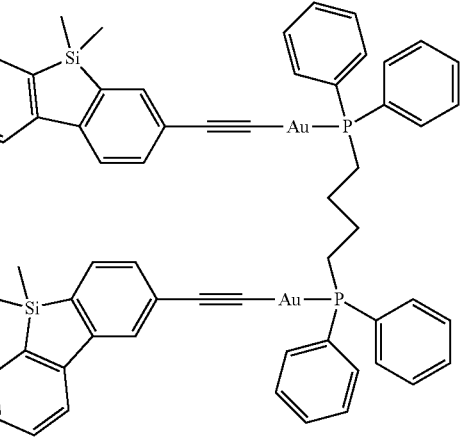
340
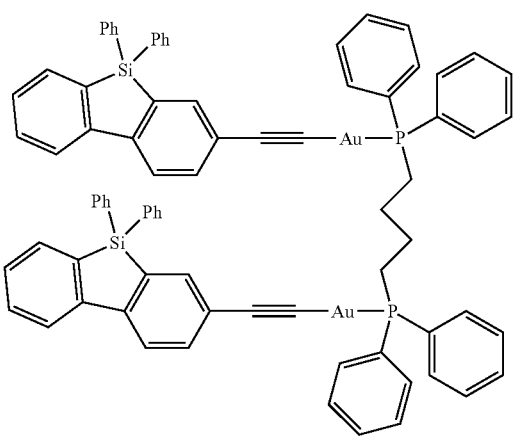
341

342
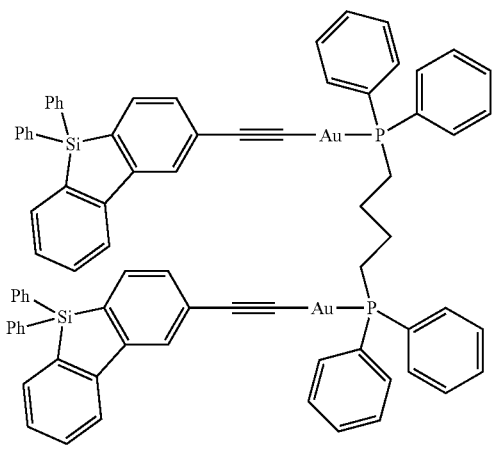
343
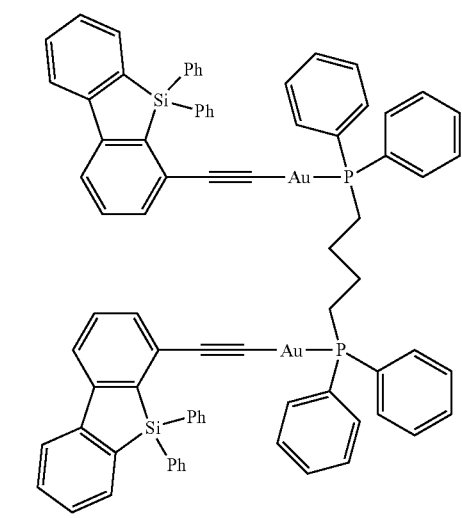
344
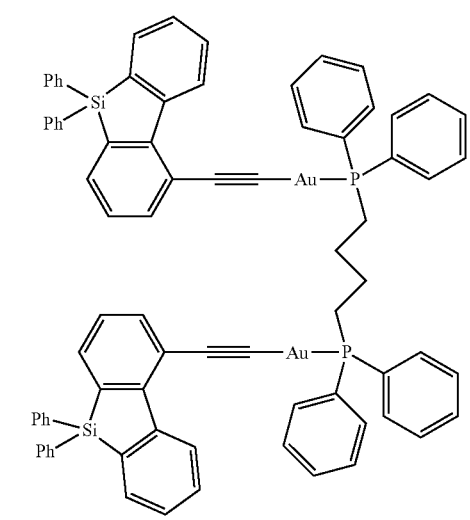
345
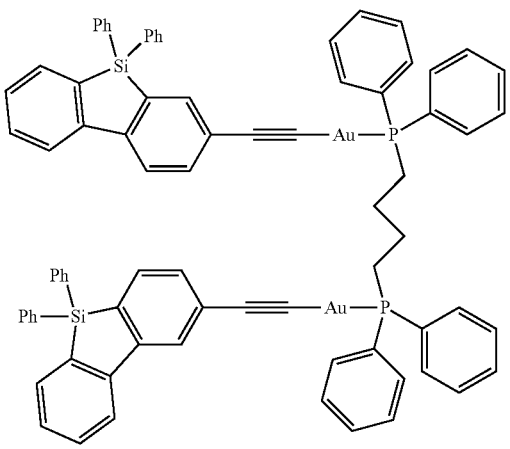
346
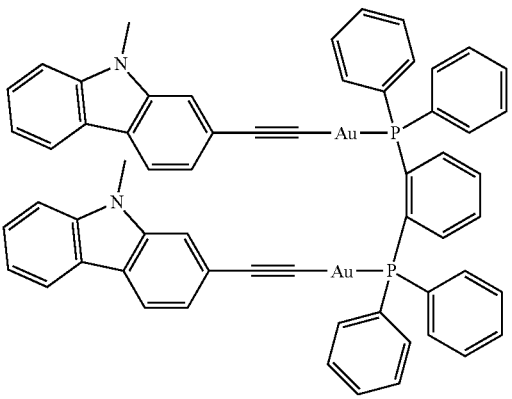
347
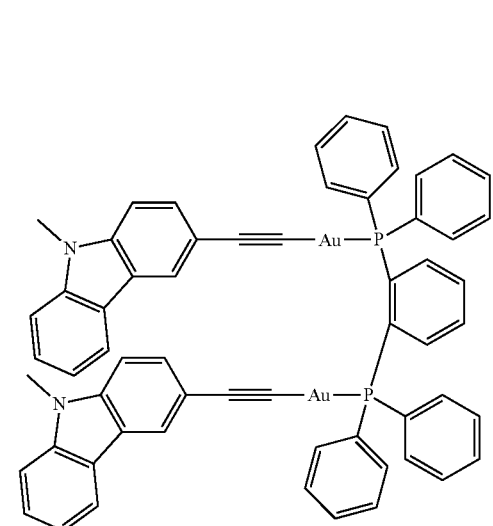

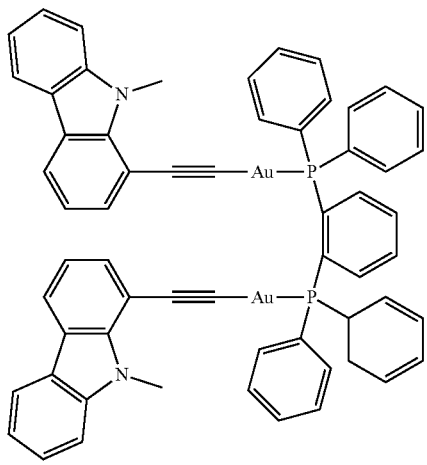
348
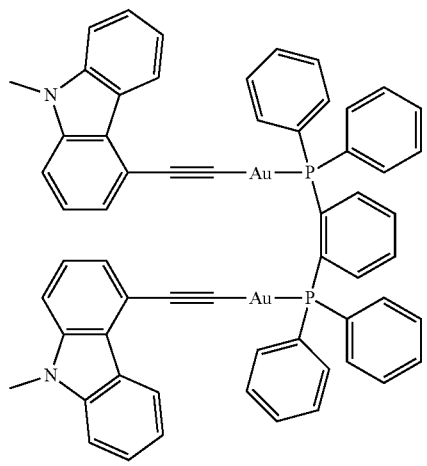
349
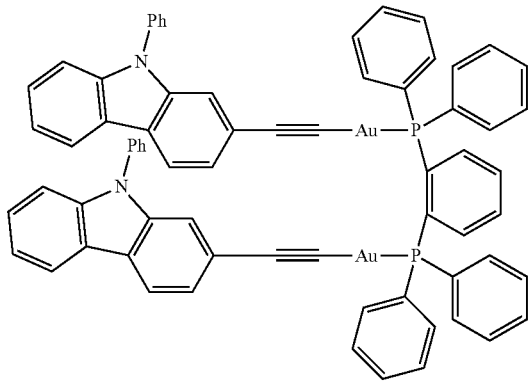
351
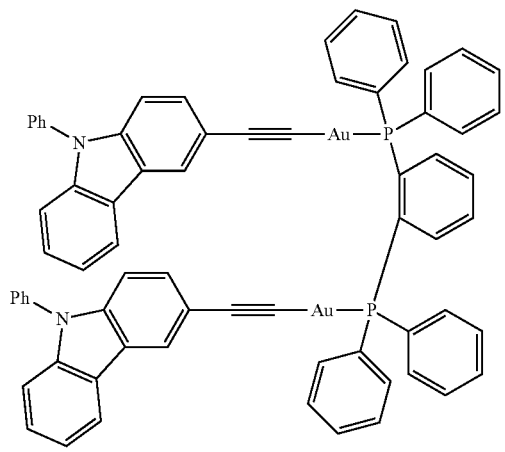
352
350
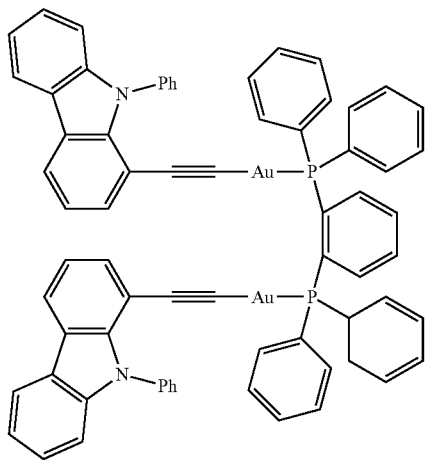
353

354
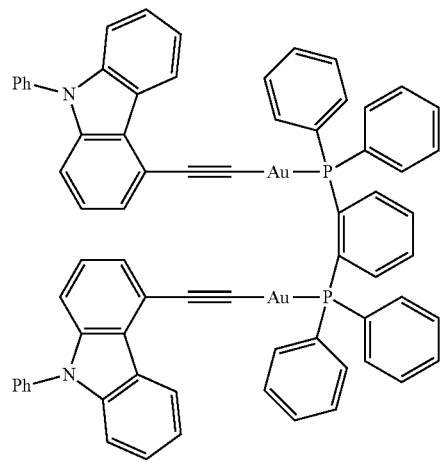
355
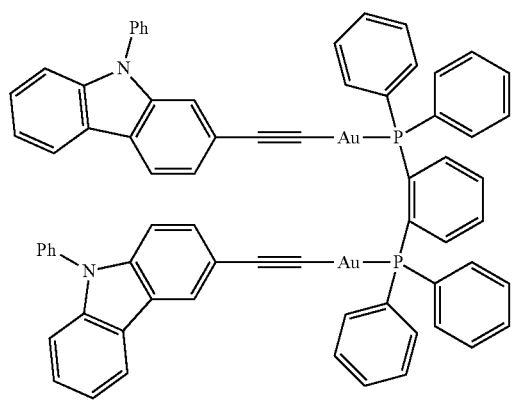
356
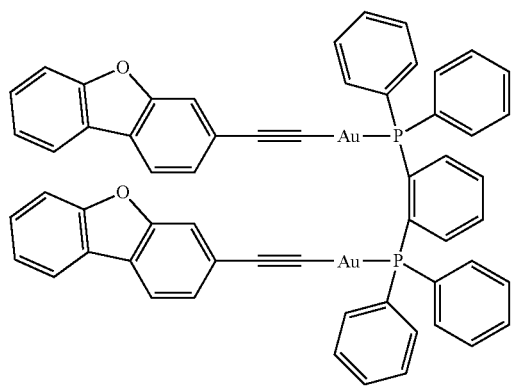
357
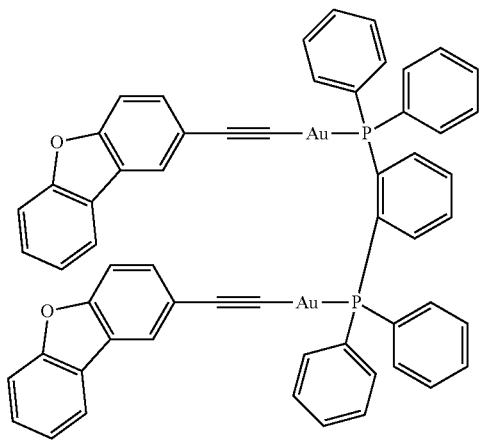
358
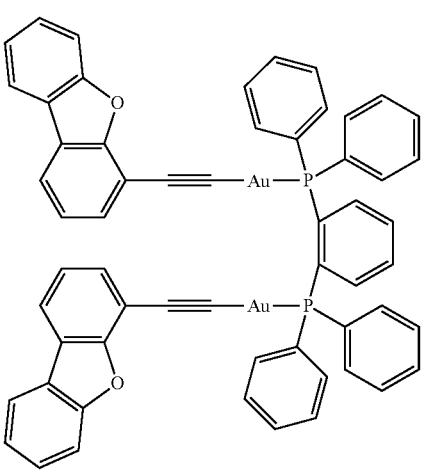
359
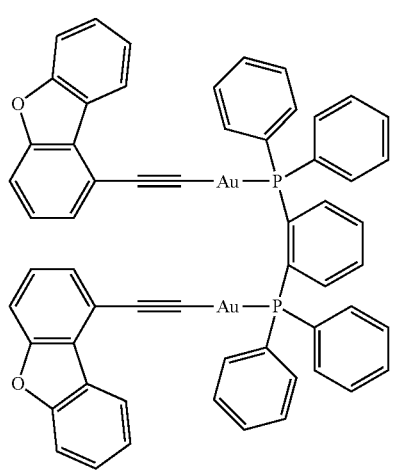

157
-continued
360
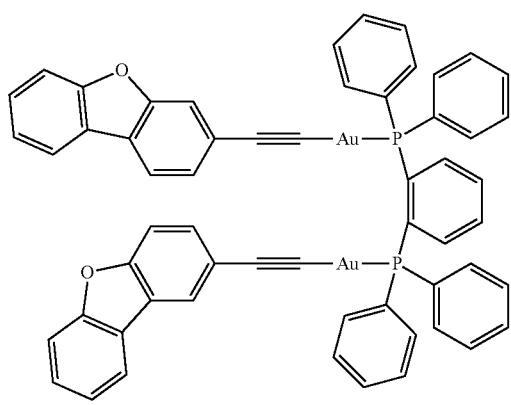
361
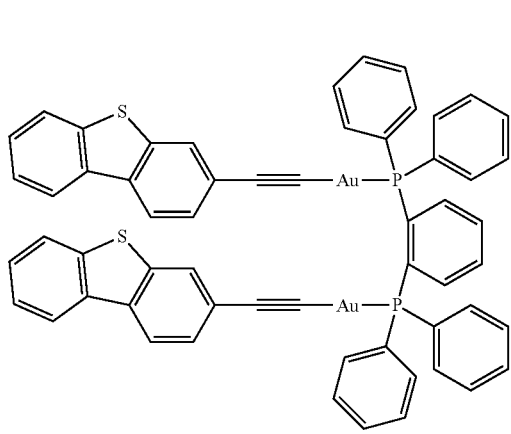
362
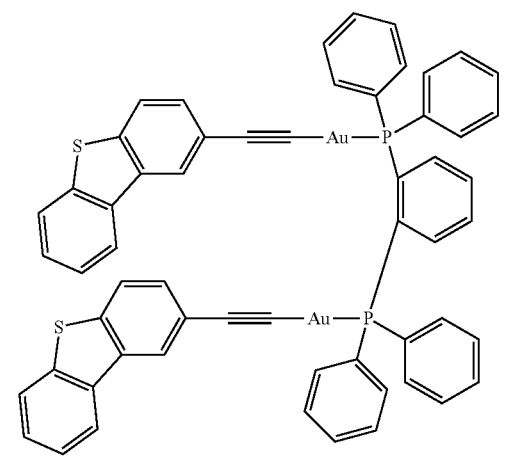
158
-continued
363
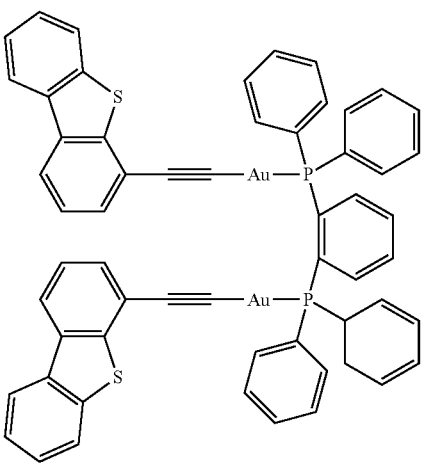
364
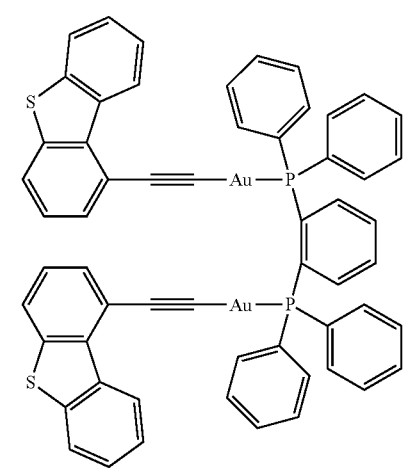
365
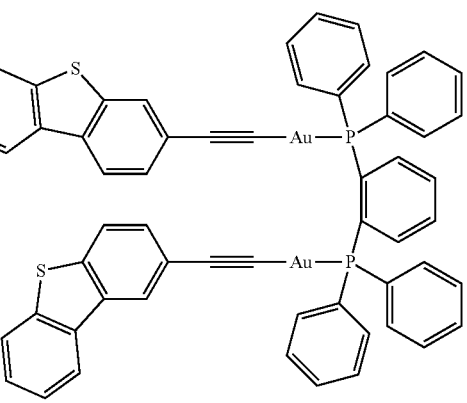

366
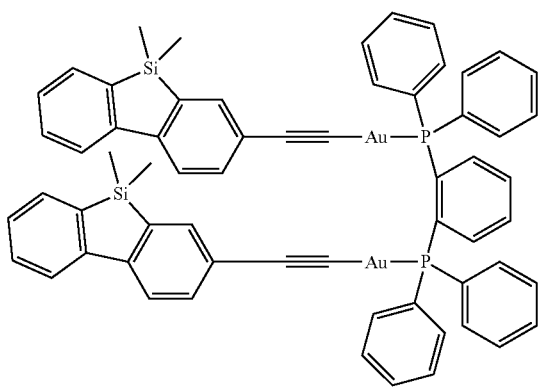
367
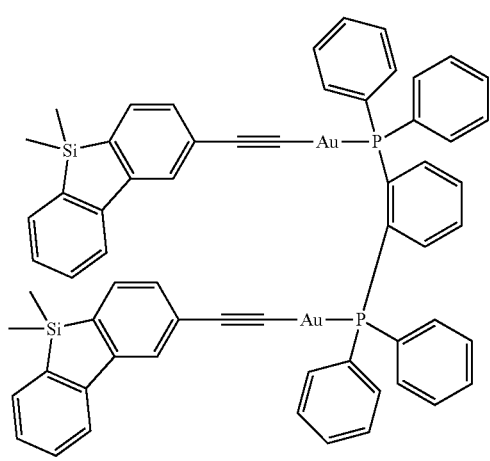
368
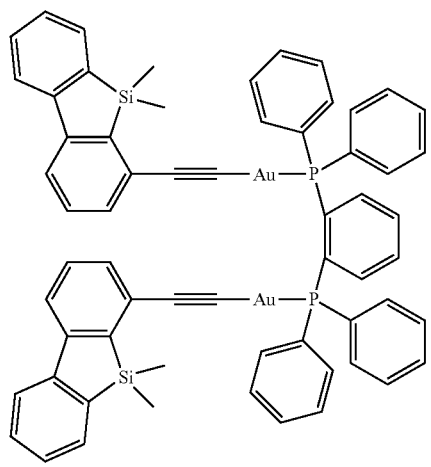
369
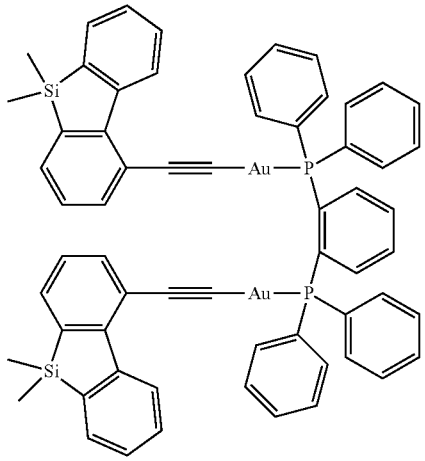
370
371
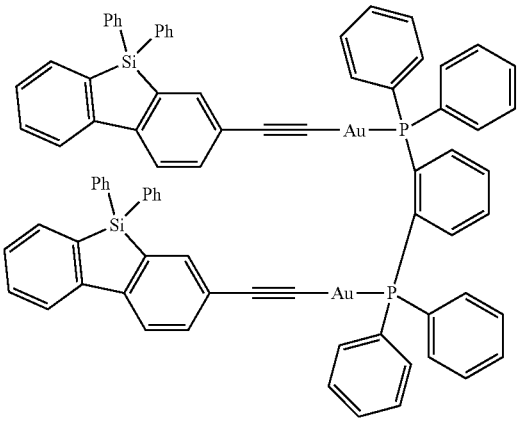

161
-continued
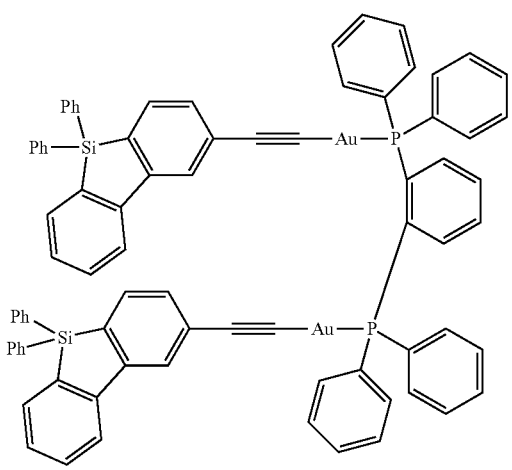
372
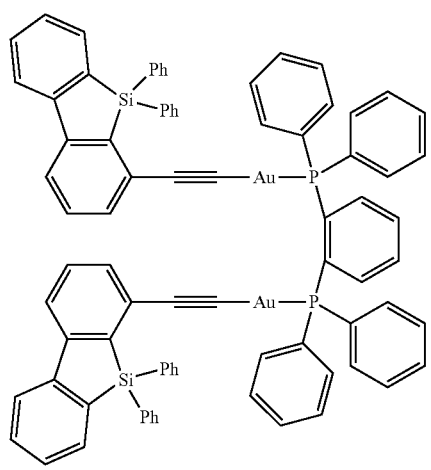
373
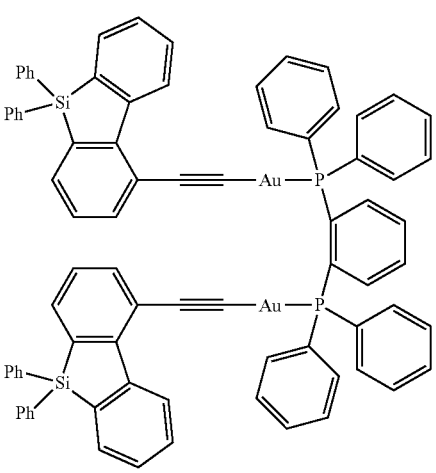
374
162
-continued
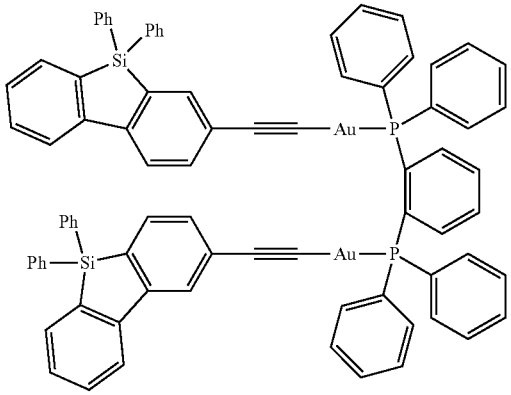
375
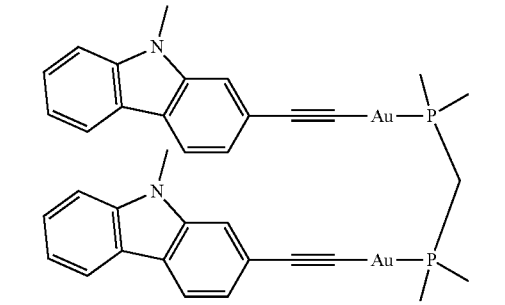
376
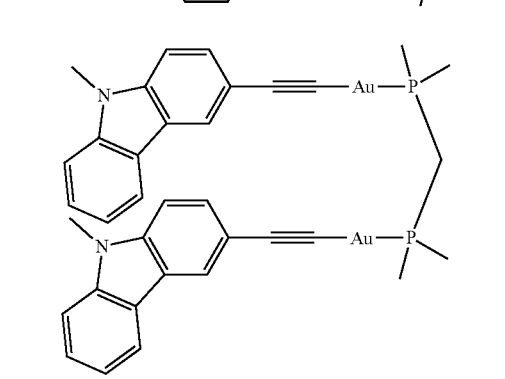
377
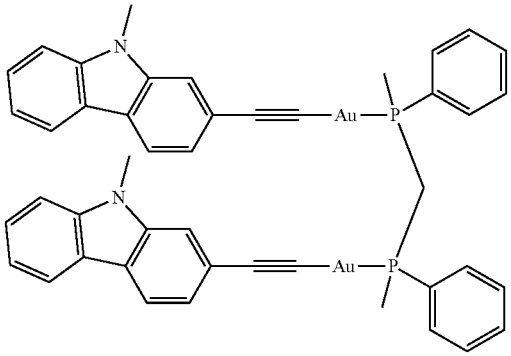
378

379
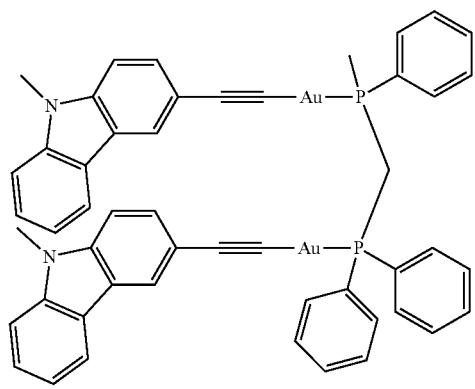
380
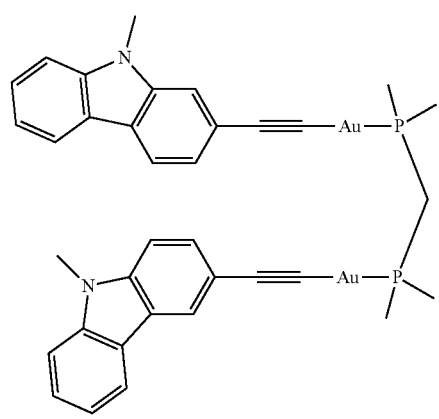
381
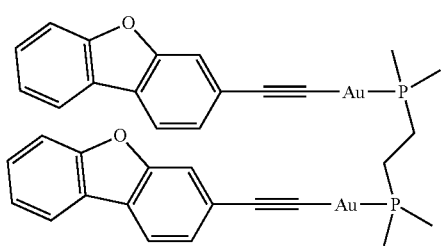
382
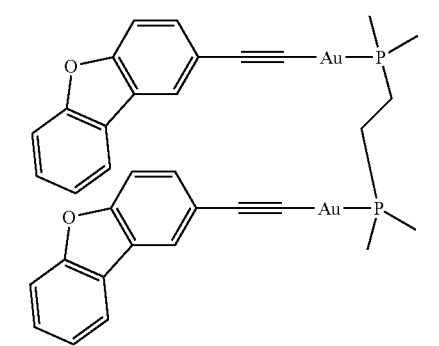
383
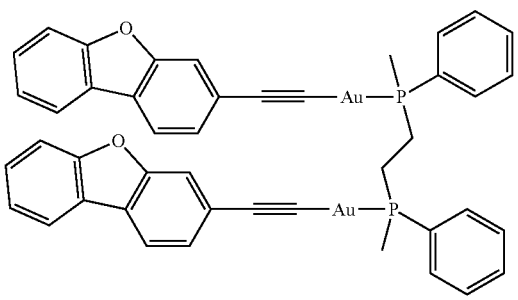
384
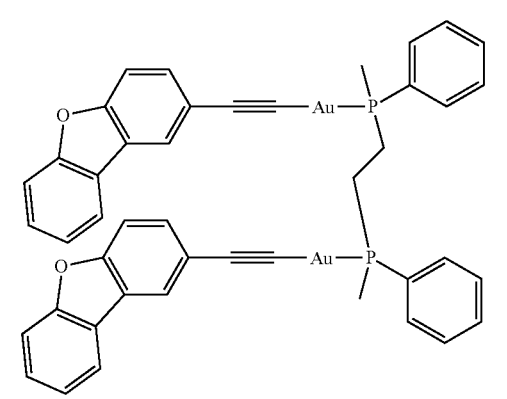
385
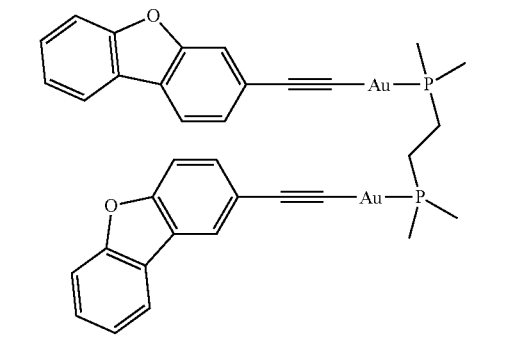
386
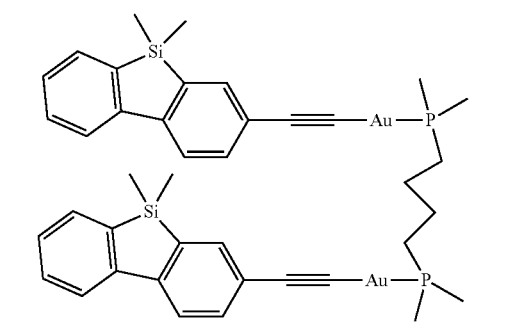

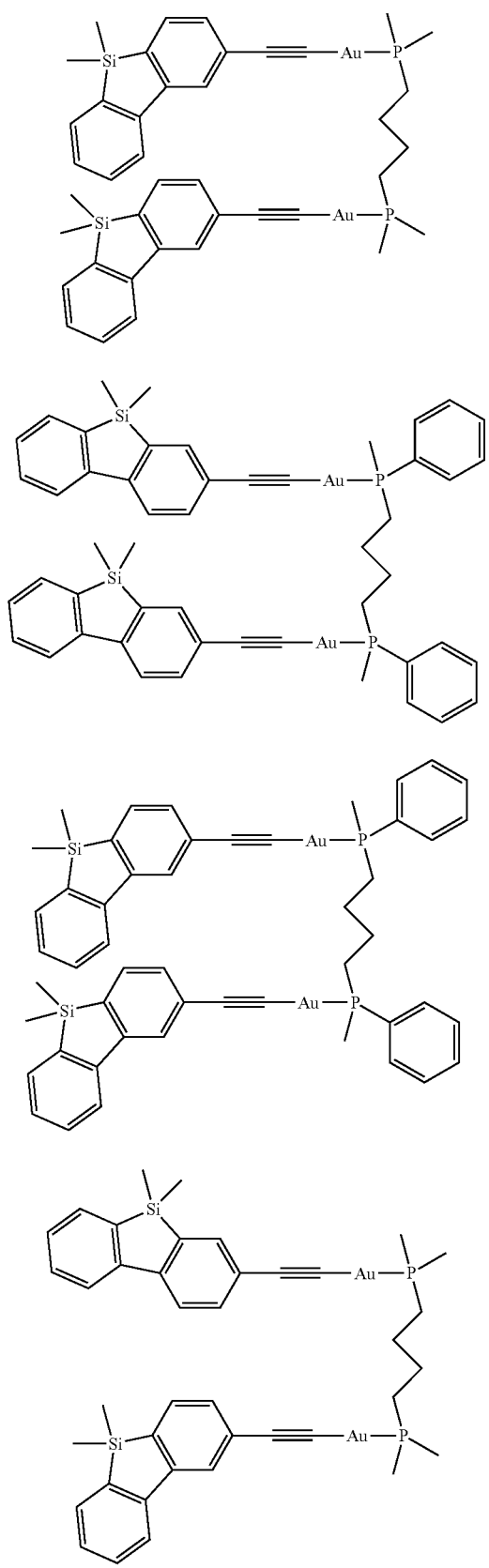
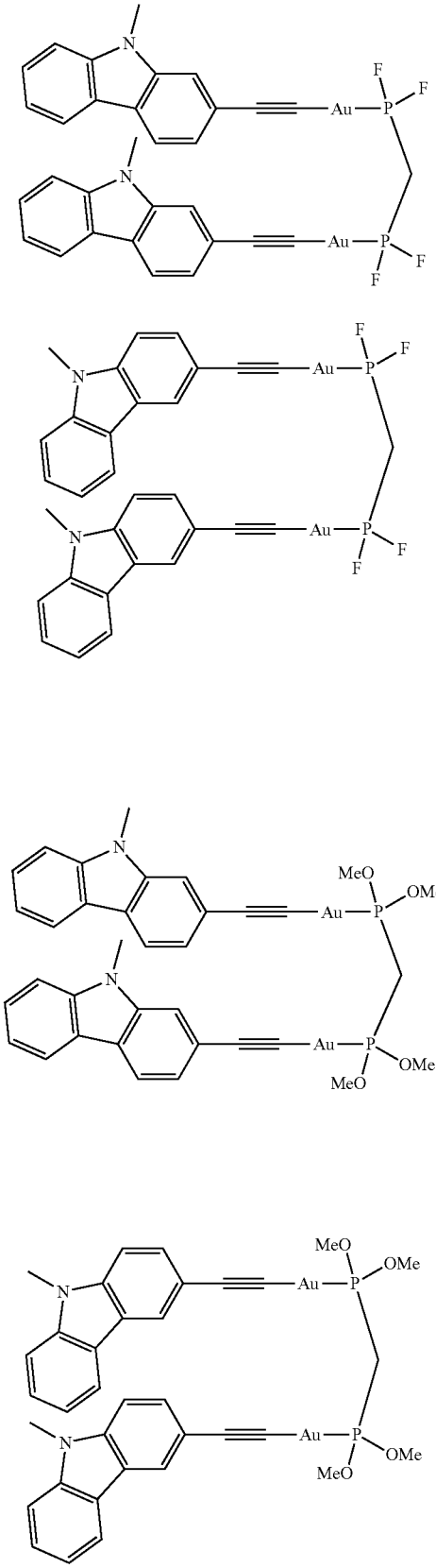

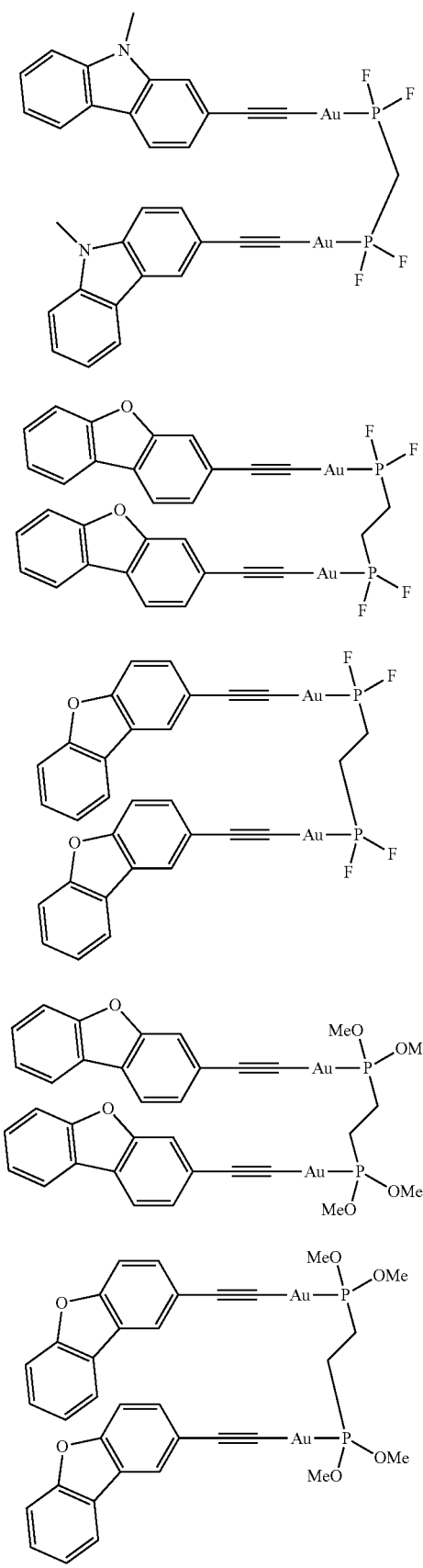
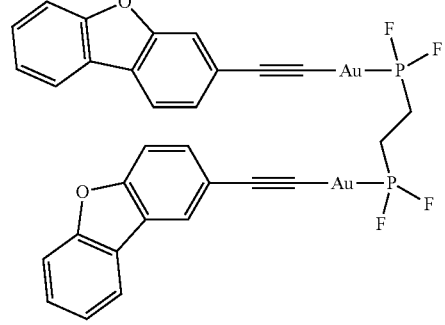
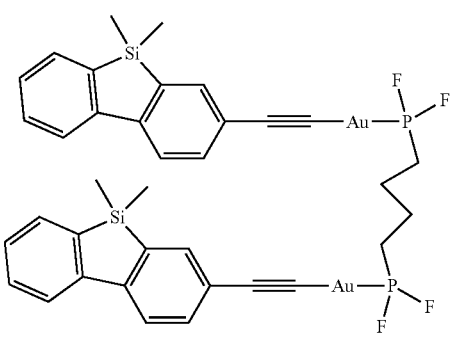
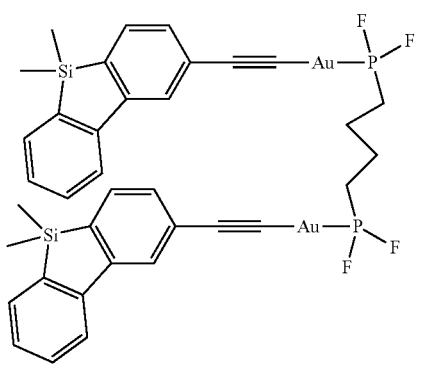
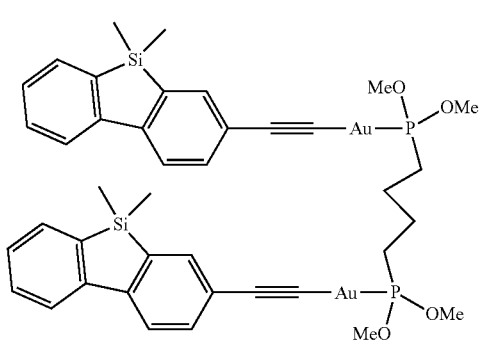

404
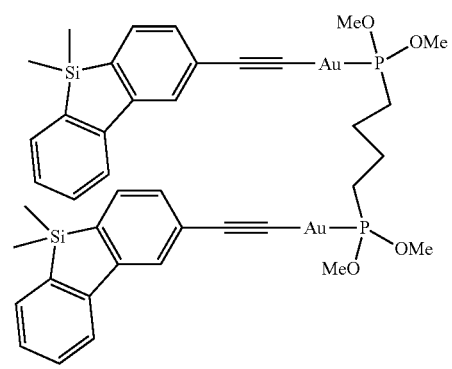
405
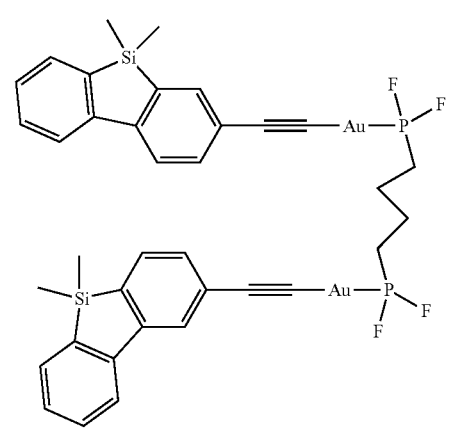
406
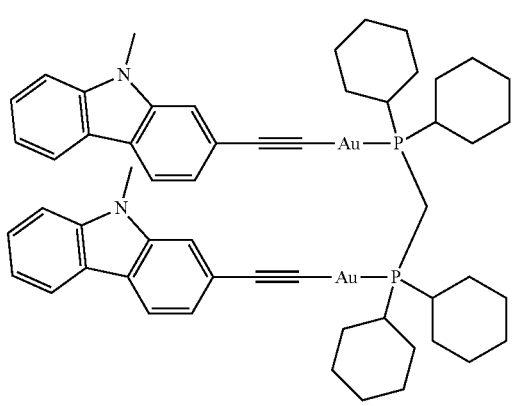
407
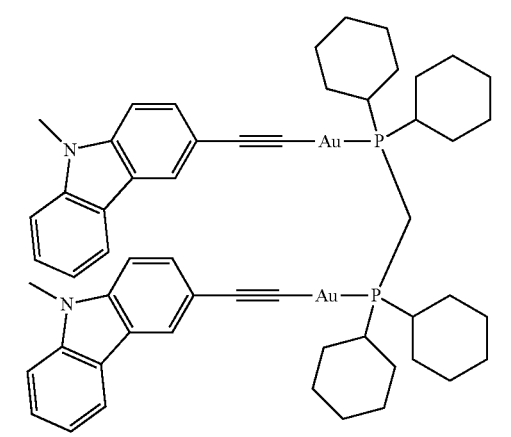
408
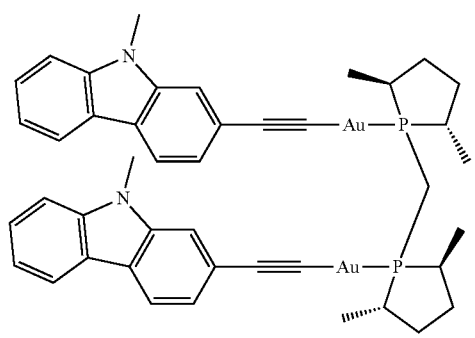
409
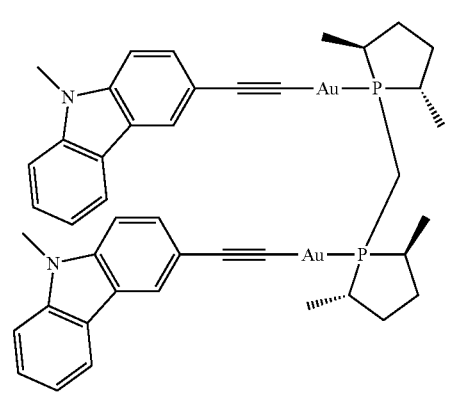
410
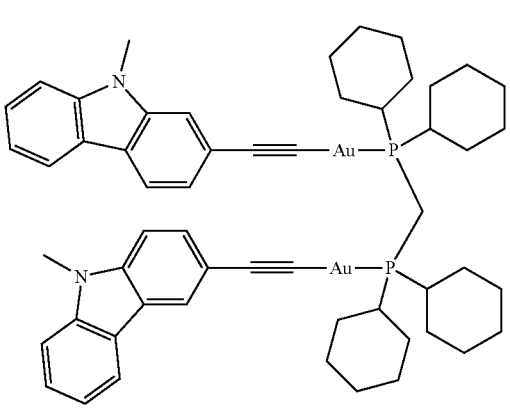
411
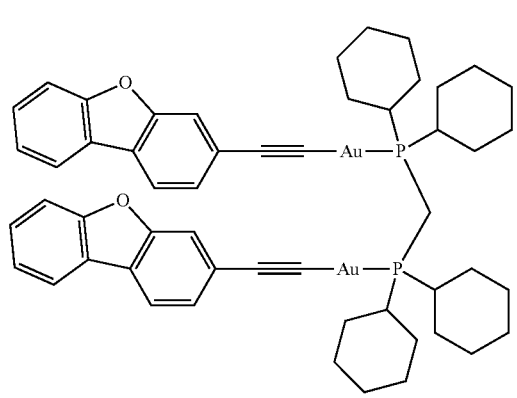

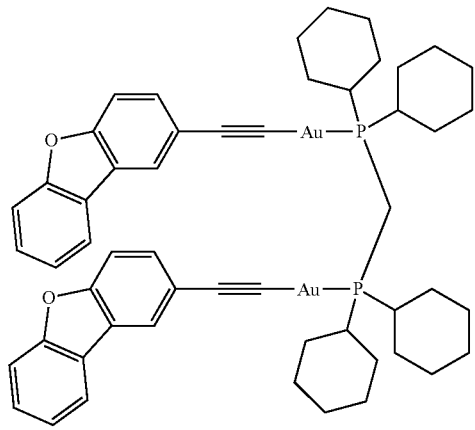
412
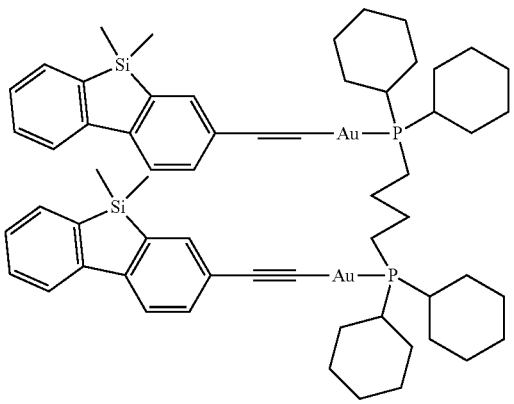
416
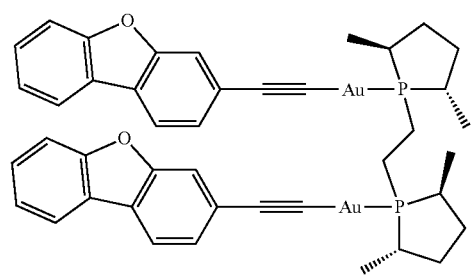
413
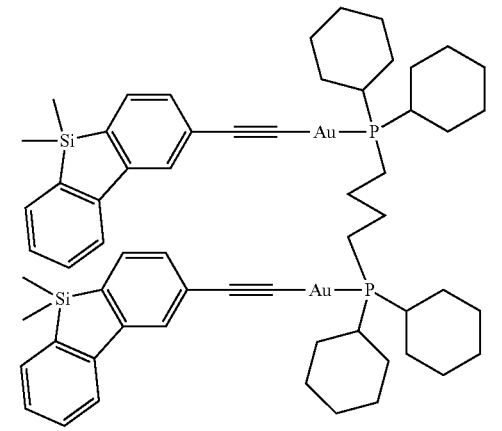
417
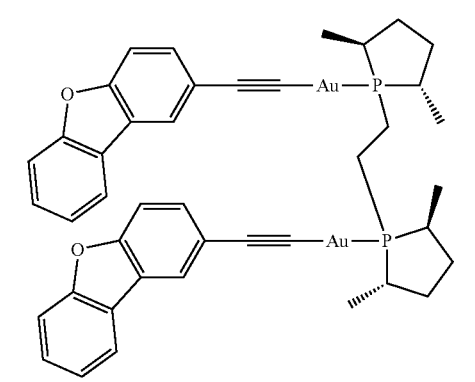
414
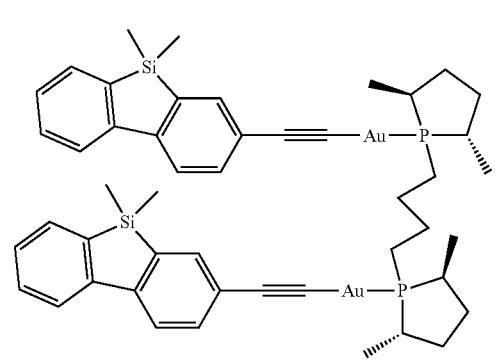
418
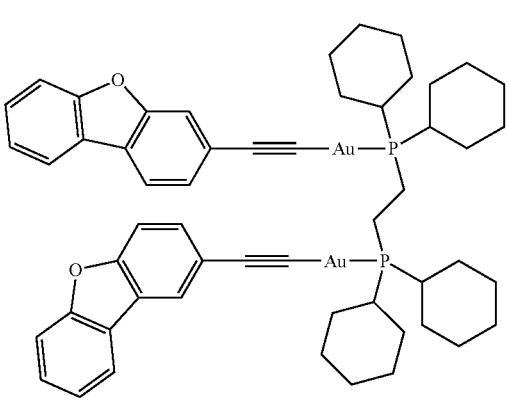
415
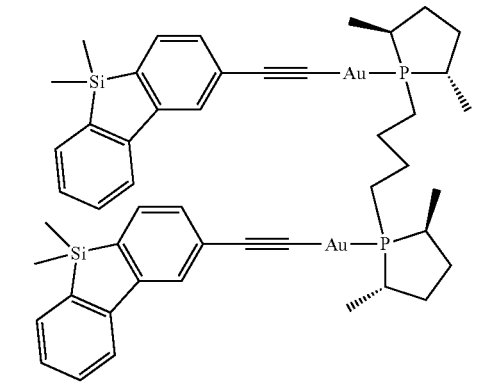
419

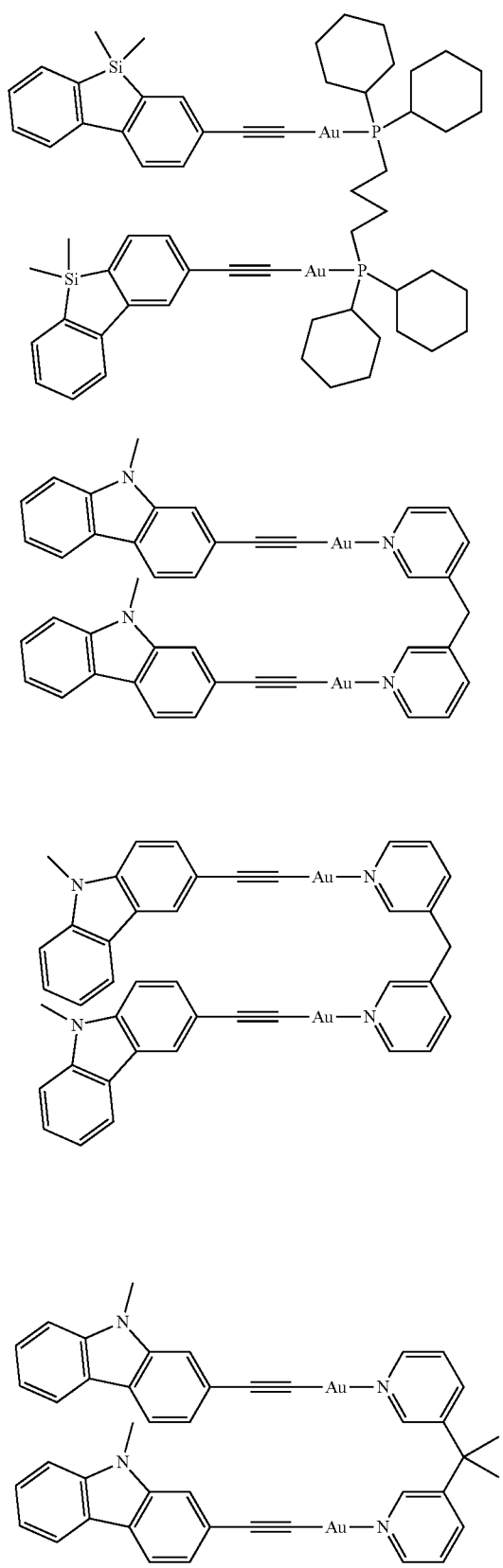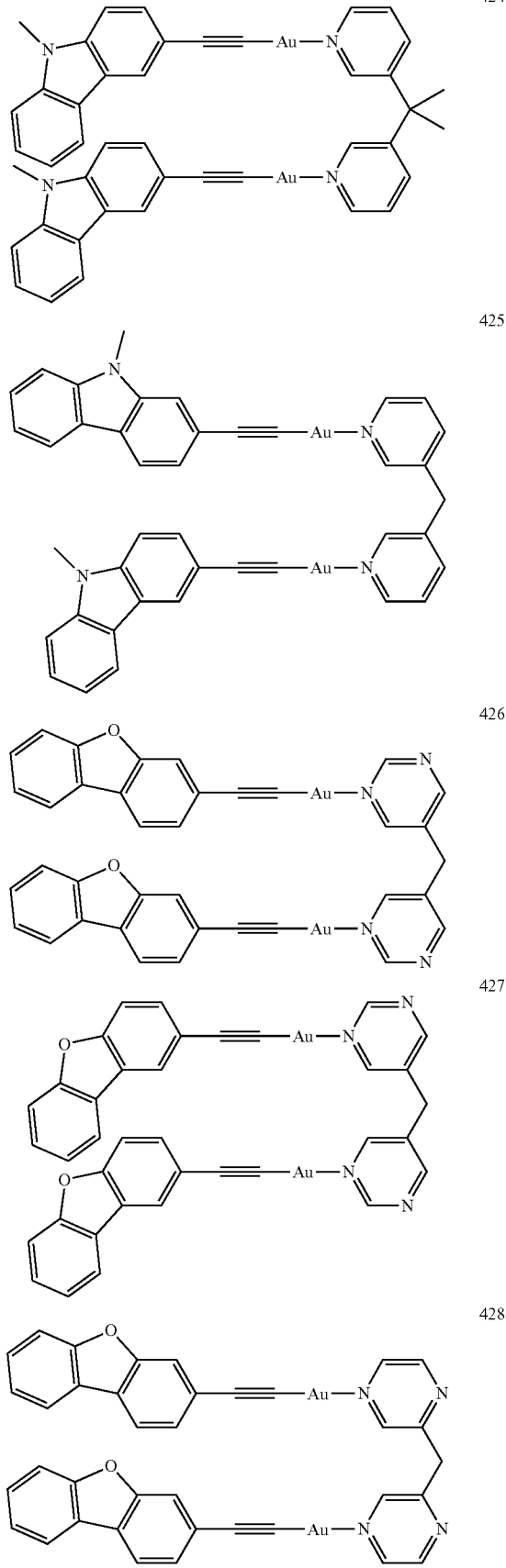

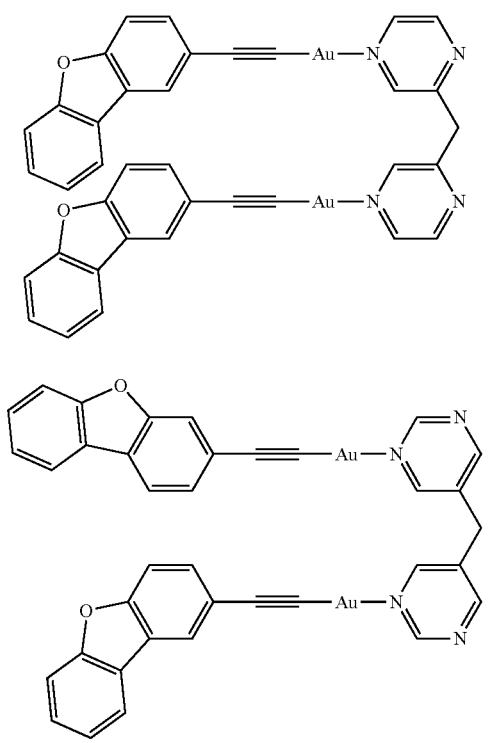
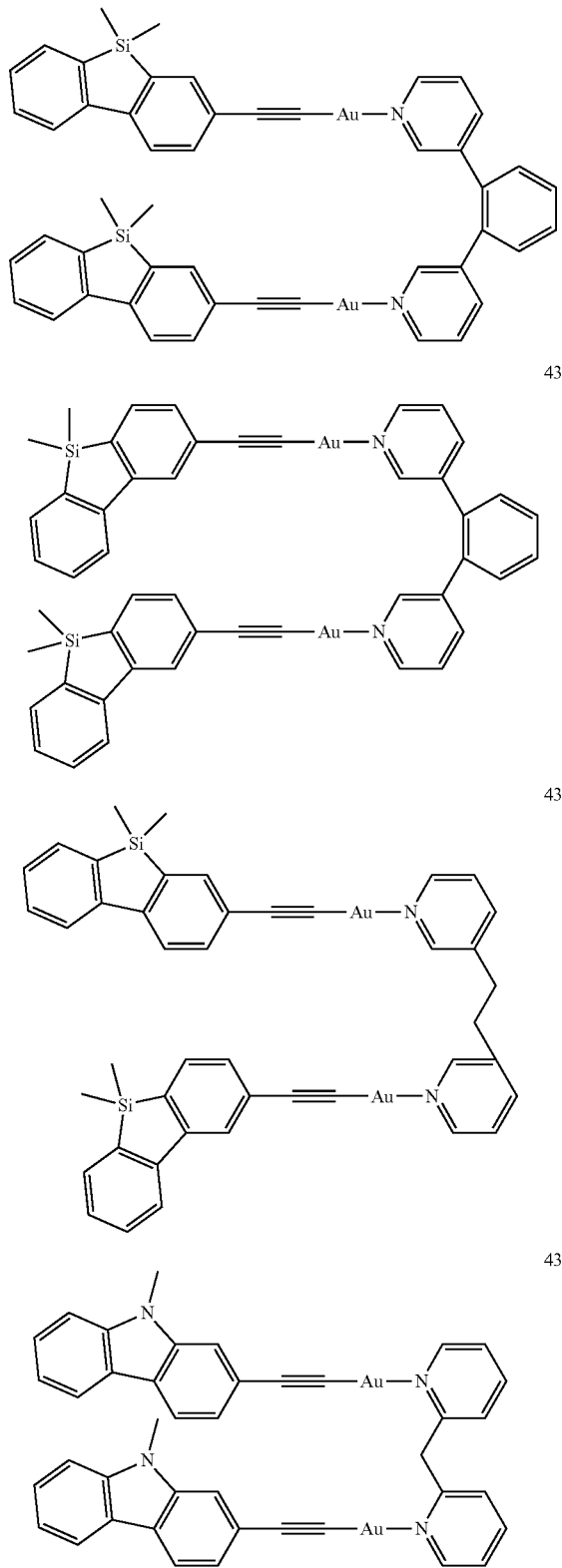

437
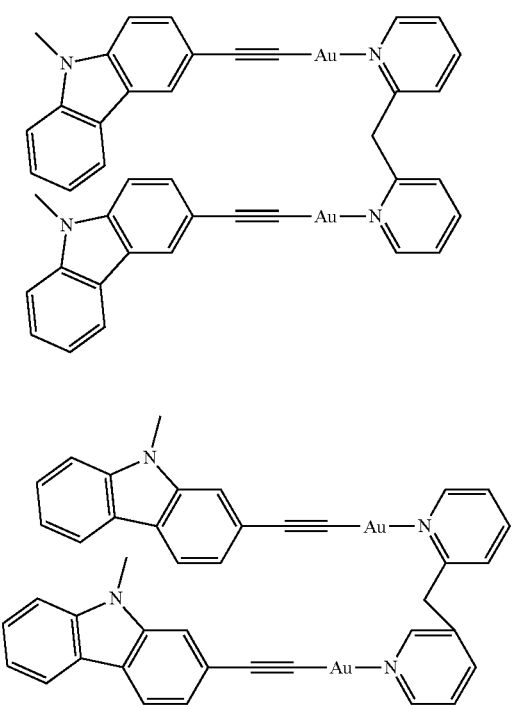
438
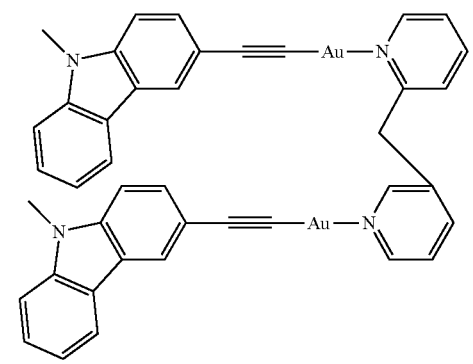
439
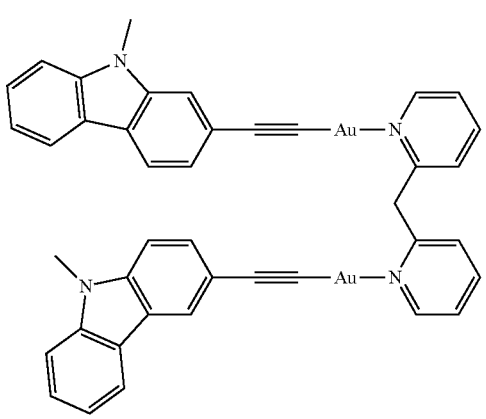
440
441
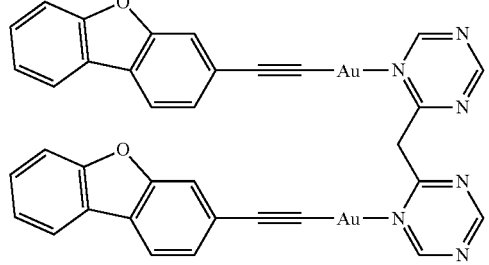
442
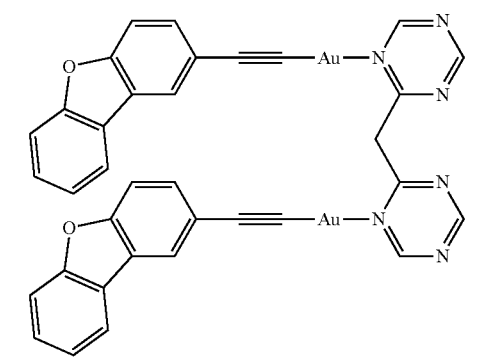
443
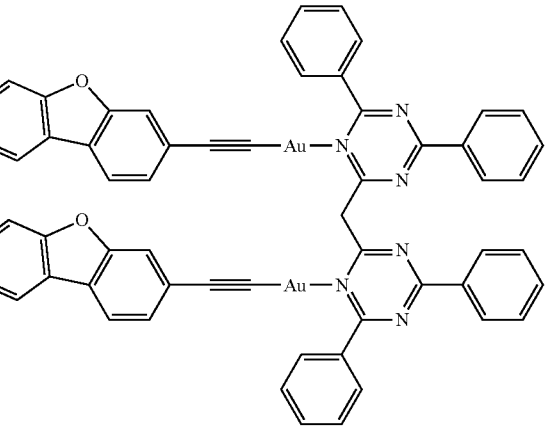
444
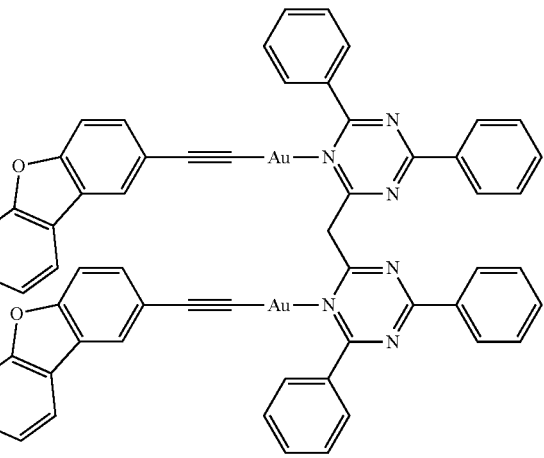

-continued

453
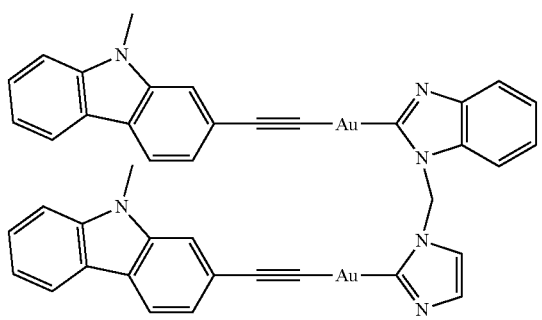
454
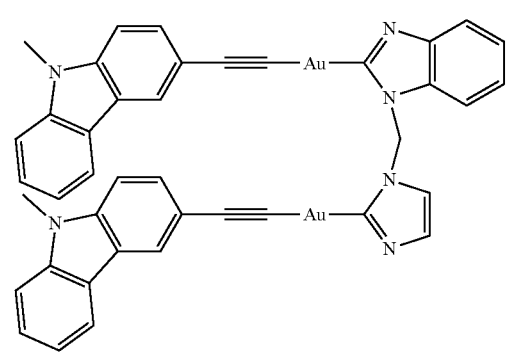
455
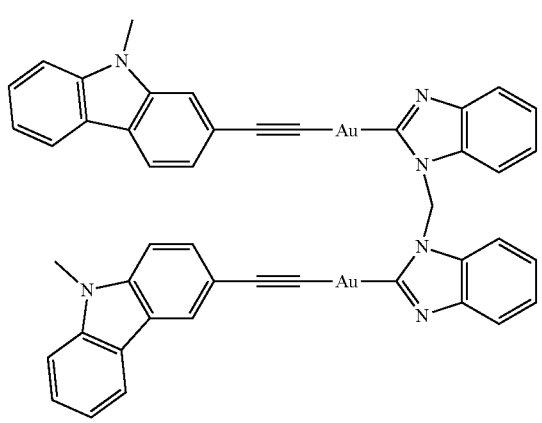
456
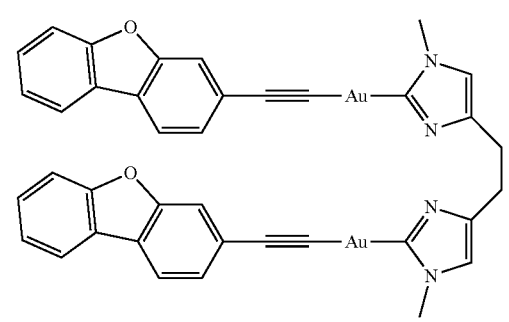
457
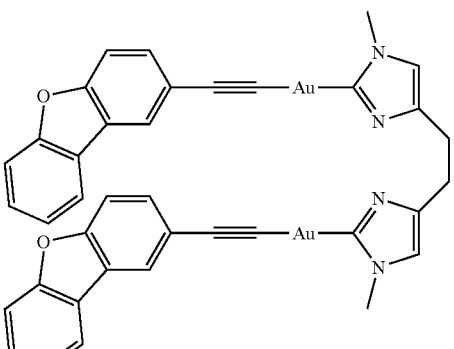
458
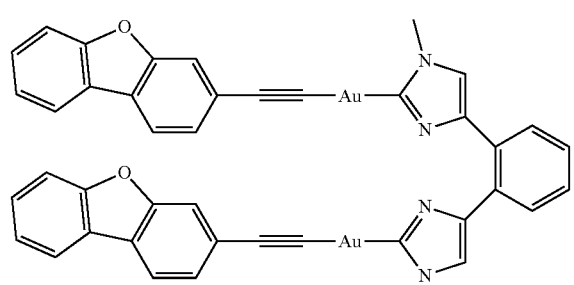
459
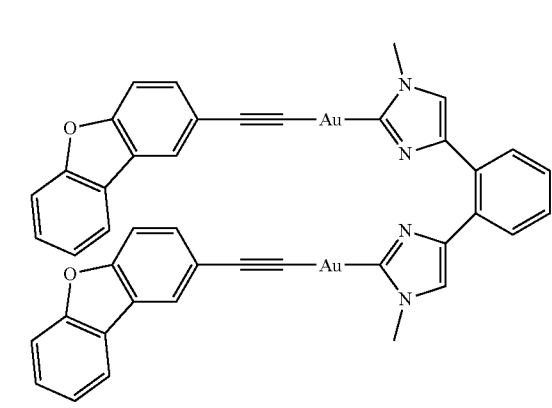
460
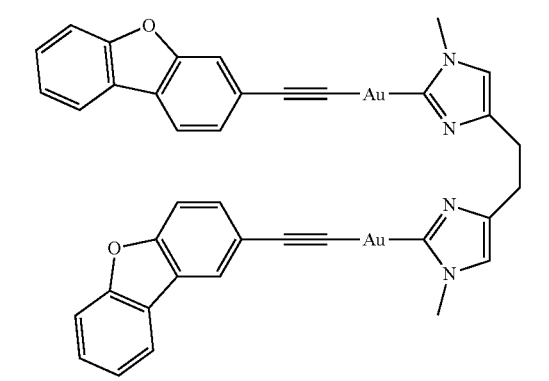

461
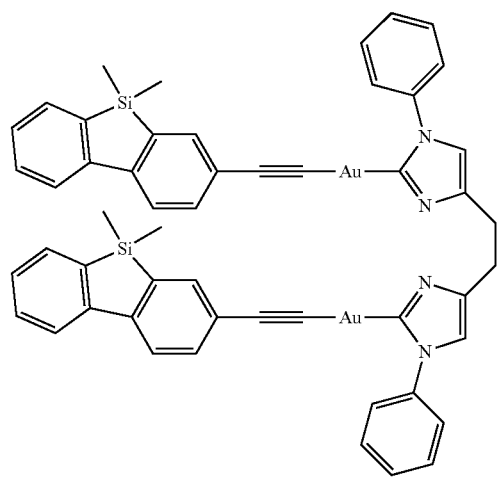
462
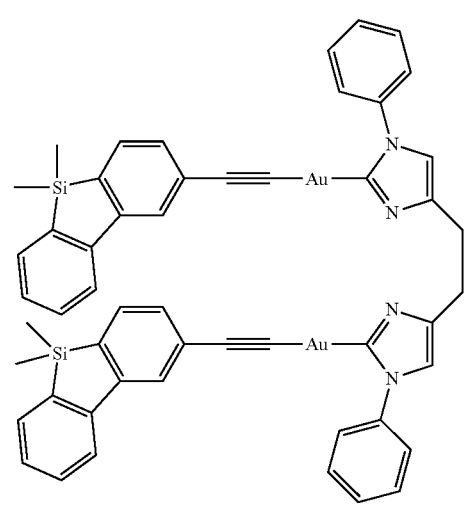
463
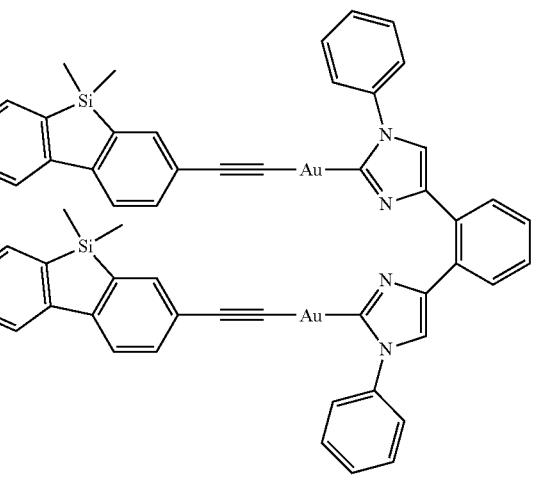
464
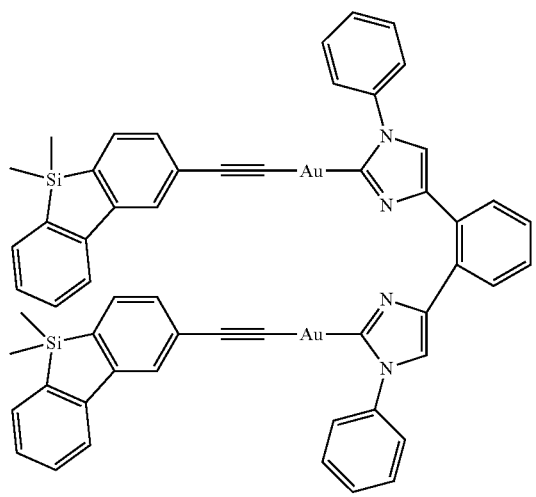
465
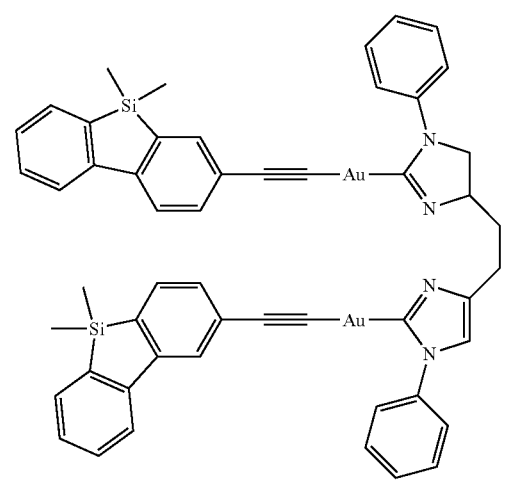
466
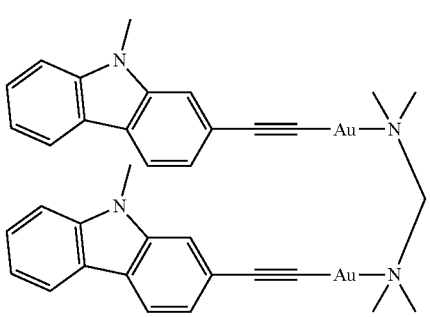
467
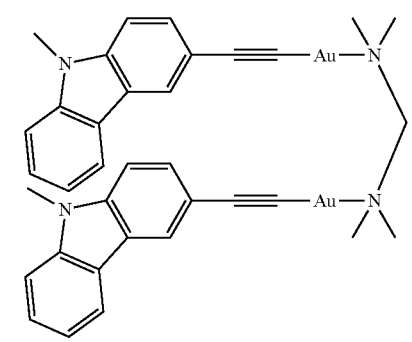

468
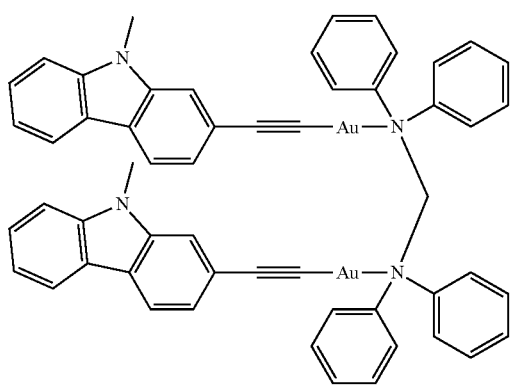
469
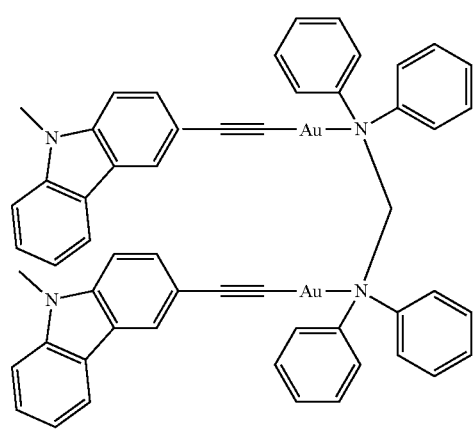
470
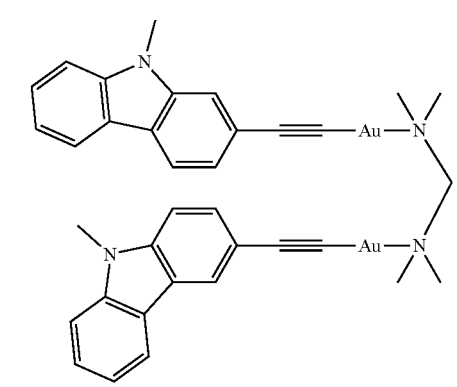
471
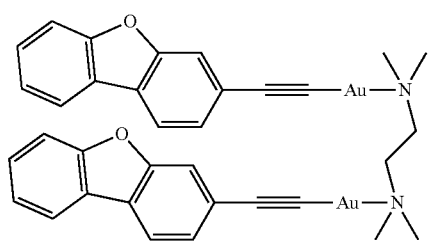
472
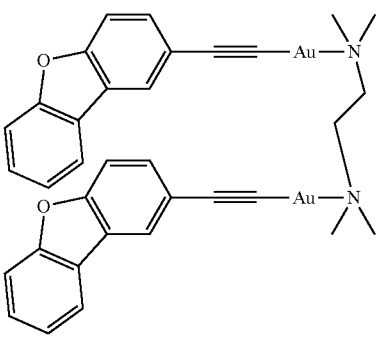
473
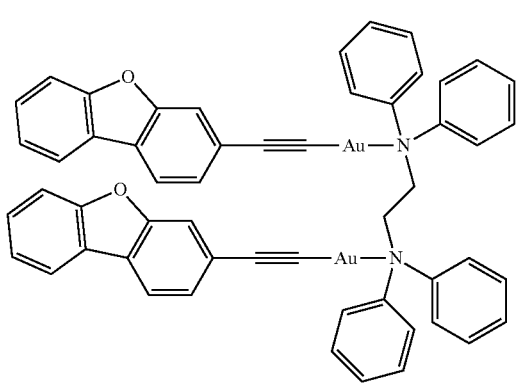
474
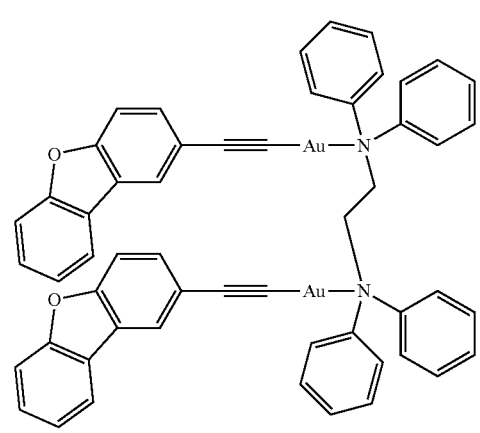
475
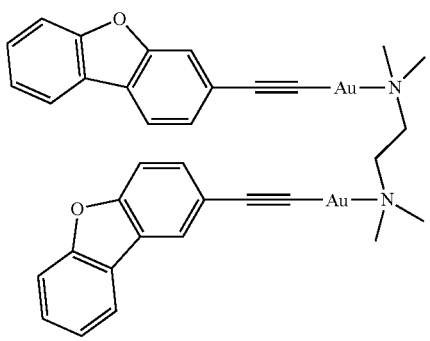

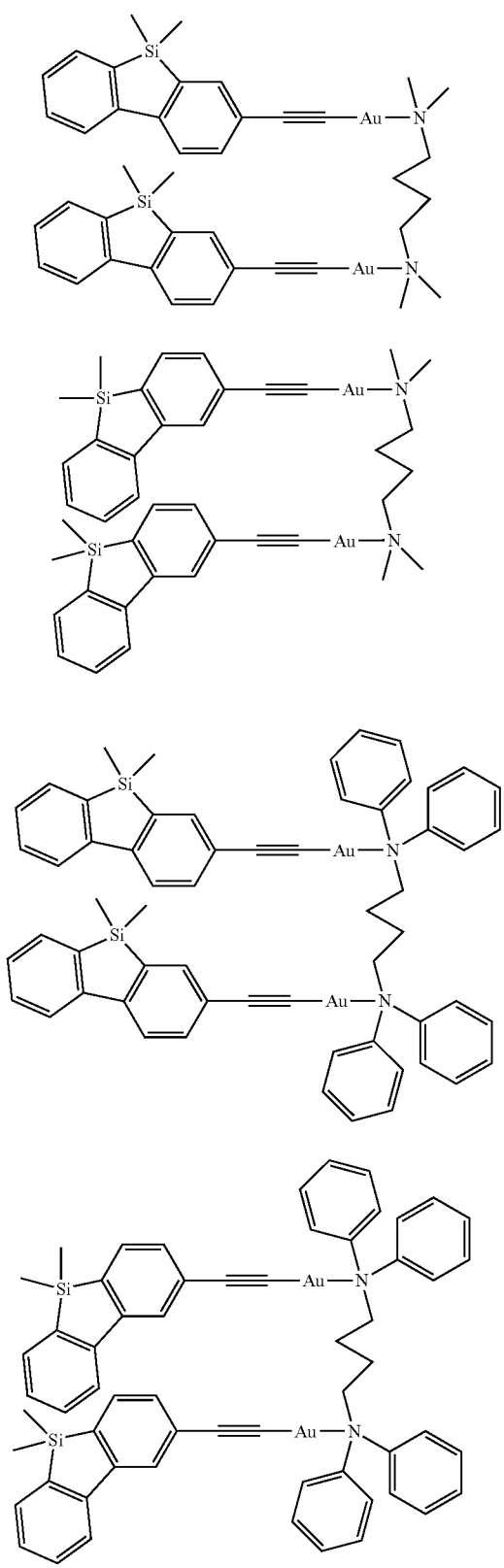
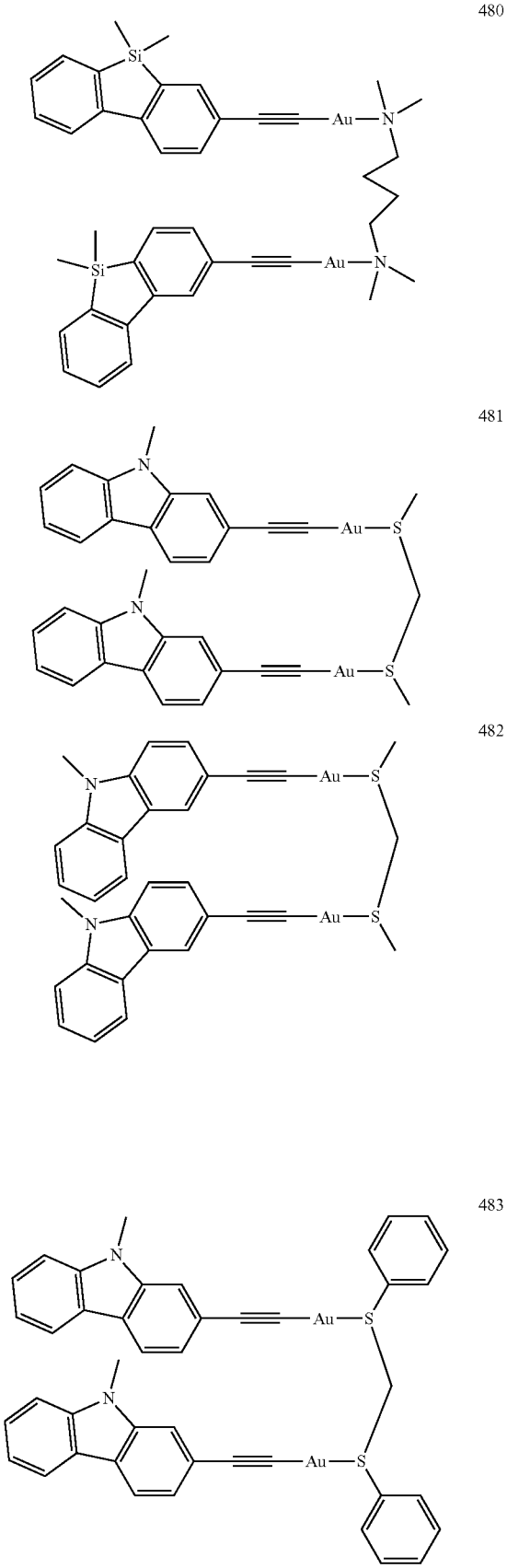

484
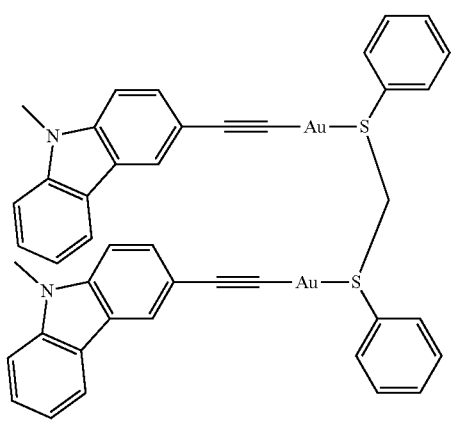
485
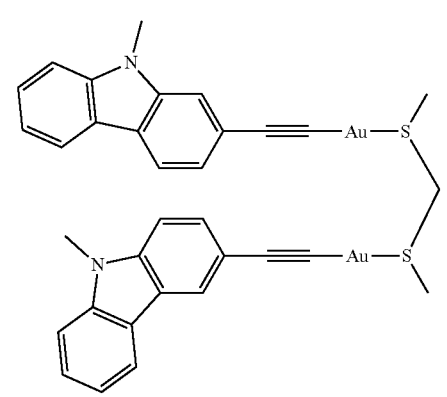
486
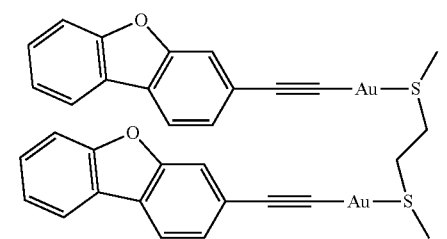
487
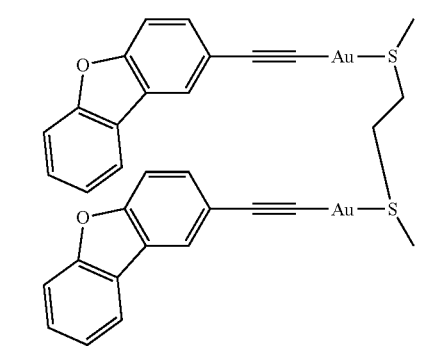
488
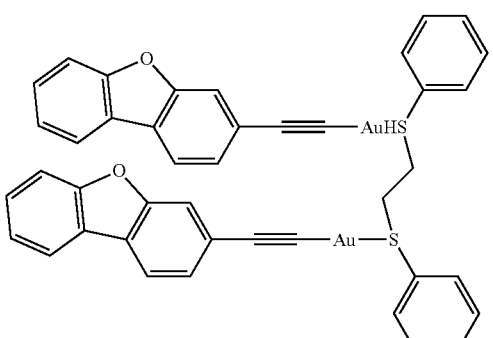
489
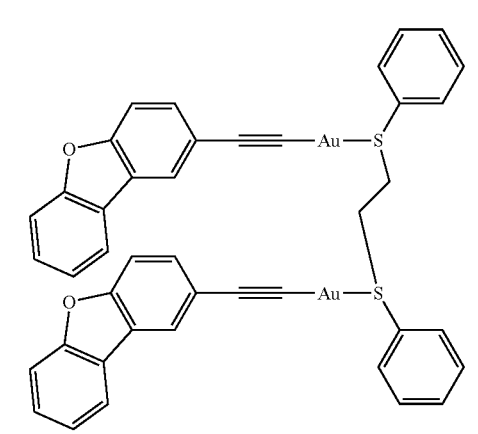
490
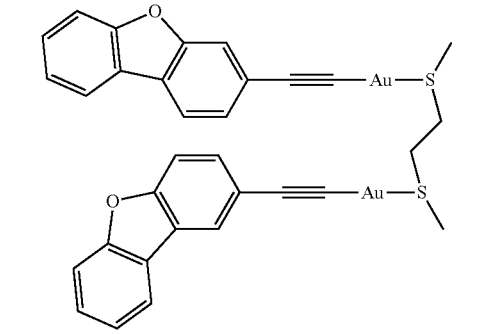
491
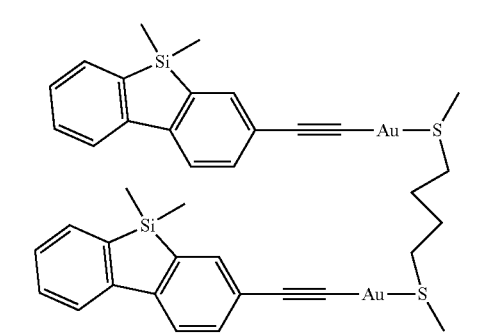

191
-continued
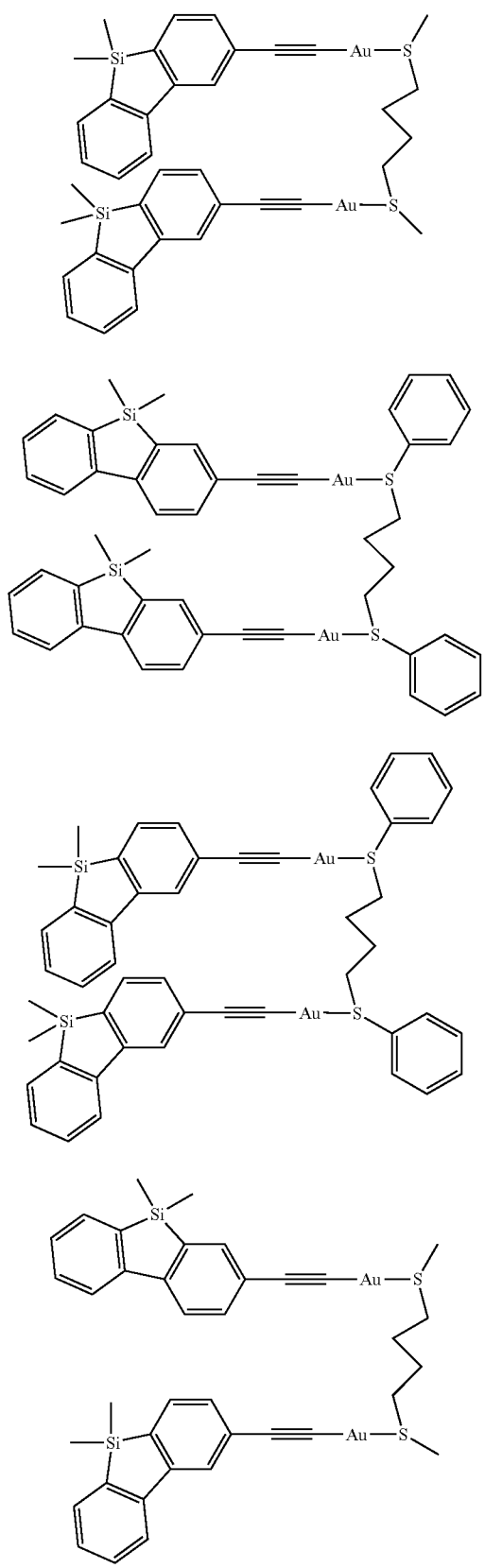
192
-continued
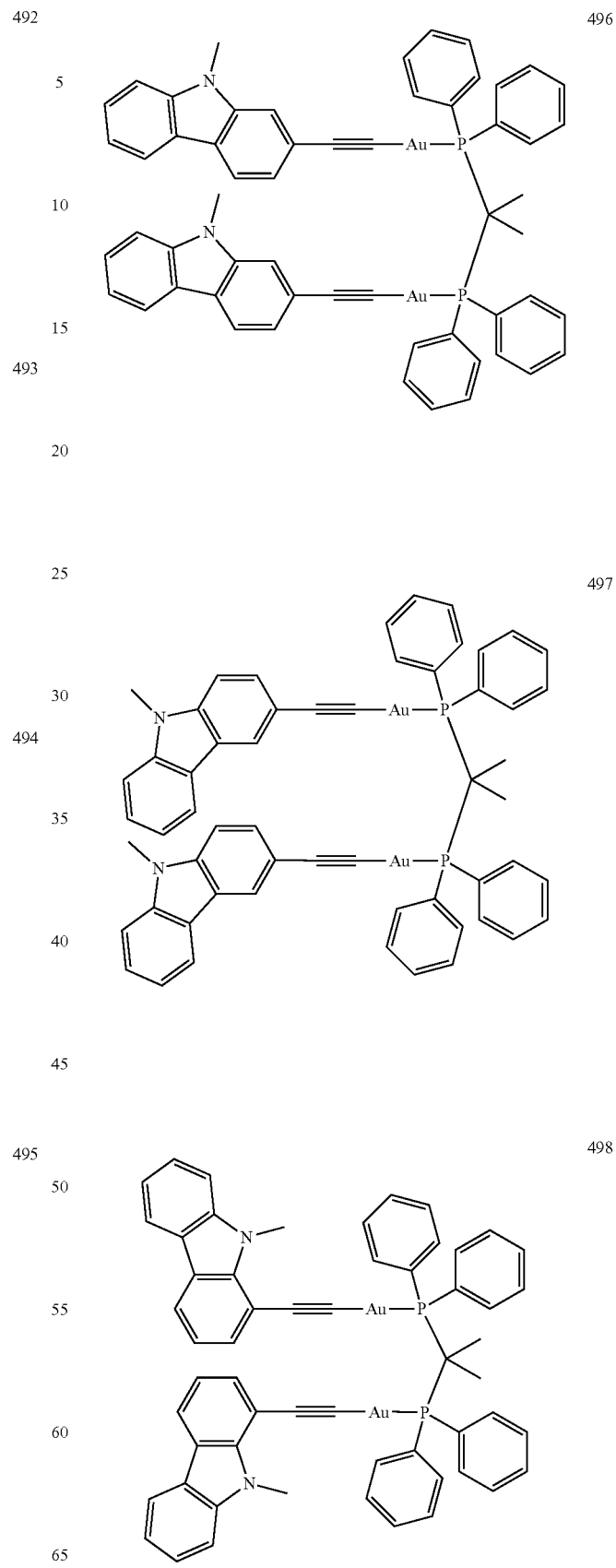

193
-continued
499
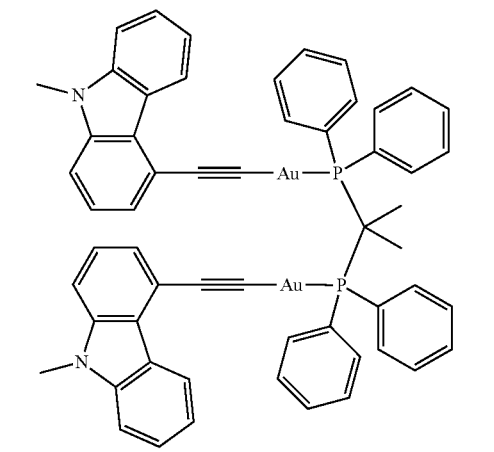
500
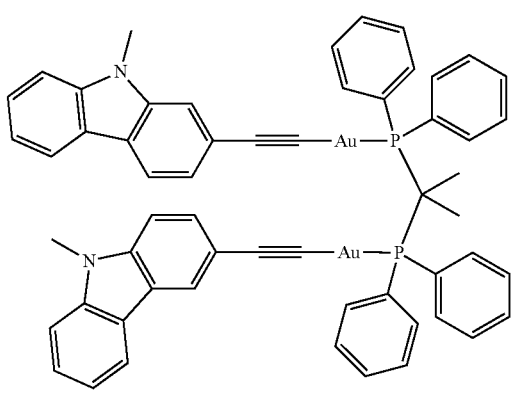
501
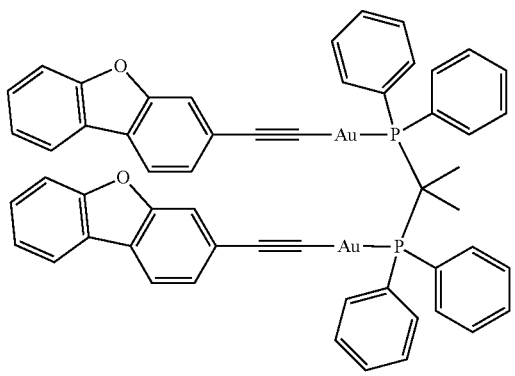
502
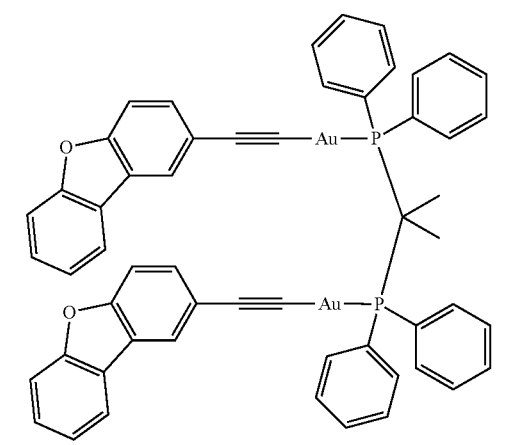
194
-continued
503
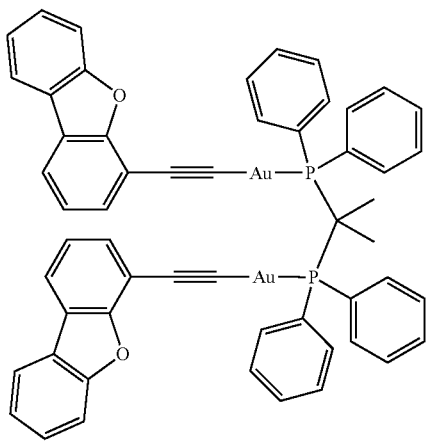
504
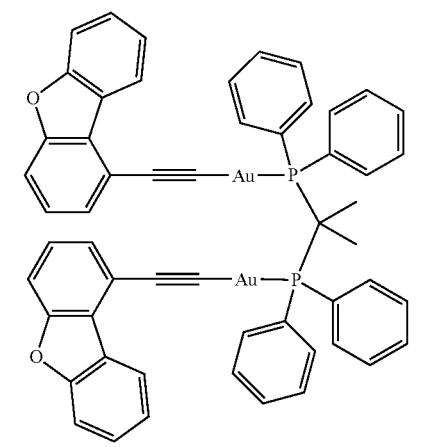
505
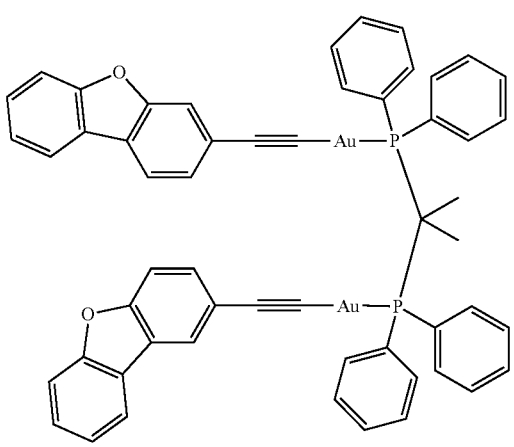

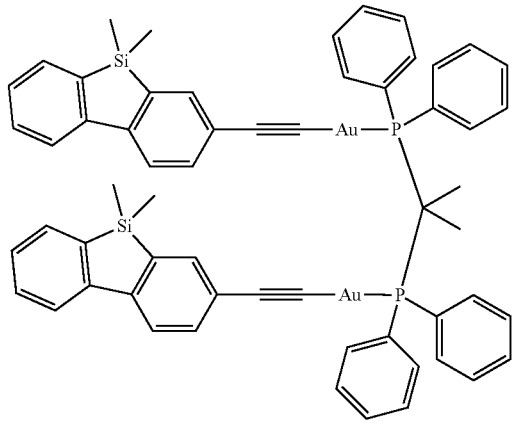
506
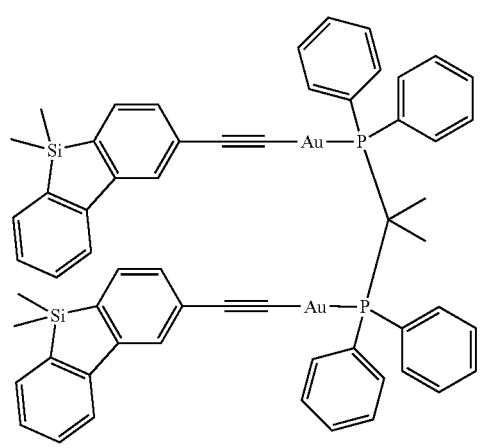
507
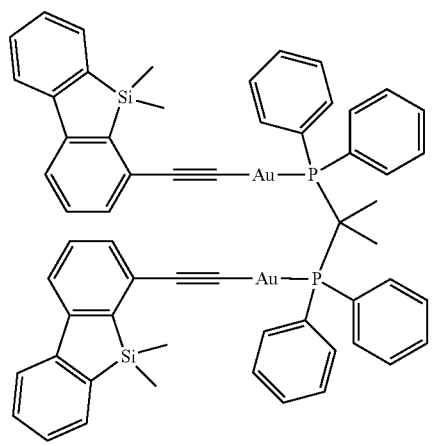
508
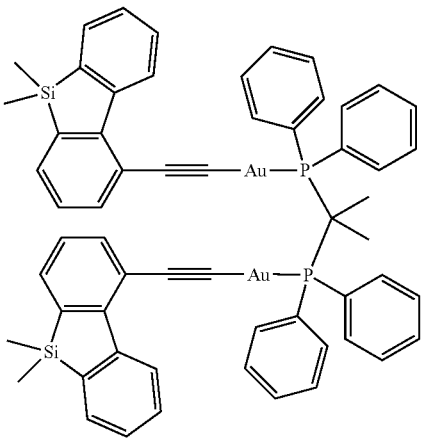
509
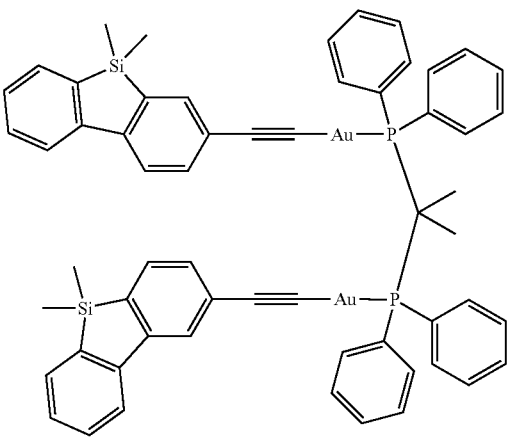
510
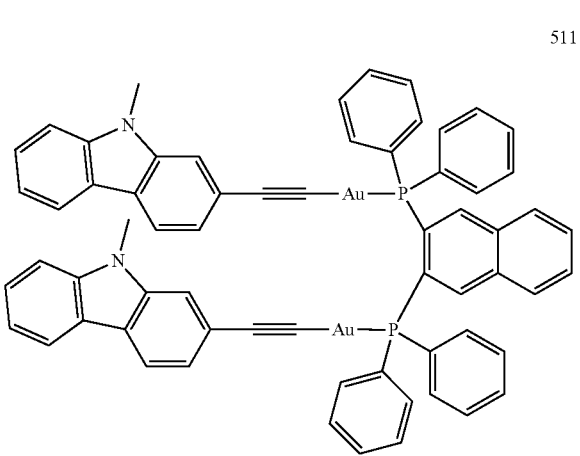
511

512
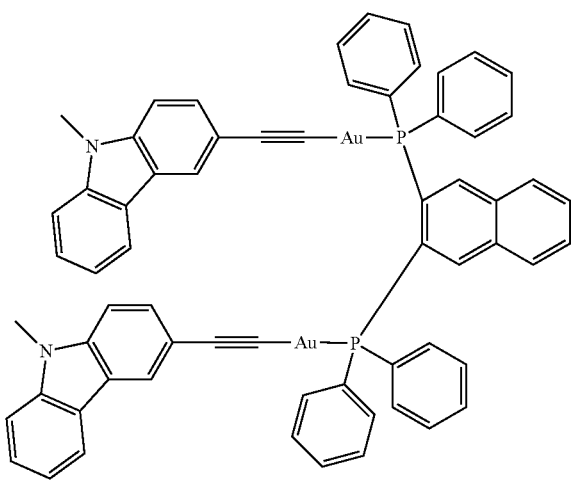
513
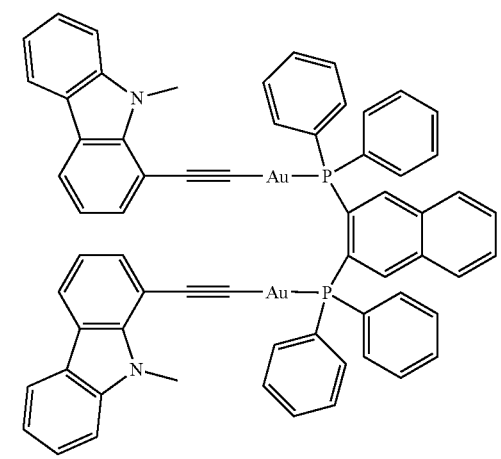
514
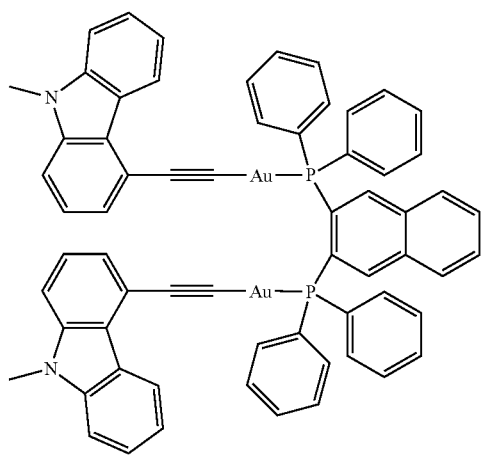
515
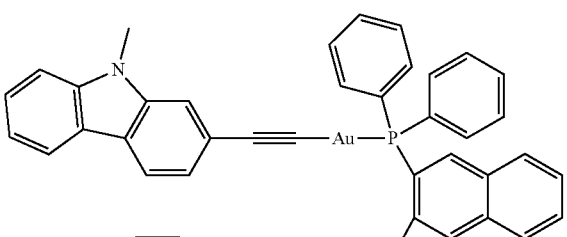
516
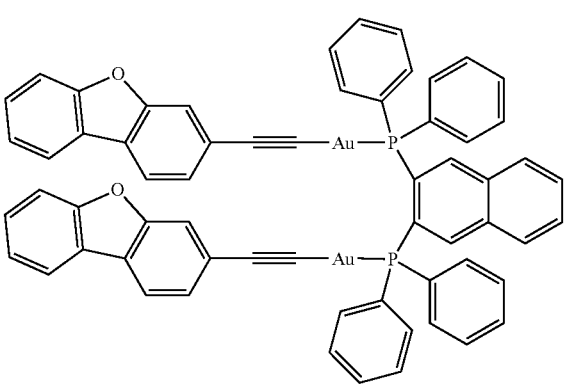
517
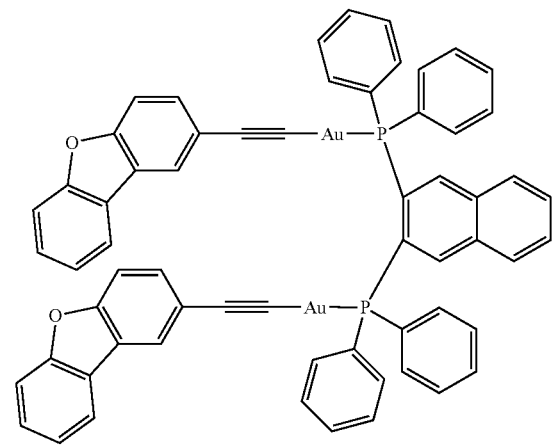

199
-continued
518
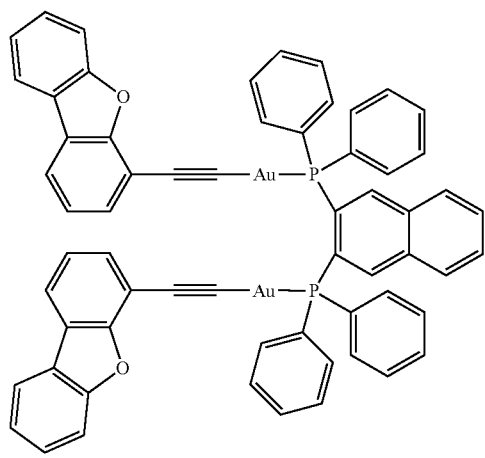
519
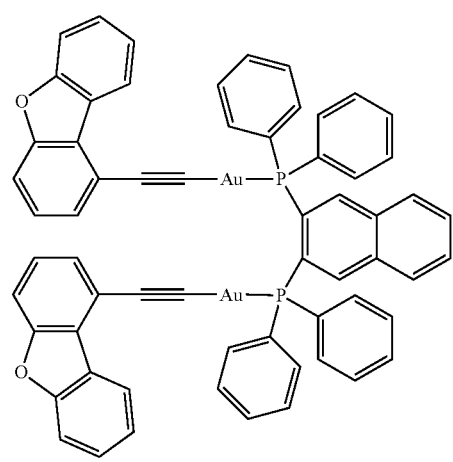
520
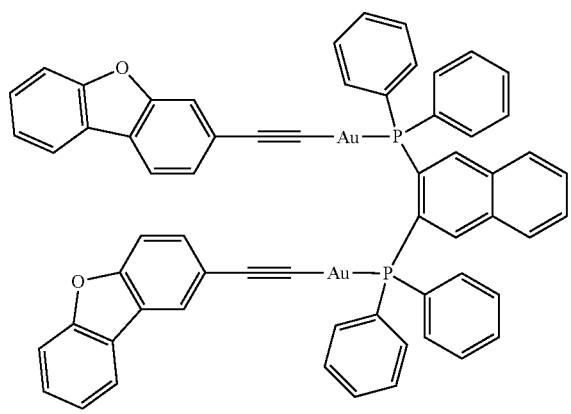
200
-continued
521
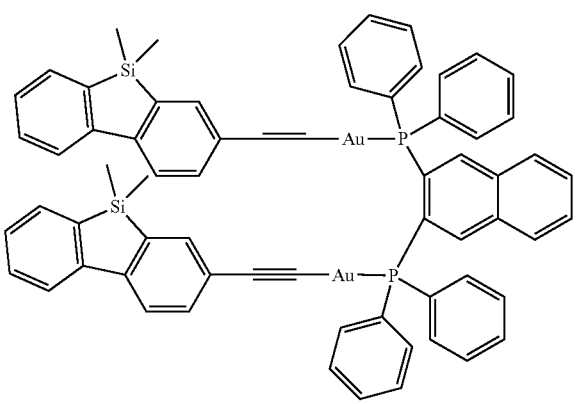
522
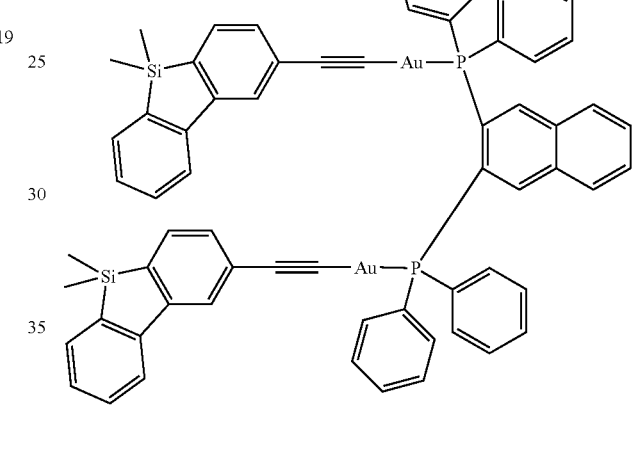
523
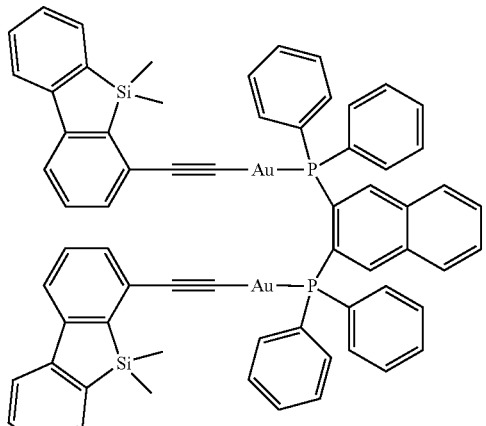

201
-continued
524
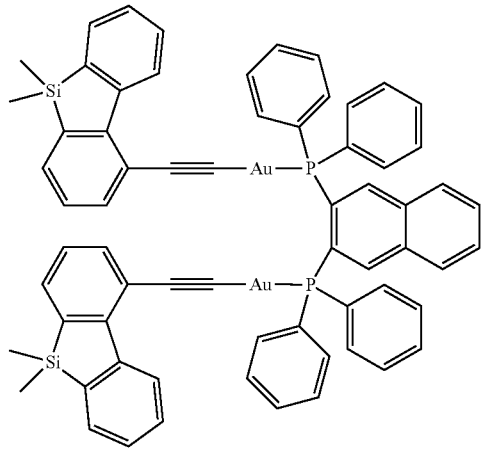
525
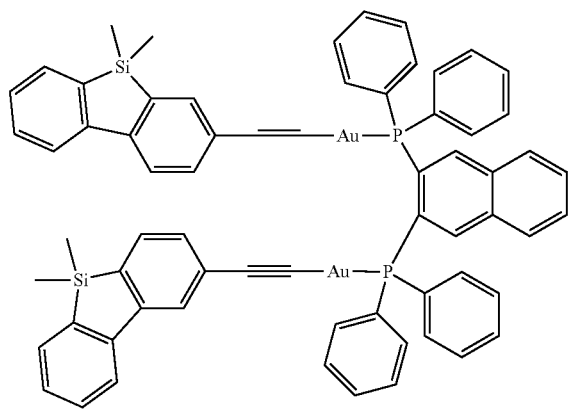
526
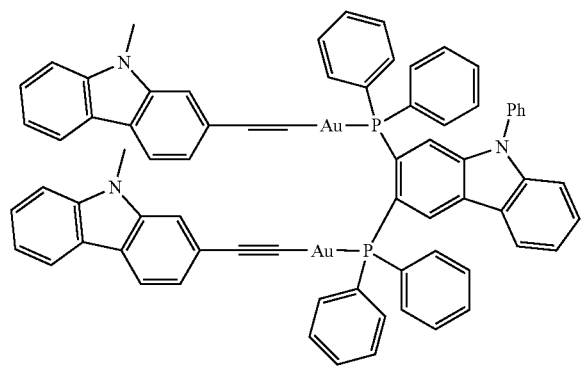
202
-continued
527
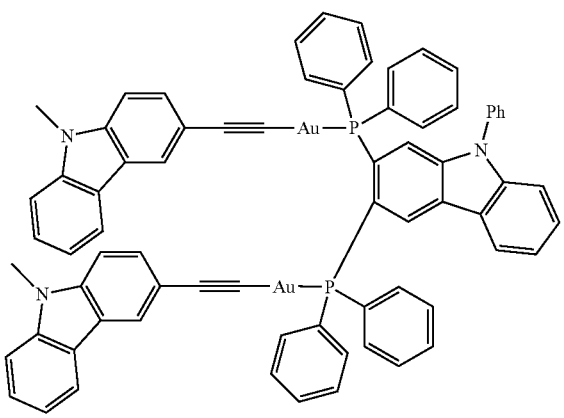
528
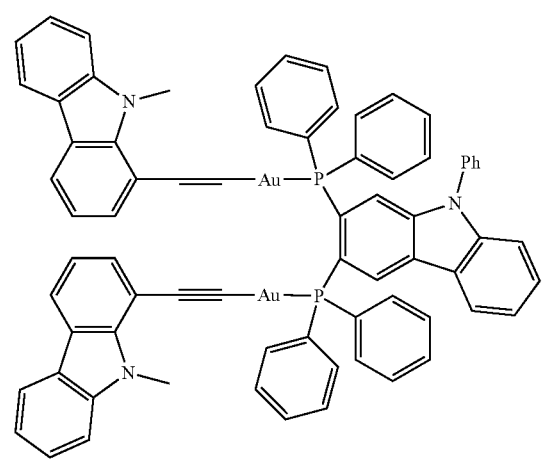
529
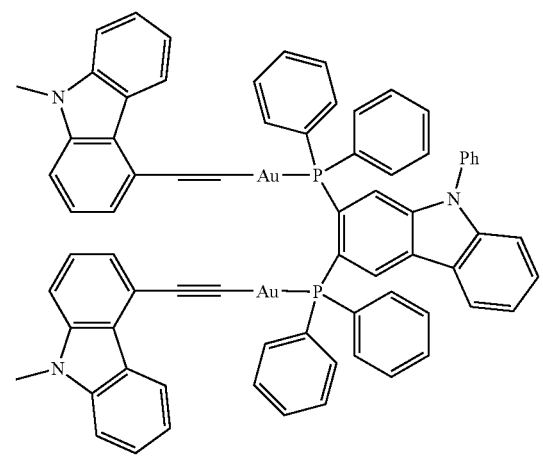

-continued
530
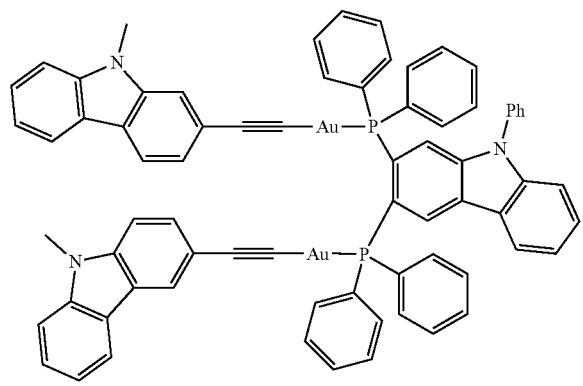
531
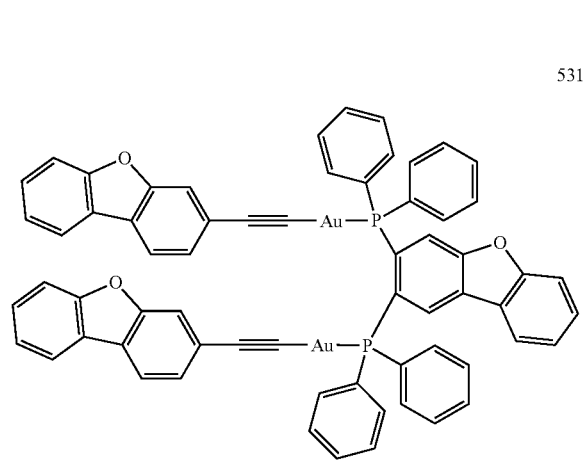
532
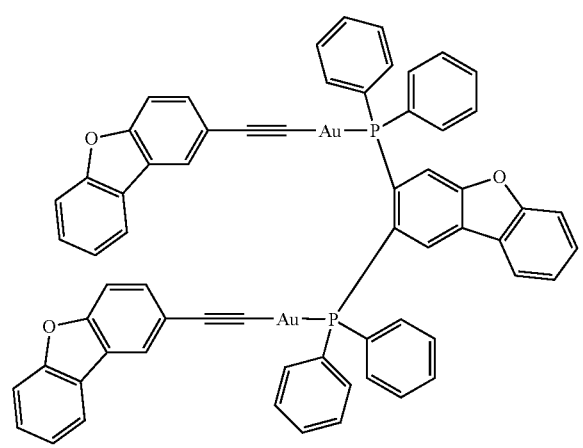
-continued
533
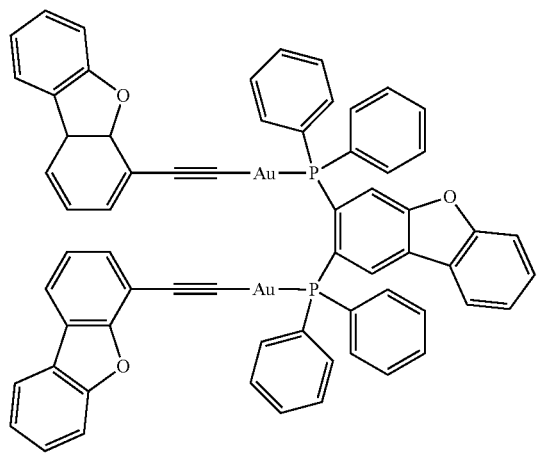
534
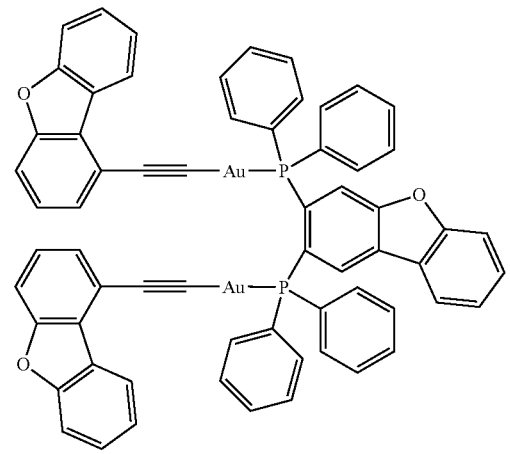
535
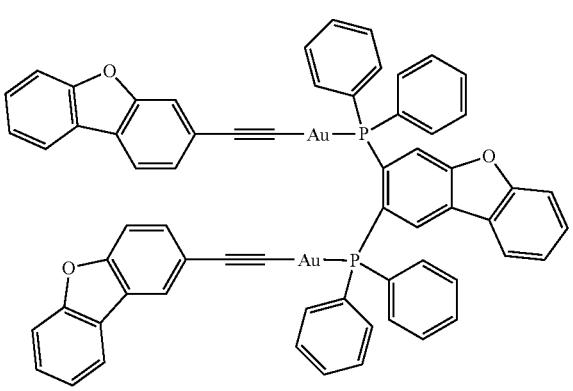

536
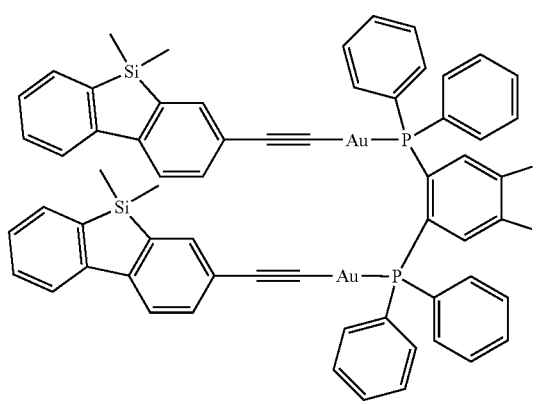
539
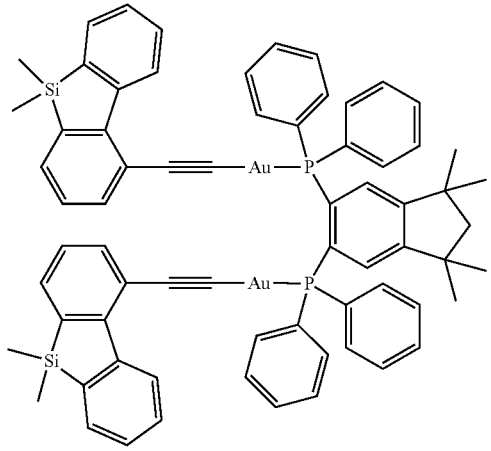
537
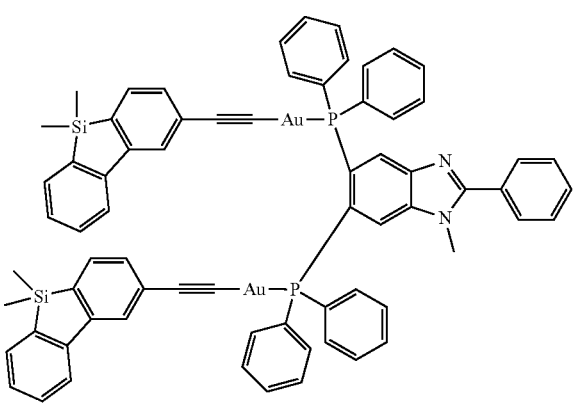
540
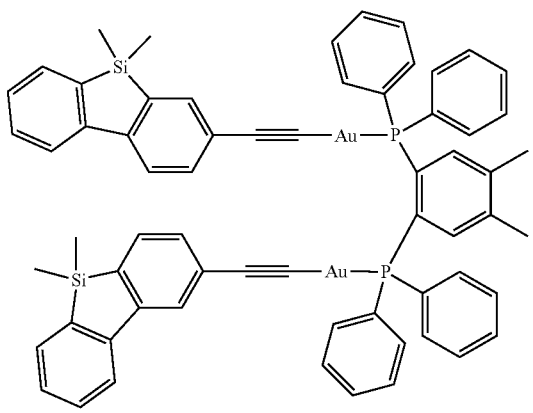
538
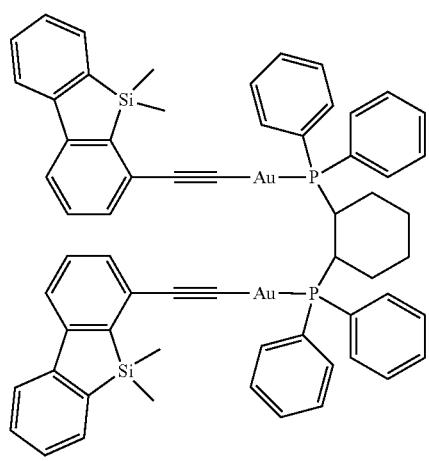
541
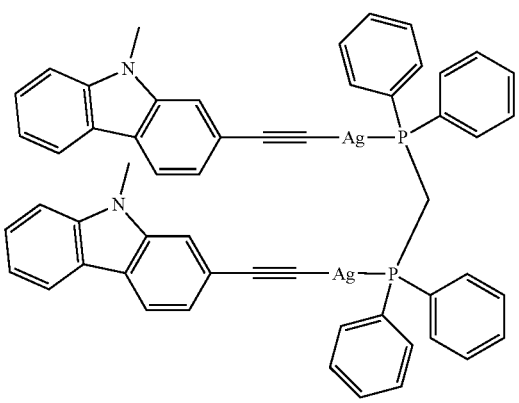

542
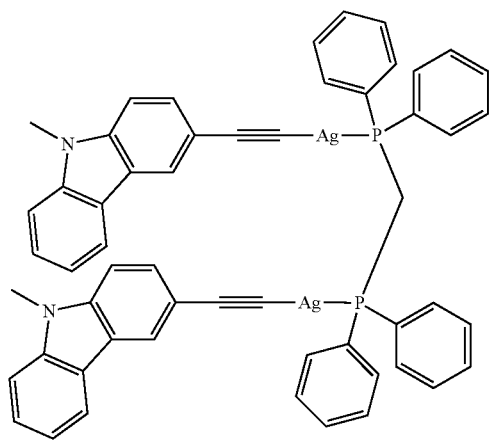
543
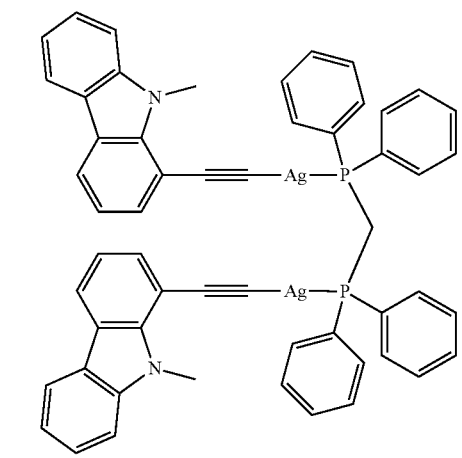
544
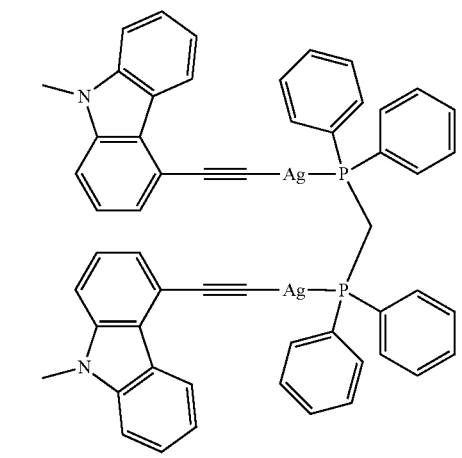
545
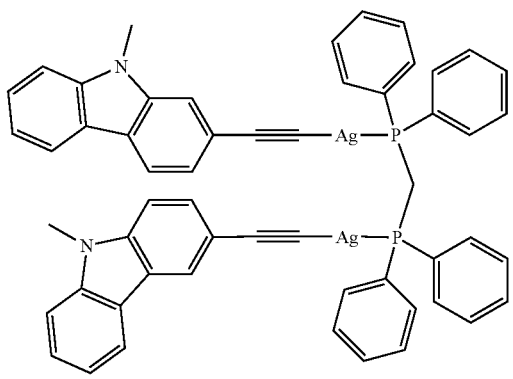
546
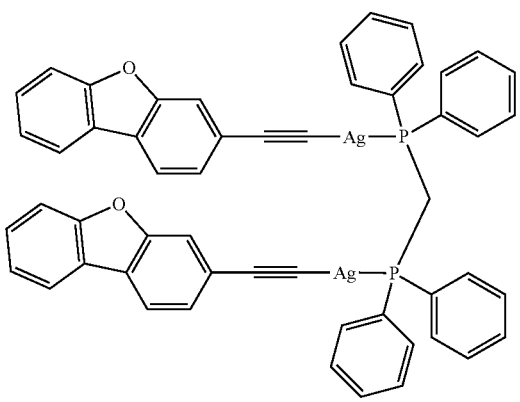
547
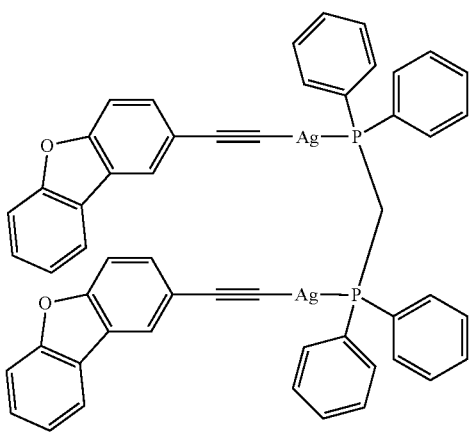

-continued
| 209 | 210 |
|---|---|
| 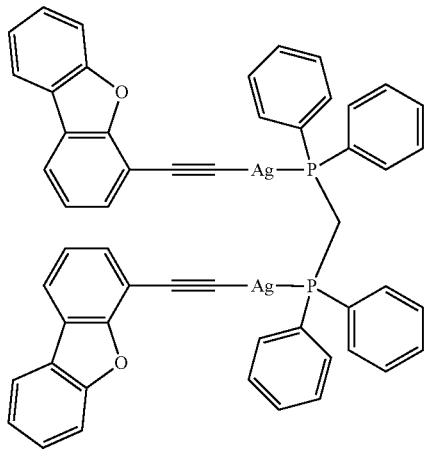 548 | 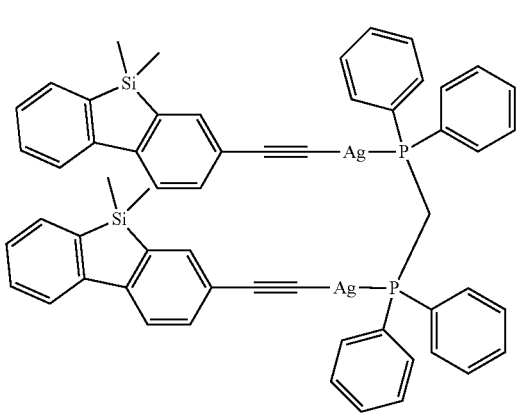 551 |
| 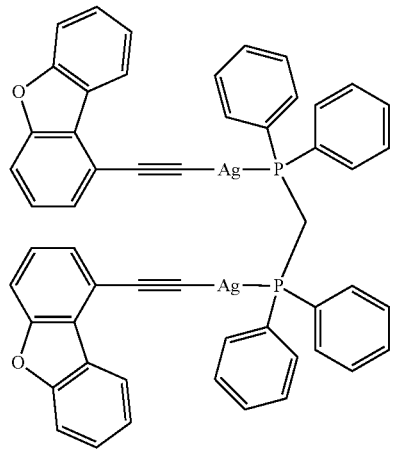 549 | 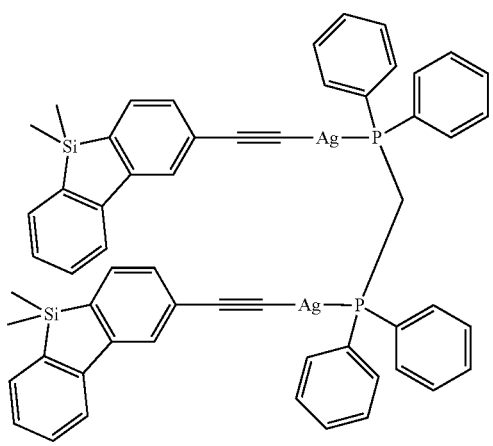 552 |
| 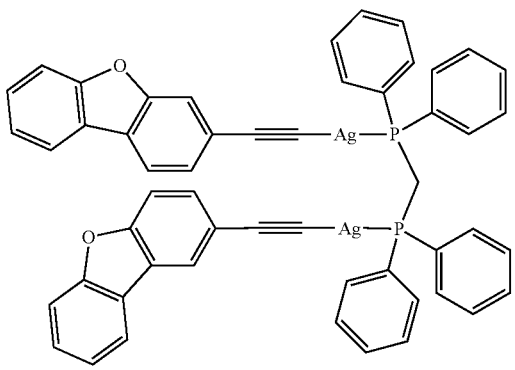 550 | 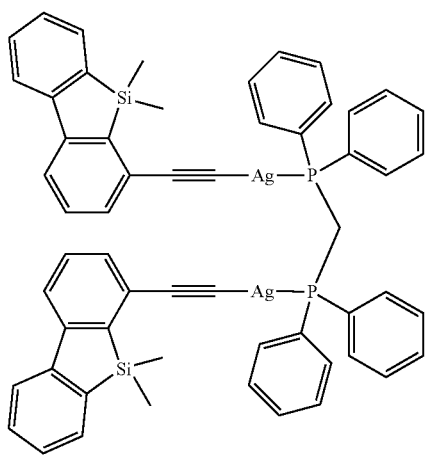 553 |

554
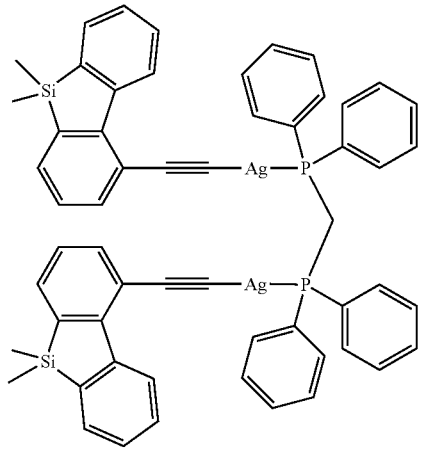
557
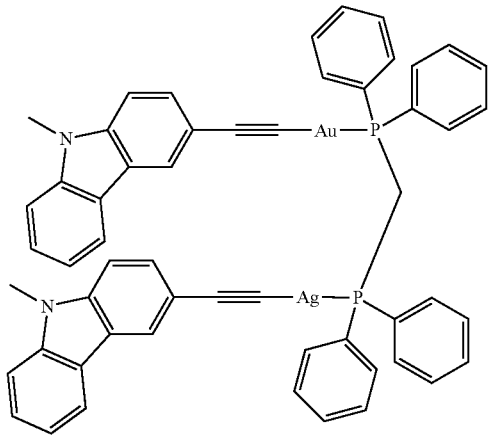
555
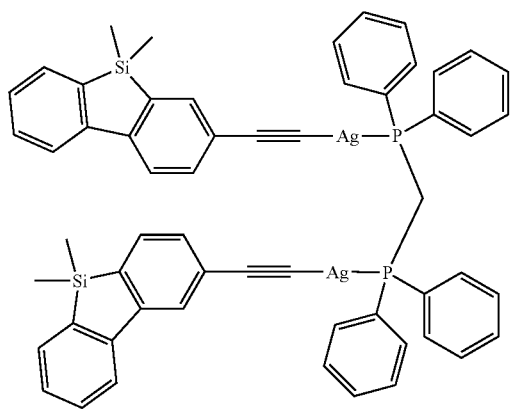
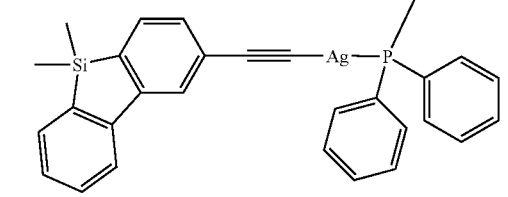
558
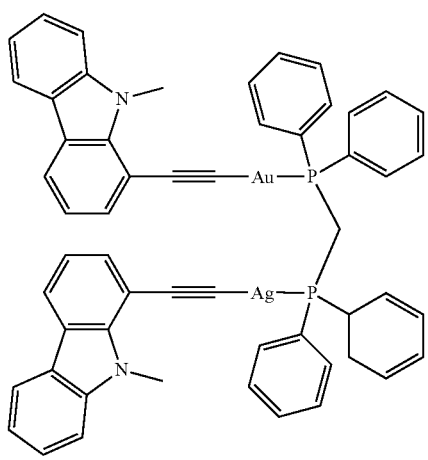
556
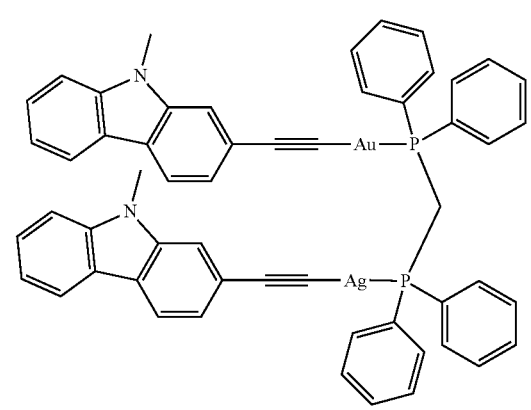
559
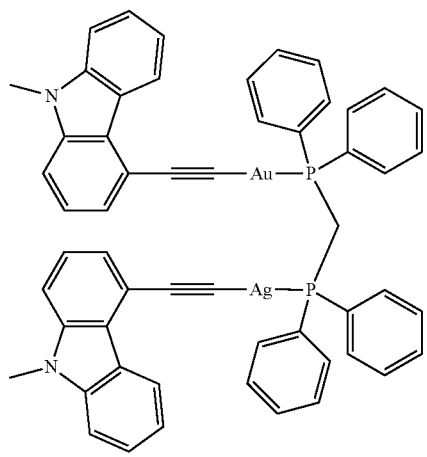

560
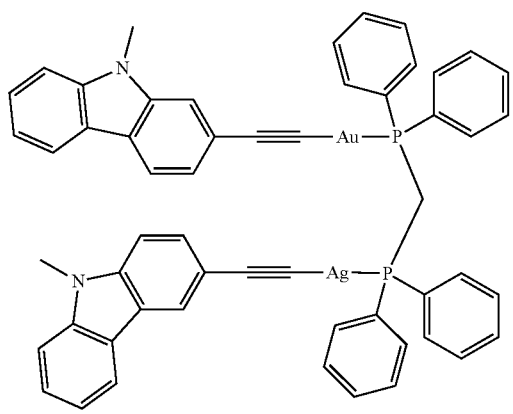
561
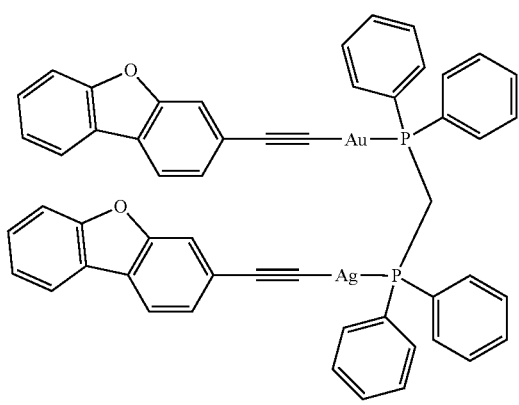
562
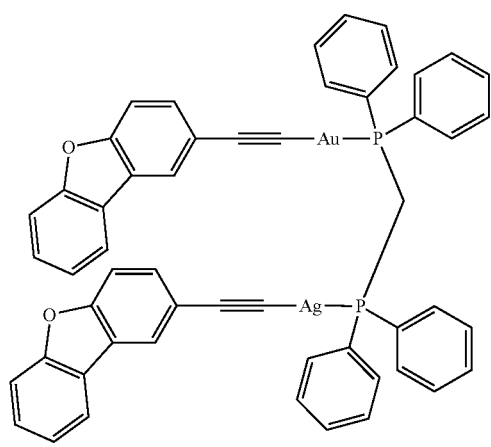
563
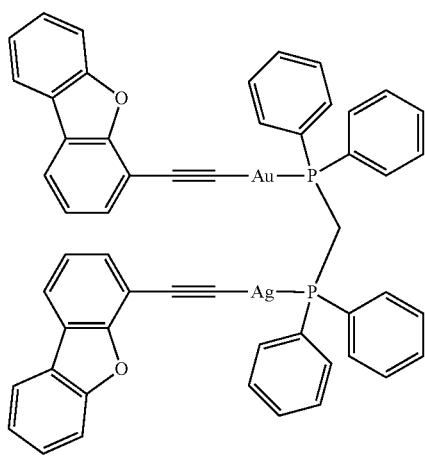
564
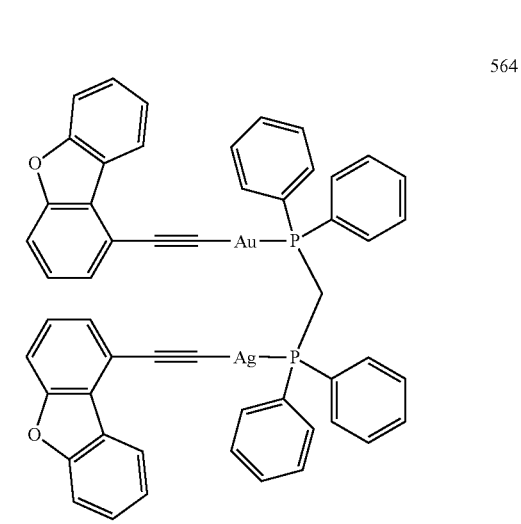
565
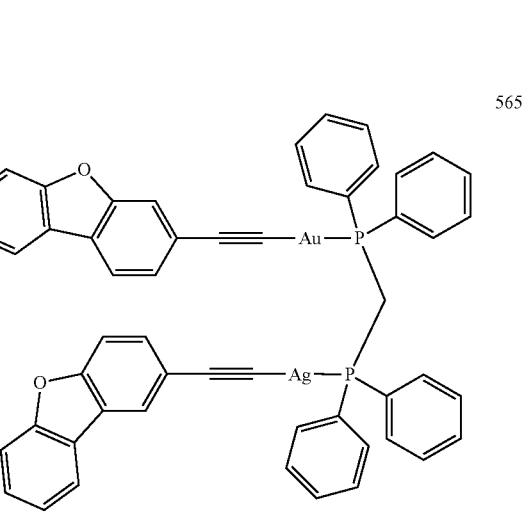

-continued
566
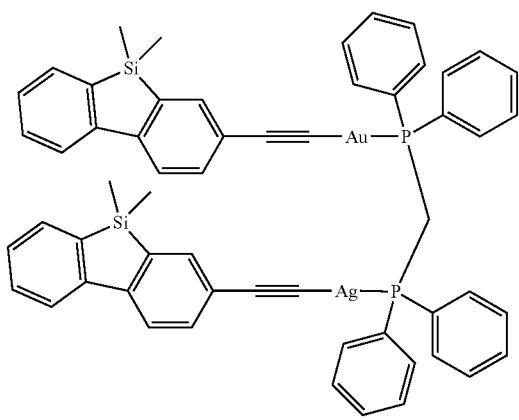
567
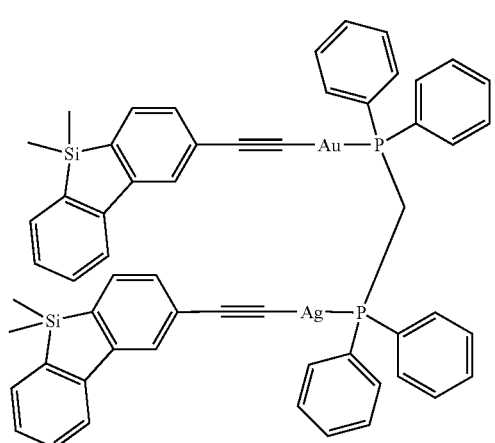
568
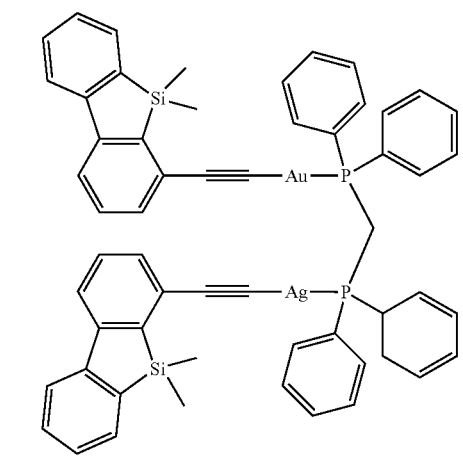
-continued
569
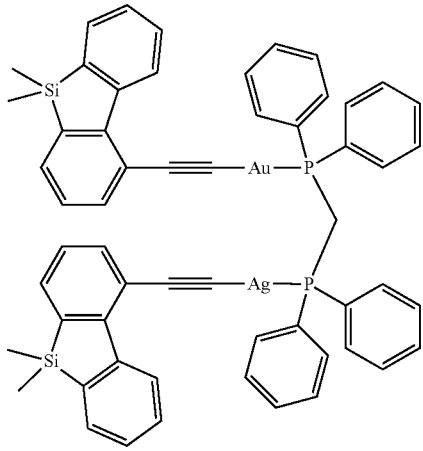
570
571

-continued
572
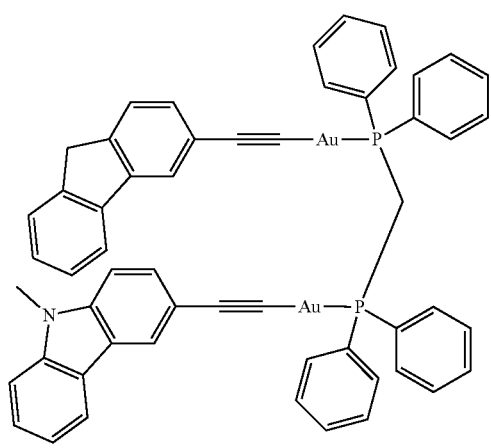
573
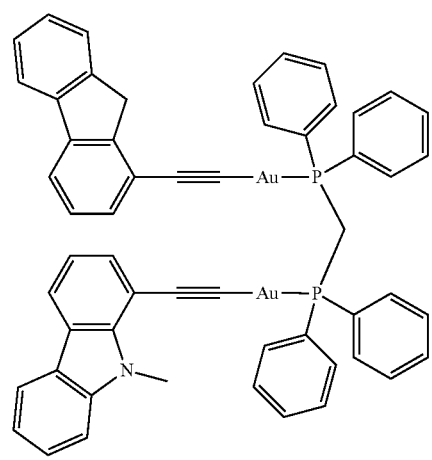
574
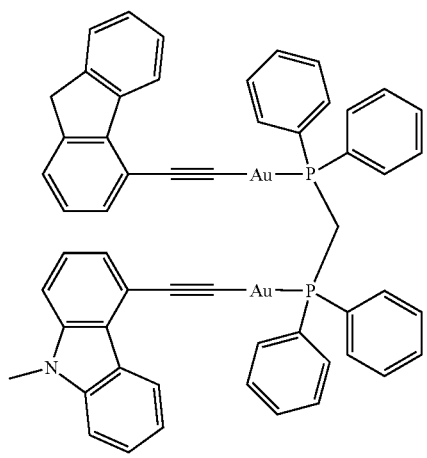
-continued
575
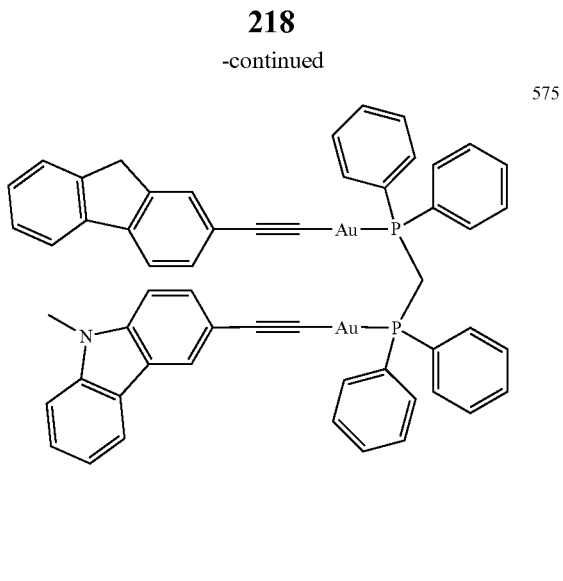
576
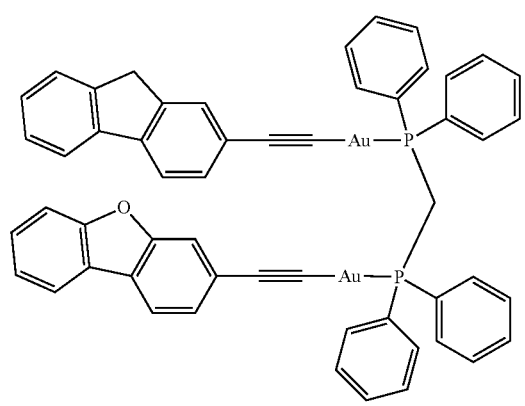
577
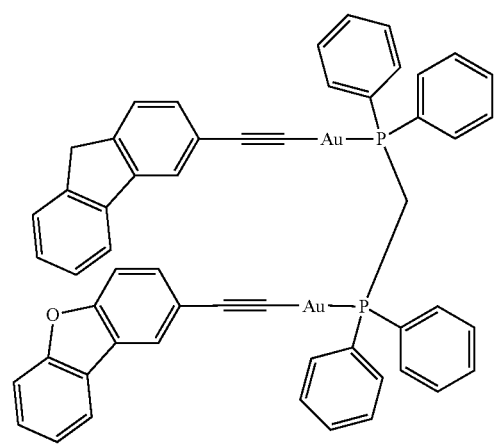

219 -continued
578
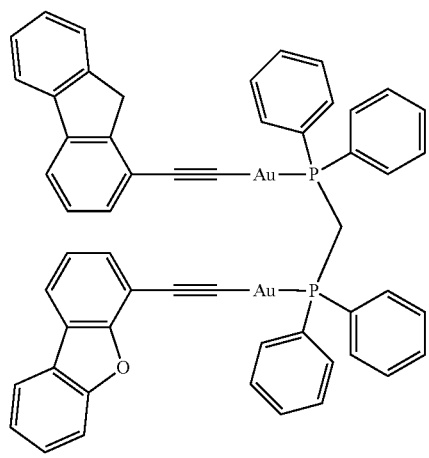
579
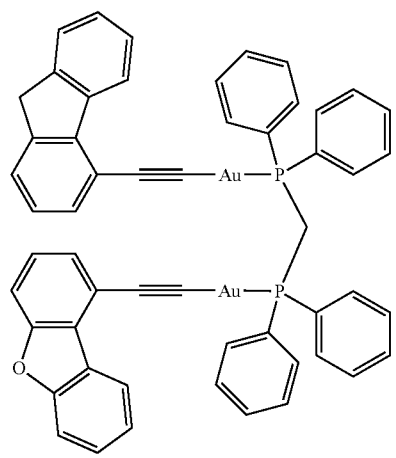
580
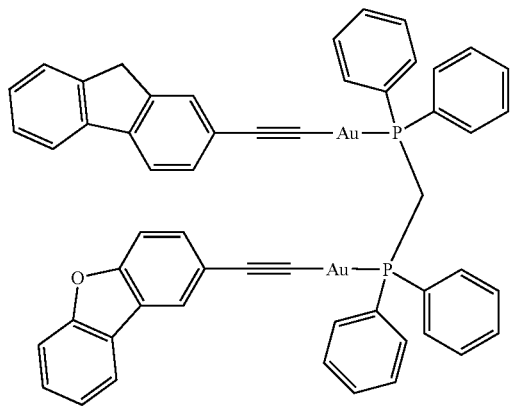
220 -continued
581
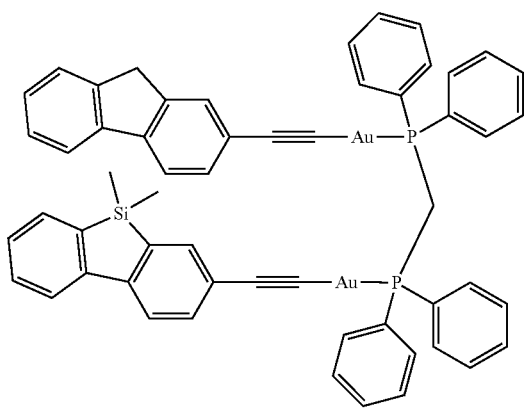
582
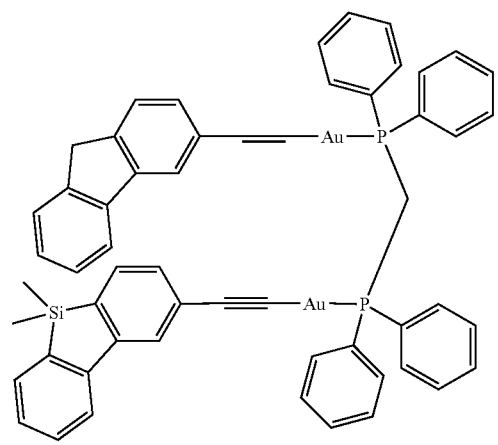
583
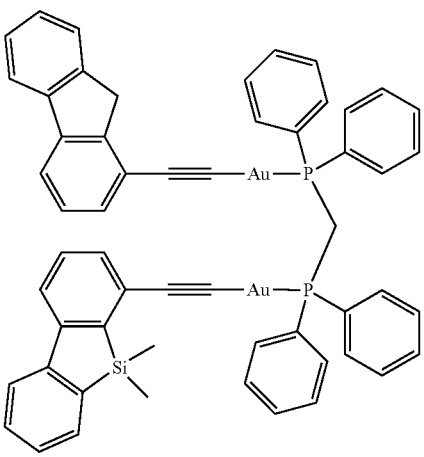

221
-continued
584
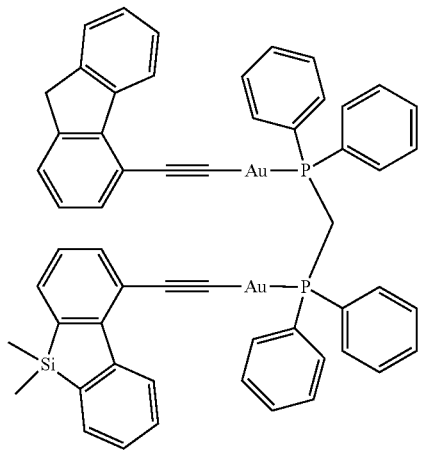
585
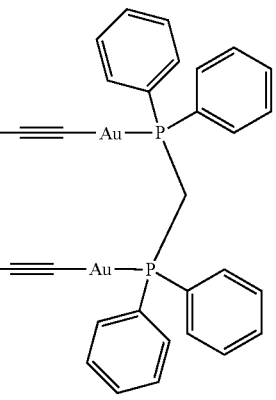
586
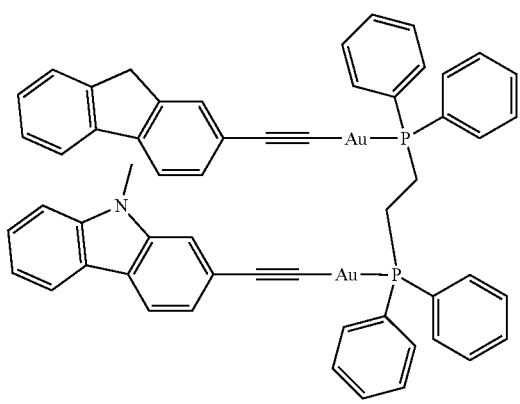
222
-continued
587
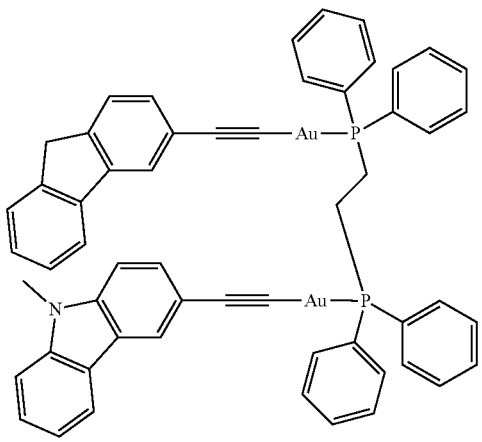
588
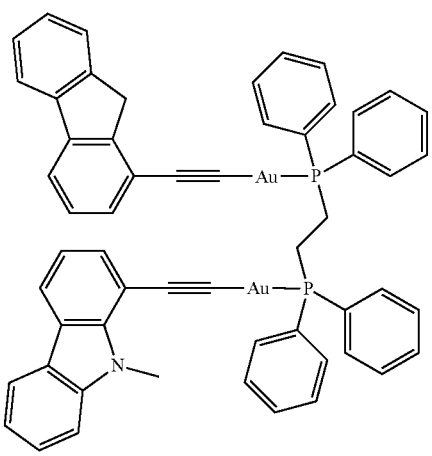
589
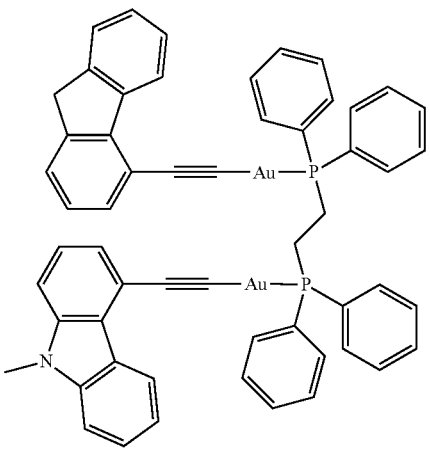

590
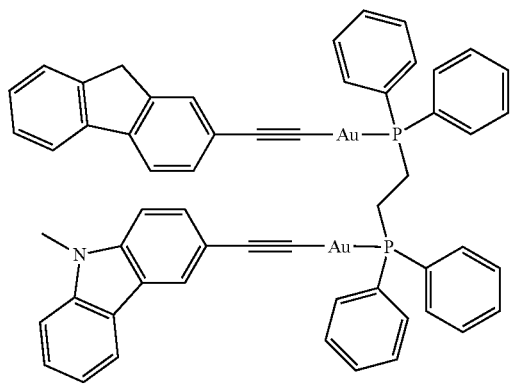
591
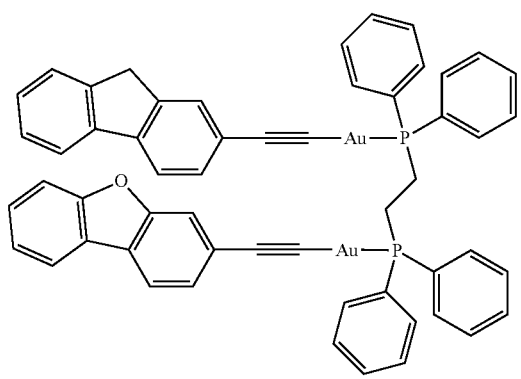
592
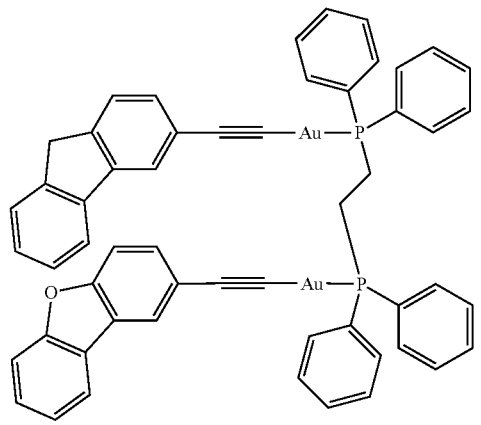
592
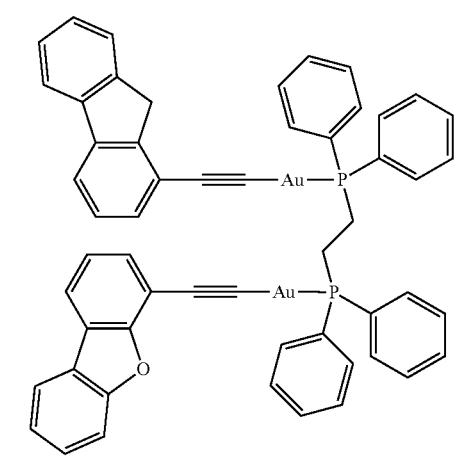
594
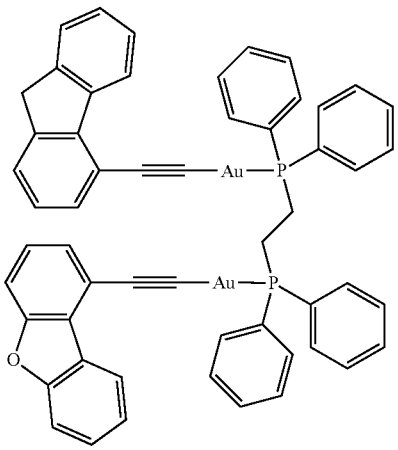
595
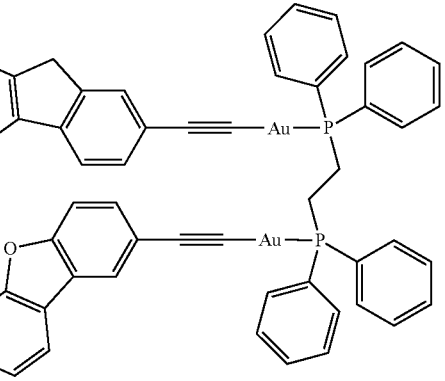
596
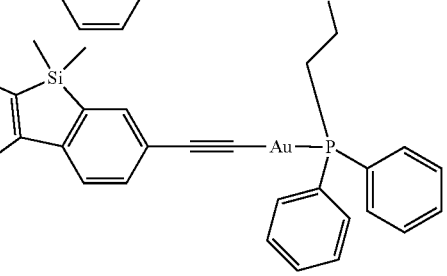

-continued
597
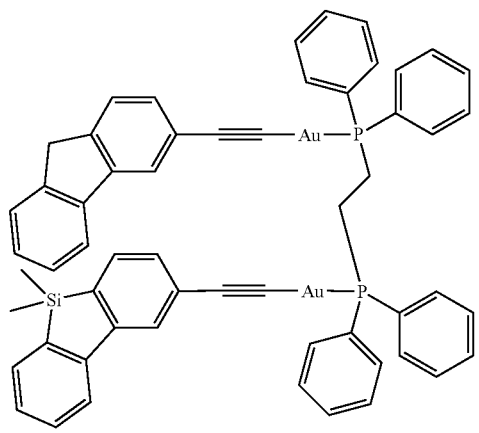
598
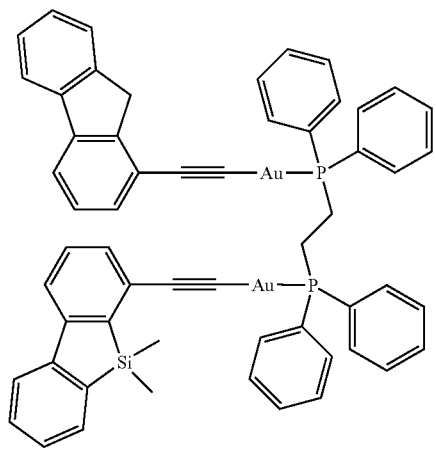
599
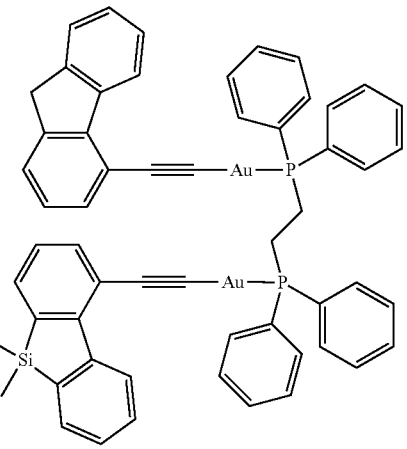
600
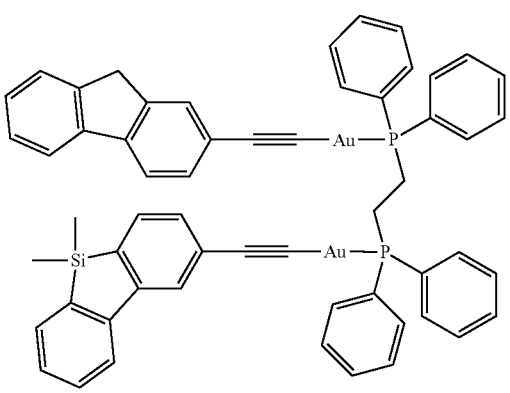
601
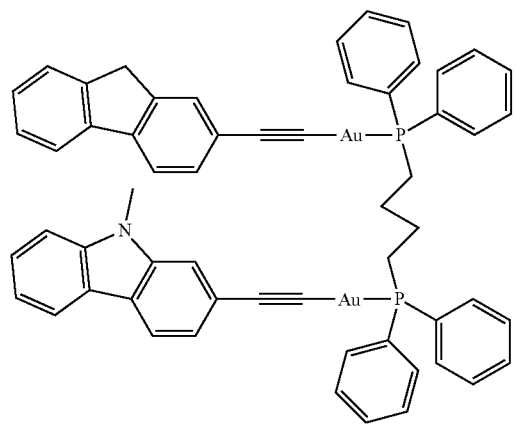
602
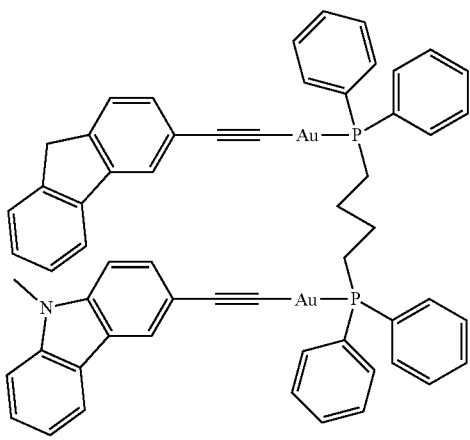

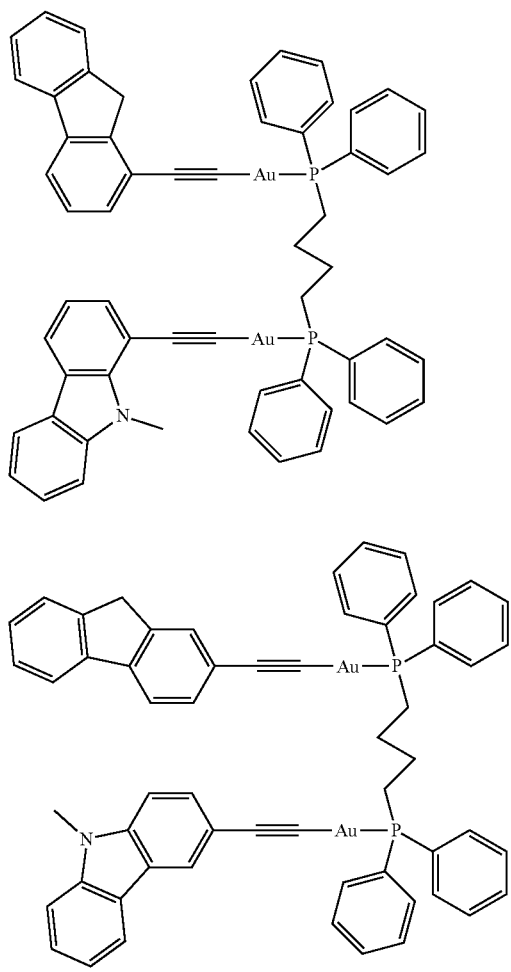
603
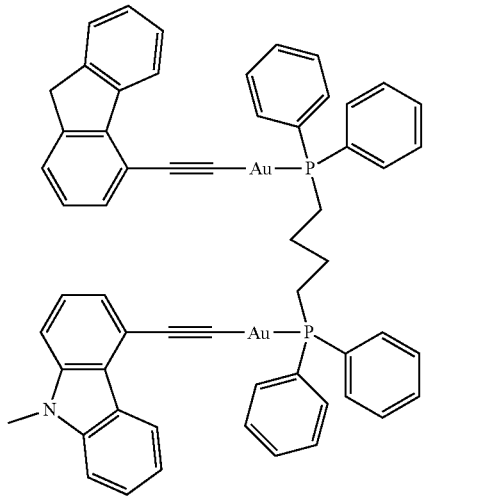
604
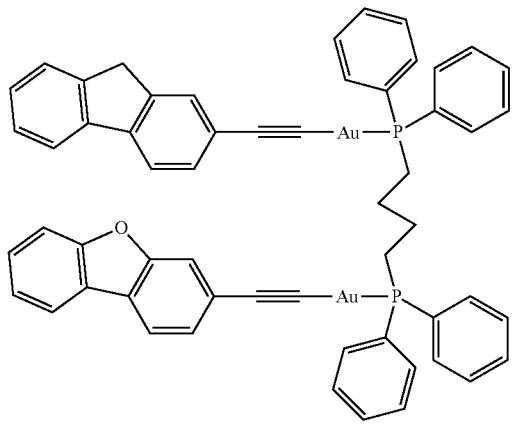
605
606
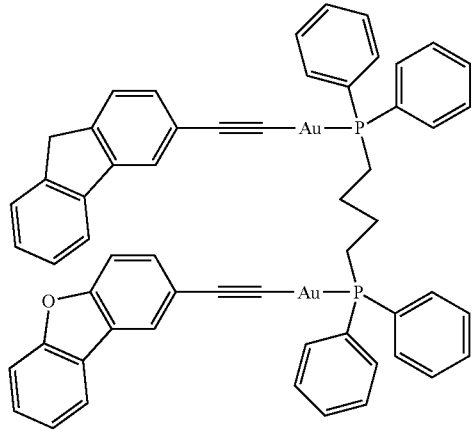
607
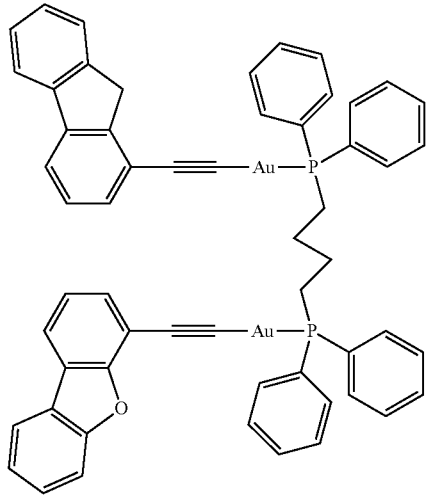
608

609
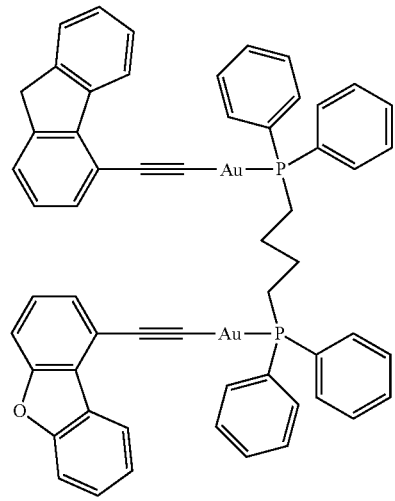
610
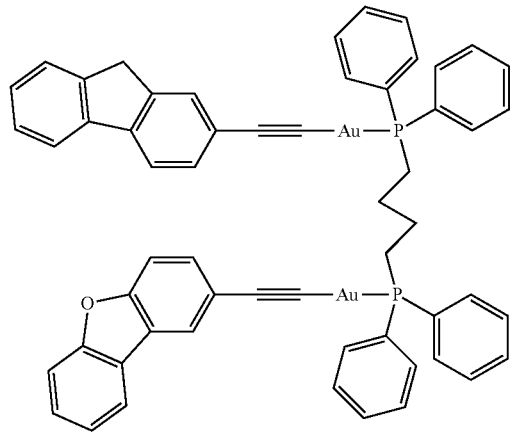
611
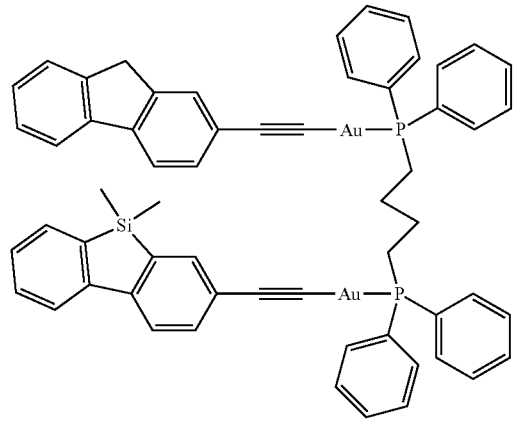
612
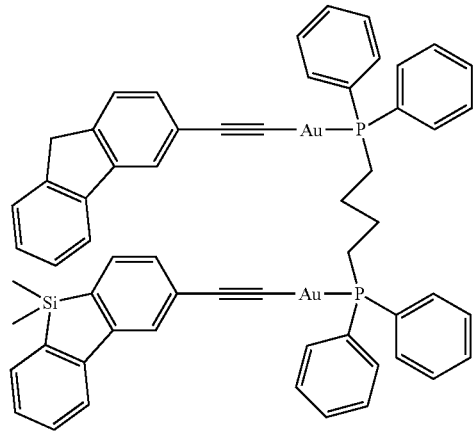
613
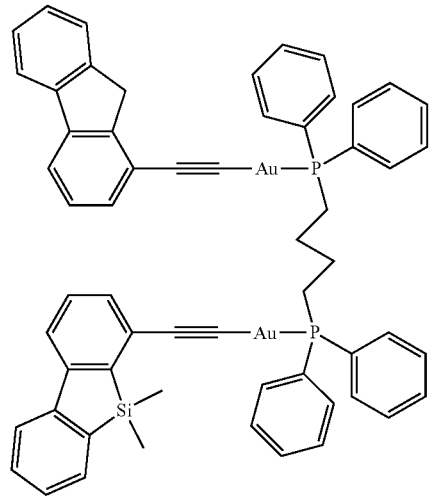
614
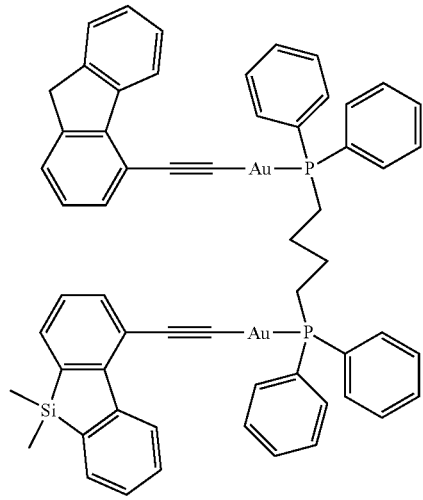

-continued
615
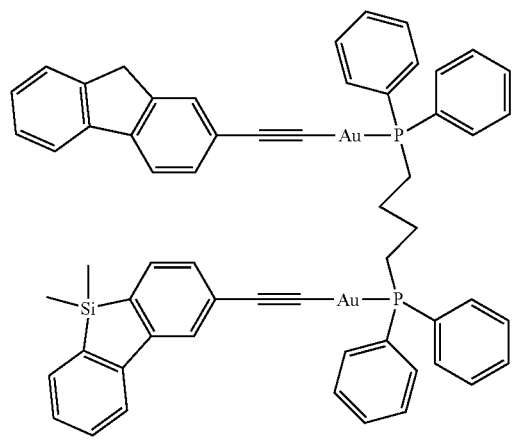
616
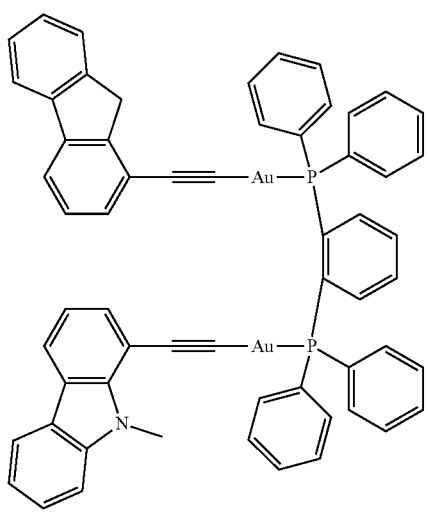
617
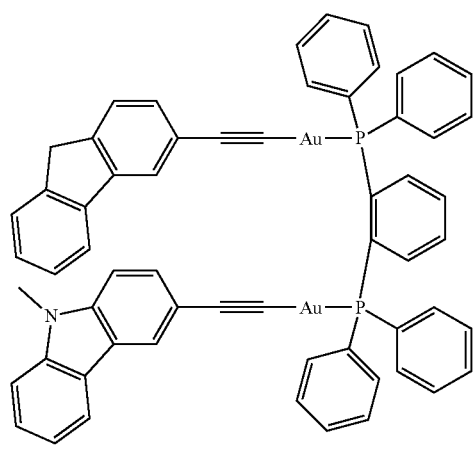
618
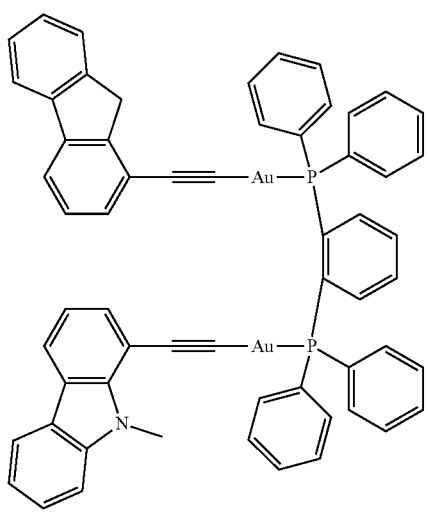
619
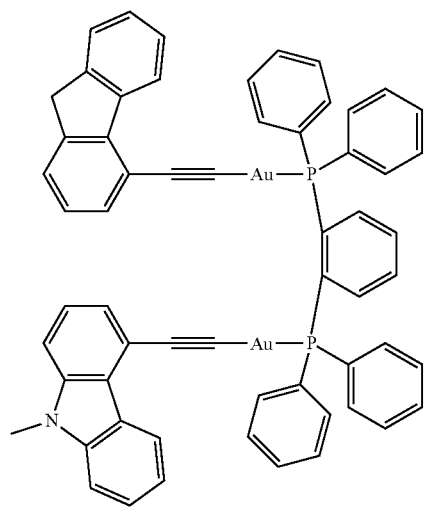
620
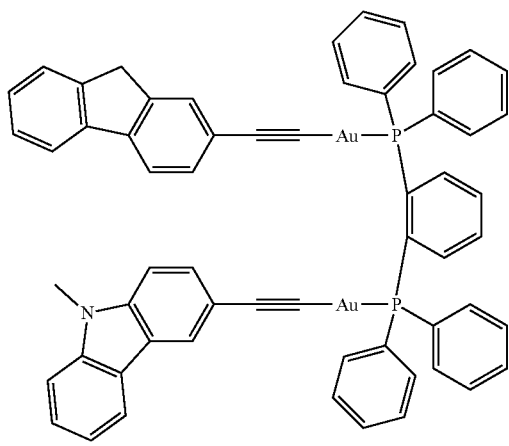

-continued
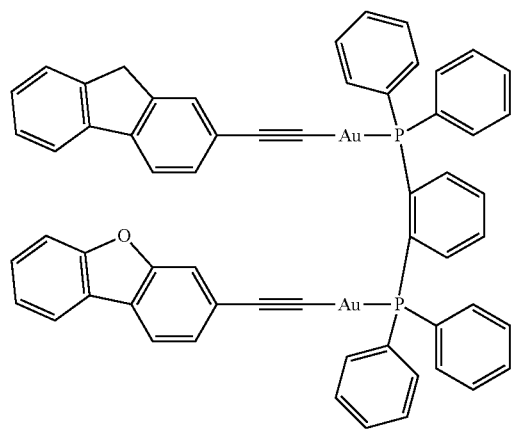
621
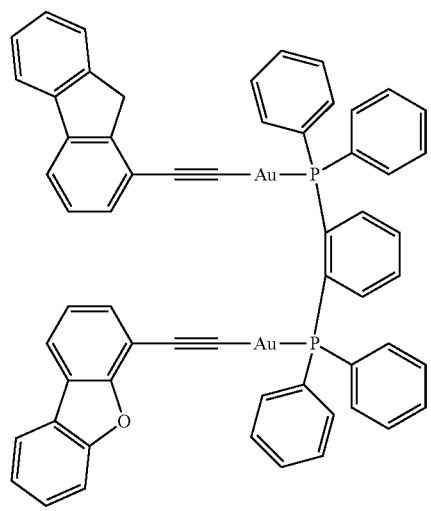
623
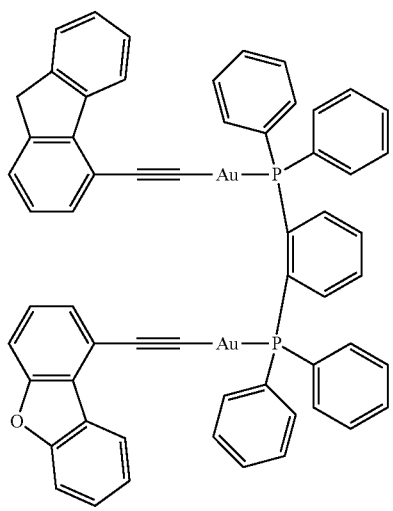
624
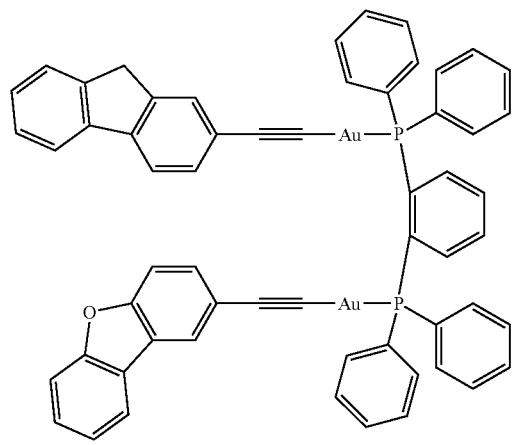
625
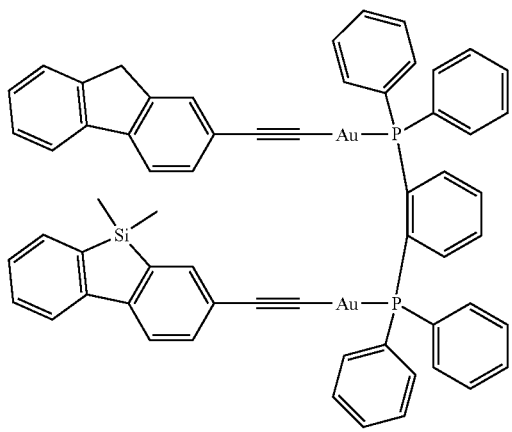
626

-continued
627
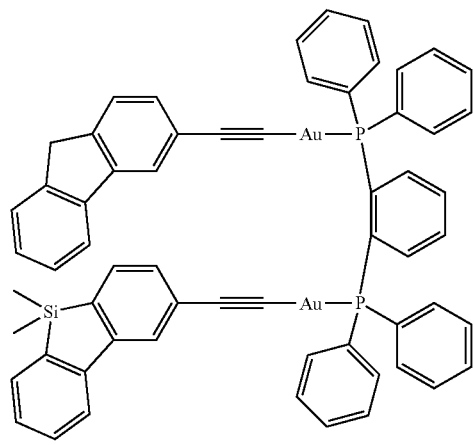
628
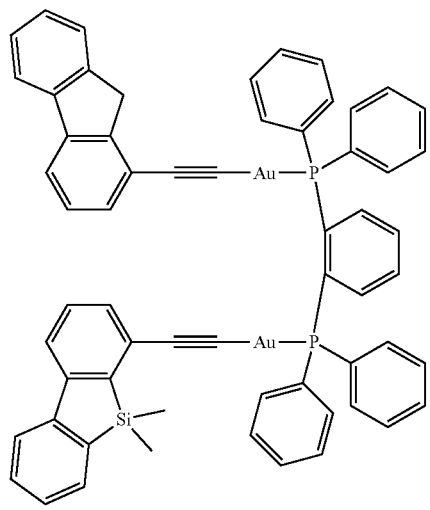
629
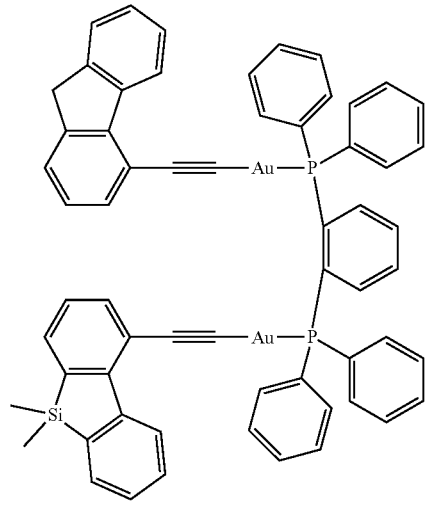
630
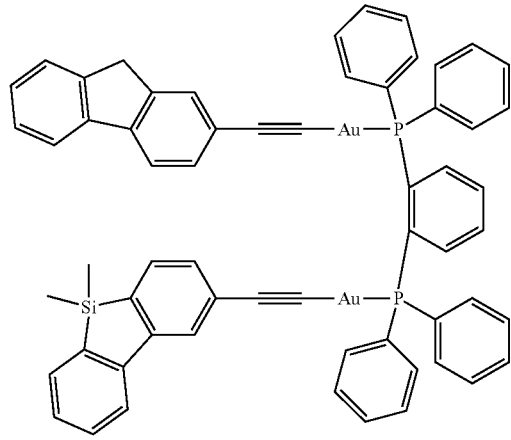
631
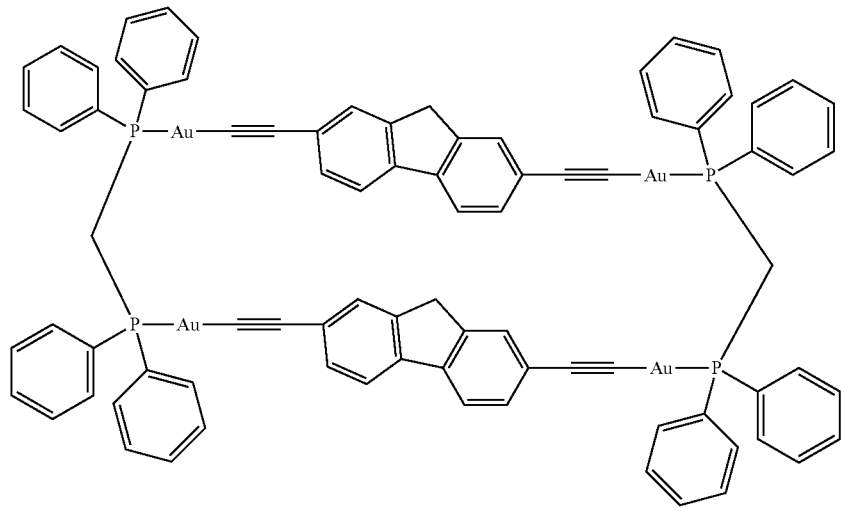

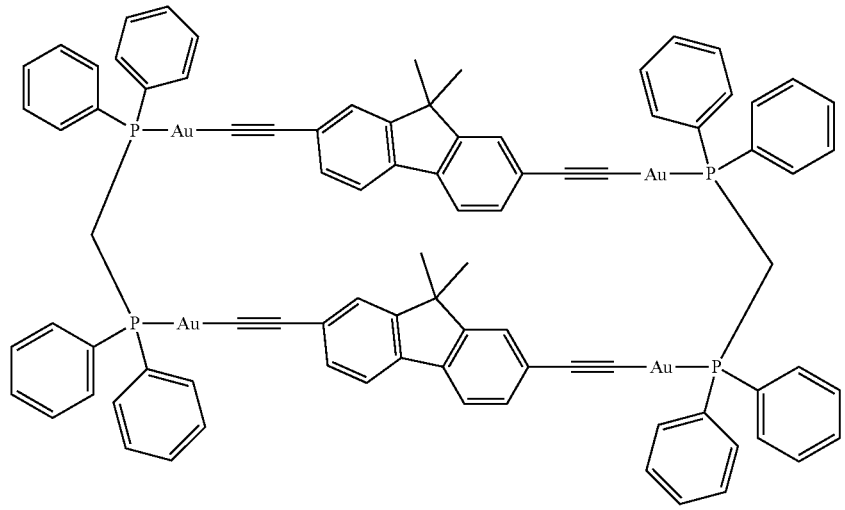
632
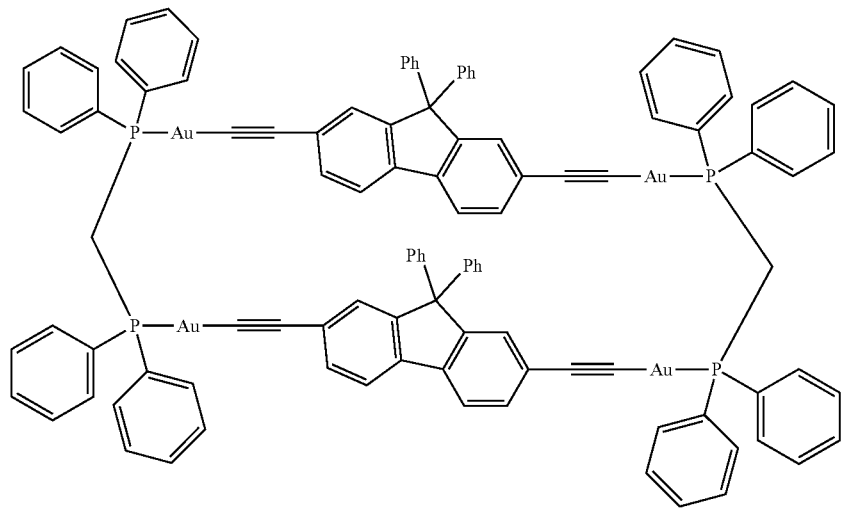
633
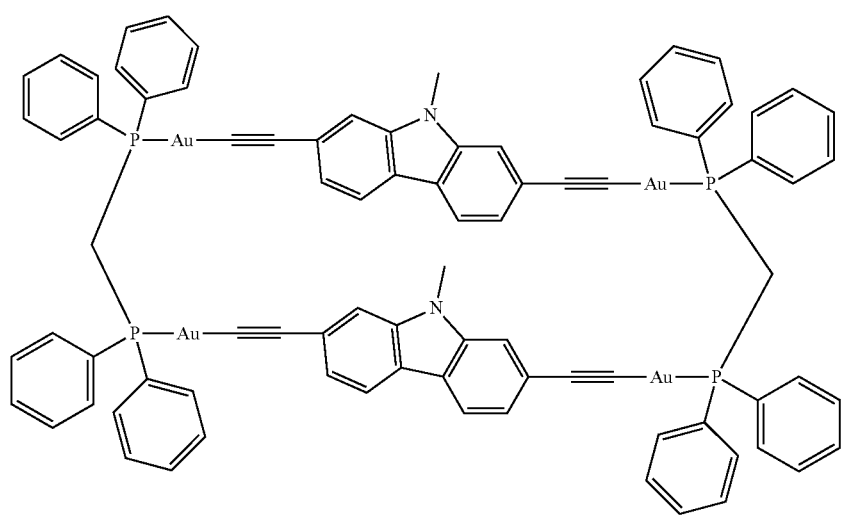
634

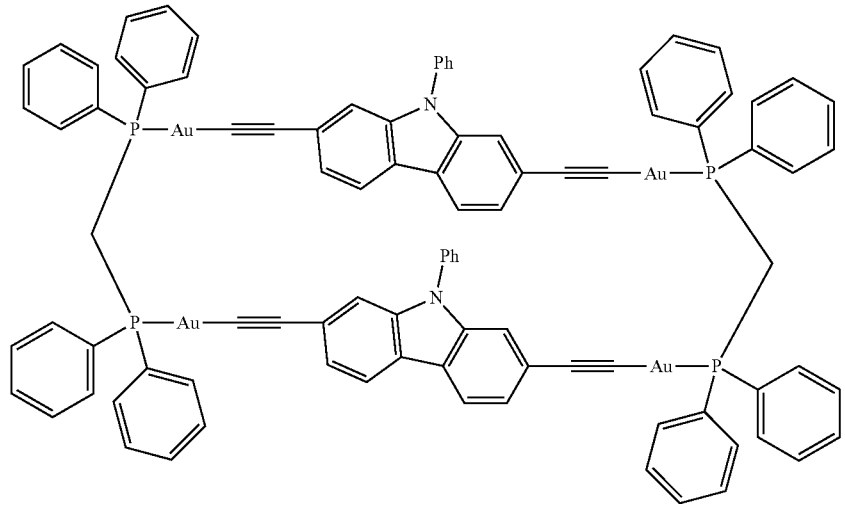
635
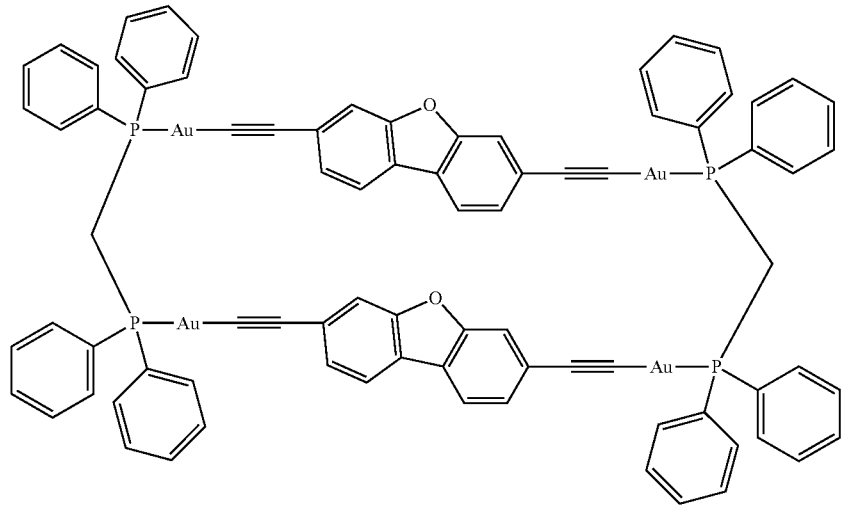
636
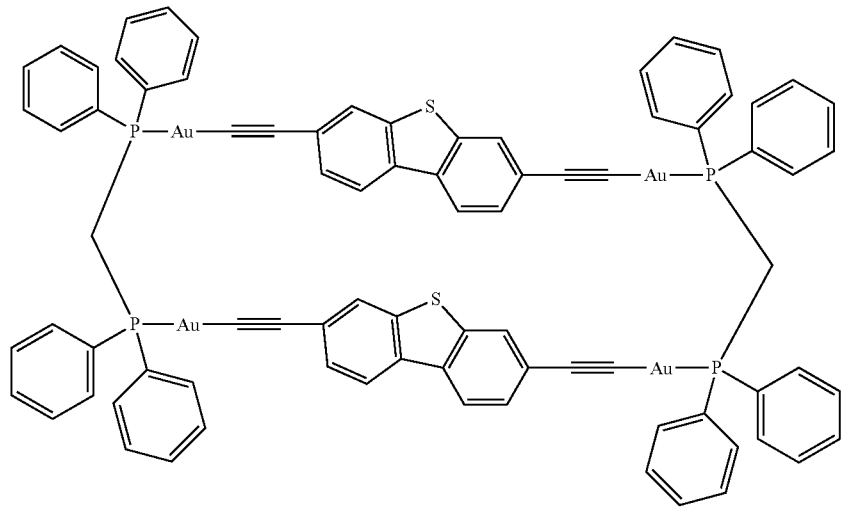
637

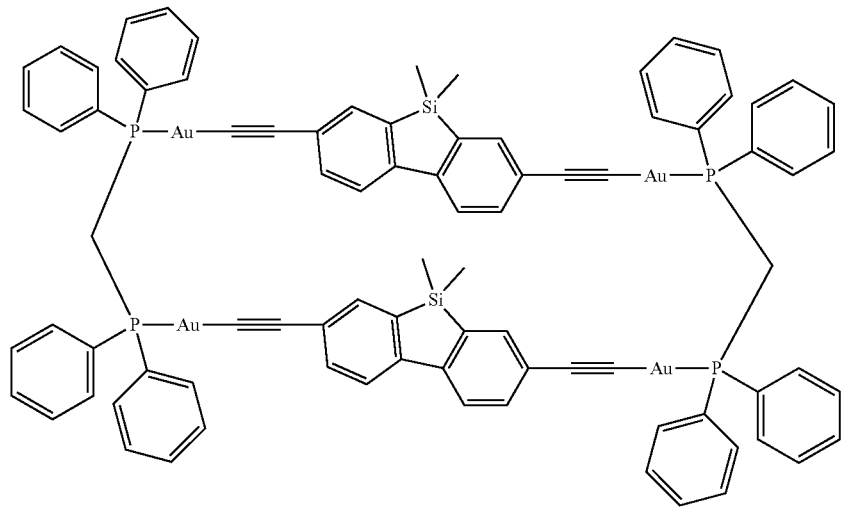
638
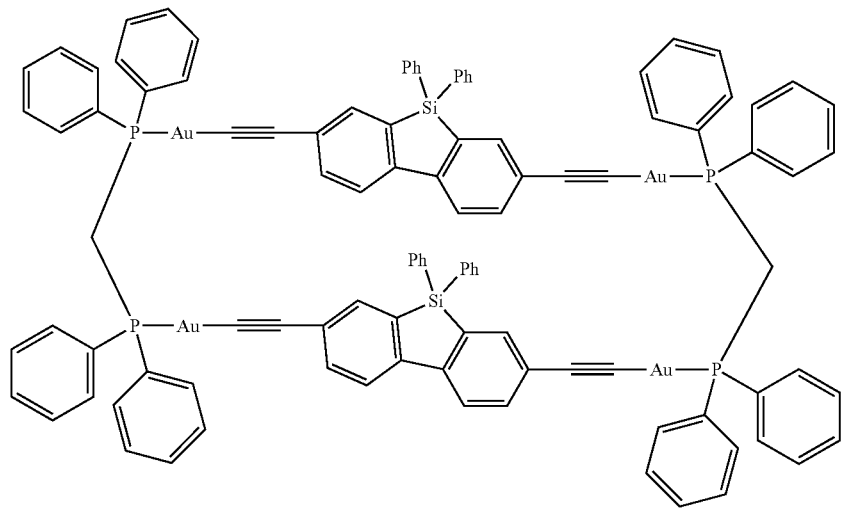
639
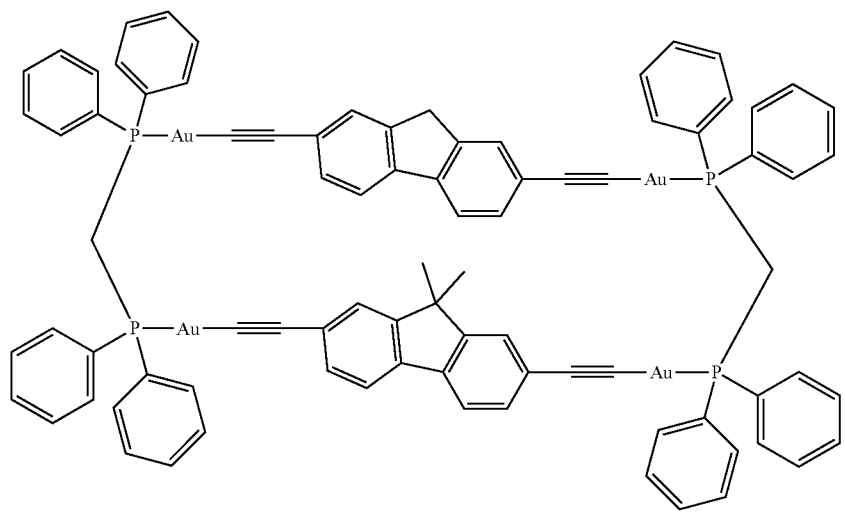
640

641
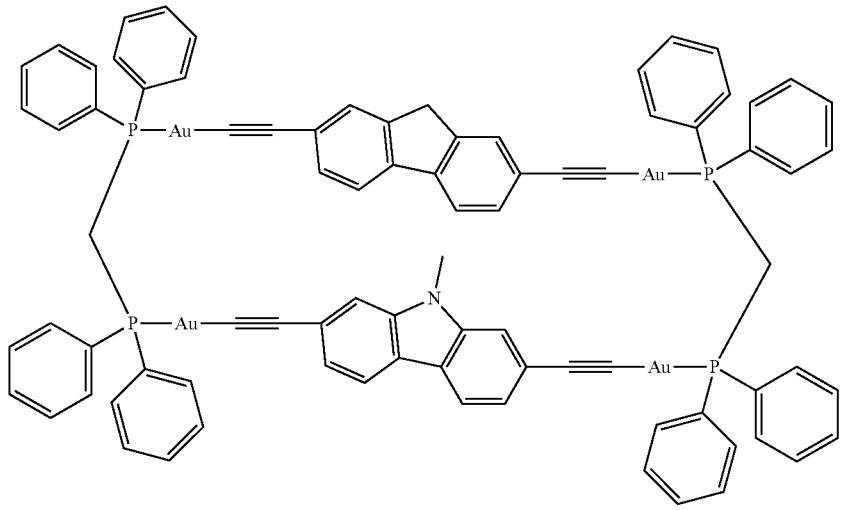
642
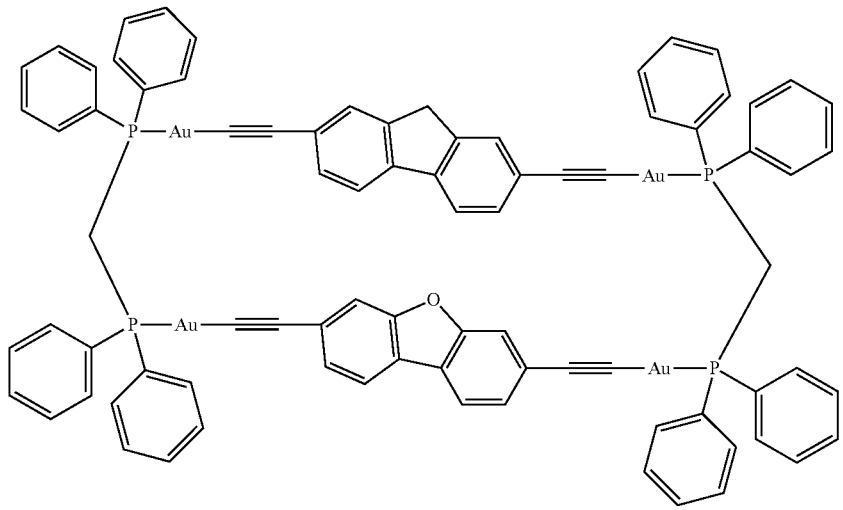
643
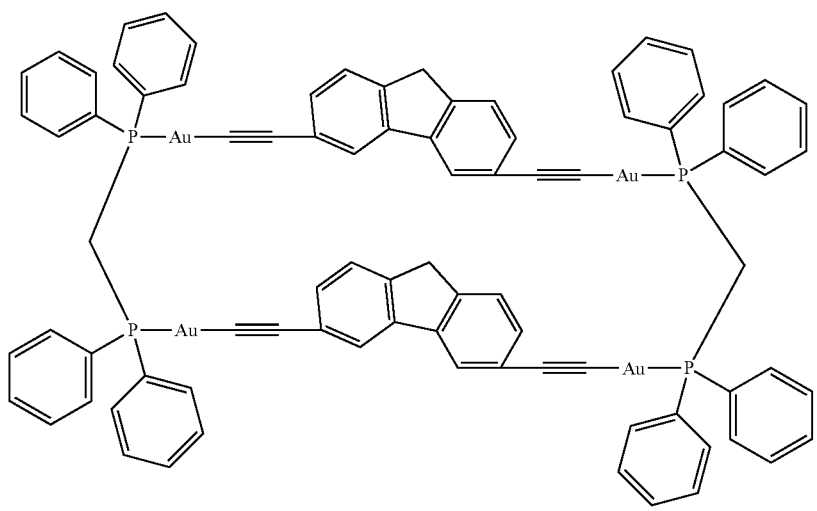

-continued
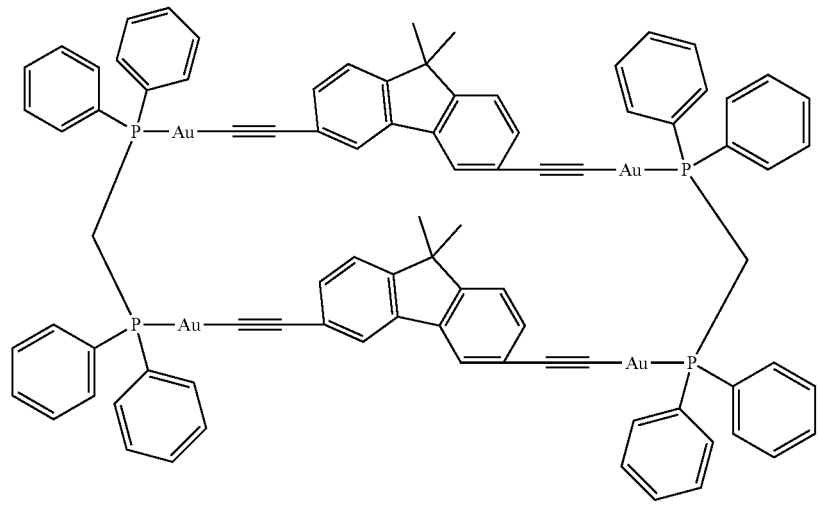
644
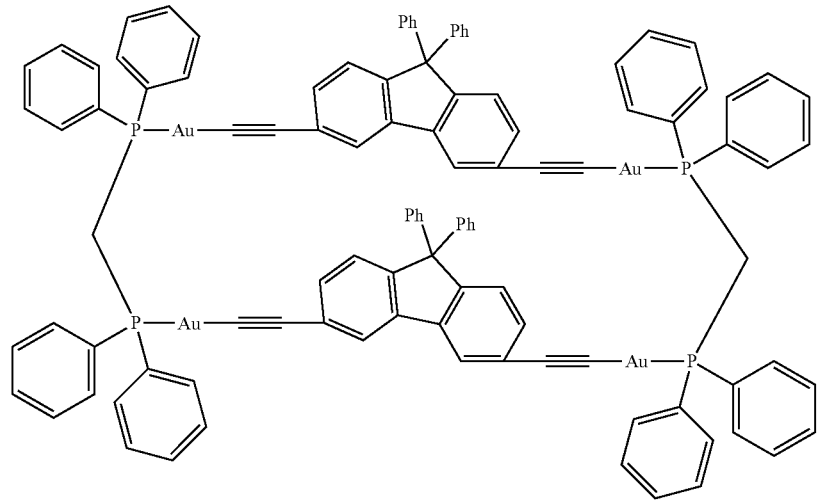
645
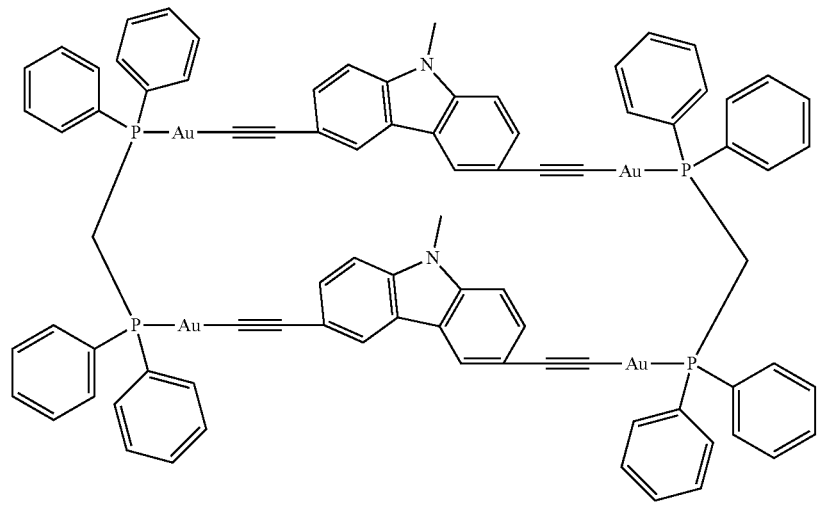
646

-continued
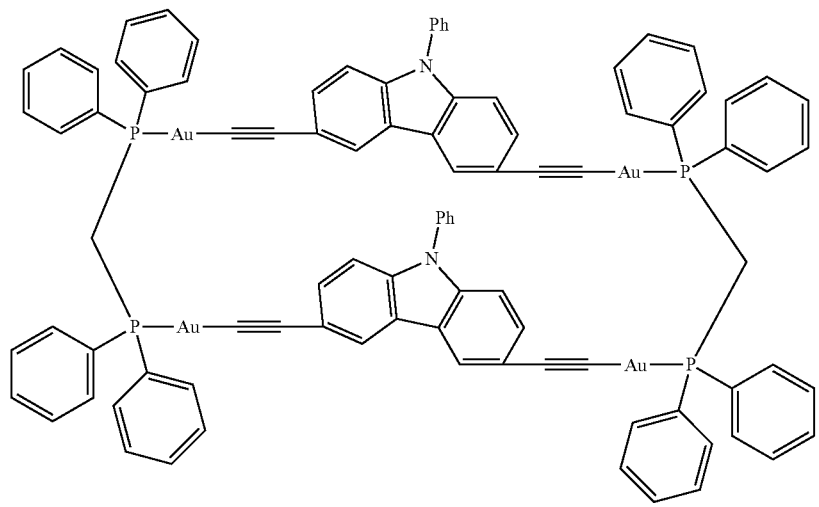
647
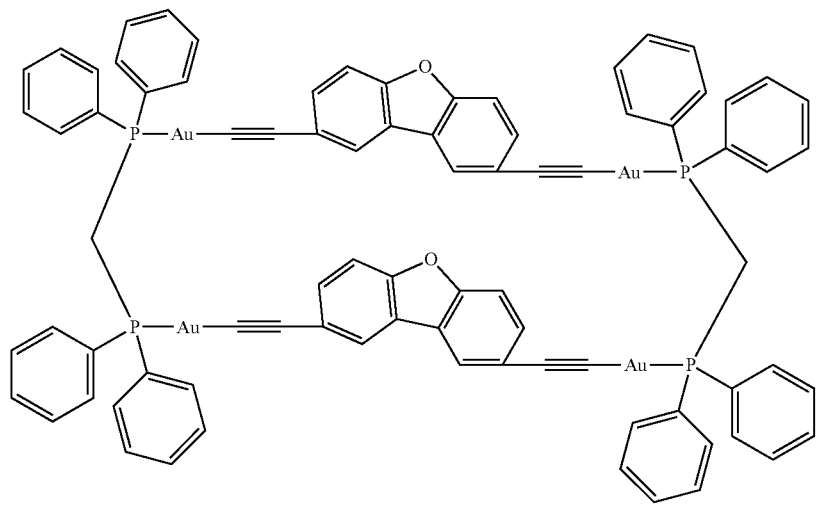
648
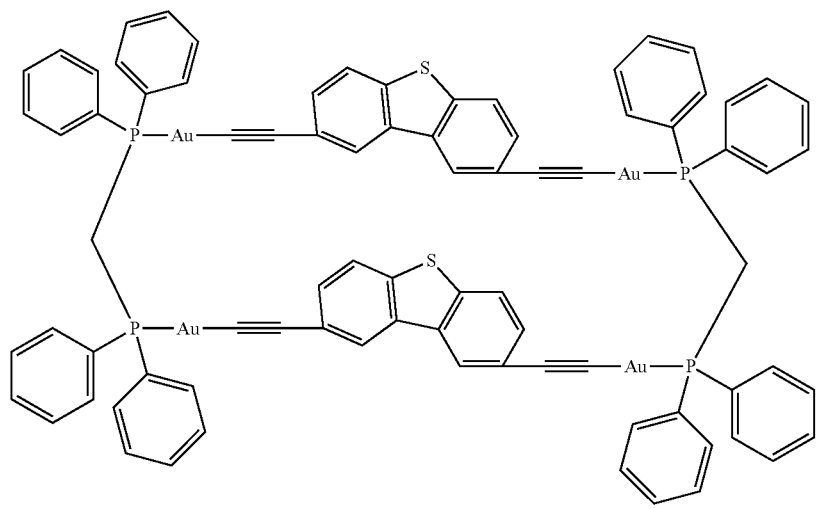
649

-continued
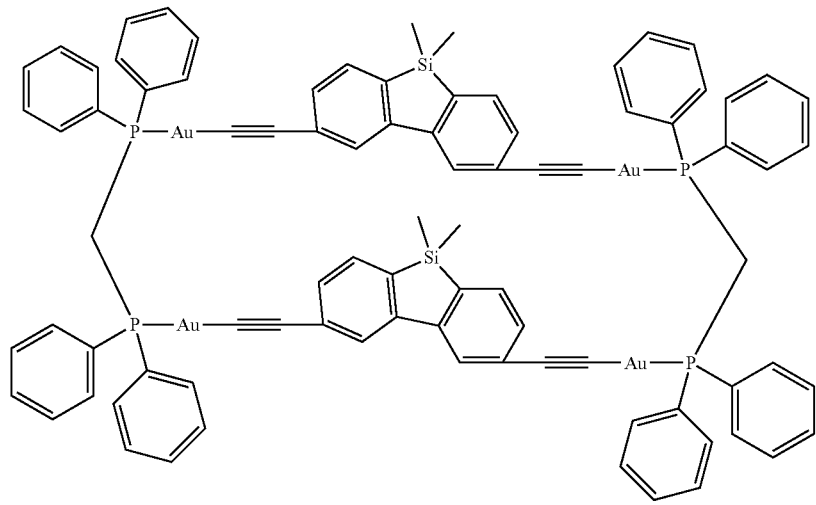
650
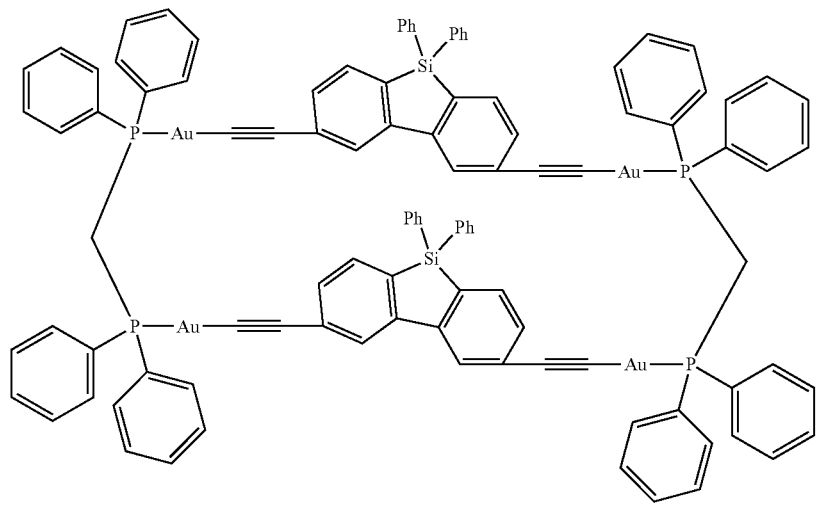
651
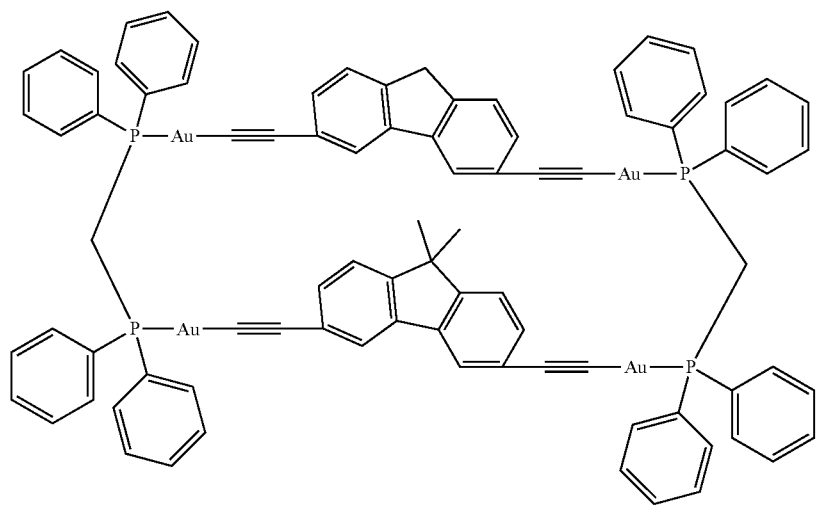
652

-continued
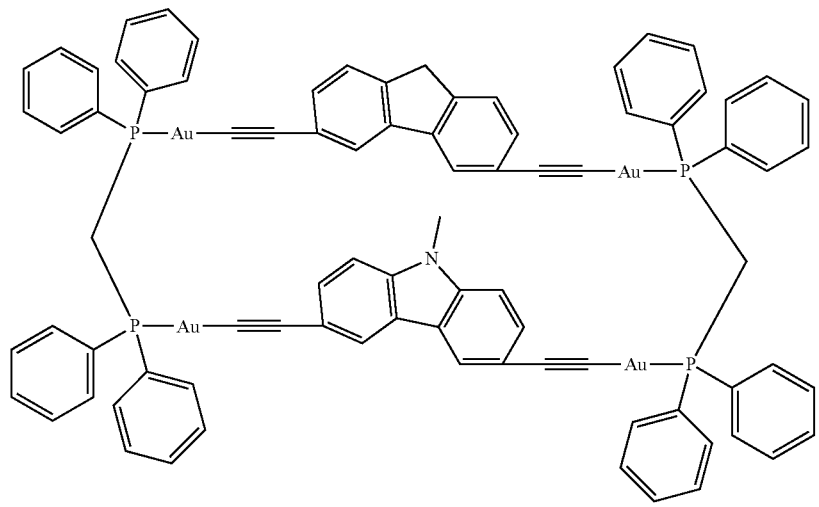
653
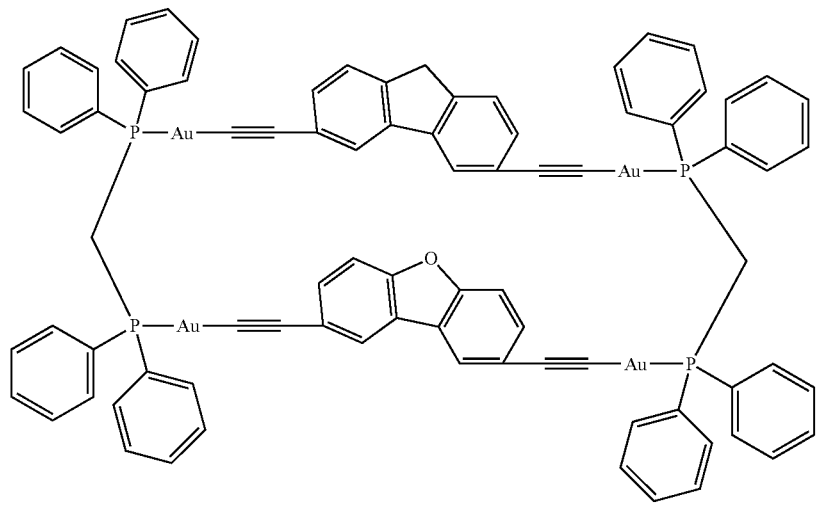
654
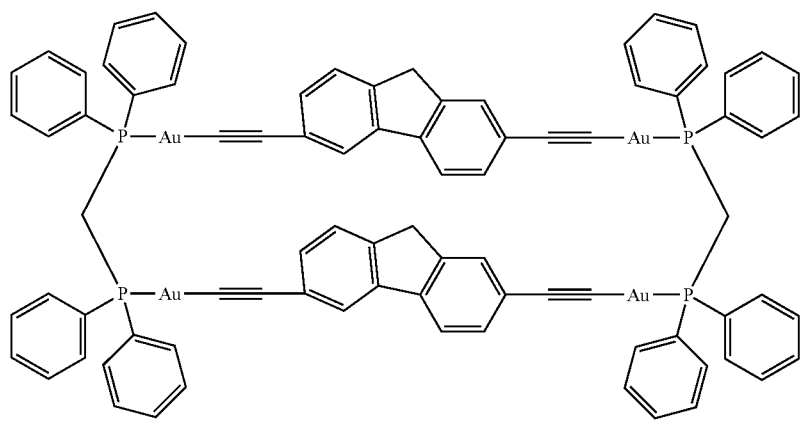
655

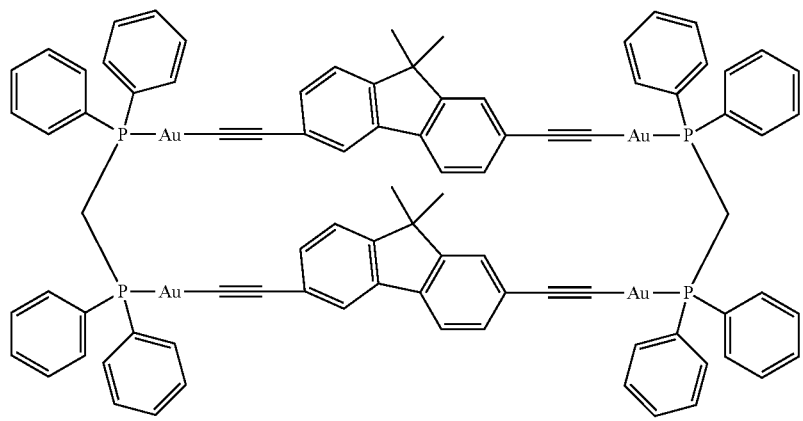
656
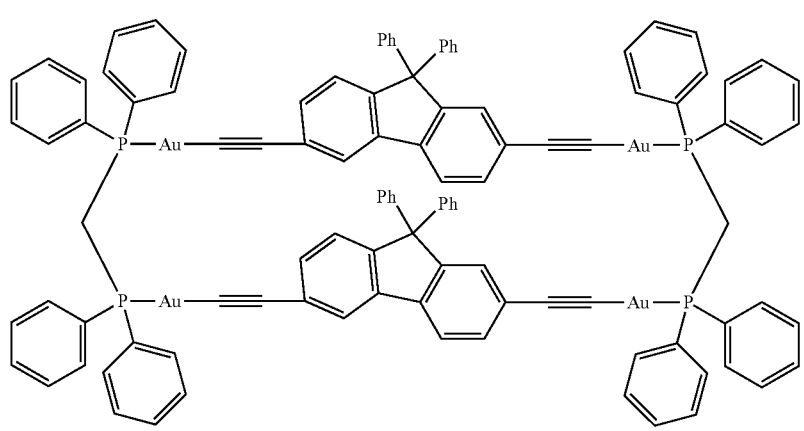
657
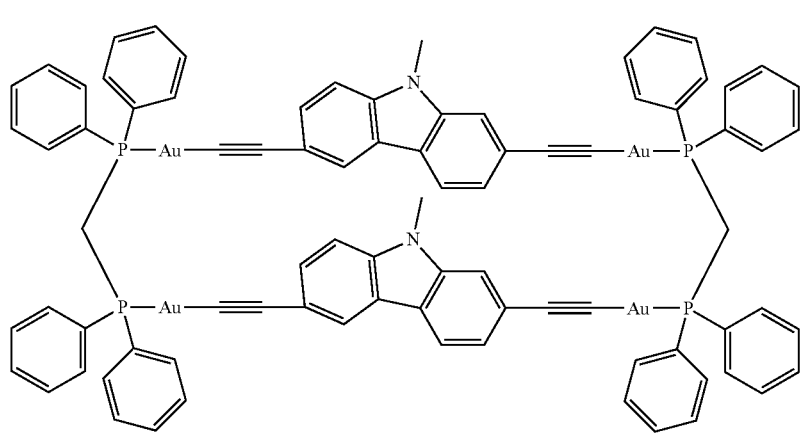
658

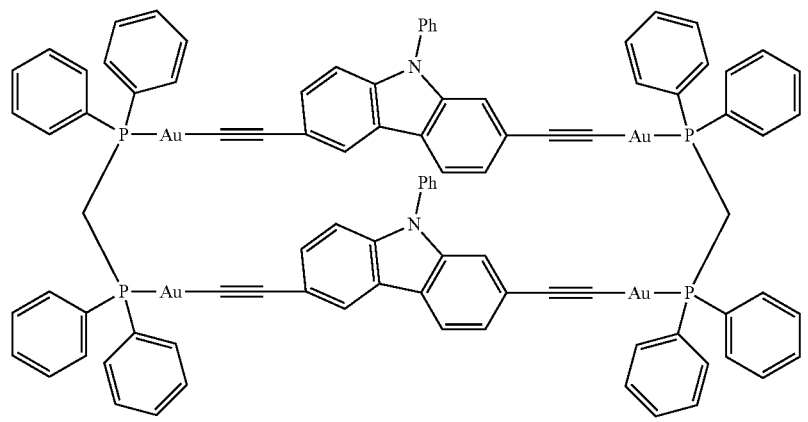
659
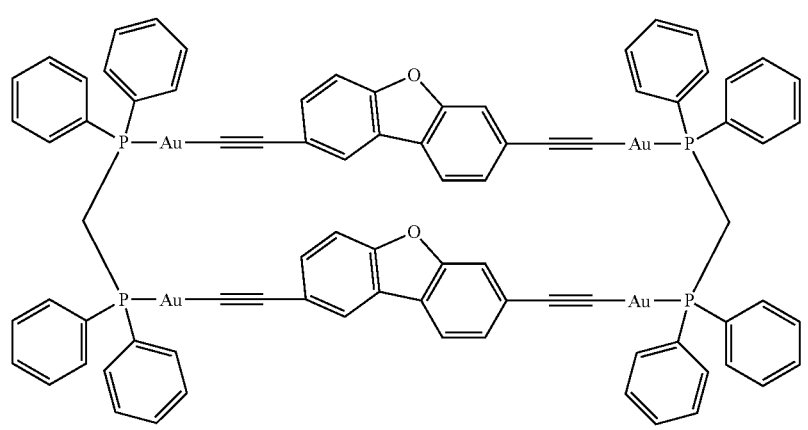
660
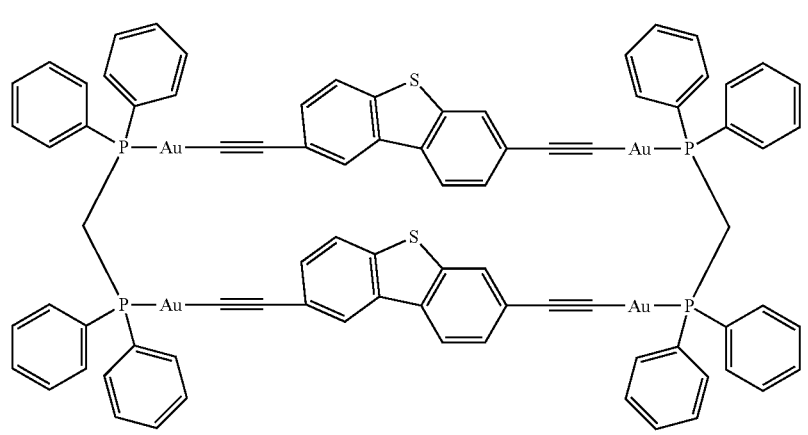
661

-continued
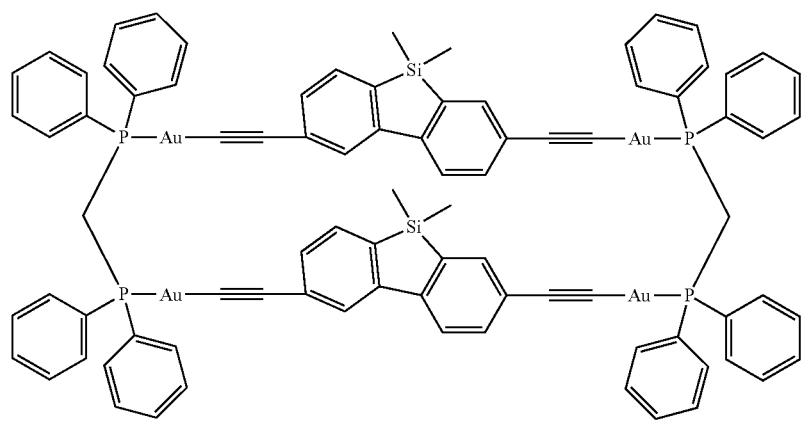
662
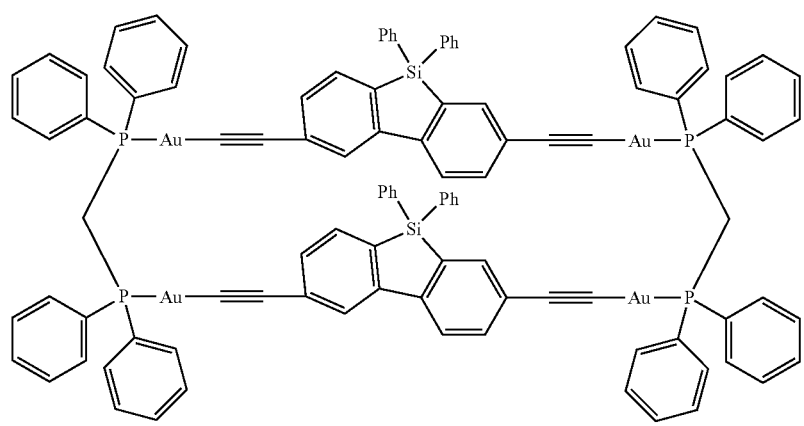
663
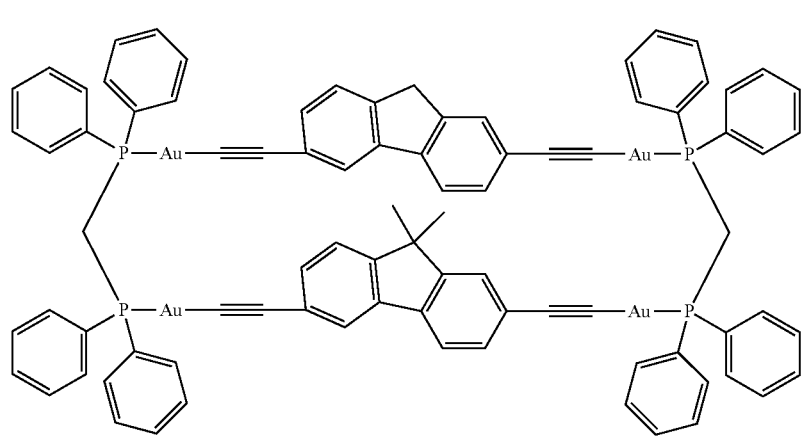
664

-continued
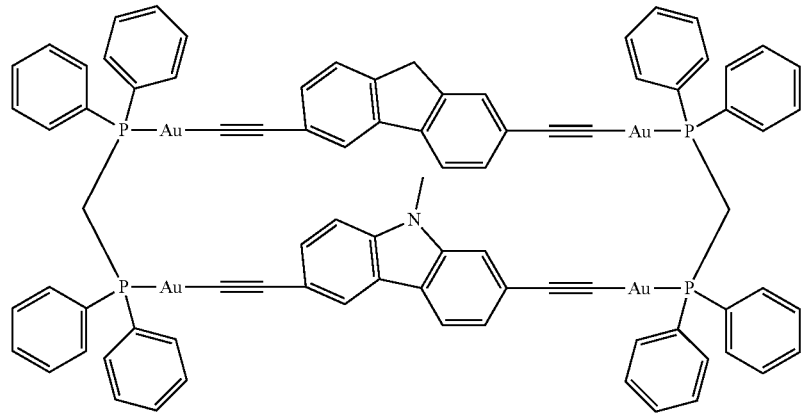
665
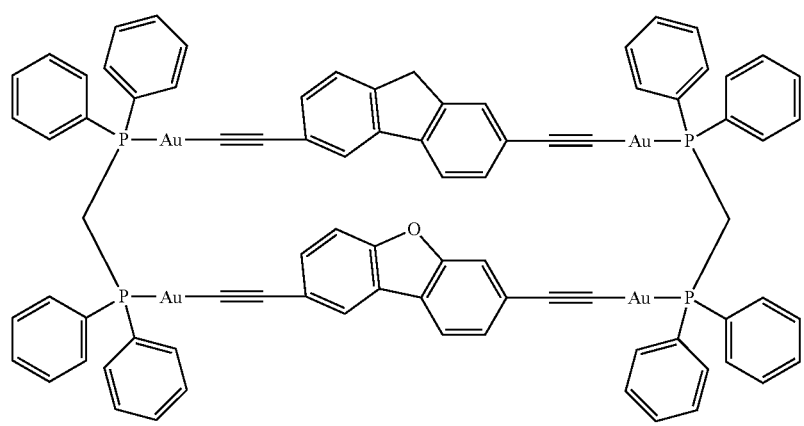
666
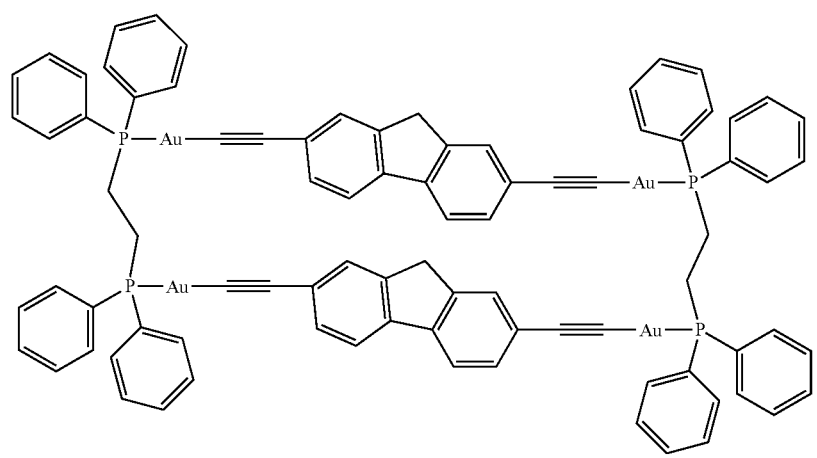
667

-continued
668
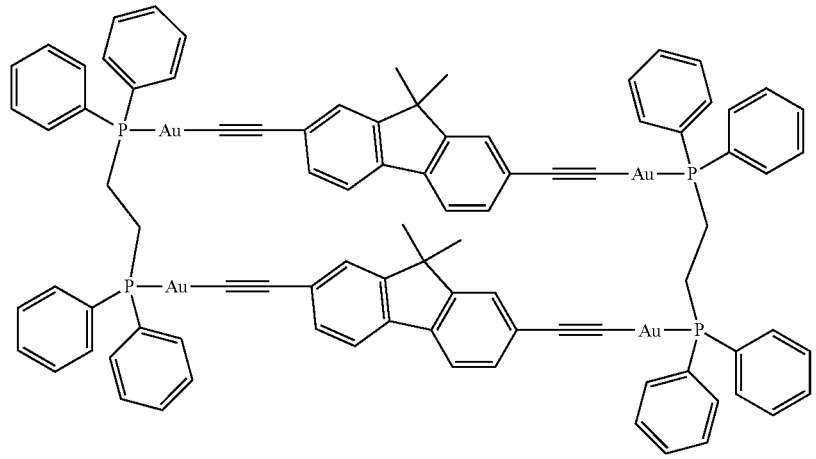
669
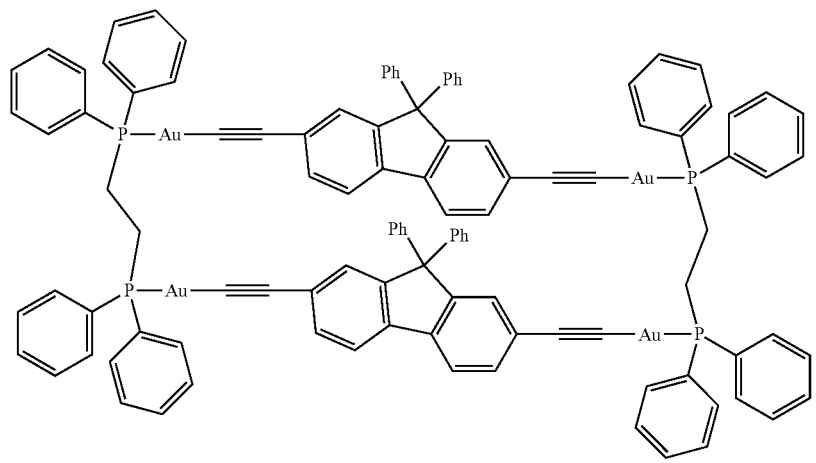
670
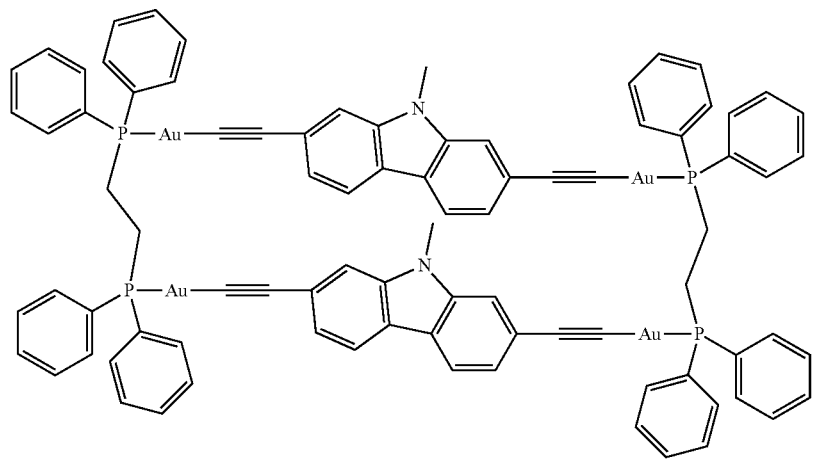

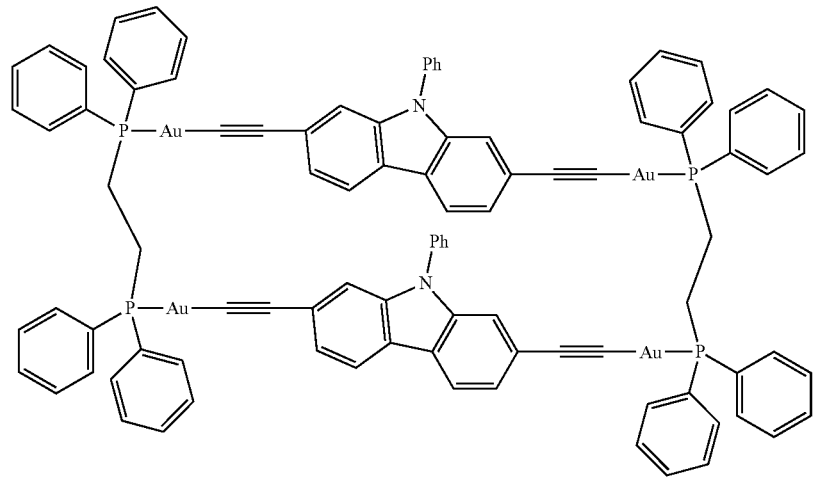
671
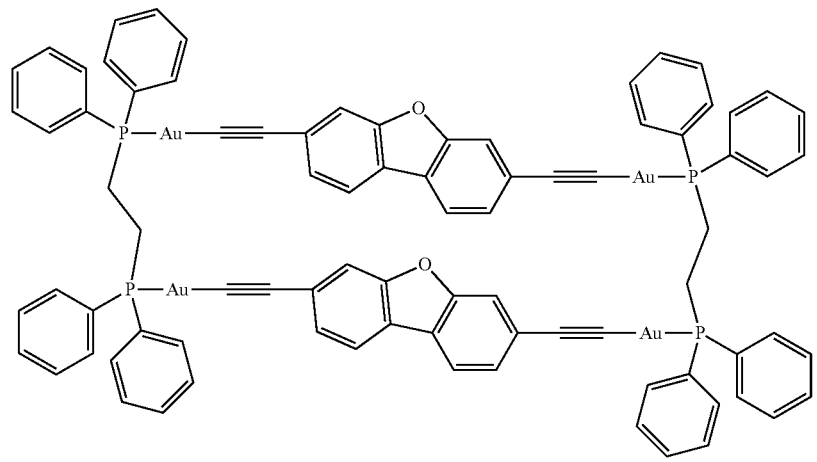
672
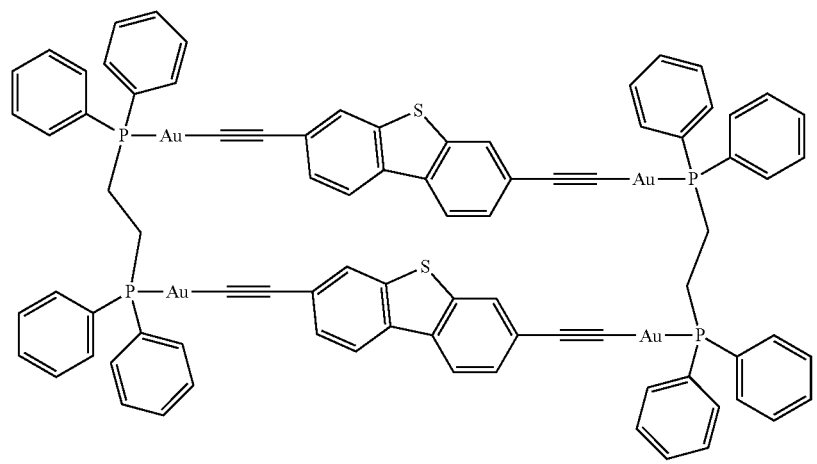
673

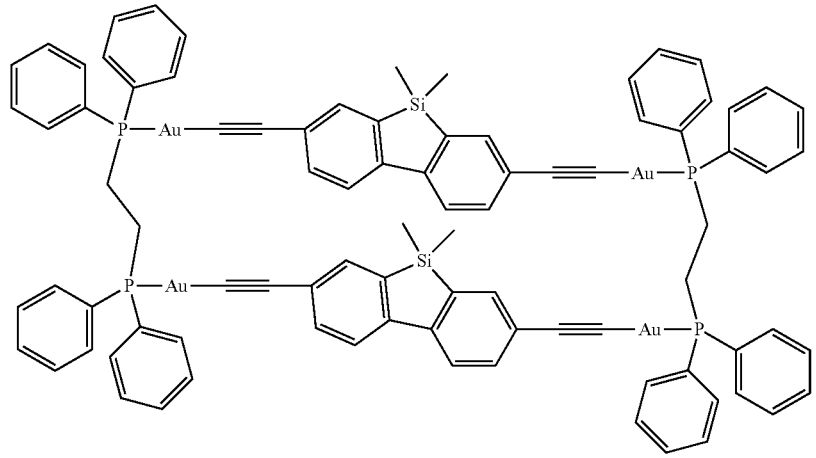
674
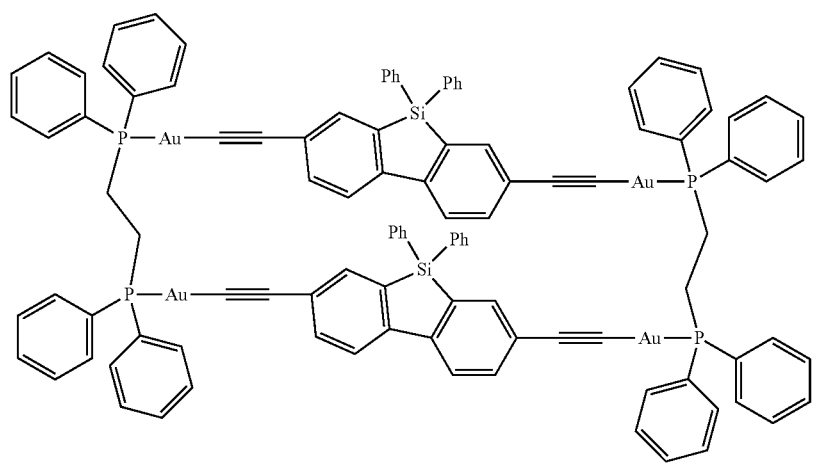
675
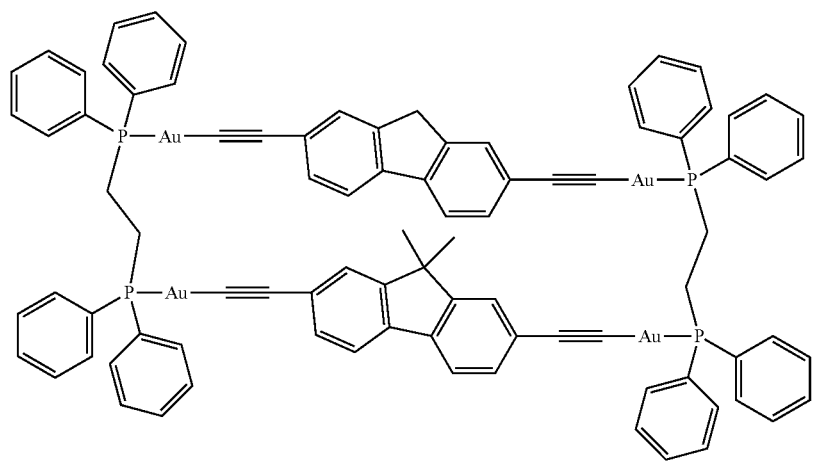
676

-continued
677
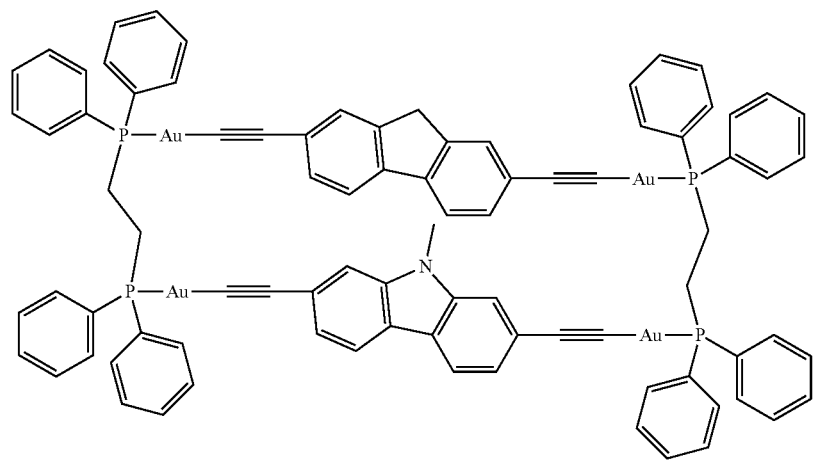
678
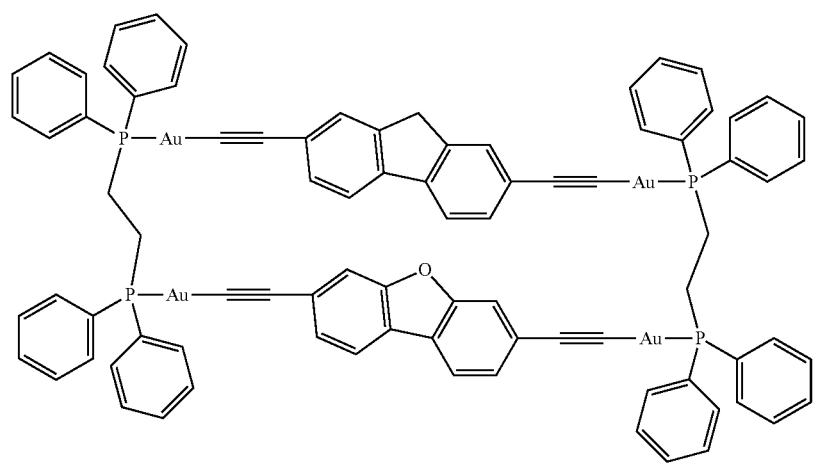
679
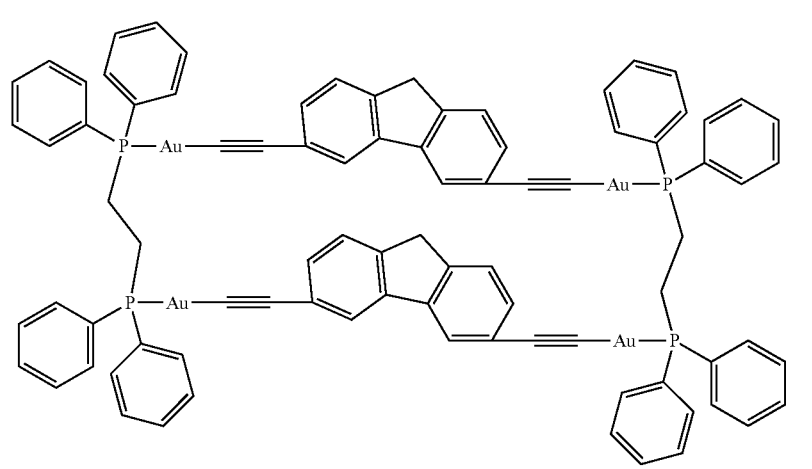

-continued
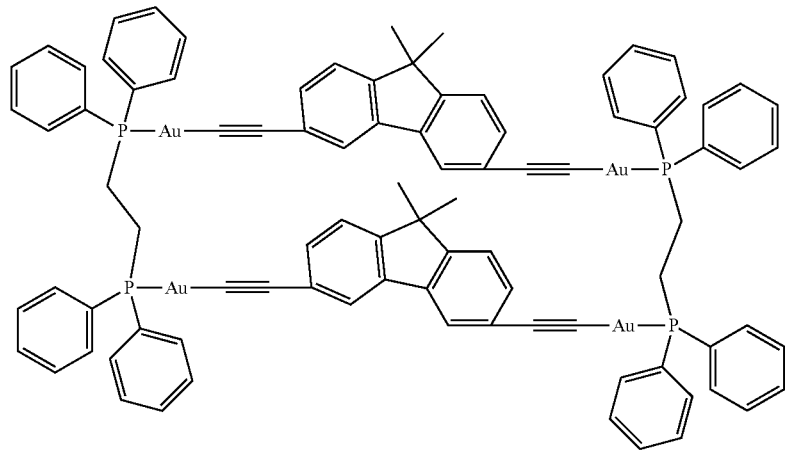
680
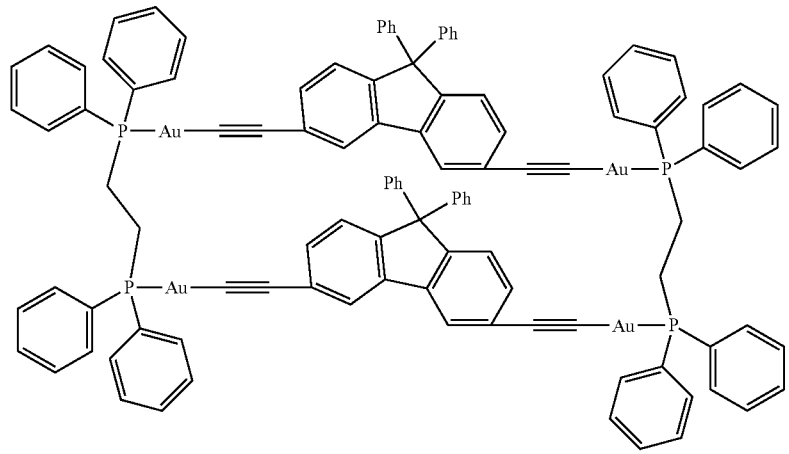
681
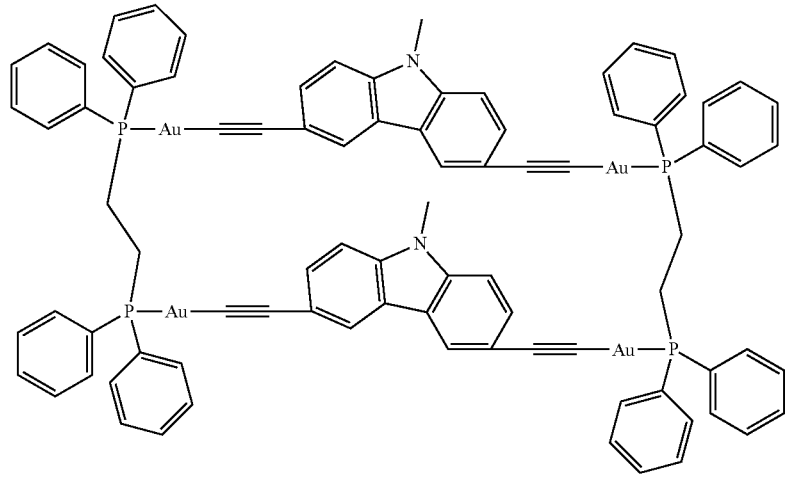
682

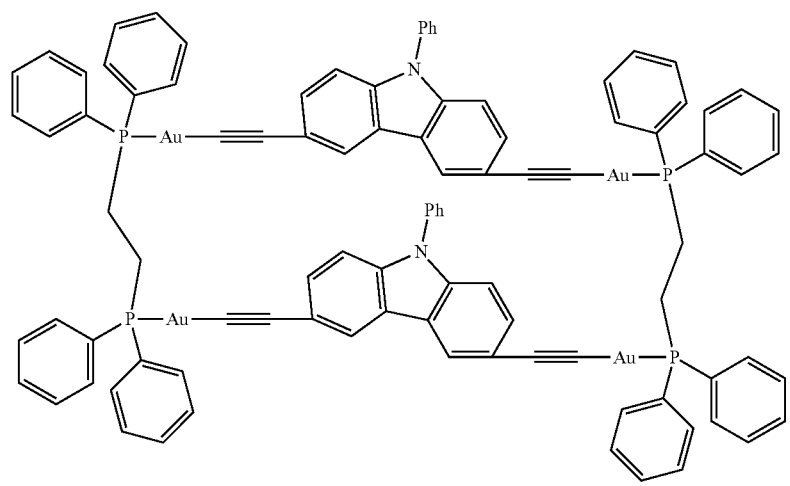
683
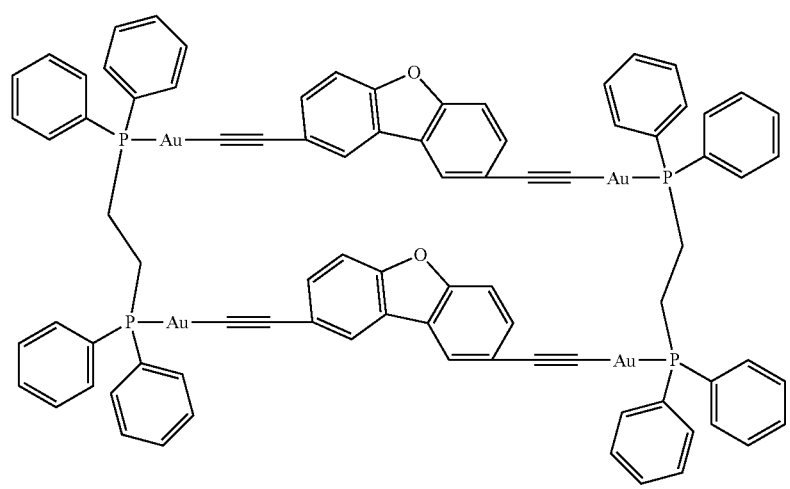
684
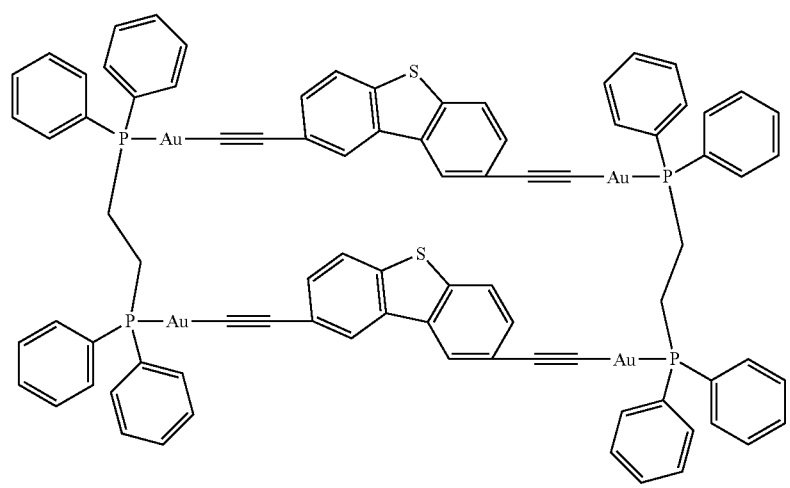
685

-continued
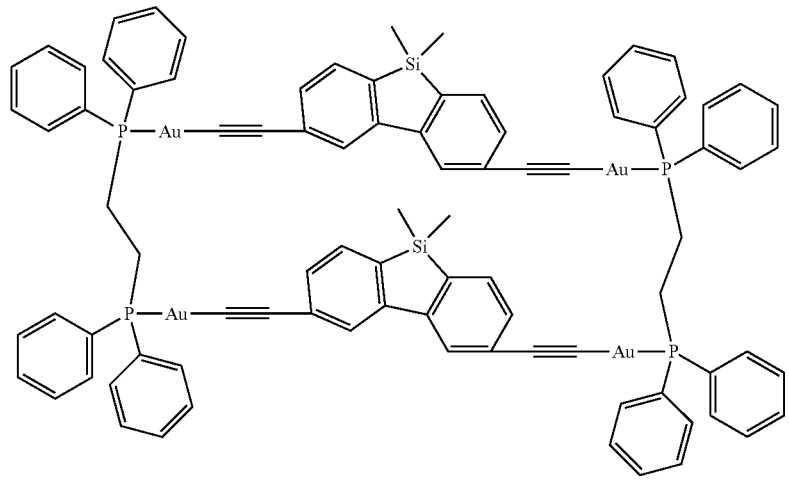
686
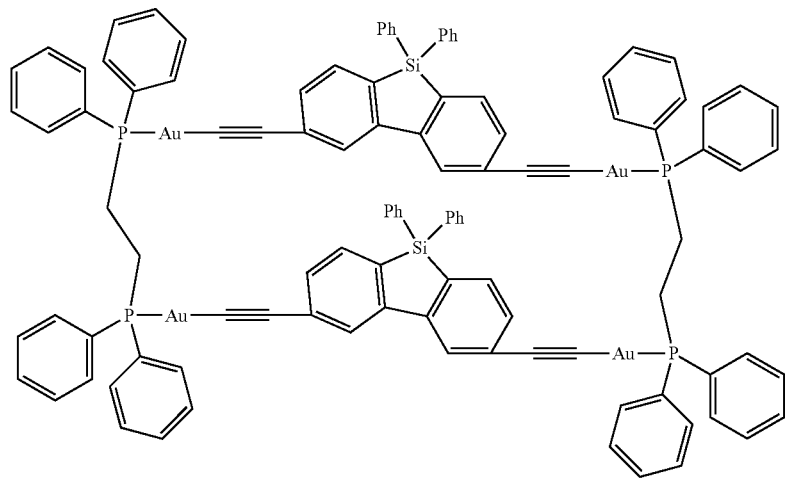
687
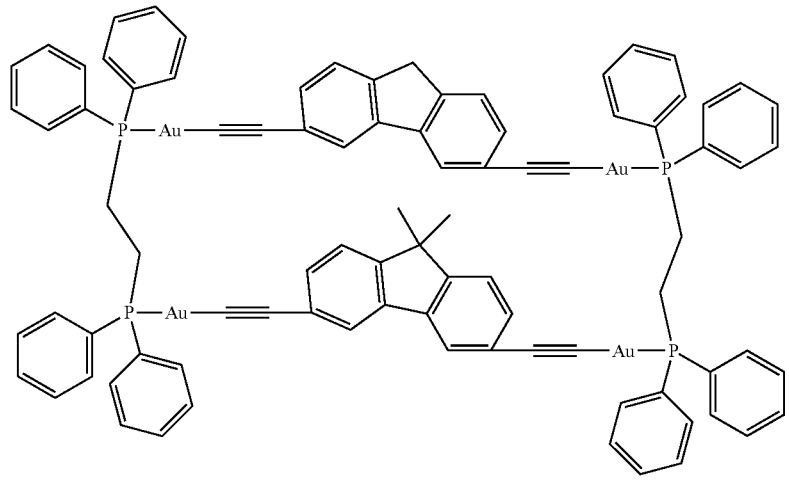
688

-continued
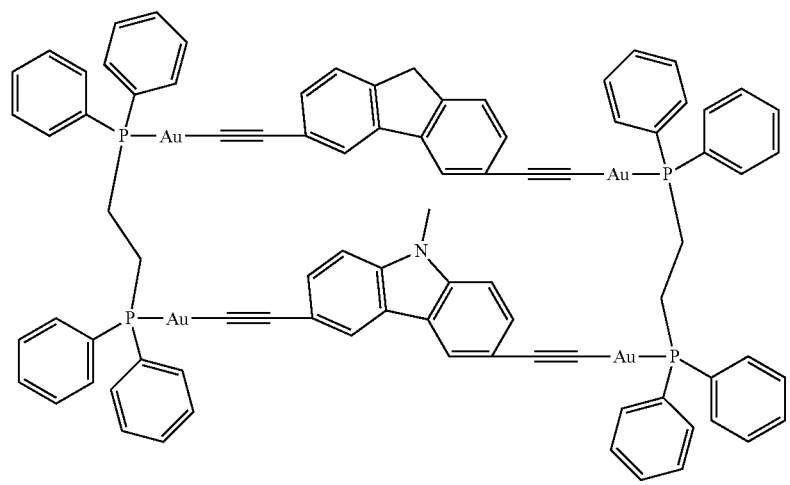
689
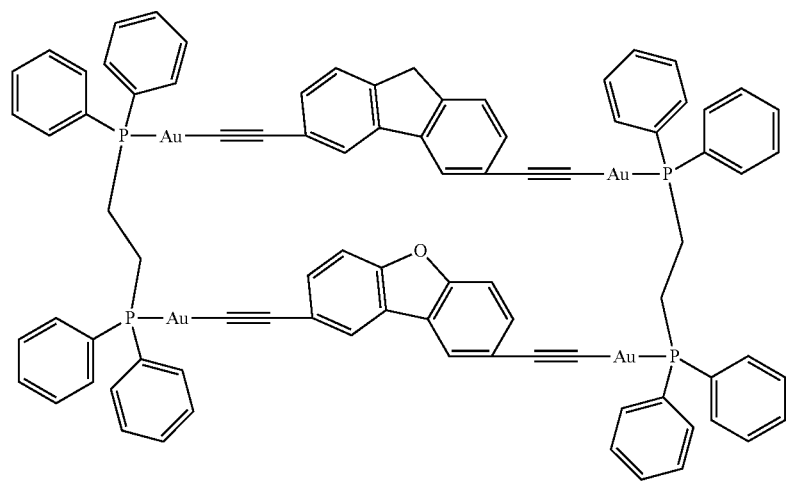
690
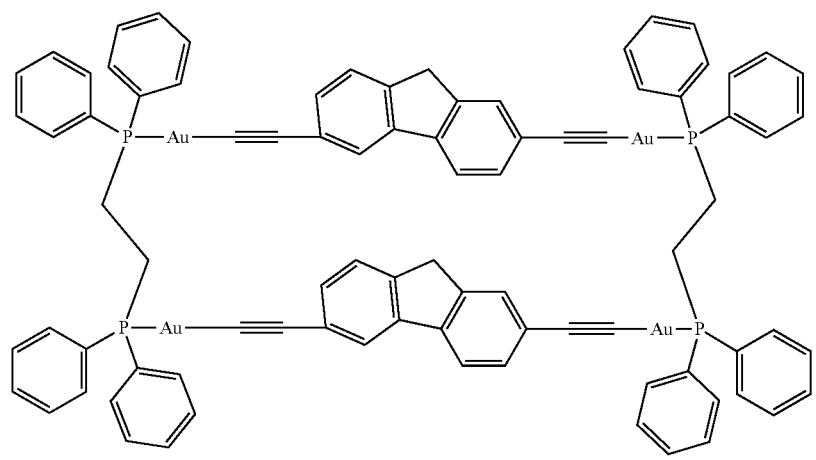
691

-continued
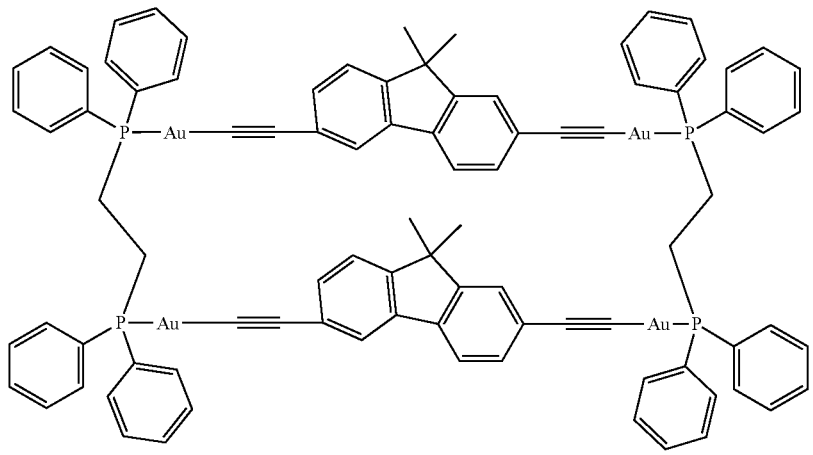
692
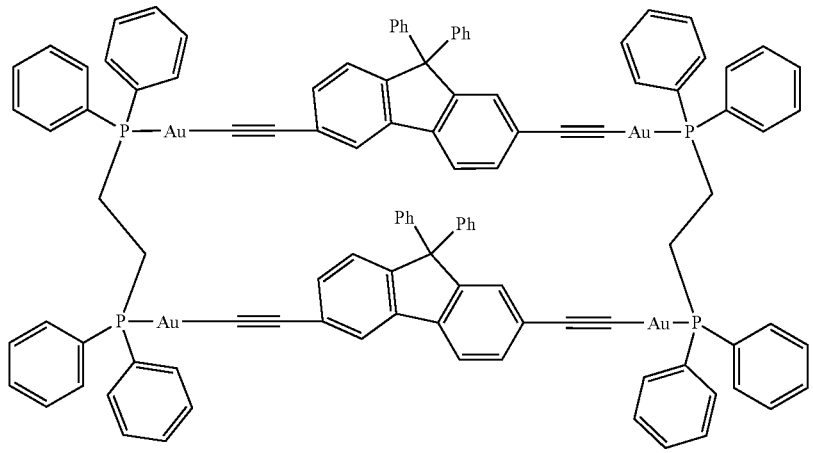
693
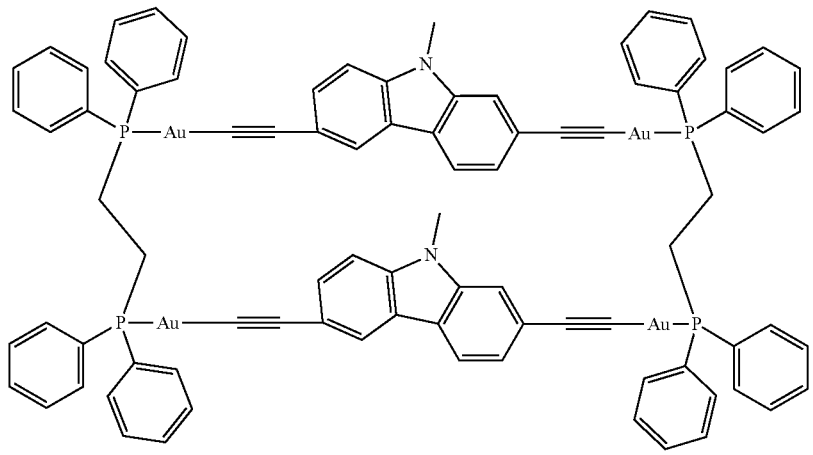
694

-continued
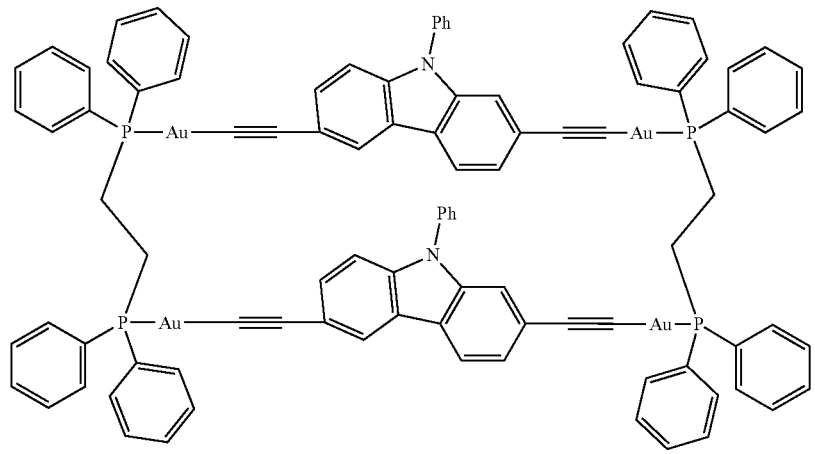
695
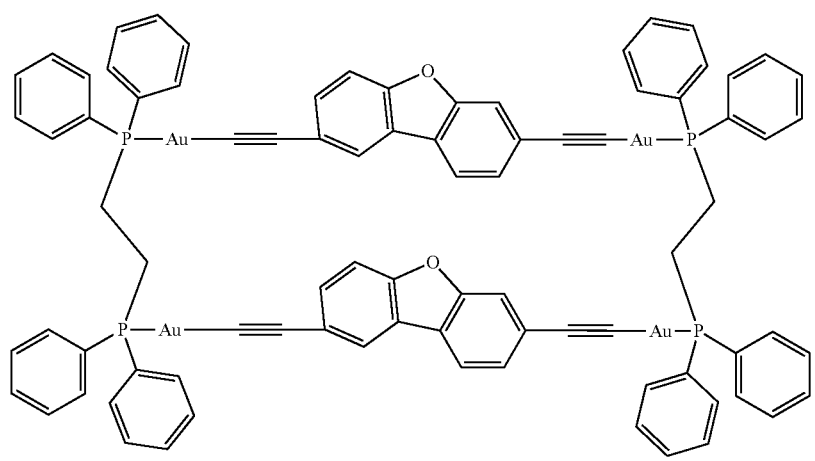
696
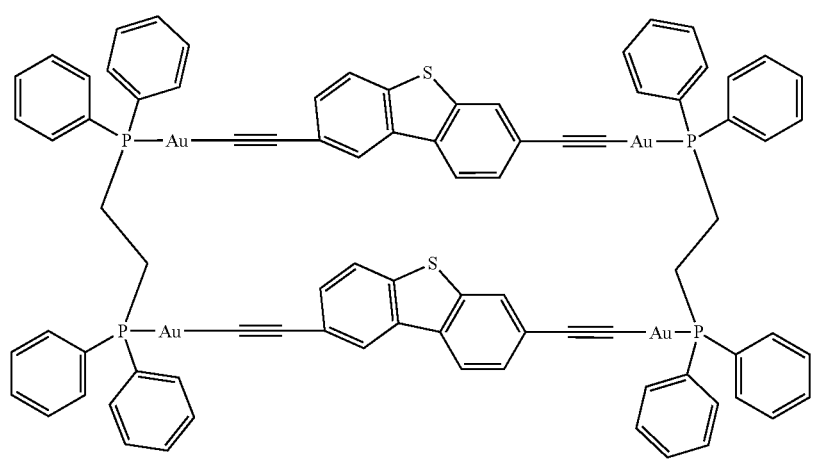
697

-continued
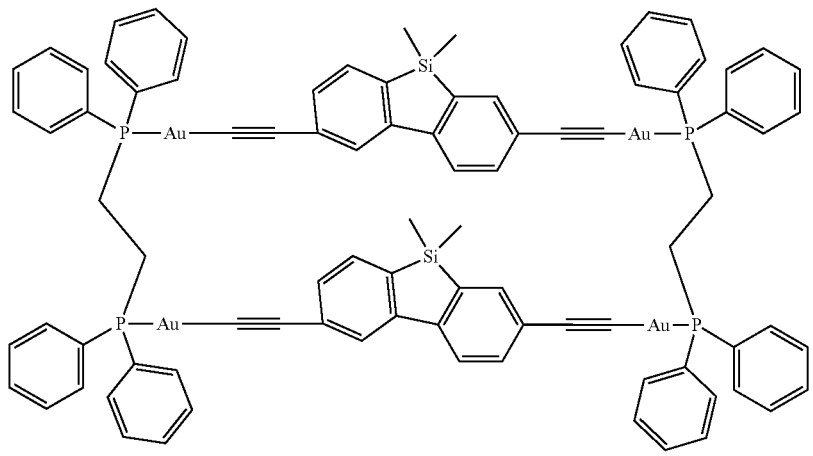
698
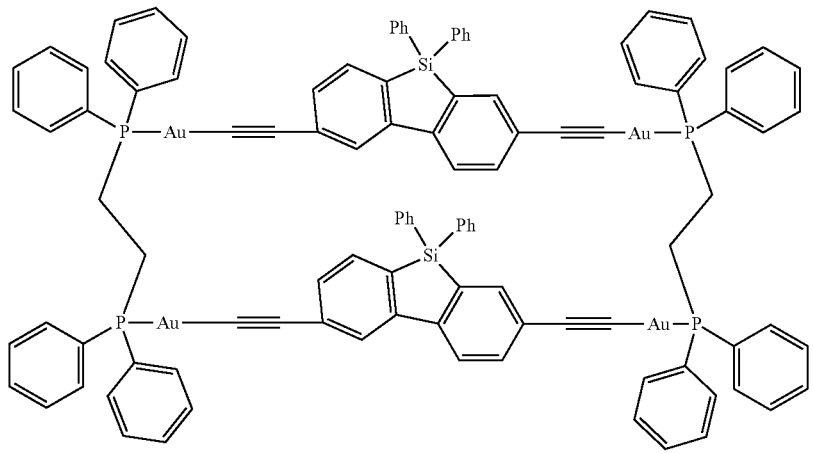
699
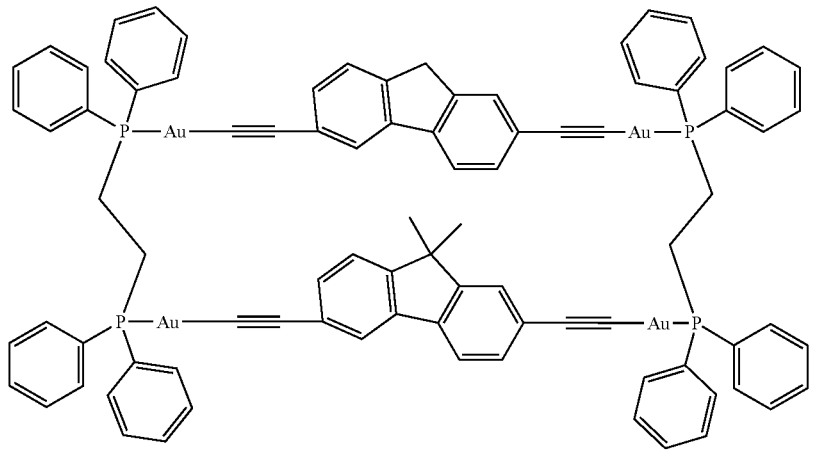
700

-continued
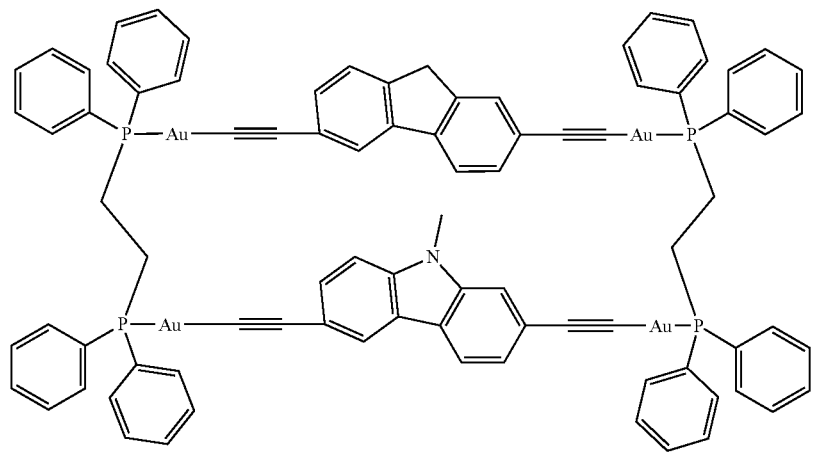
701
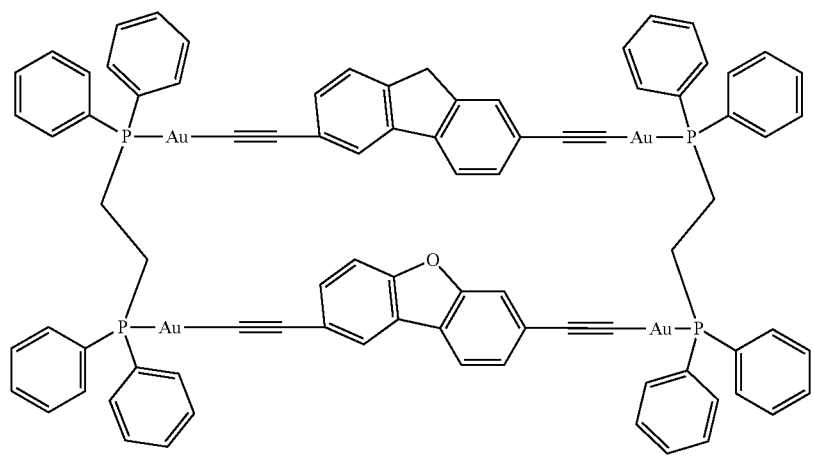
702
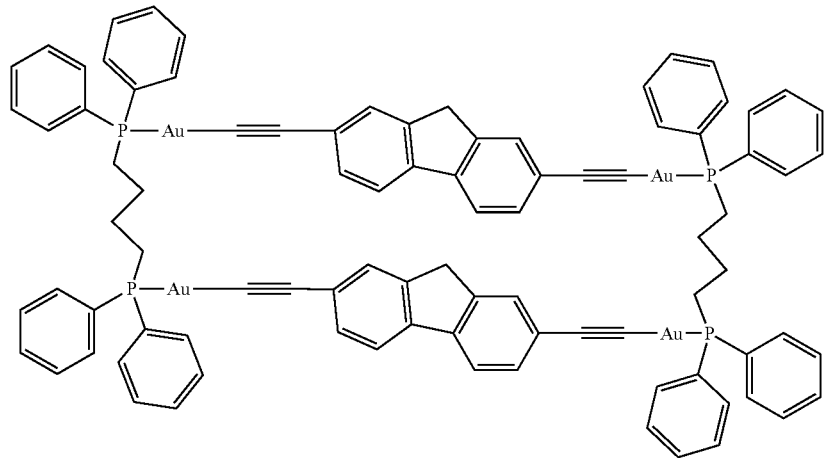
703

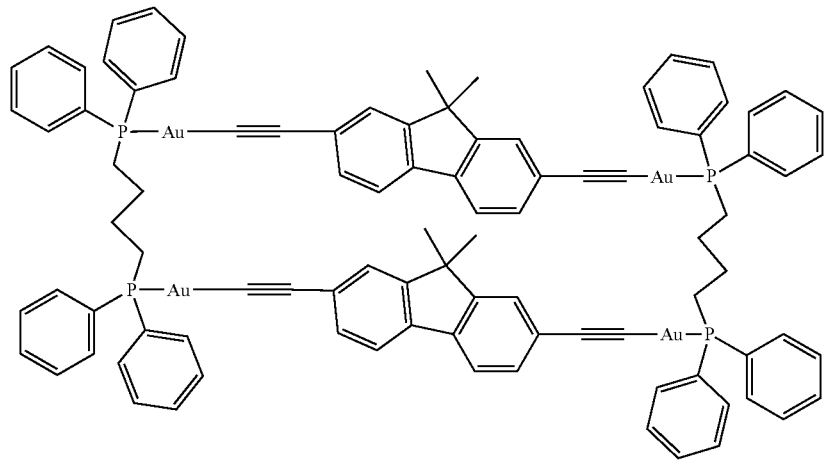
704
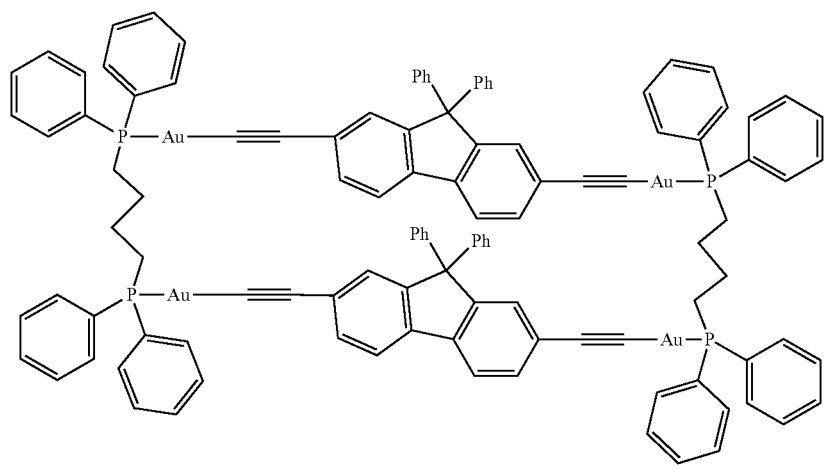
705
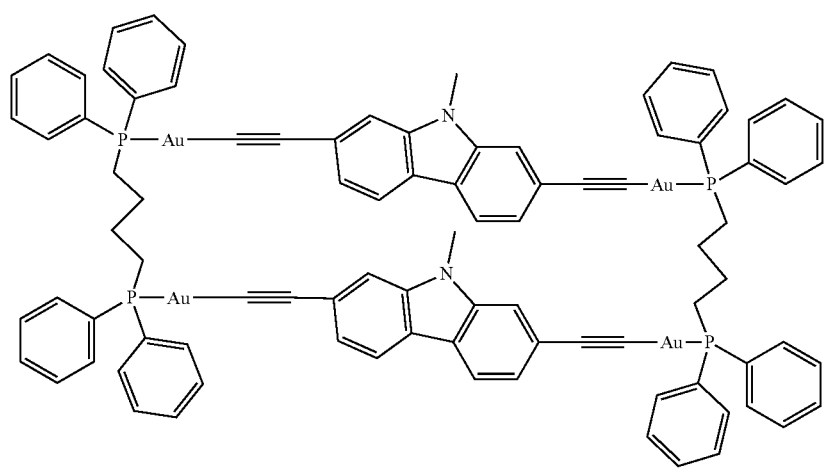
706

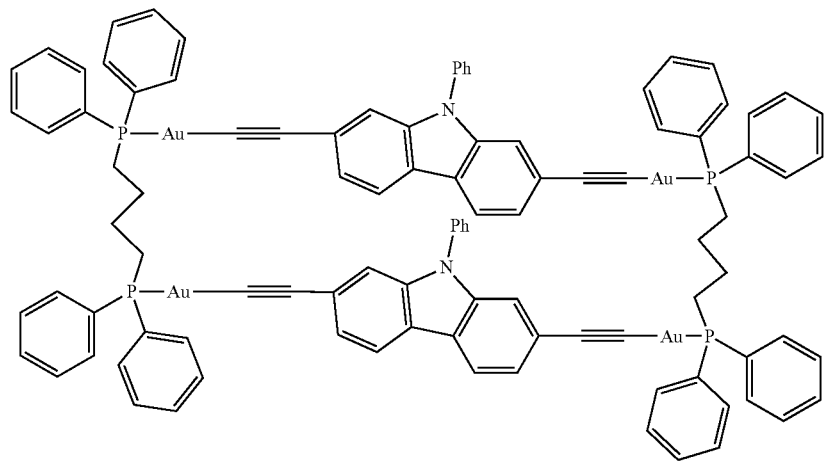
707
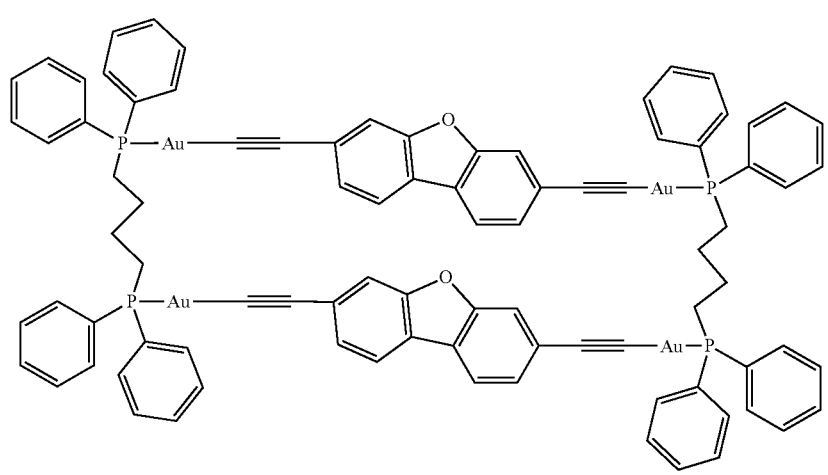
708
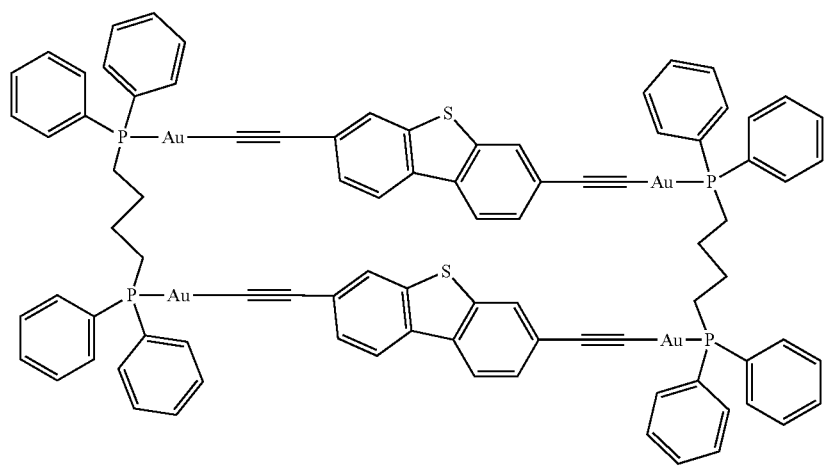
709

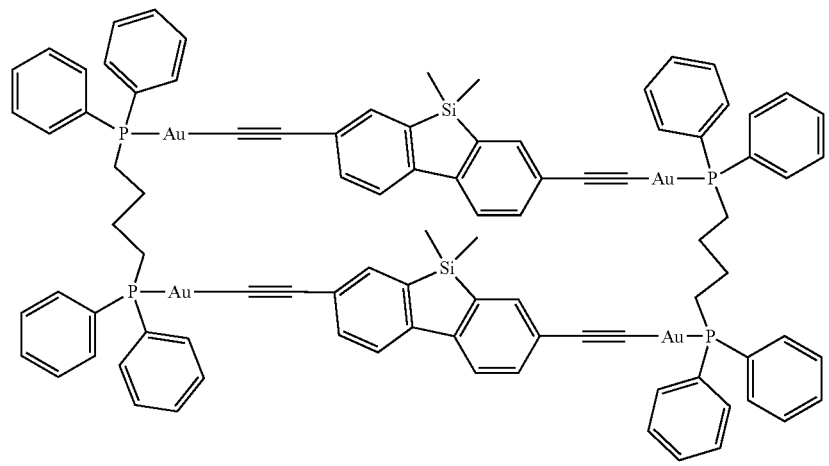
710
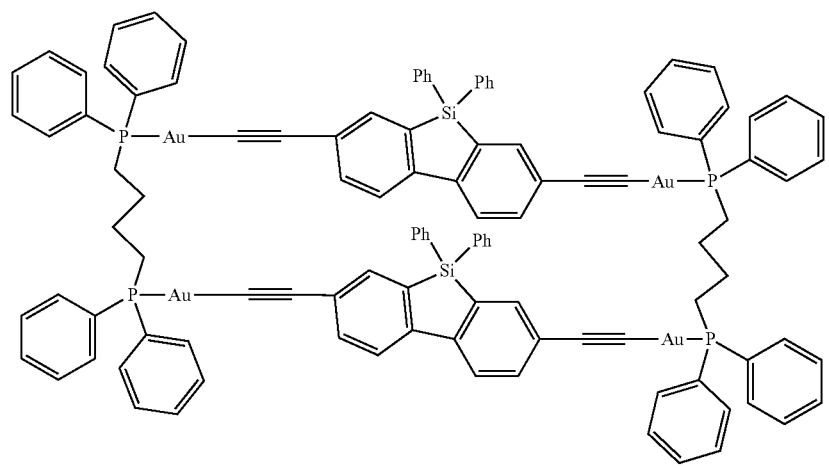
711
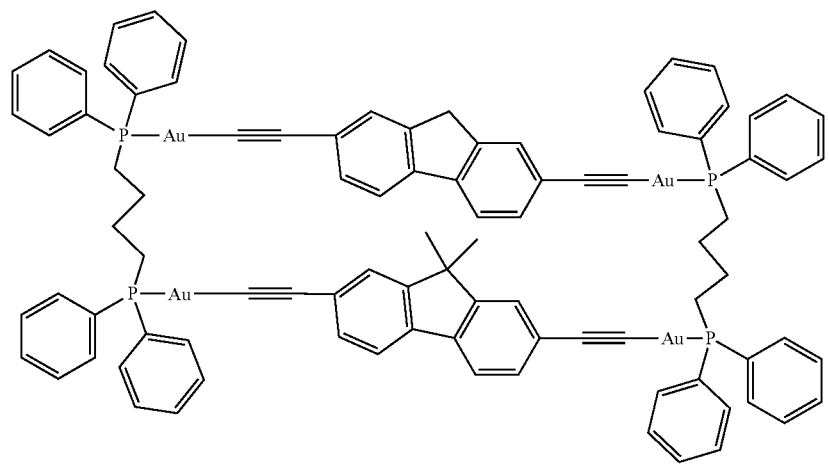
712

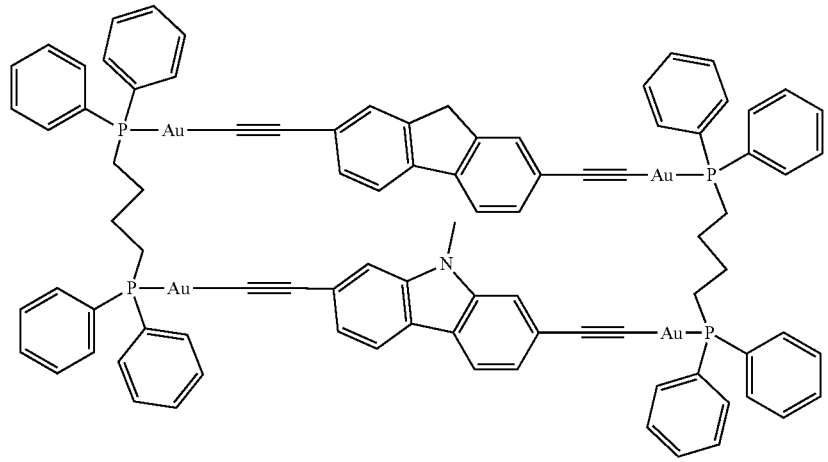
713
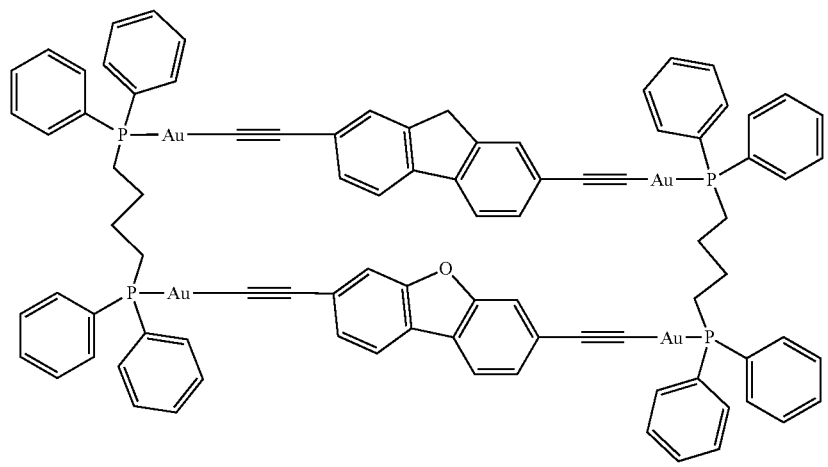
714
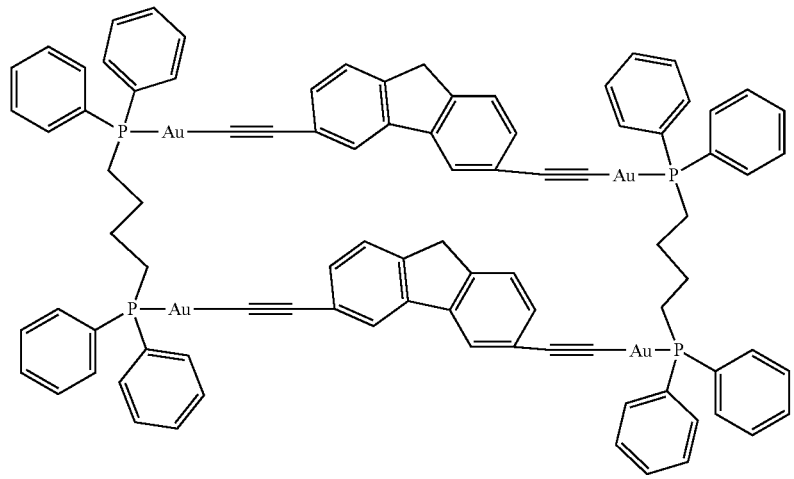
715

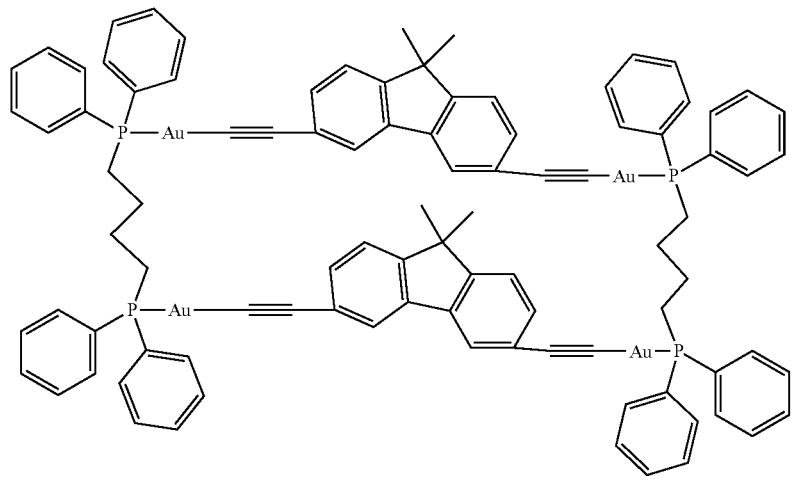
716
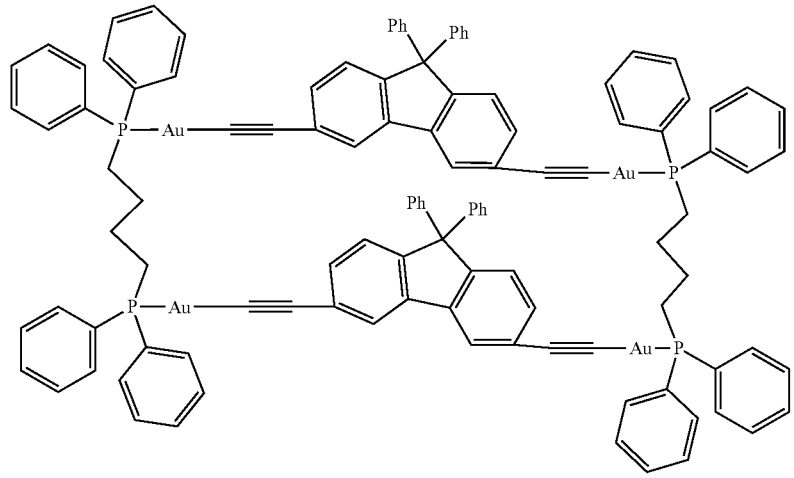
717
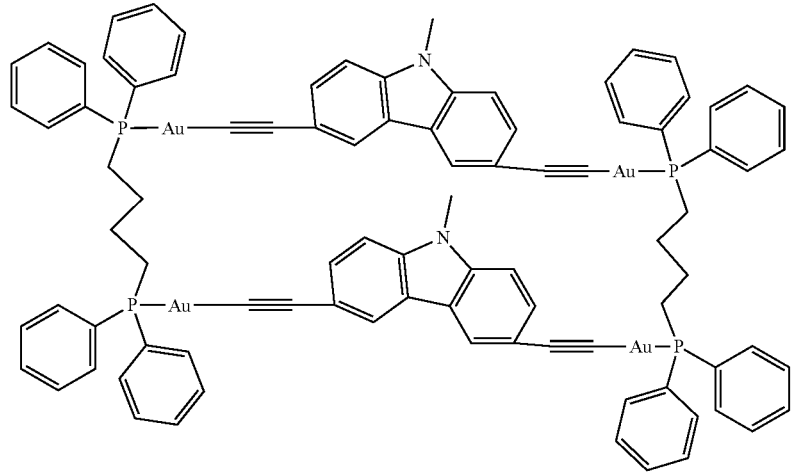
718

-continued
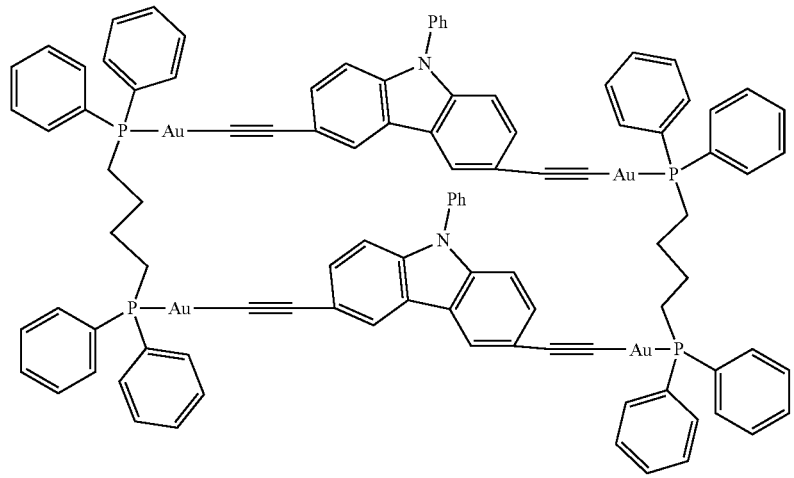
719
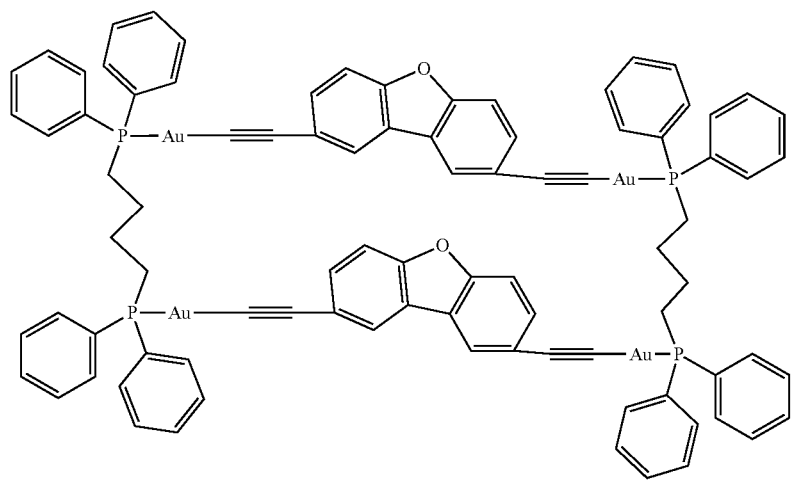
720
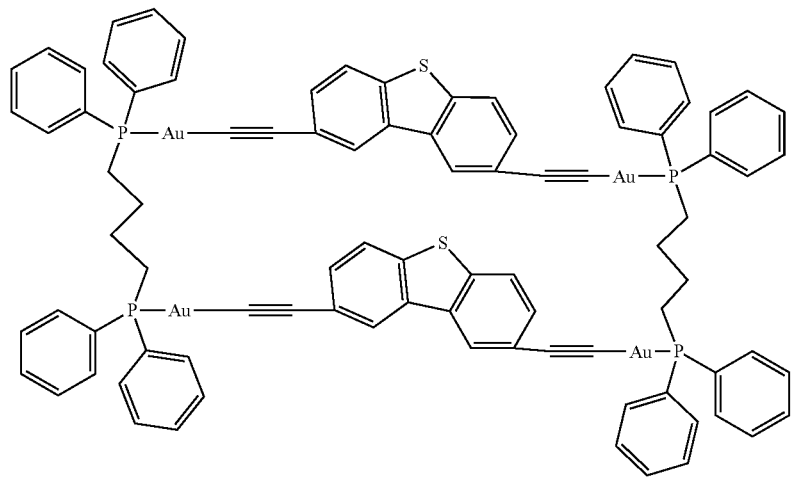
721

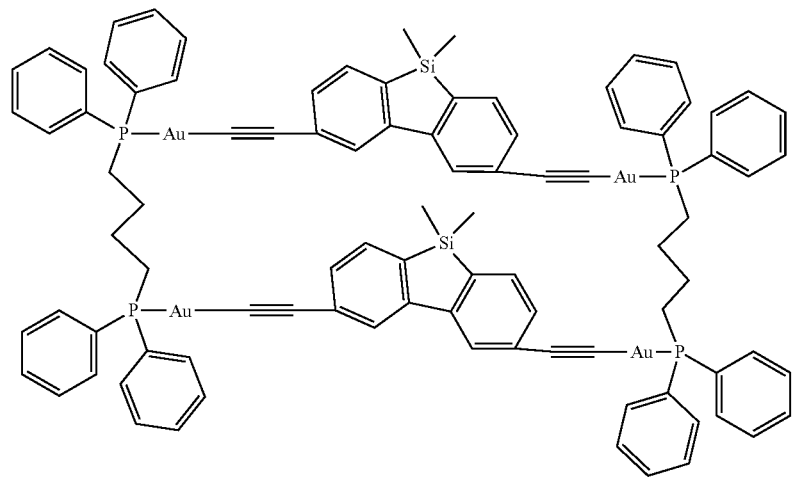
722
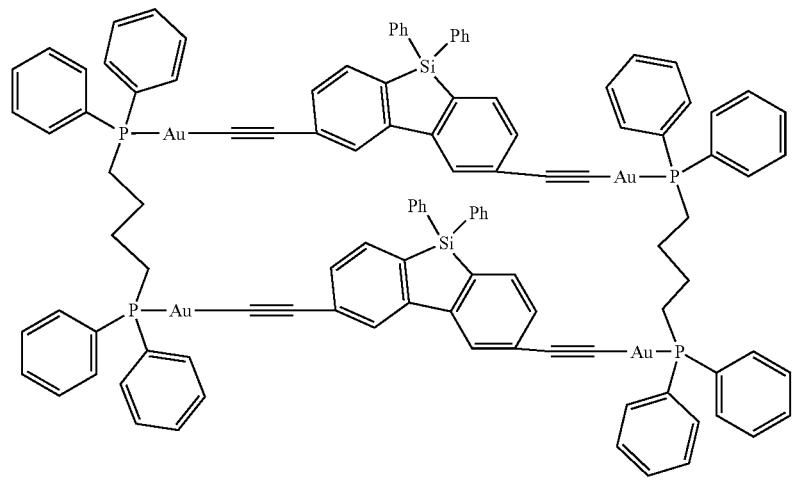
723
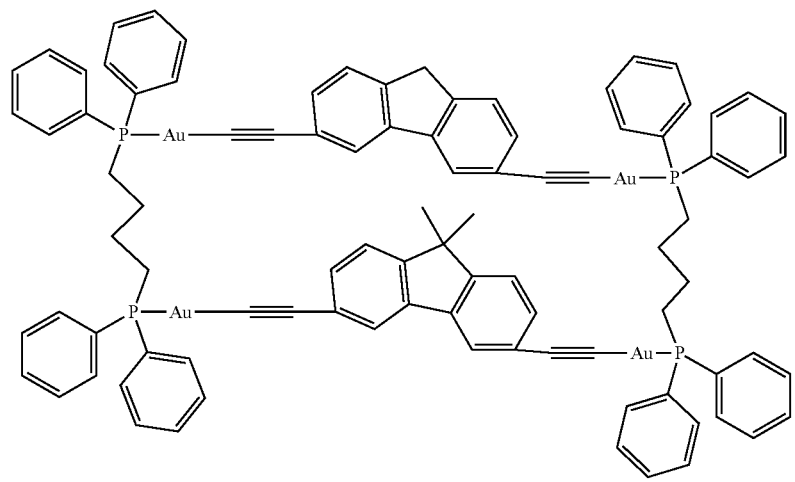
724

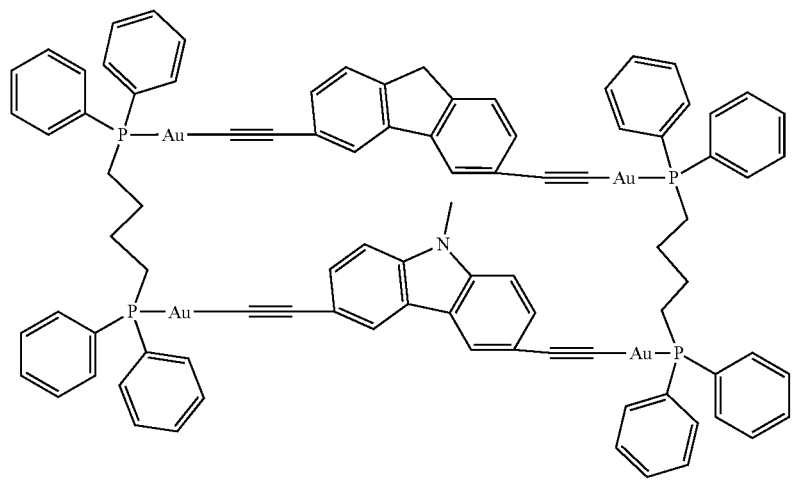
725
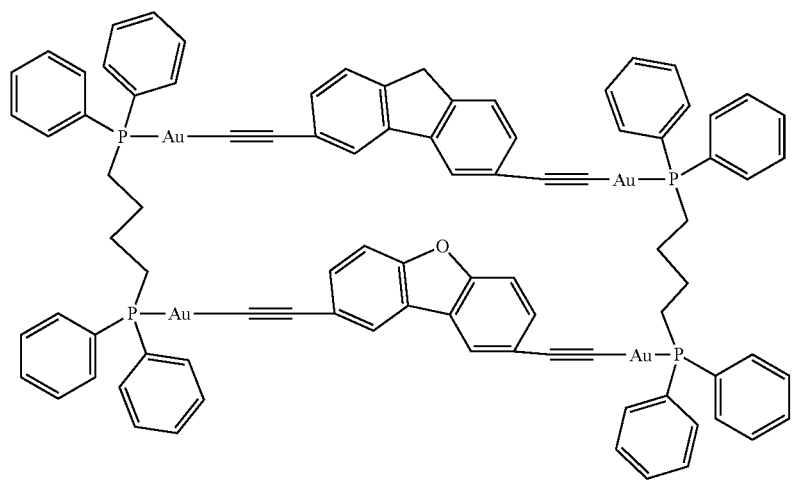
726
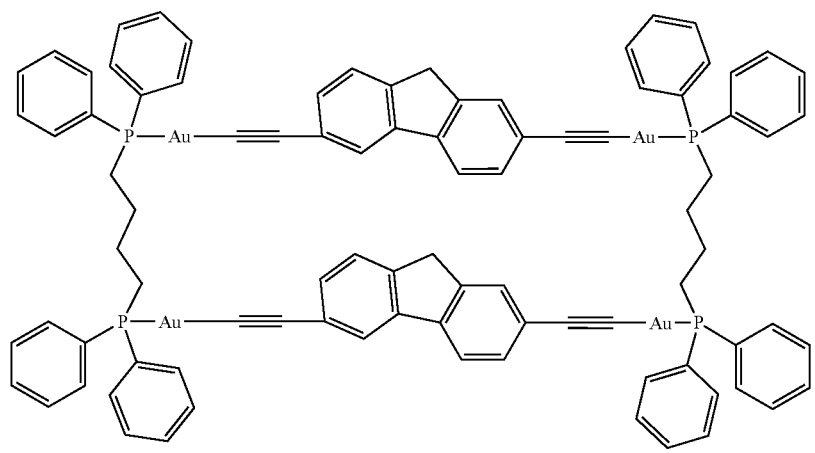
727

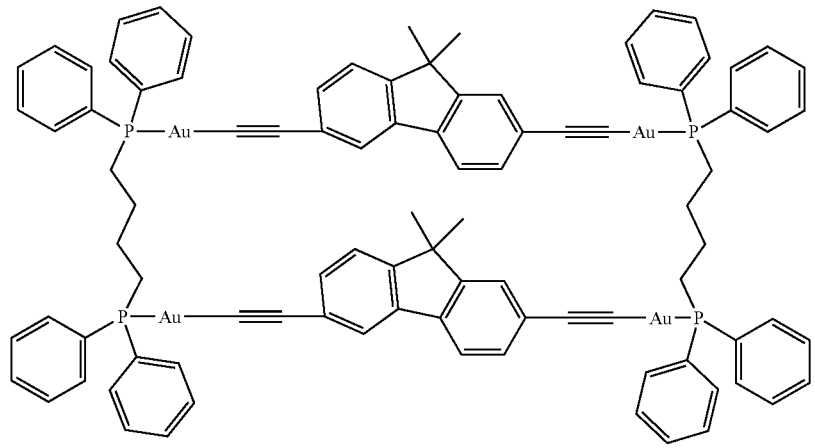
728
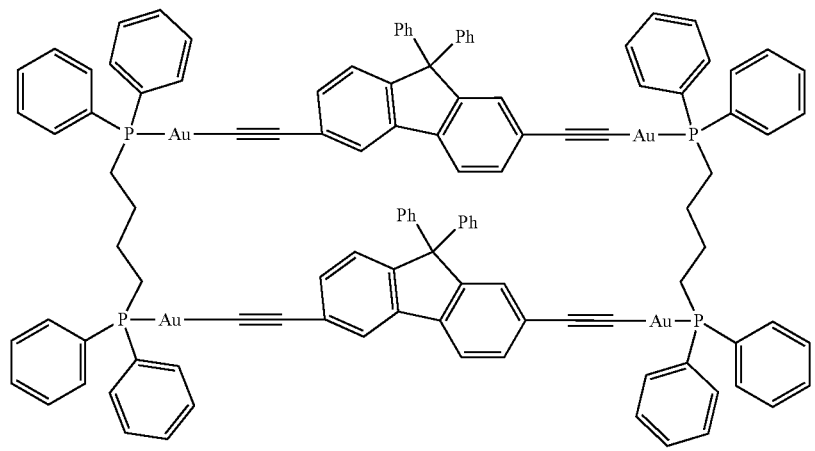
729
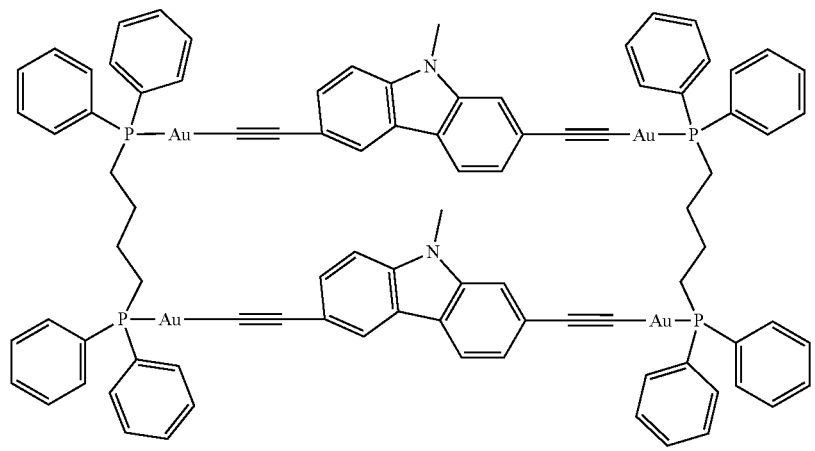
730

731
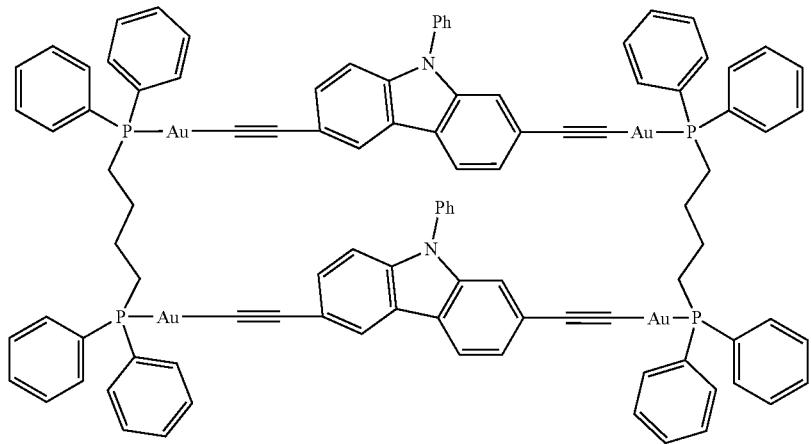
732
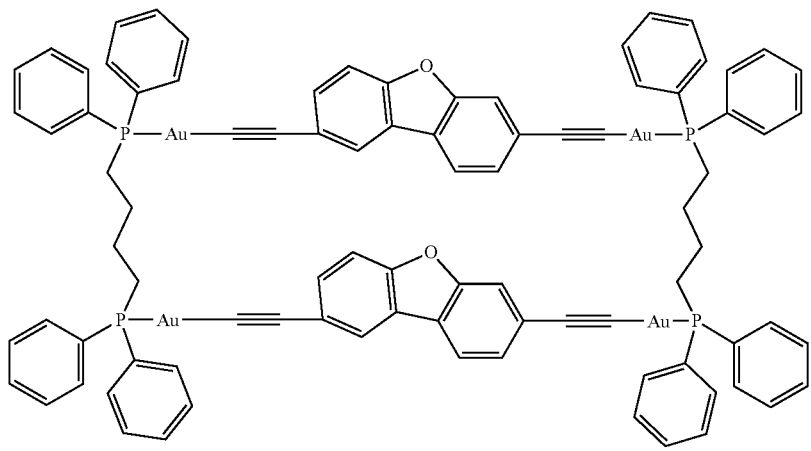
733
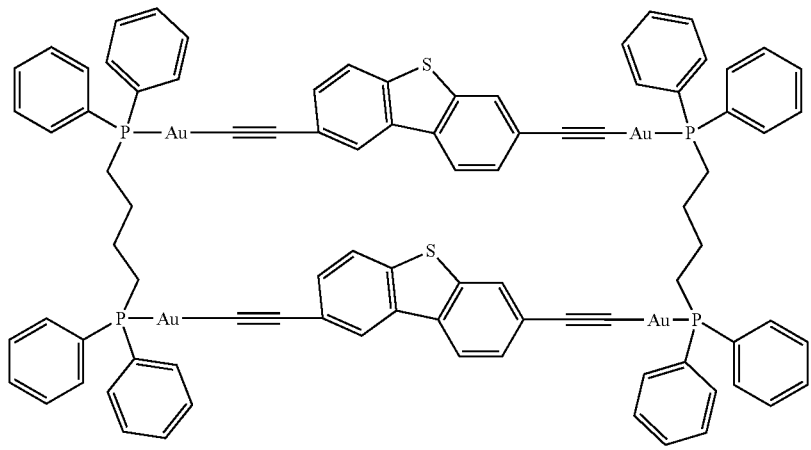

734
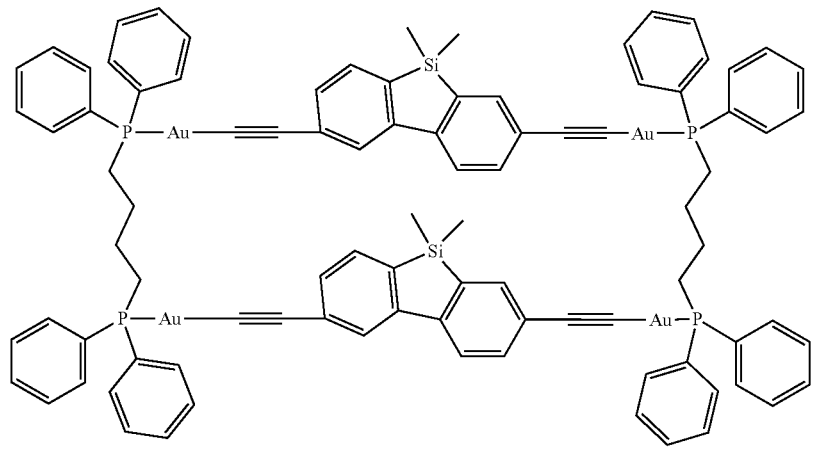
735
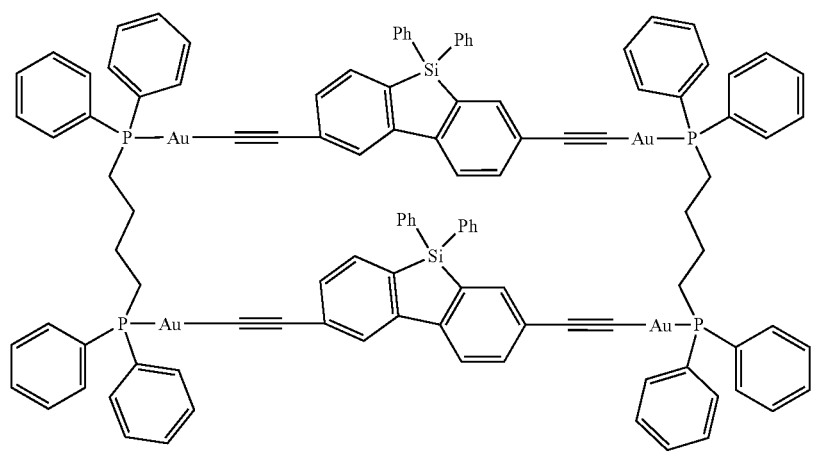
736
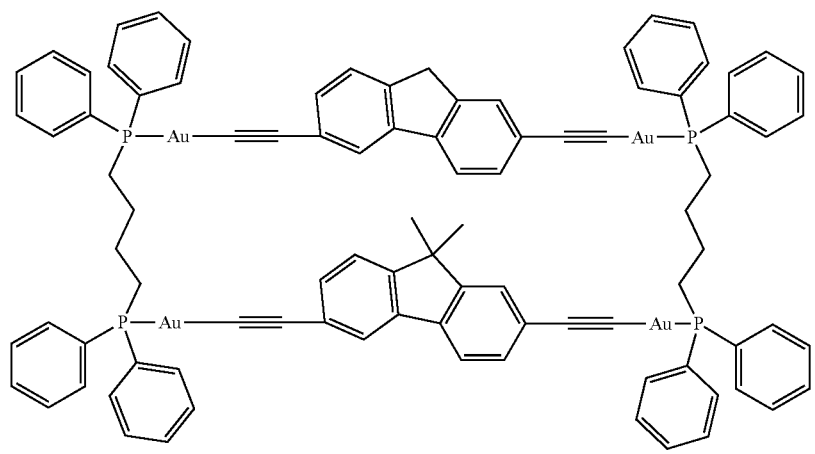

737
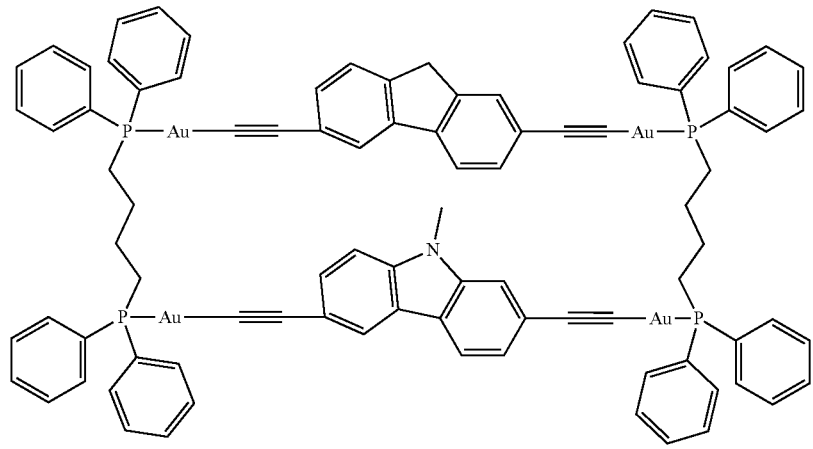
738
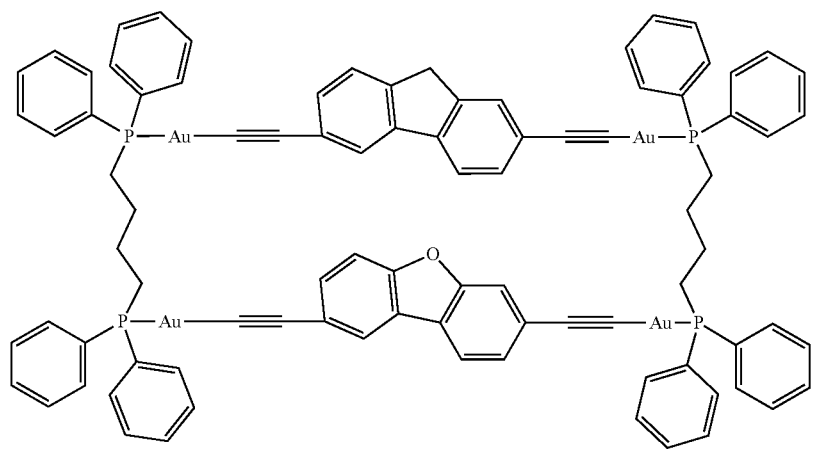
739
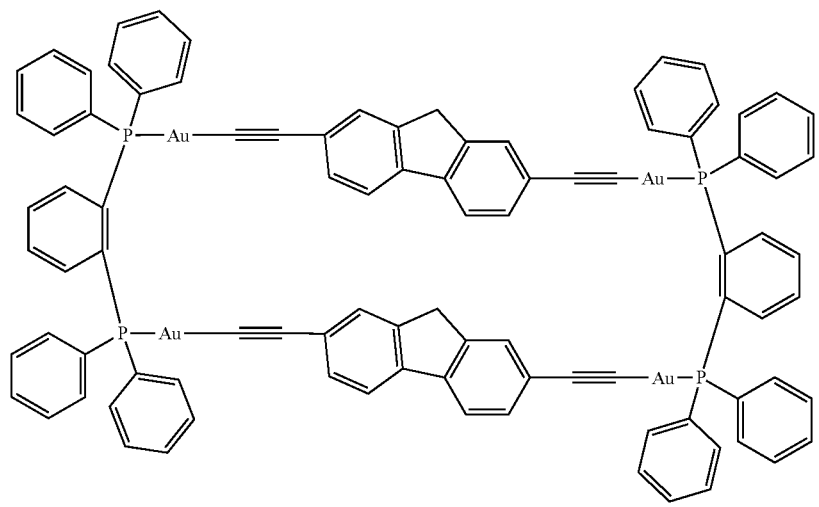

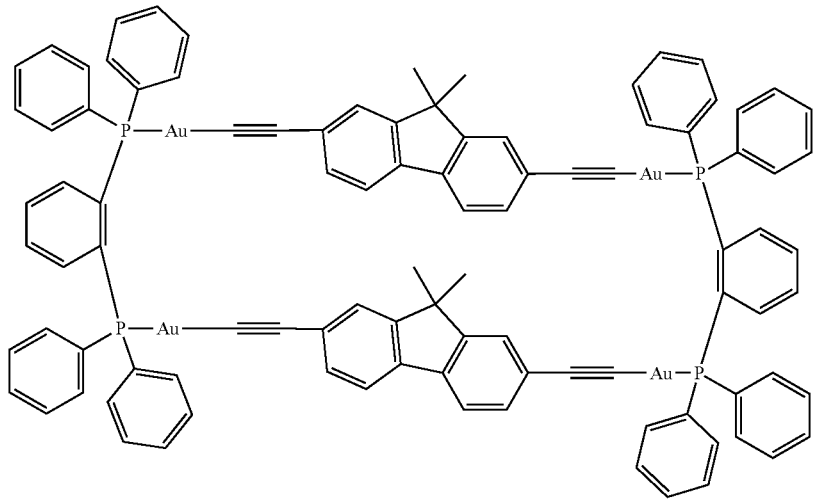
740
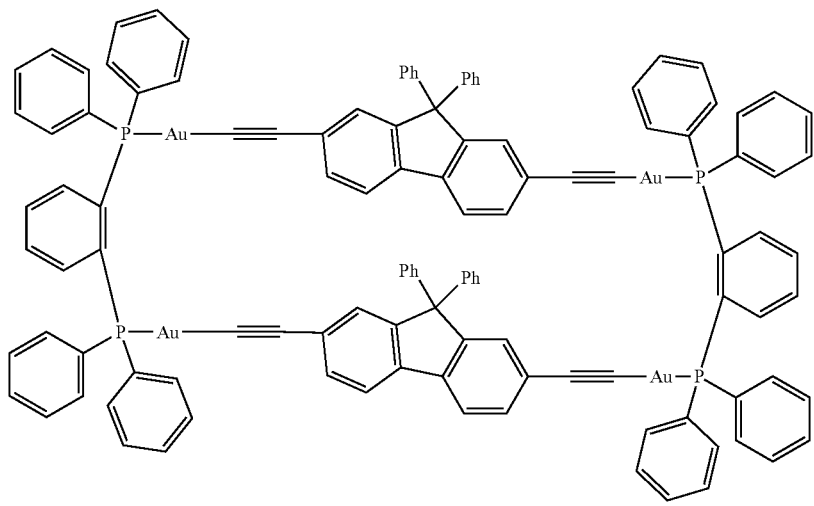
741
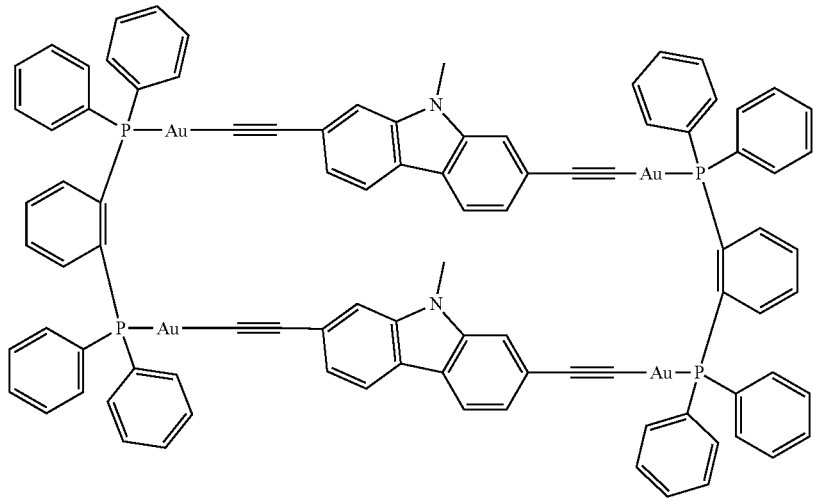
742

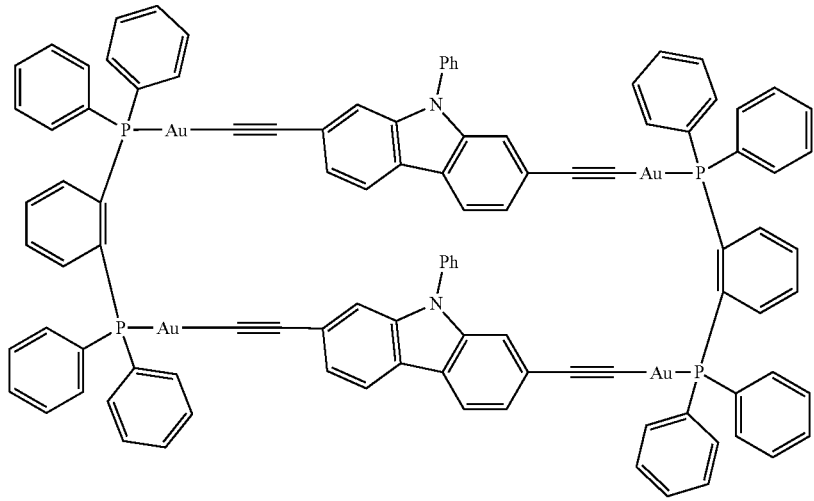
743
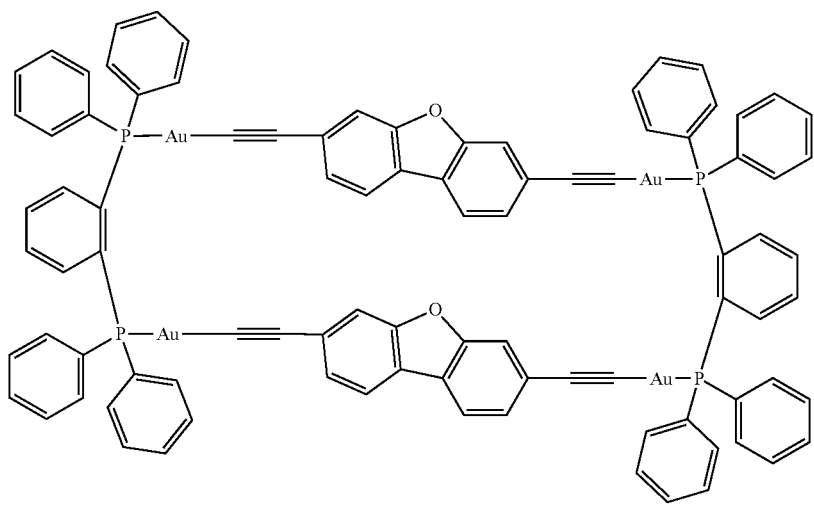
744
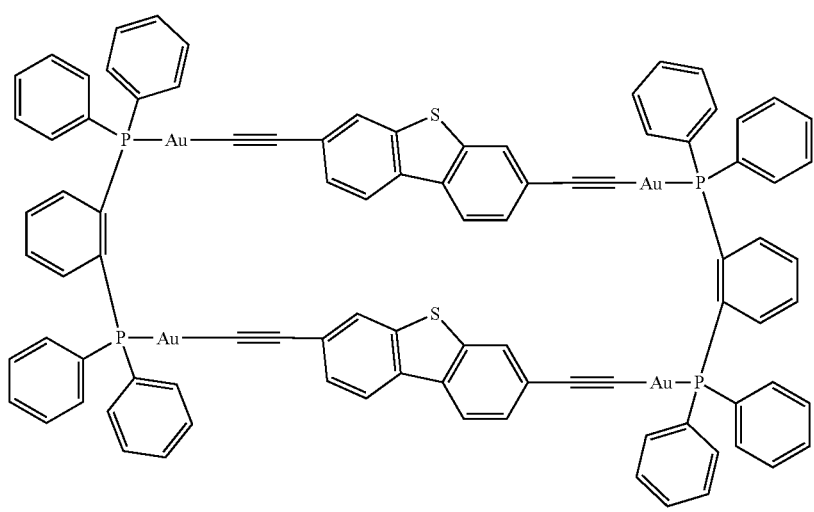
745

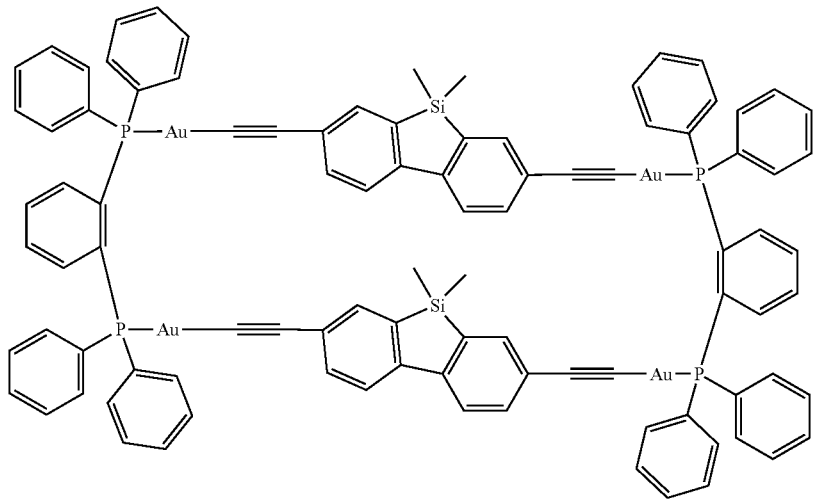
746
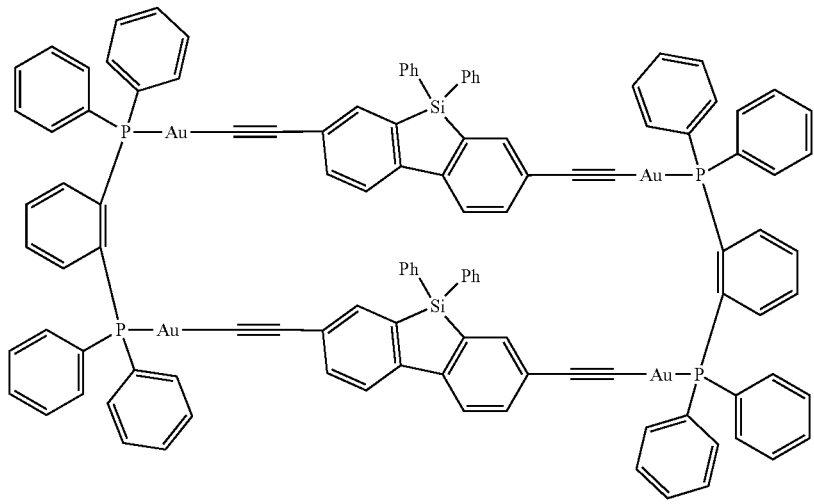
747
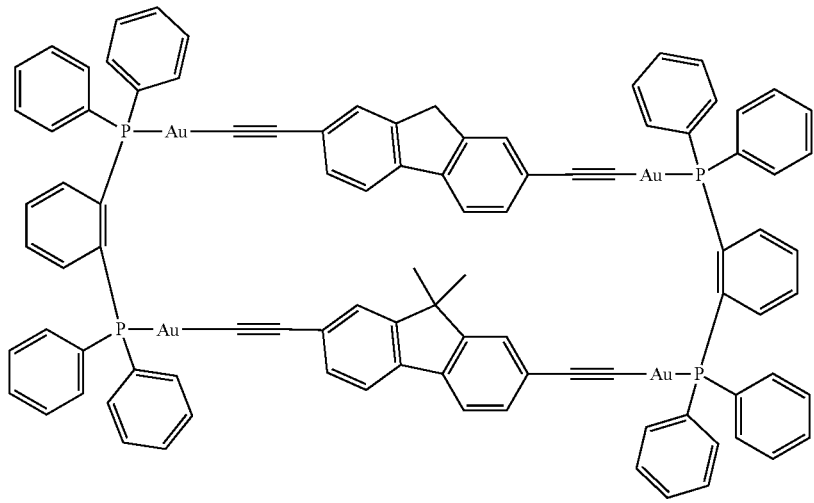
748

-continued
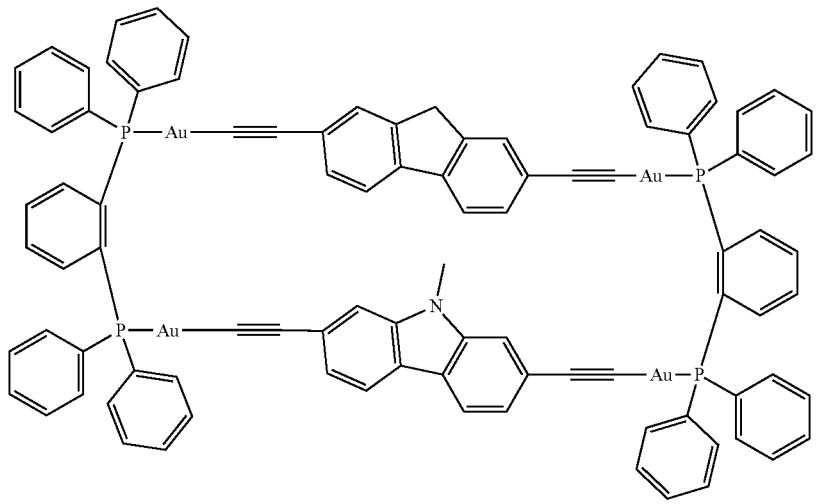
749
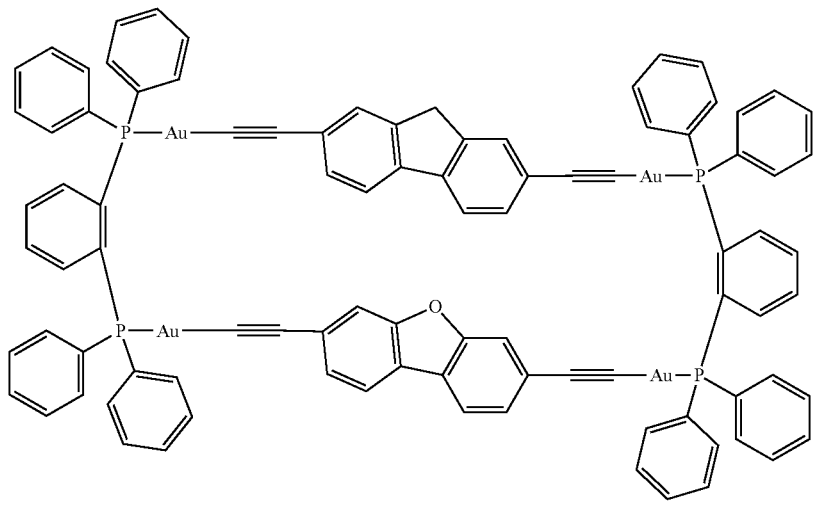
750
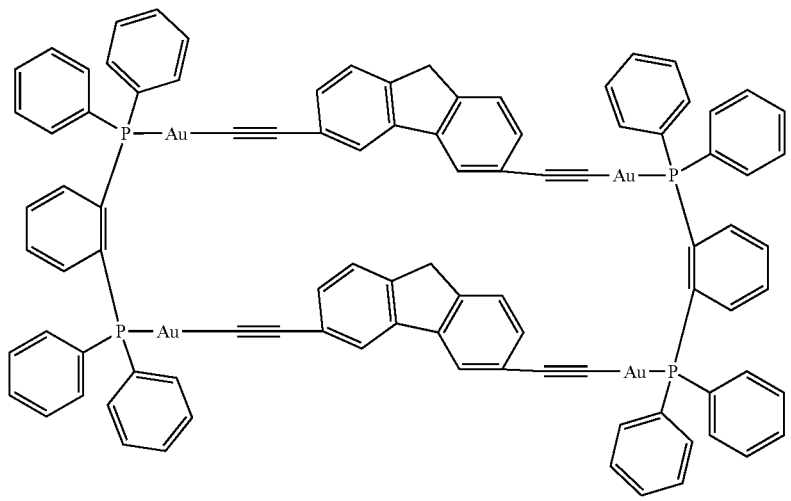
751

752
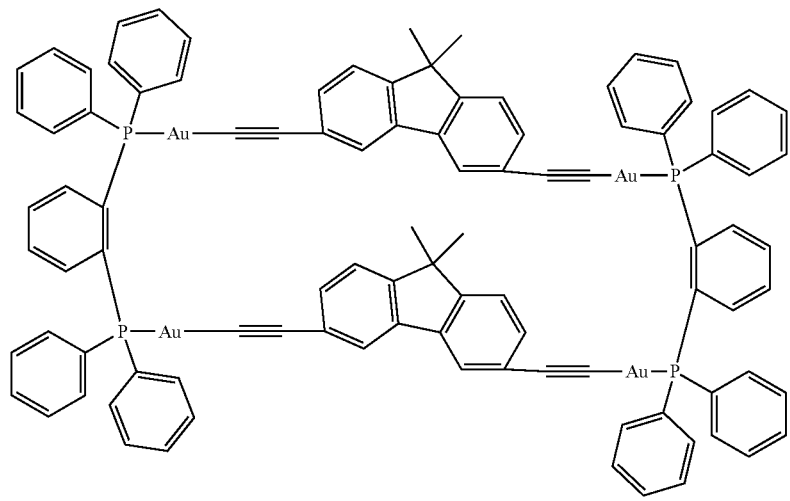
753
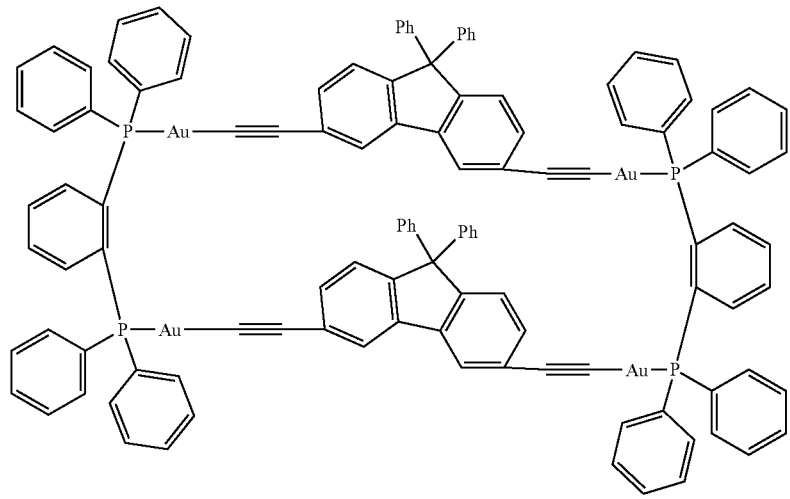
754
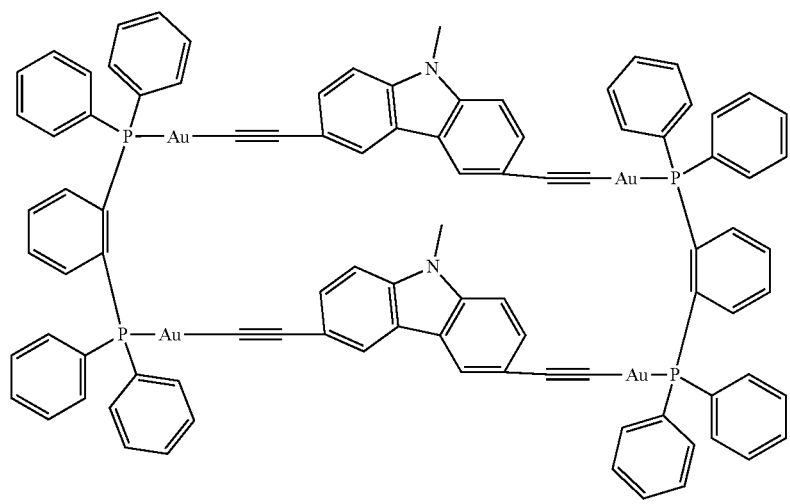

755
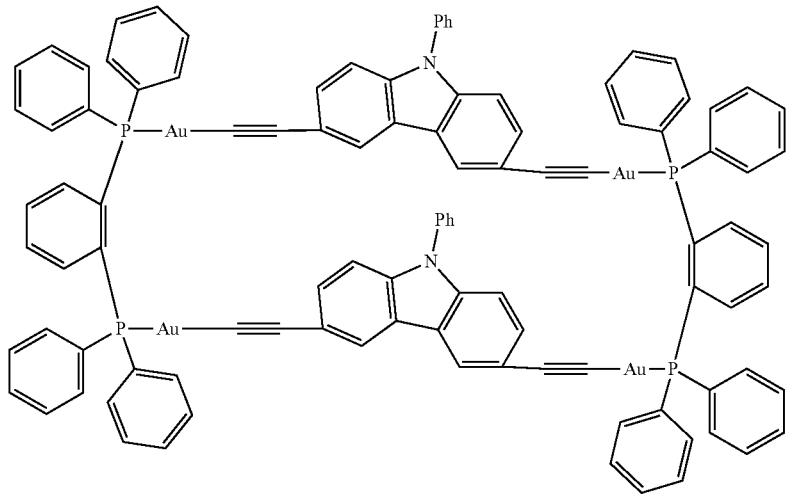
756
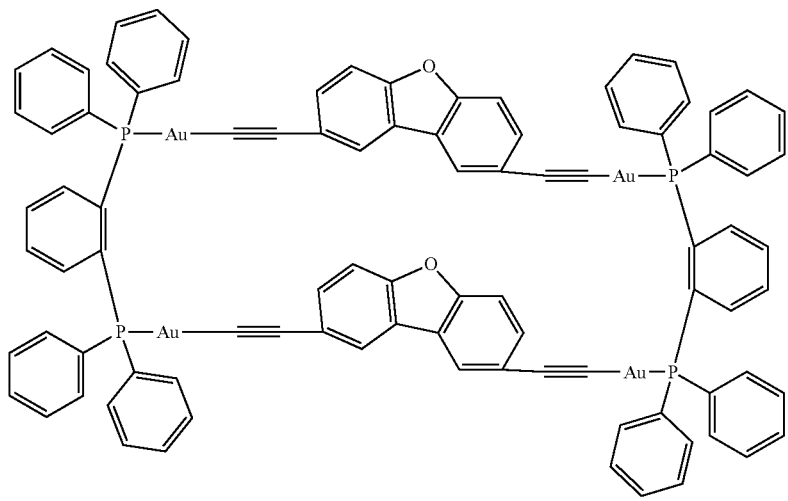
757
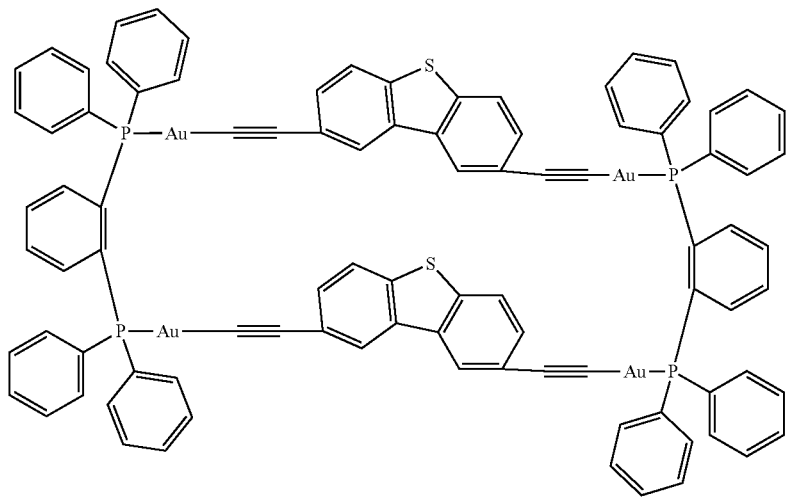

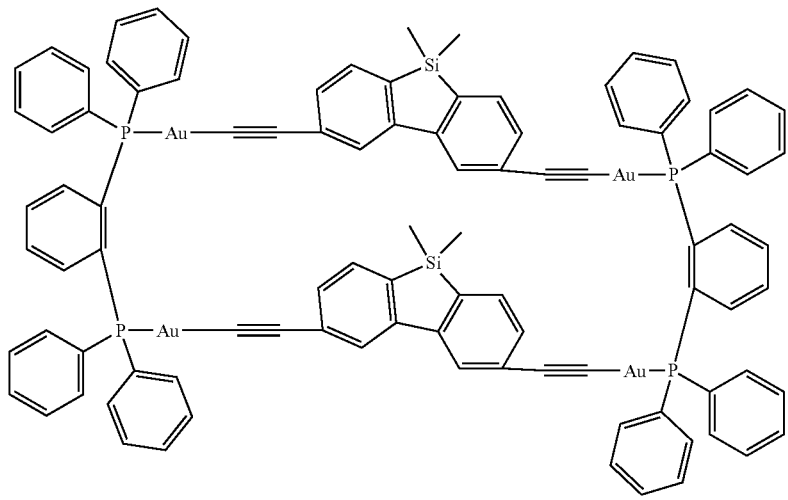
758
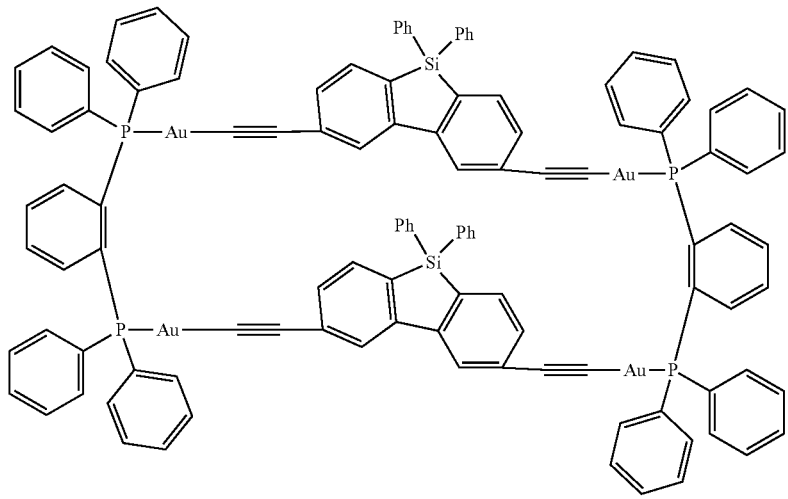
759
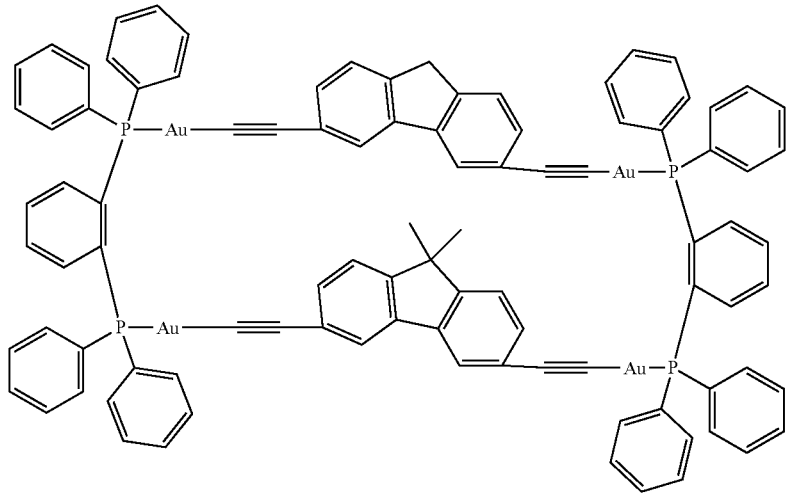
760

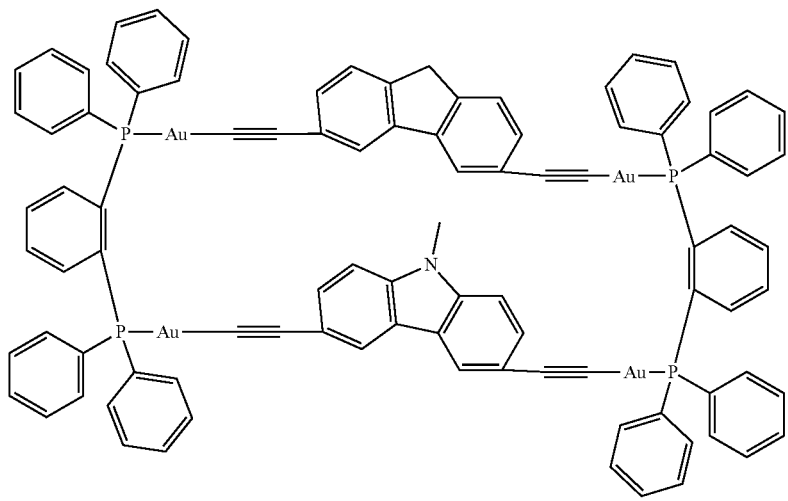
761
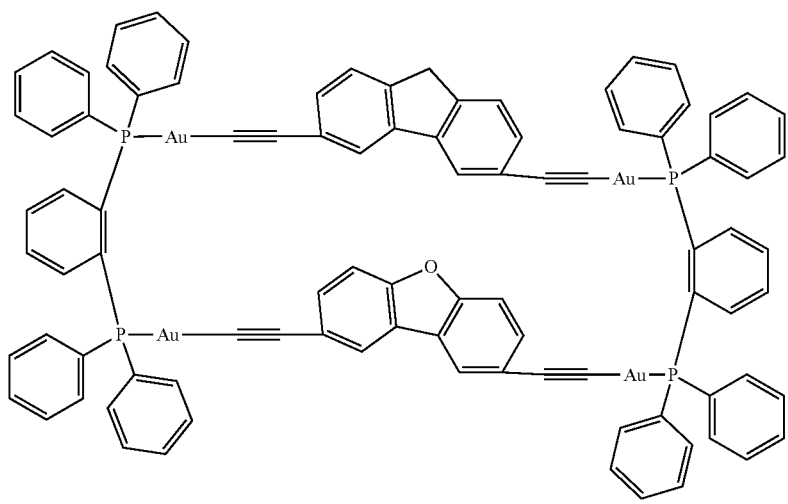
762
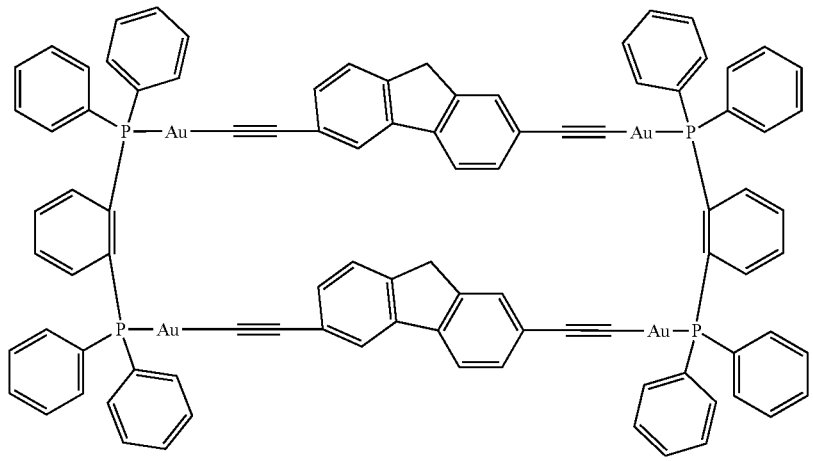
763

764
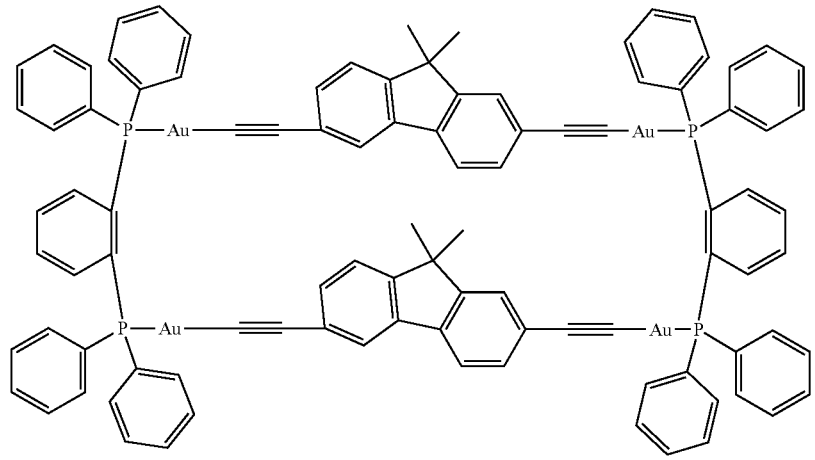
765
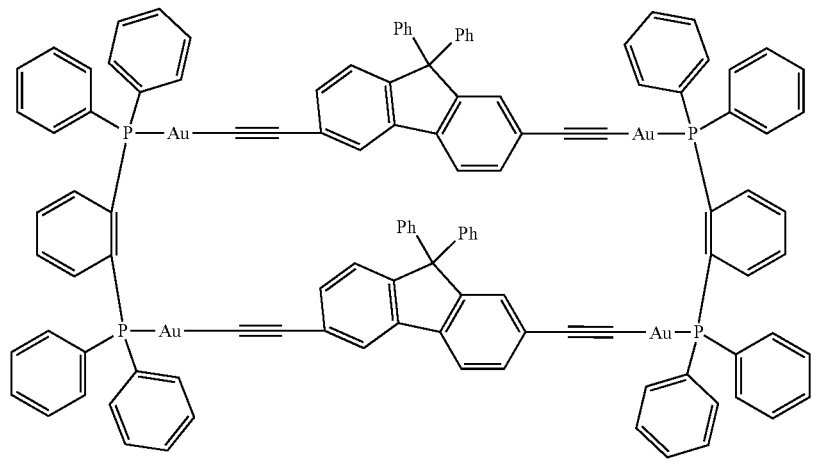
766
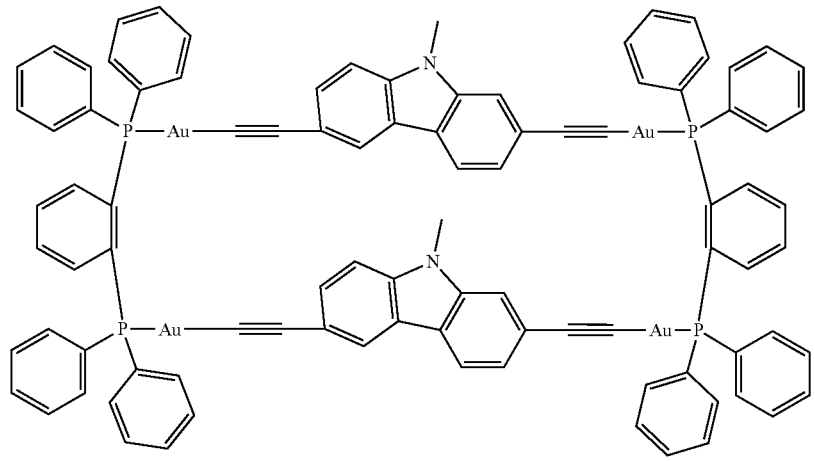

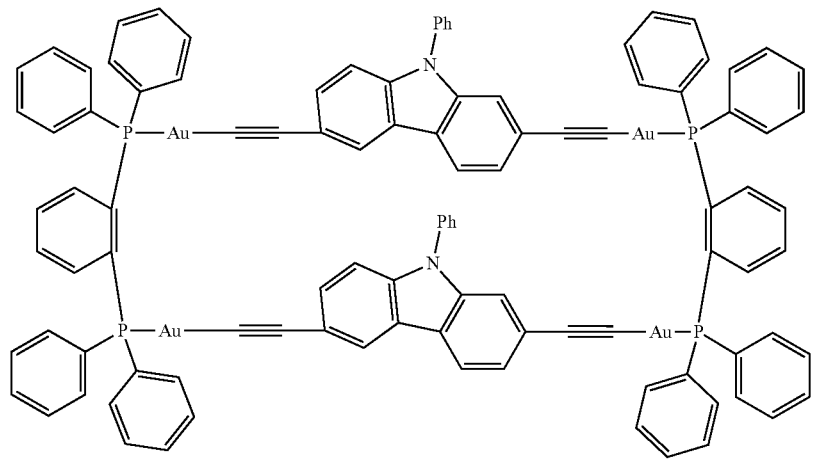
767
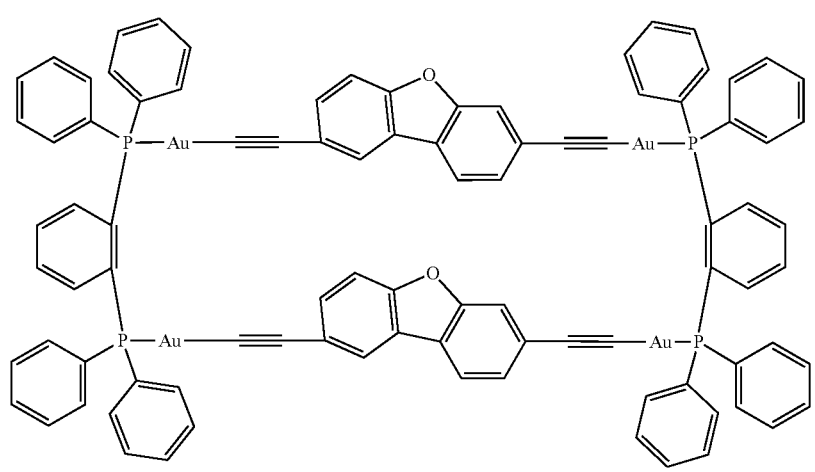
768
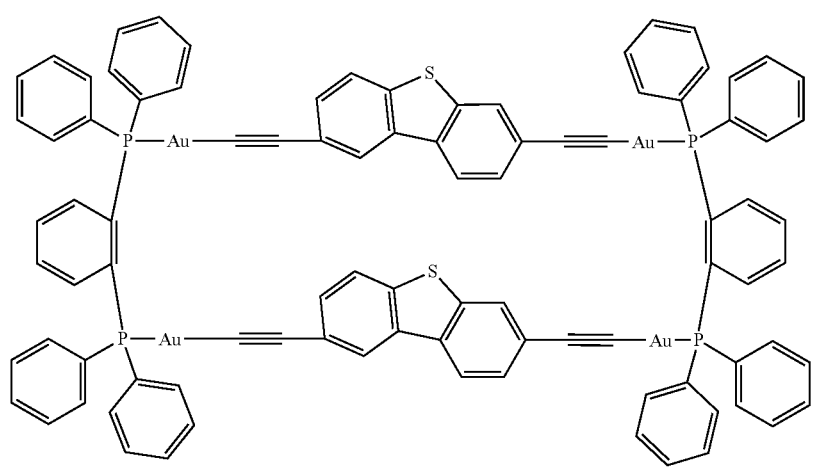
769

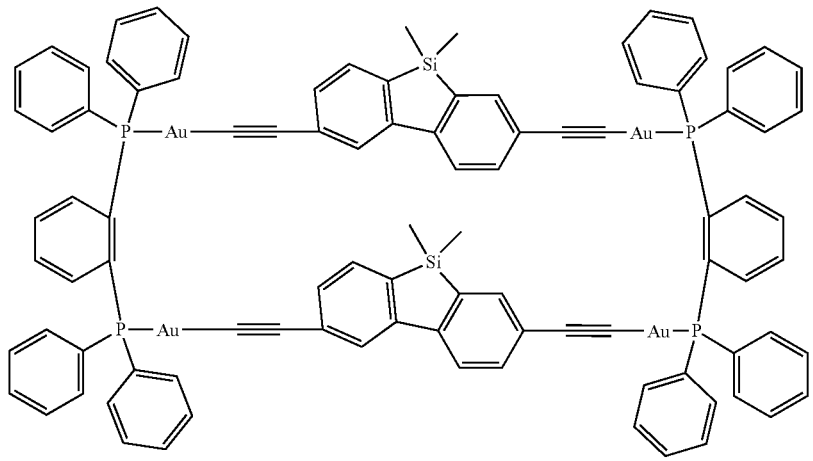
770
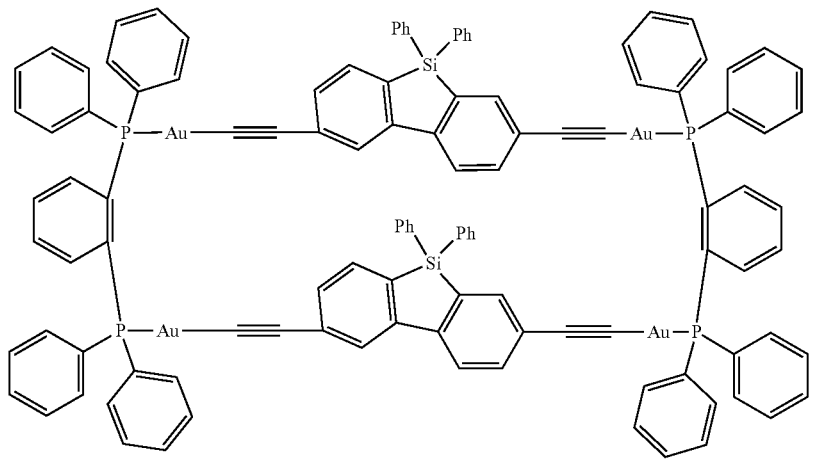
771
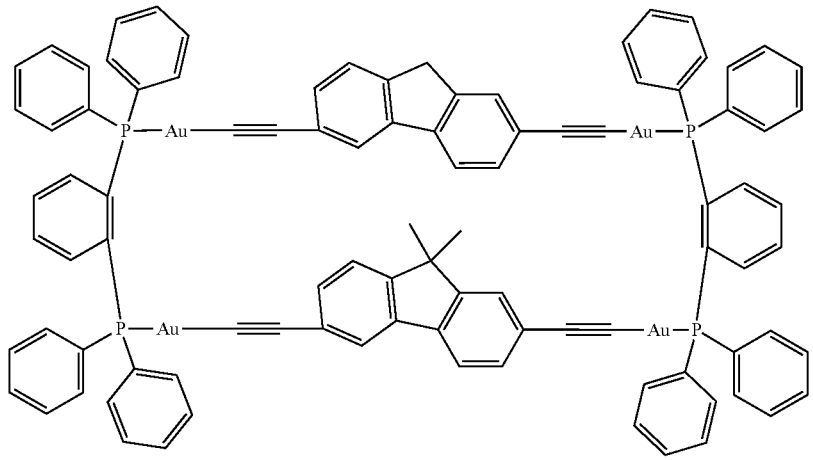
772

773
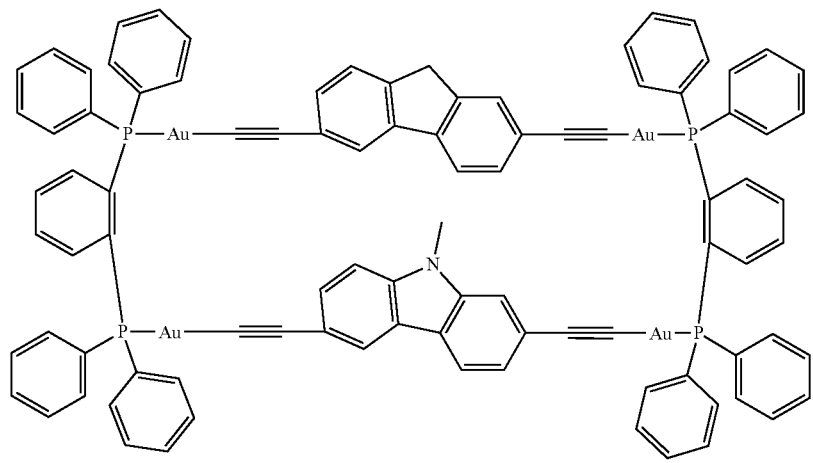
774
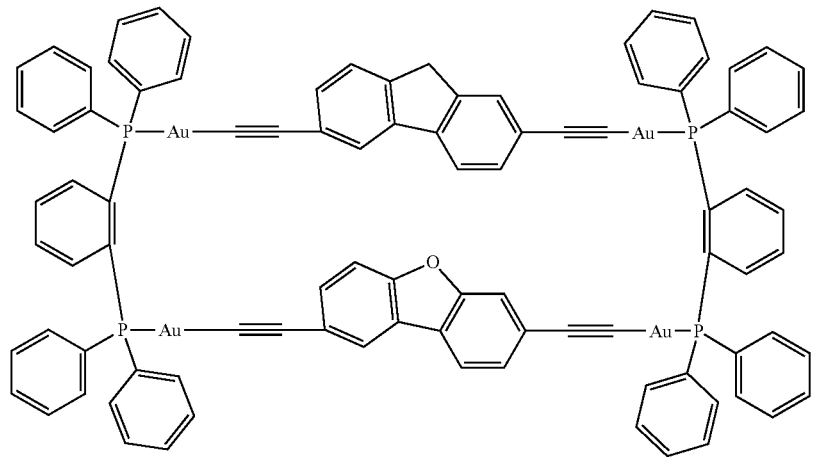
775
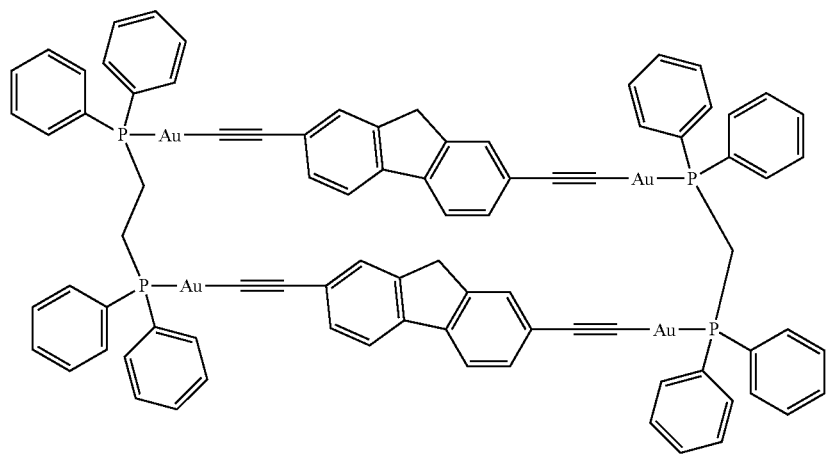

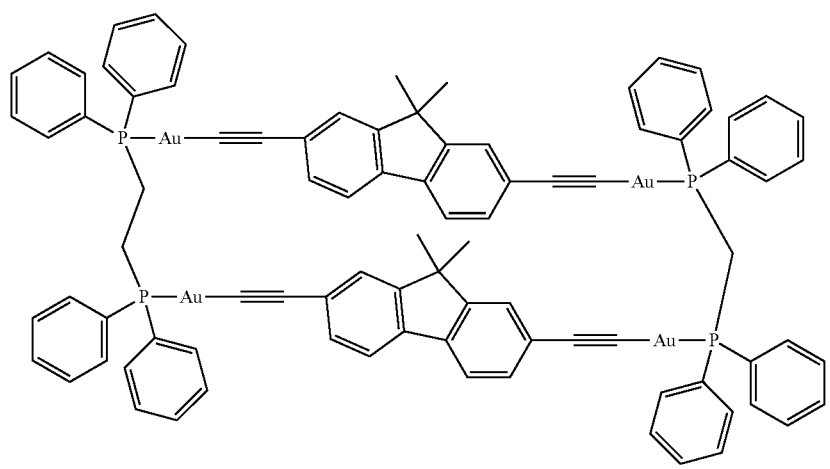
776
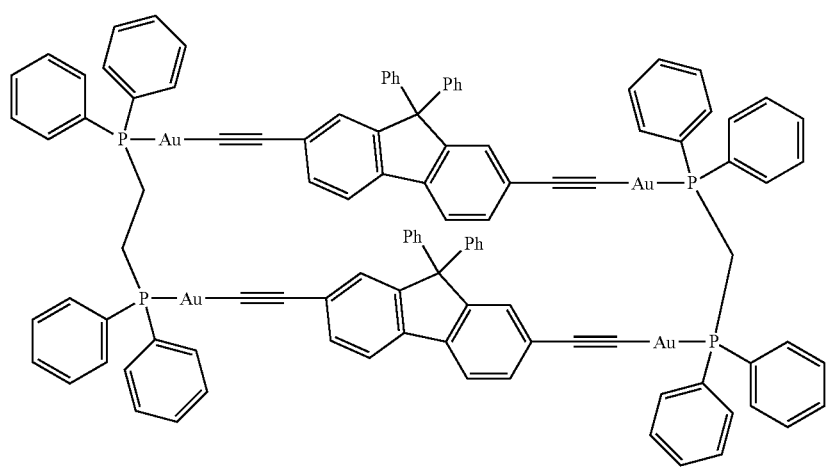
777
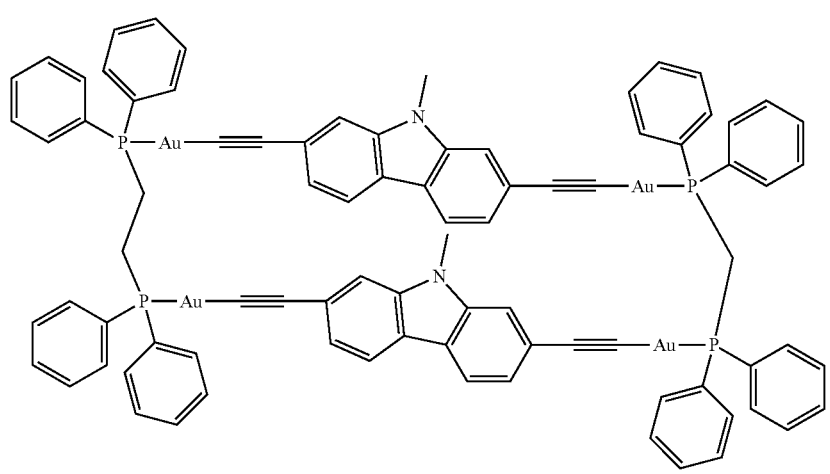
778

779
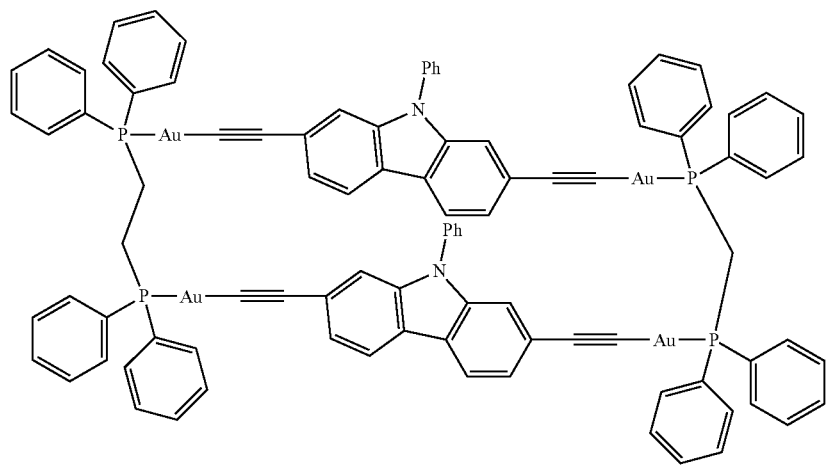
780
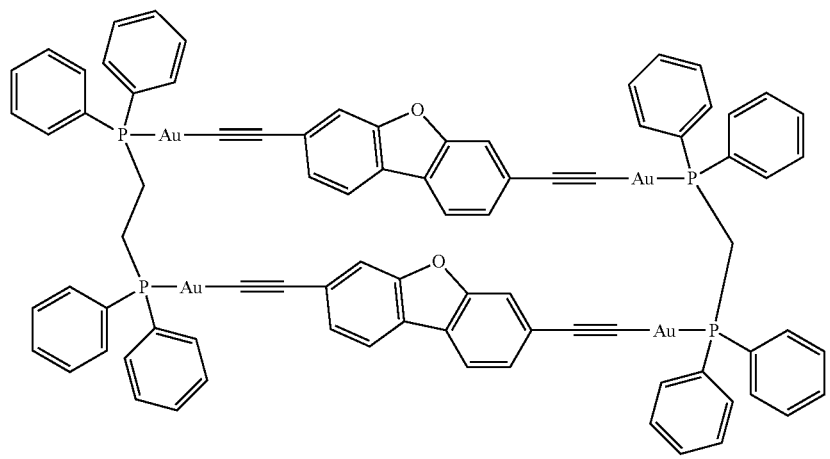
781
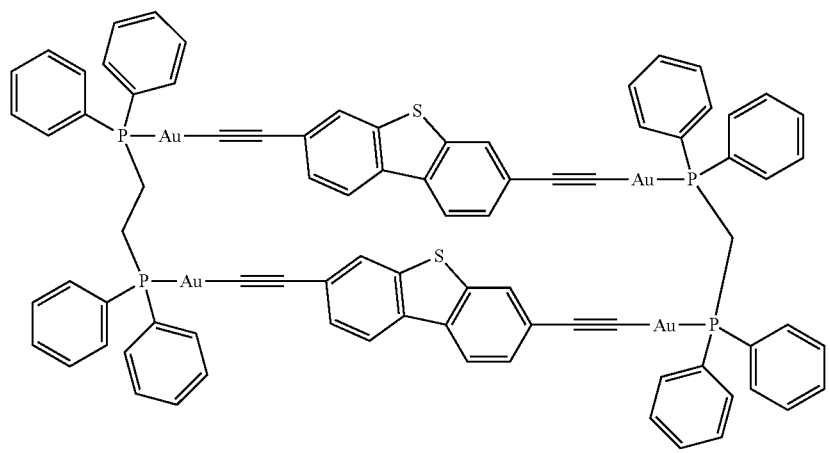

782
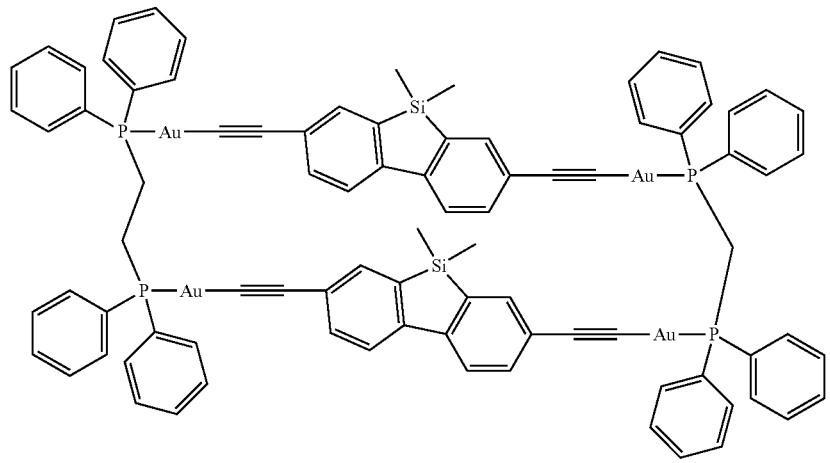
783
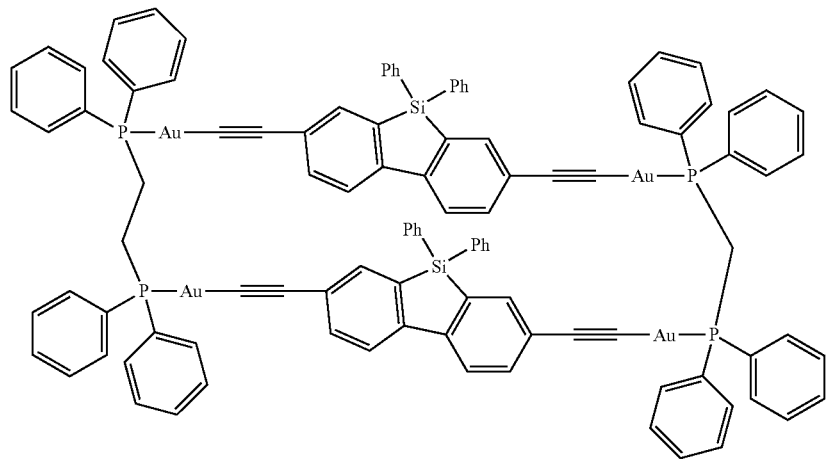
784
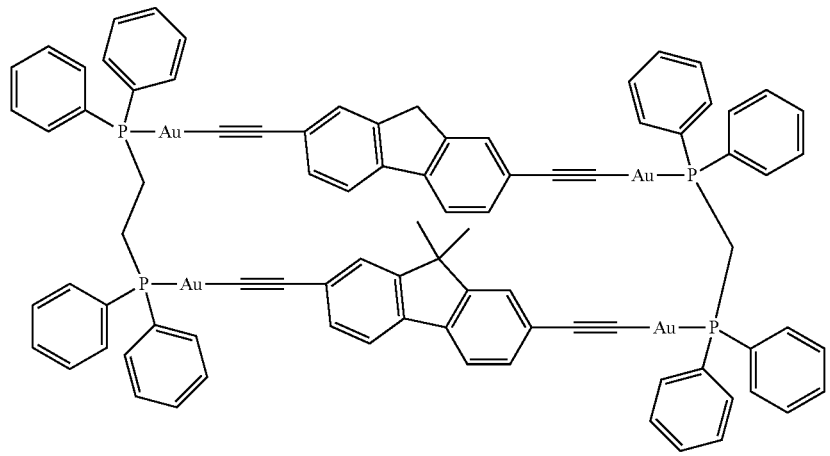

-continued
785
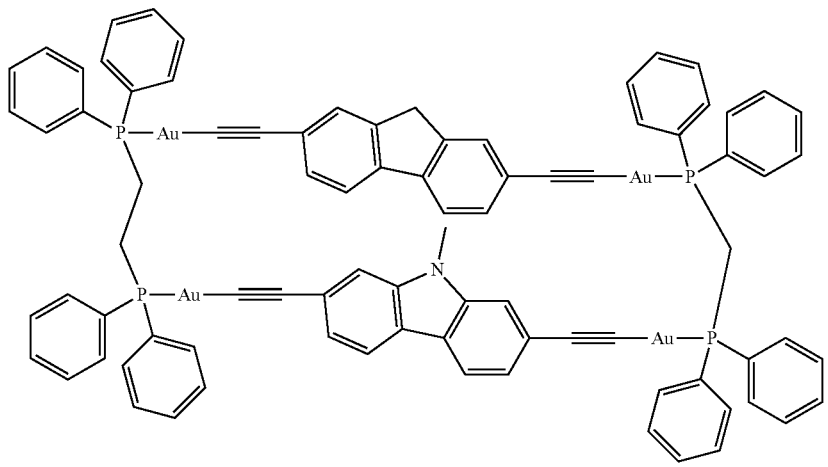
786
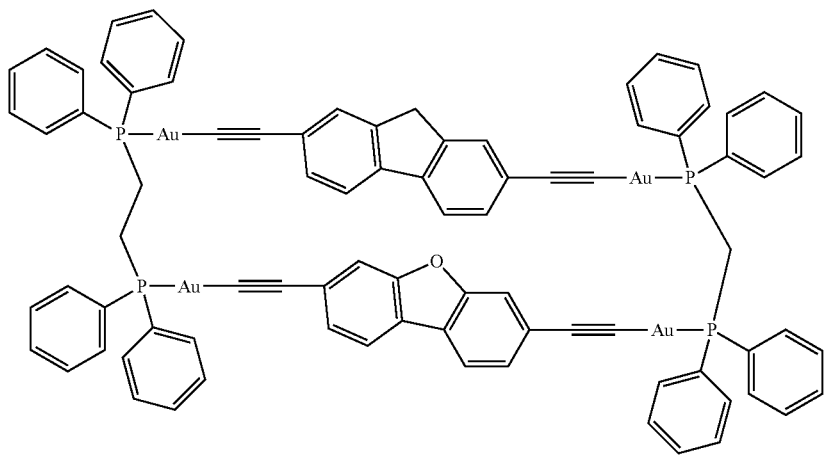
787
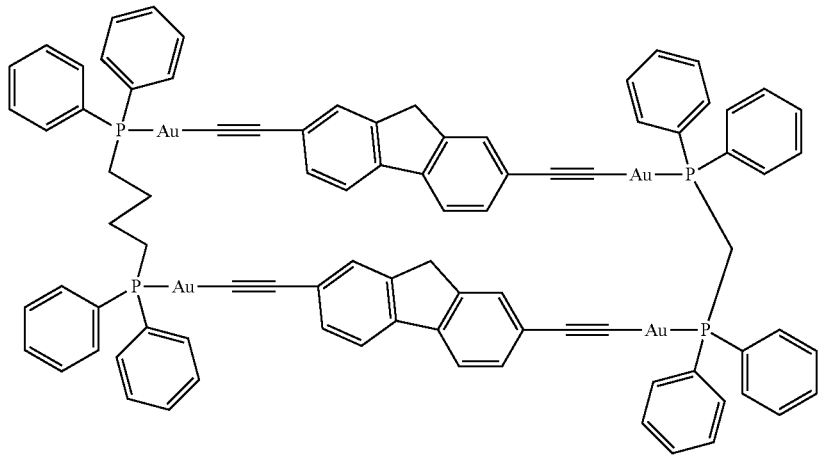

788
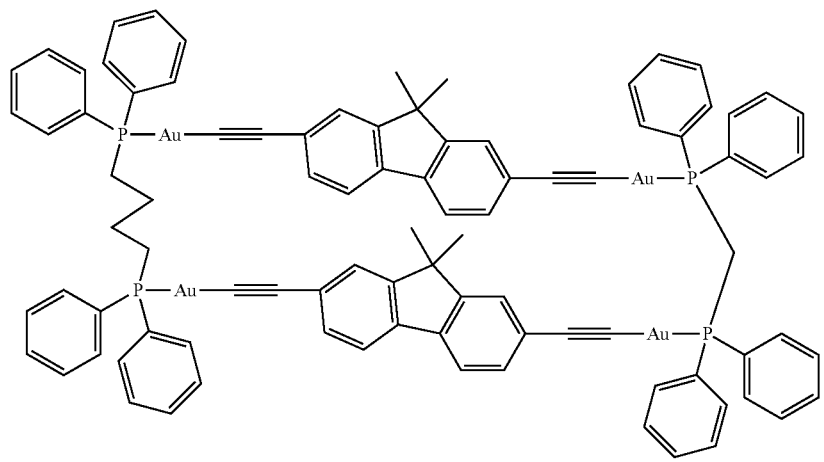
789
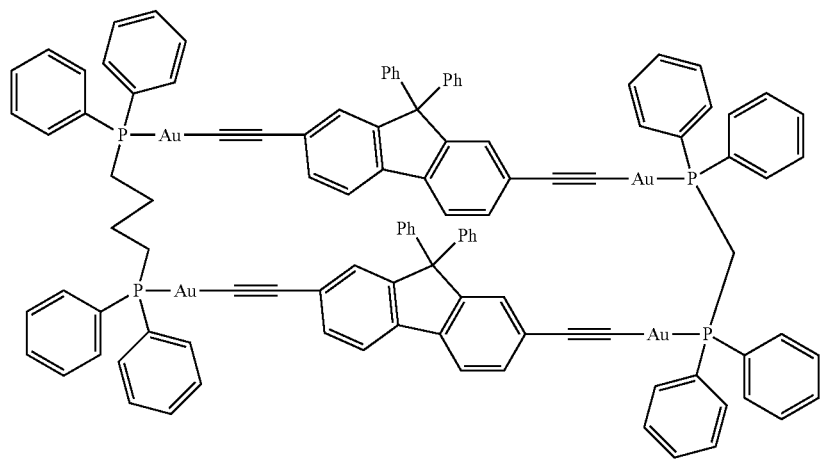
790
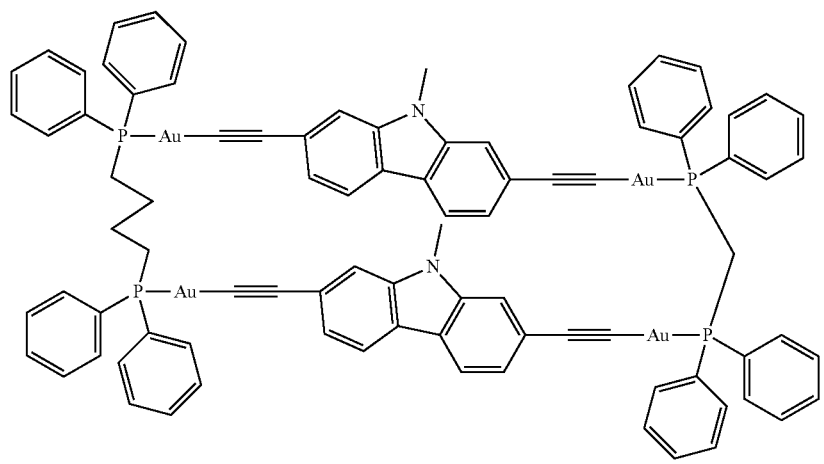

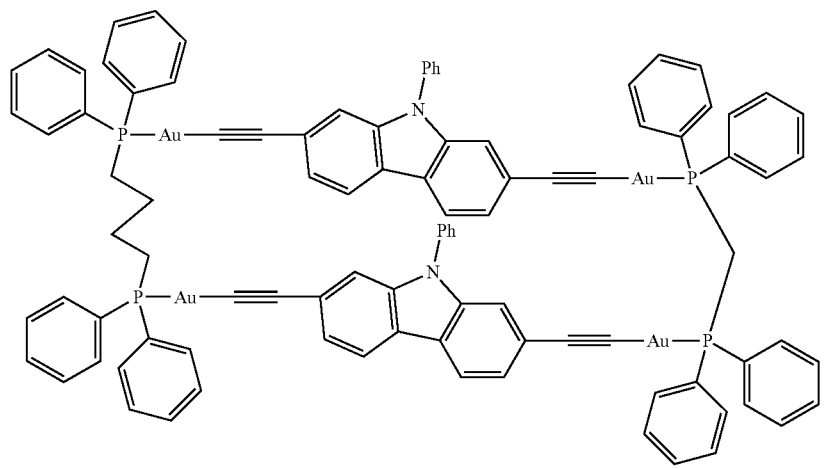
791
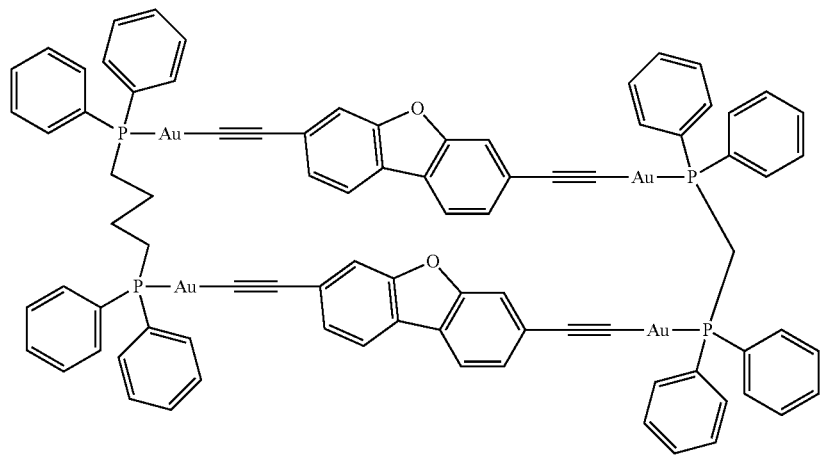
792
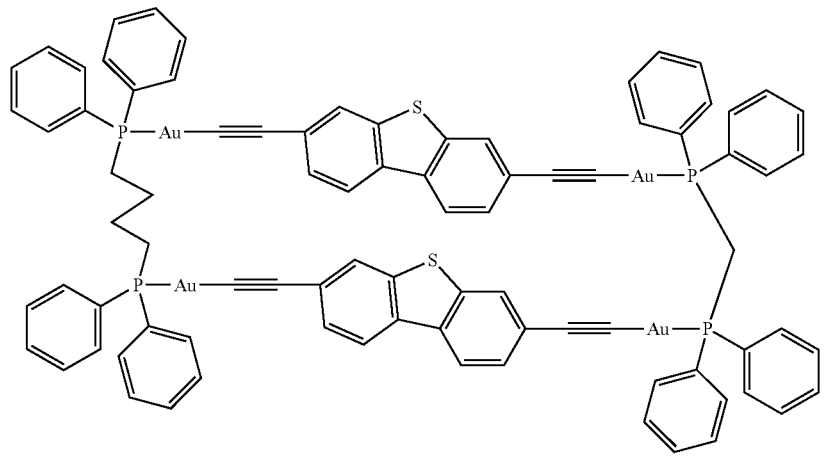
793

794
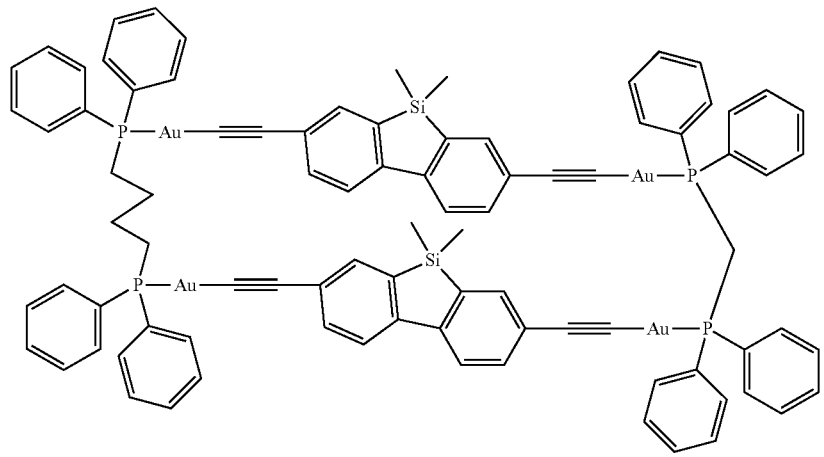
795
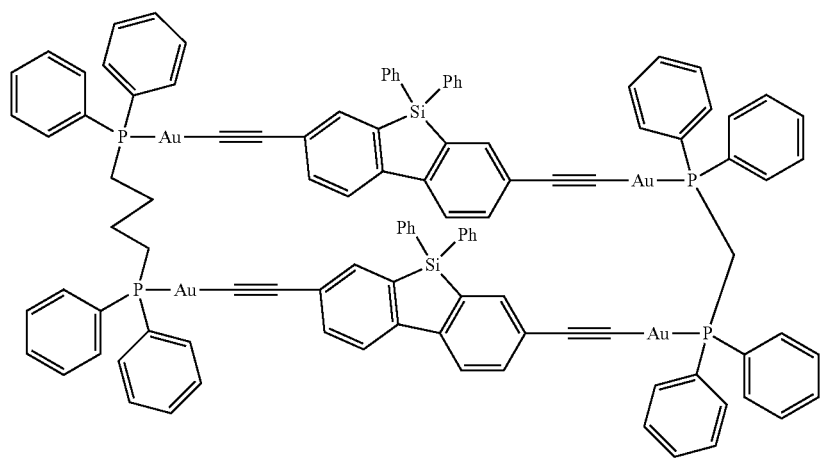
796
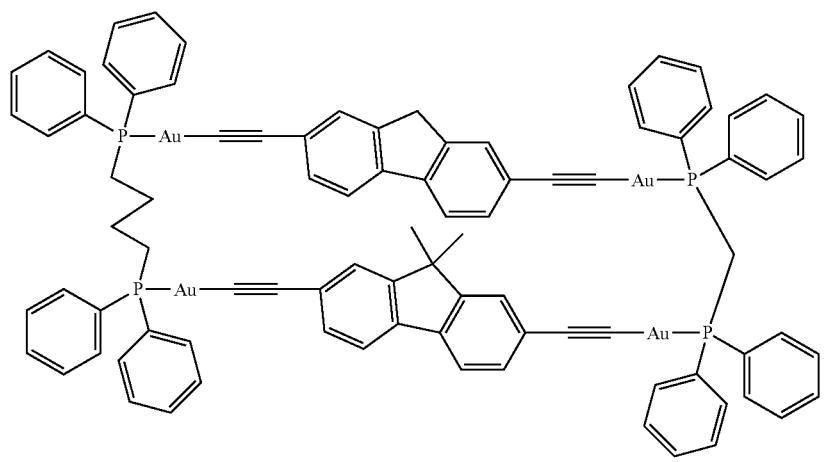

-continued
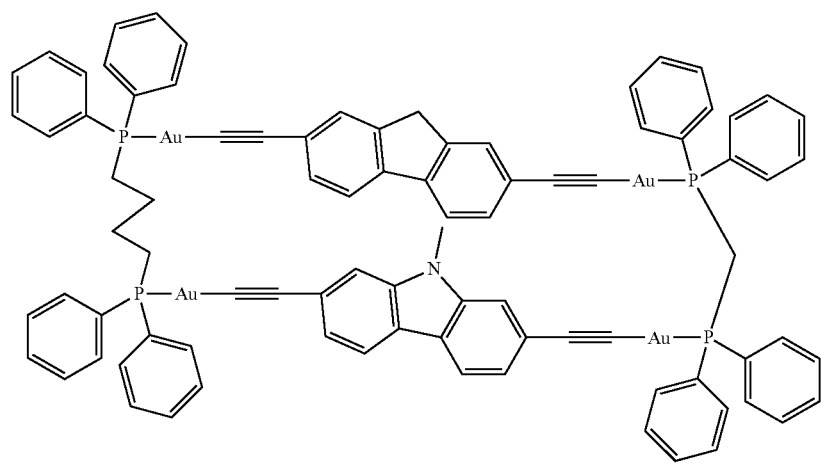
797
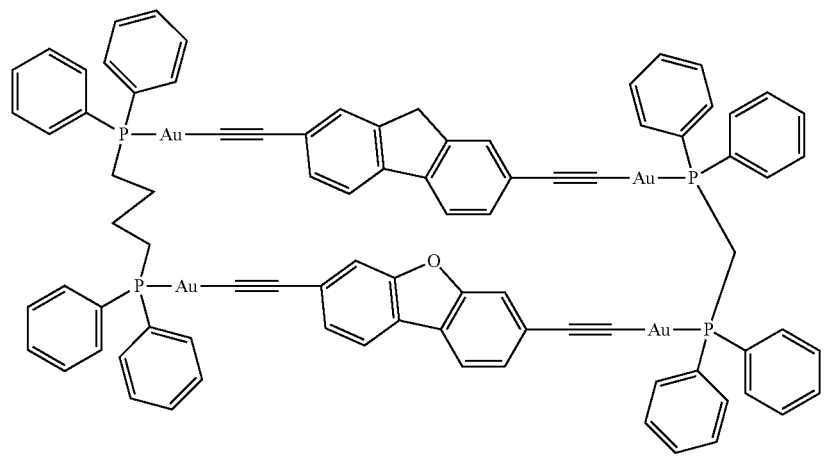
798
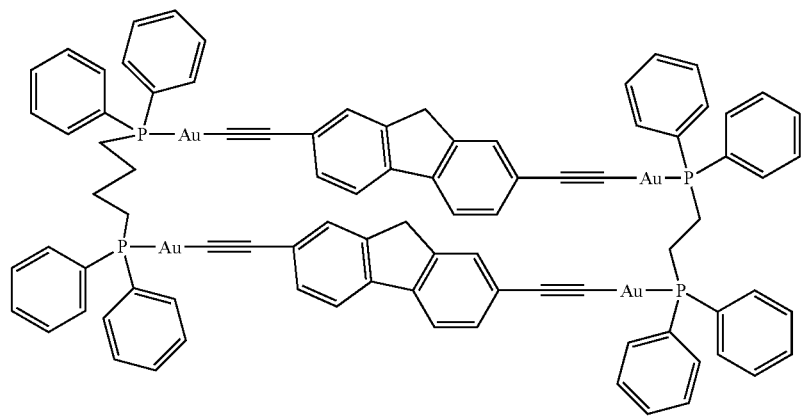
799

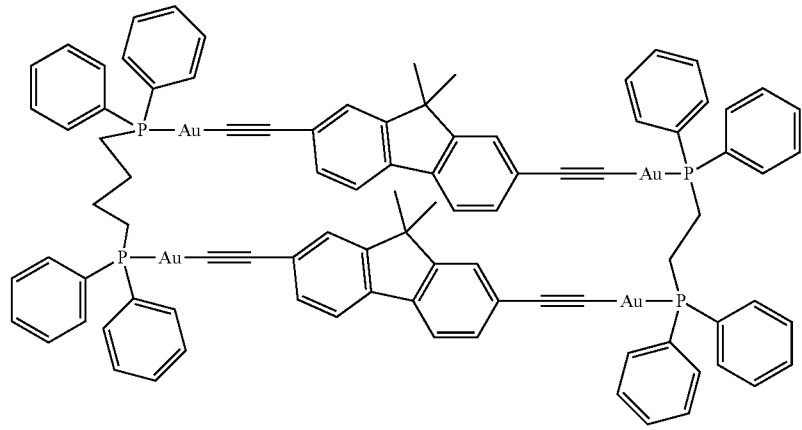
800
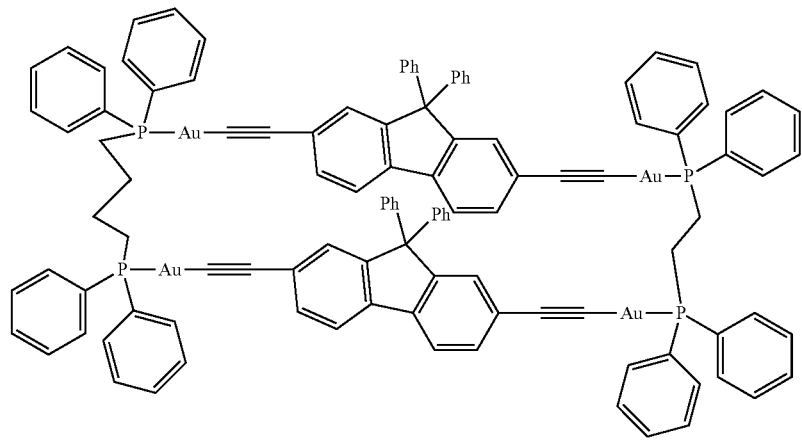
801
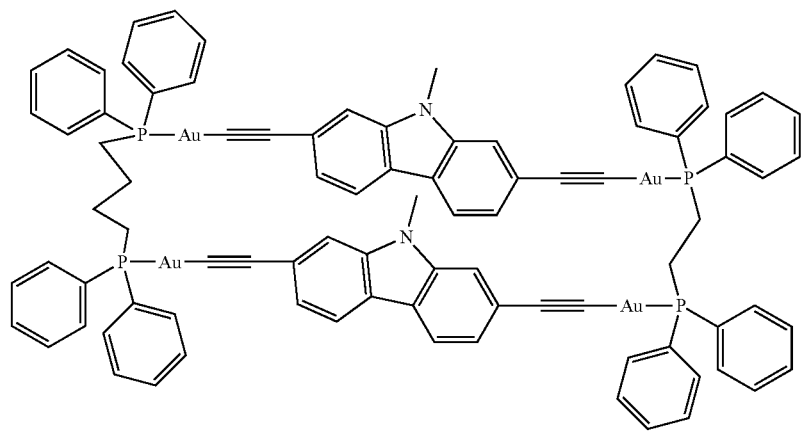
802

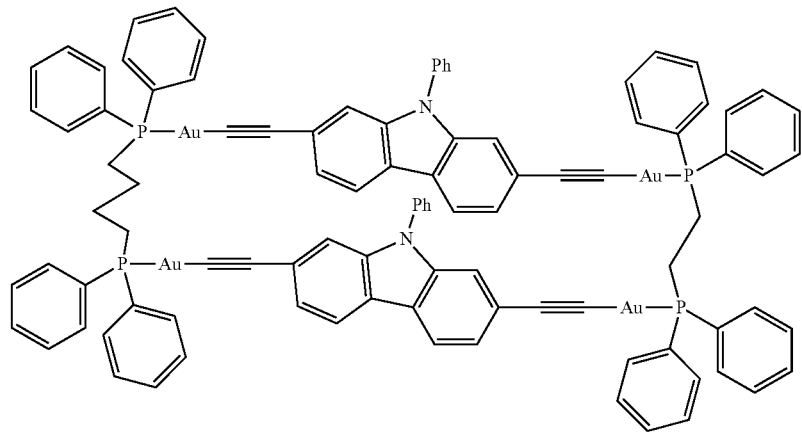
803
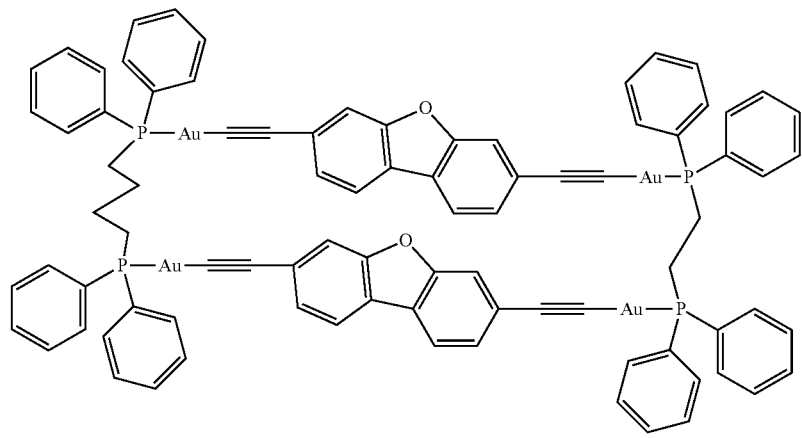
804
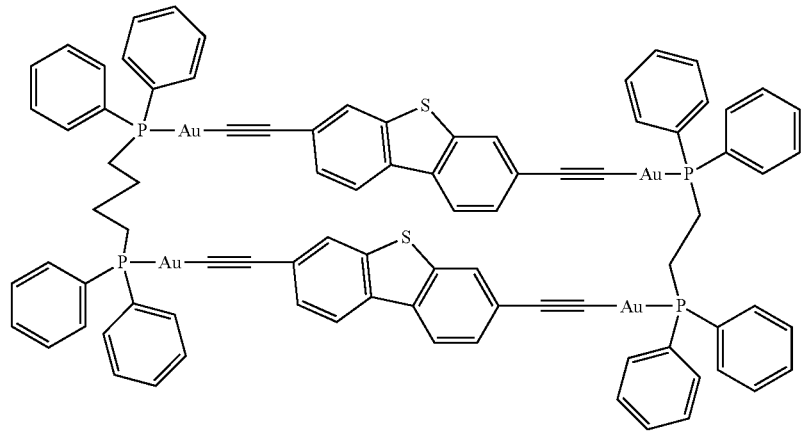
805

-continued
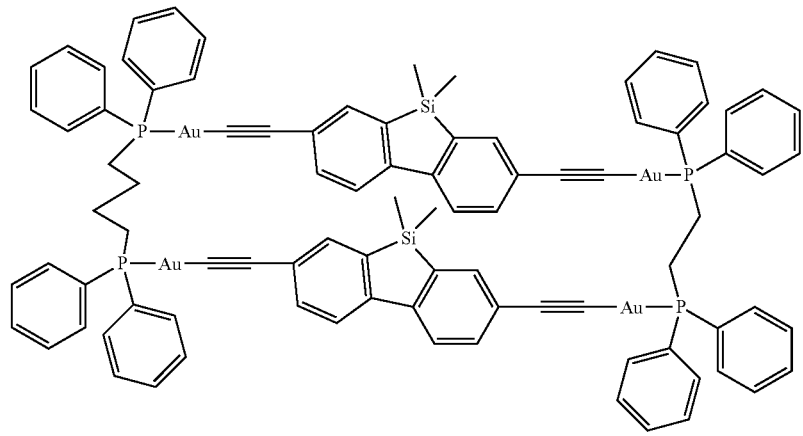
806
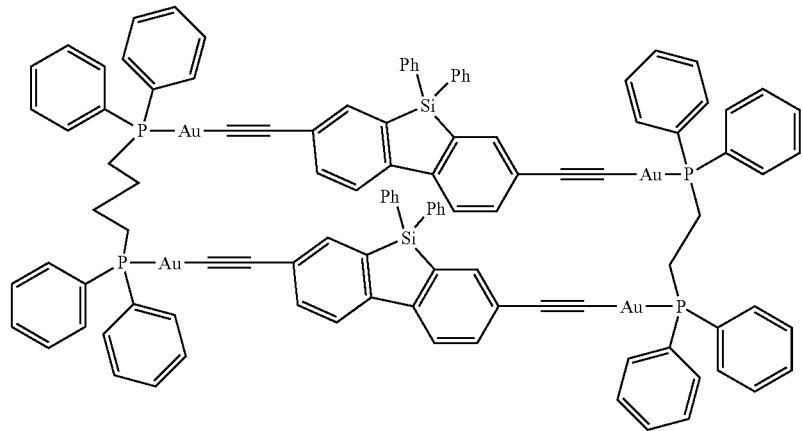
807
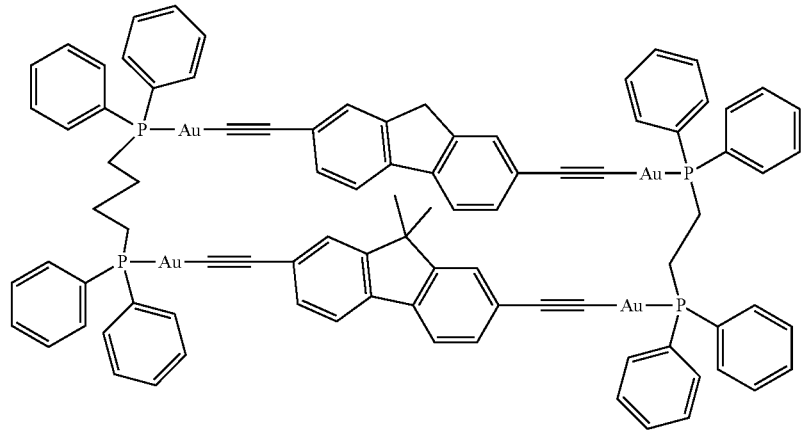
808

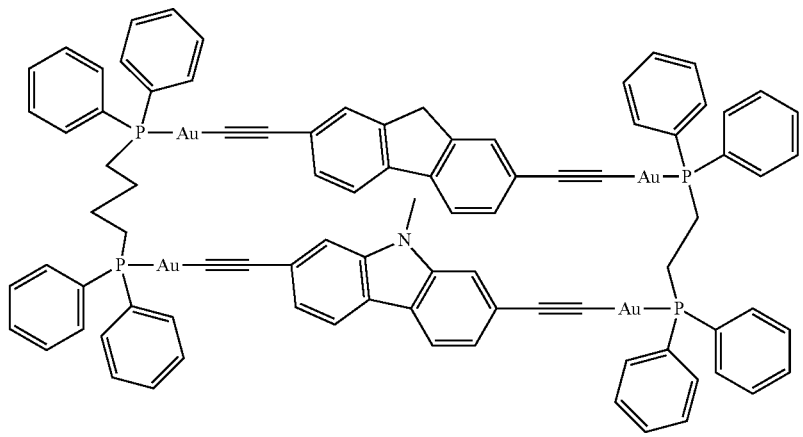

809

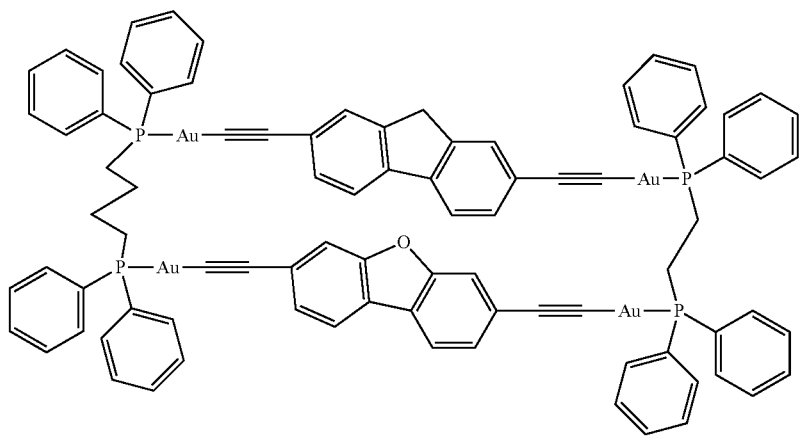

810

The organometallic compound may absorb ultraviolet rays (UV) at room temperature to emit phosphorescent light having a maximum luminescence wavelength of about 400 nanometers (nm) to about 700 nm, for example, about 430 nm to about 650 nm, about 450 nm to about 550 nm, or about 470 nm to about 500 nm.

In the present specification, UV may be electromagnetic radiation having one or more wavelengths in a range of about 10 nm to about 400 nm.

The organometallic compound represented by Formula 1 has a pincer or closed-ring structure including metal atoms $M_1$, $M_2$, $M_3$, and $M_4$, which are heavy atoms. In the pincer or closed-ring structure, a distance between two metal atoms, for example, between $M_1$ and $M_2$ and between $M_3$ and $M_4$, is relatively shortened, and thus the stability of a triplet exciton may be improved by the interaction between the two metal atoms. When the stability is improved, the lifespan of the triplet exciton increases and the distribution density of the triplet exciton increases. Accordingly, the organometallic compound may stably emit phosphorescent light through photoluminescence even at room temperature. Therefore, an electronic device, for example, an organic light-emitting device, including the organometallic compound may have improved luminescence efficiency.

The organometallic compound may include groups represented by:

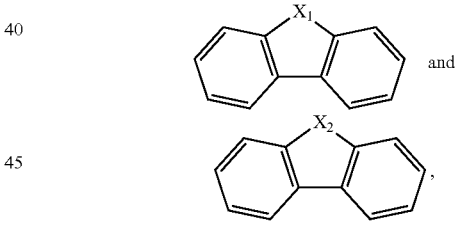

and and accordingly, the linearity of a molecular structure may be increased. Accordingly, the distance between two metal atoms may further shortened, resulting in further improvement of the stability of the triplet exciton.

Also, the organometallic compound includes an alkyne ligand coordinated with a metal atom. Because the alkyne ligand has a weak acidity and forms a strong coordinative bond compared to an alkyl ligand, the reactivity to the substitution reaction is relatively small. Especially, the alkyne ligand may form a strong bond with a transition metal such as gold (Au) or silver (Ag). Accordingly, the organometallic compound may have improved molecular stability and may be easily synthesized.

As described above, the organometallic compound may exhibit room-temperature phosphorescence emission characteristics, and may have electrical characteristics that are appropriate for application as a material for an organic light-emitting device, for example, a material for a dopant in an emission layer. Accordingly, the organic light-emitting device including the organometallic compound may have high efficiency and/or long lifespan.

Furthermore, the organometallic compound may be applied to an image sensor as well as a material for an organic light-emitting device. Also, because the organometallic compound has excellent room-temperature phosphorescence emission characteristics, a diagnostic composition having high diagnostic efficiency may be provided using the organometallic compound and the organometallic compound may be used for a therapy using light.

The organometallic compound may emit phosphorescent light at room temperature due to photoluminescence, and thus, may be used for optical recording and bio-imaging.

For example, the organometallic compound has excellent room-temperature phosphorescence emission characteristics, and thus, may be usefully used as a labeling material for bio-imaging. For example, after the labeling material for bio-imaging including the organometallic compound is injected into a living body, the organometallic compound is photo-excited using an excitation source, and then luminescence is observed such that a position of the labeling material may be monitored.

In one or more embodiments, the phosphorescence emission intensity of the organometallic compound may reversibly vary according to the oxygen concentration. For example, as the oxygen concentration of the organometallic compound decreases, the phosphorescence emission intensity may increase.

Accordingly, the organometallic compound may be used as a material for measuring the oxygen concentration. For example, a phosphorescence intensity reduction curve is optimized as an exponential decay curve to thereby measure phosphorescence lifetime, followed by comparison and analysis to thereby estimate the oxygen concentration.

Alternatively, the organometallic compound may be used as a material for measuring pressure, based on a principle in which the oxygen concentration inside an object to be measured varies in response to pressure applied to the object to be measured.

Accordingly, the organometallic compound may be used for an oxygen concentration measurement sensor, an oxygen concentration measurement system, a pressure detection sensor, a pressure detection system, or the like.

Synthesis methods of the organometallic compound represented by Formula 1 may be recognizable by one of ordinary skill in the art by referring to the Synthesis Examples provided below.

Composition

According to another aspect, provided is a composition including at least one organometallic compound represented by Formula 1.

The composition may further include a solvent, in addition to the organometallic compound. The solvent may include an organic solvent that is commonly used.

In one or more embodiments, the composition may be used, for example, in the manufacture of organic layers of electronic devices (for example, organic light-emitting devices).

In one or more embodiments, the composition may be a diagnostic composition or a composition for measurement.

Because the organometallic compound represented by Formula 1 may provide high luminescence efficiency, the diagnostic composition may have high diagnostic efficiency and the composition for measurement may reliably measure an object to be measured.

The diagnostic composition or the composition for measurement may be variously applied to various diagnostic kits, diagnostic reagents, measurement kits, measurement reagents, biosensors, biomarkers, or the like.

In one or more embodiments, the composition may be a security ink composition.

Because the organometallic compound may emit phosphorescent light at room temperature due to photoluminescence, the organometallic compound may be appropriate for use in the security ink composition.

For example, the security ink composition may be provided in the form of a security pattern on a security document or a security article. The security article may be an article that has the risk of forgery, such as an identification card (for example, a resident registration certificate, a driver's license, or an employee card), a certificate, a passport, a credit card, or the like. When light energy having an energy greater than a band gap of the organometallic compound is applied to the security ink composition by using an electromagnetic radiation excitation source such as UV light to thereby excite the organometallic compound, the organometallic compound may emit light by photoluminescence, and thus a security pattern appears. By observing the security pattern with naked eyes, it is possible to determine forge and falsification of security documents or security articles.

Organic Light-Emitting Device

The organometallic compound represented by Formula 1 may be appropriate for use as an organic layer of the organic light-emitting device, for example, a material for an emission layer in the organic layer. Accordingly, according to another aspect, provided is an organic light-emitting device including: a first electrode; a second electrode; and an organic layer located between the first electrode and the second electrode and including an emission layer, wherein the organic layer includes at least one organometallic compound represented by Formula 1.

The organic light-emitting device may have low driving voltage, high efficiency, high luminance, high quantum efficiency, and/or long lifespan by including the organic layer including at least one organometallic compound represented by Formula 1.

The organometallic compound represented by Formula 1 may be used between a pair of electrodes of an organic light-emitting device. In one or more embodiments, the organometallic compound may be included in at least one of an emission layer, a hole transport region (for example, the hole transport region including at least one of a hole injection layer, a hole transport layer, and an electron blocking layer), and an electron transport region (for example, the electron transport region including at least one of a hole blocking layer, an electron transport layer, and an electron injection layer).

In one or more embodiments, the first electrode may be an anode, the second electrode may be a cathode, the organic layer may include a hole transport region between the first electrode and the emission layer and an electron transport region between the emission layer and the second electrode, the hole transport region may include a hole injection layer, a hole transport layer, an electron blocking layer, a buffer layer, or any combination thereof, and the electron transport region may include a hole blocking layer, an electron transport layer, an electron injection layer, or any combination thereof, but embodiments of the present disclosure are not limited thereto.

In one or more embodiments, the emission layer of the organic light-emitting device may include the organometallic compound represented by Formula 1.

The emission layer of the organic light-emitting device may emit red light, green light, or blue light. For example, the emission layer may emit green light or blue light.

In one or more embodiments, the emission layer of the organic light-emitting device may include a host and a dopant, and the dopant may include the organometallic compound. An amount of the host in the emission layer may be greater than an amount of the dopant in the emission layer.

In one or more embodiments, the emission layer may be a green or blue emission layer including the organometallic compound, but embodiments of the present disclosure are not limited thereto. In one or more embodiments, the organometallic compound may be a green phosphorescent dopant or a blue phosphorescent dopant.

The expression "(an organic layer) includes at least one of organometallic compounds" used herein may include a case in which "(an organic layer) includes identical organometallic compounds represented by Formula 1" and a case in which "(an organic layer) includes two or more different organometallic compounds represented by Formula 1."

For example, the organic layer may include, as the organometallic compound, only Compound 1. In this case, Compound 1 may be included in the emission layer of the organic light-emitting device. In one or more embodiments, the organic layer may include, as the organometallic compound, Compound 1 and Compound 2. In this case, Compound 1 and Compound 2 may be present in an identical layer (for example, Compound 1 and Compound 2 may all be present in an emission layer), or different layers (for example, Compound 1 may be present in an emission layer and Compound 2 may be present in a hole blocking layer).

The first electrode may be an anode, which is a hole injection electrode, and the second electrode may be a cathode, which is an electron injection electrode, or the first electrode may be a cathode, which is an electron injection electrode, and the second electrode may be an anode, which is a hole injection electrode.

The term "organic layer" used herein refers to a single layer and/or a plurality of layers between the first electrode and the second electrode of the organic light-emitting device. The "organic layer" may include, in addition to an organic compound, an organometallic complex including metal, but the organic layer is not limited thereto.

FIG. 1 is a schematic cross-sectional view of an organic light-emitting device 10 according to one or more embodiments. Hereinafter, a structure of an organic light-emitting device according to one or more embodiments of the present disclosure and a method of manufacturing the organic light-emitting device will be described with reference to FIG. 1. The organic light-emitting device 10 includes a first electrode 11, an organic layer 15, and a second electrode 19, which are sequentially stacked.

A substrate may be additionally located under the first electrode 11 or above the second electrode 19. For use as the substrate, any substrate that is used in general organic light-emitting devices may be used, and the substrate may be a glass substrate or a transparent plastic substrate, each having excellent mechanical strength, thermal stability, transparency, surface smoothness, ease of handling, and water resistance.

The first electrode 11 may be formed, for example, by depositing or sputtering a material for forming the first electrode 11 on the substrate. The first electrode 11 may be an anode. The material for forming the first electrode 11 may be chosen from materials with a high work function to facilitate hole injection. The first electrode 11 may be a reflective electrode, a semi-transmissive electrode, or a transmissive electrode. The material for forming the first electrode 11 may be indium tin oxide (ITO), indium zinc oxide (IZO), tin oxide ($SnO_2$), or zinc oxide (ZnO). In one or more embodiments, the material for forming the first electrode 11 may be metal, such as magnesium (Mg), aluminum (Al), aluminum-lithium (Al—Li), calcium (Ca), magnesium-indium (Mg—In), or magnesium-silver (Mg—Ag).

The first electrode 11 may have a single-layered structure or a multi-layered structure including two or more layers. In one or more embodiments, the first electrode 11 may have a three-layered structure of ITO/Ag/ITO, but the structure of the first electrode 11 is not limited thereto.

The organic layer 15 is located on the first electrode 11.

The organic layer 15 may include a hole transport region, an emission layer, and an electron transport region.

The hole transport region may be between the first electrode 11 and the emission layer.

The hole transport region may include at least one of a hole injection layer, a hole transport layer, an electron blocking layer, and a buffer layer.

The hole transport region may include only either a hole injection layer or a hole transport layer. In one or more embodiments, the hole transport region may have a hole injection layer/hole transport layer structure or a hole injection layer/hole transport layer/electron blocking layer structure, wherein, for each structure, each layer is sequentially stacked in this stated order from the first electrode 11.

When the hole transport region includes a hole injection layer, the hole injection layer may be formed on the first electrode 11 by using one or more suitable methods, for example, vacuum deposition, spin coating, casting, and/or Langmuir-Blodgett (LB) deposition.

When a hole injection layer is formed by vacuum deposition, the deposition conditions may vary according to a material that is used to form the hole injection layer, and the structure and thermal characteristics of the hole injection layer. For example, the deposition conditions may include a deposition temperature of about 100° C. to about 500° C., a vacuum pressure of about $10^{-8}$ torr to about $10^{-3}$ torr, and a deposition rate of about 0.01 angstrom per second (Å/sec) to about 100 Å/sec. However, the deposition conditions are not limited thereto.

When the hole injection layer is formed using spin coating, coating conditions may vary according to the material used to form the hole injection layer, and the structure and thermal properties of the hole injection layer. For example, a coating speed may be from about 2,000 revolutions per minute (rpm) to about 5,000 rpm, and a temperature at which a heat treatment is performed to remove a solvent after coating may be from about 80° C. to about 200° C. However, the coating conditions are not limited thereto.

Conditions for forming a hole transport layer and an electron blocking layer may be understood by referring to conditions for forming the hole injection layer.

The hole transport region may include at least one of m-MTDATA, TDATA, 2-TNATA, NPB, β-NPB, TPD, Spiro-TPD, Spiro-NPB, methylated-NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonicacid (PANI/CSA), polyaniline/poly(4-styrenesulfonate) (PANI/PSS), a compound represented by Formula 201 below, or a compound represented by Formula 202 below:
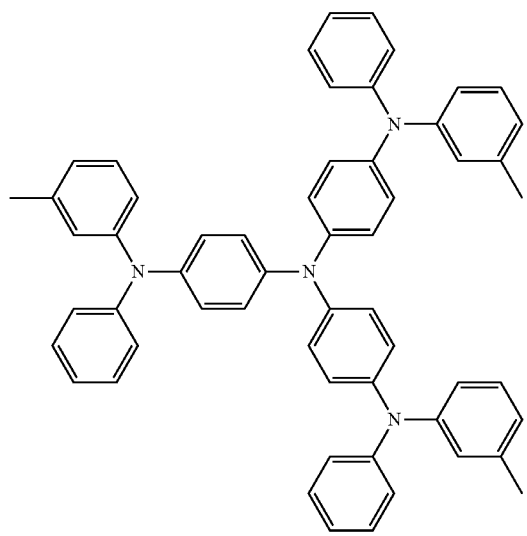
m-MTDATA
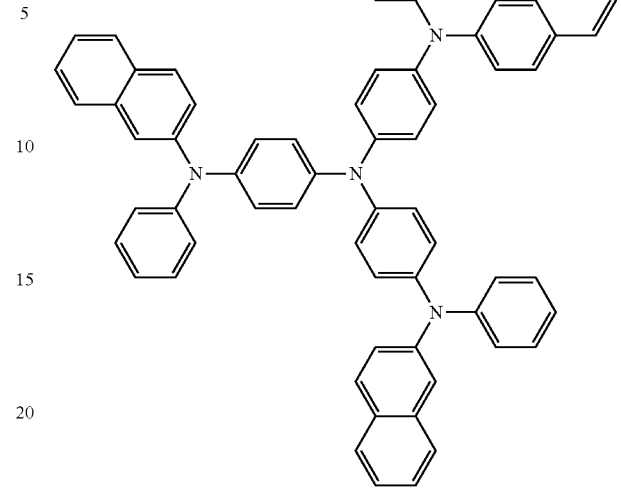
2-TNATA
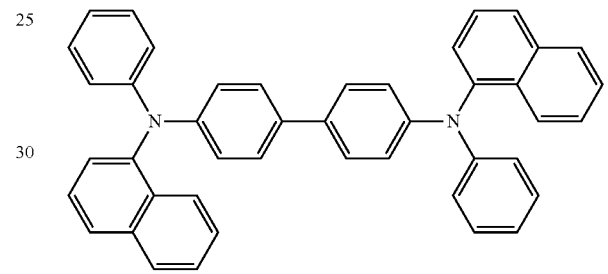
NPB
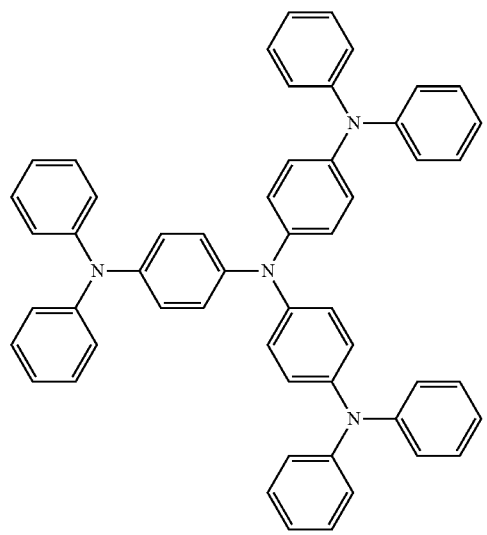
TDATA
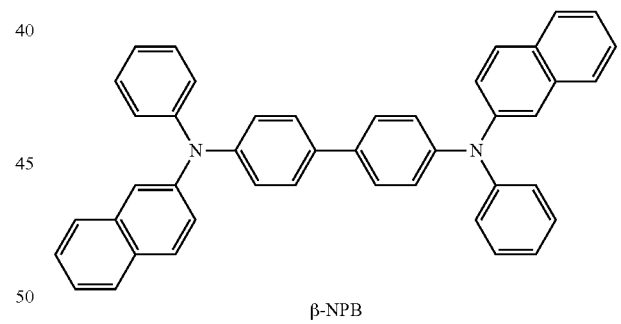
β-NPB
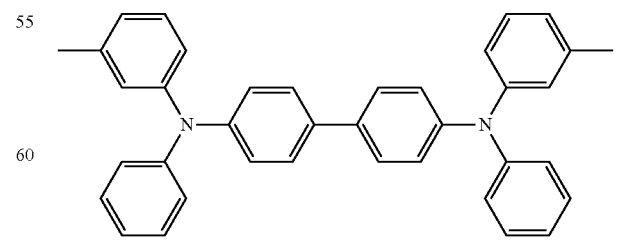
TPD -continued

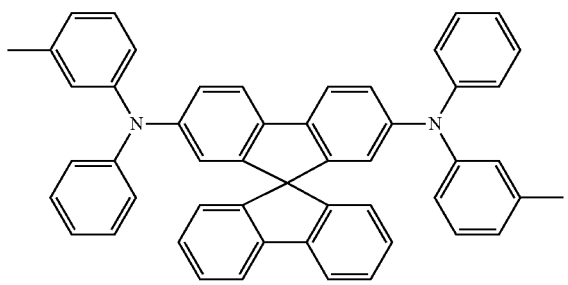
Spiro-TPD

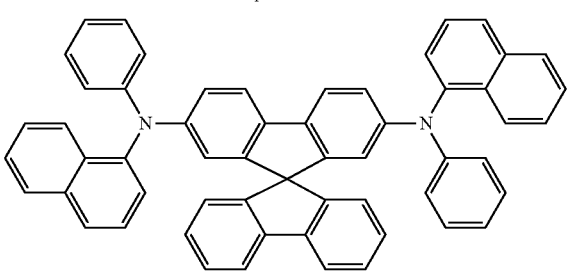
Spiro-NPB

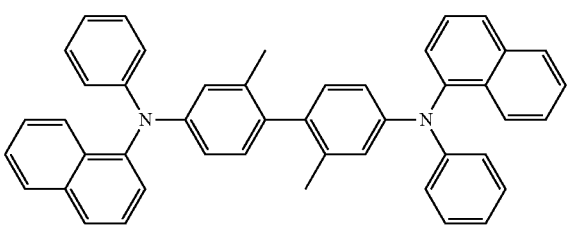
methylated NPB

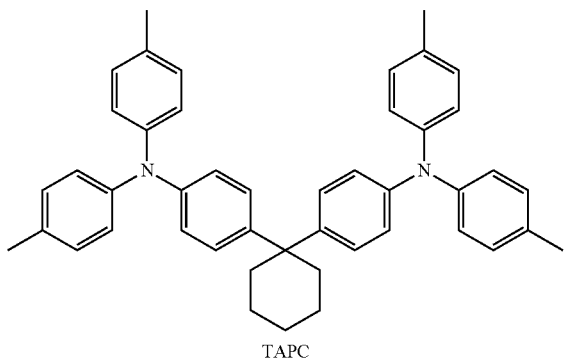
TAPC

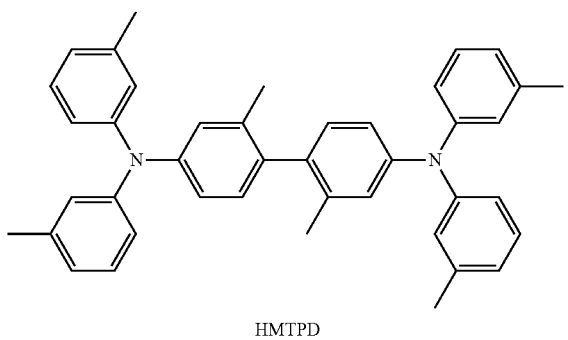
HMTPD

-continued

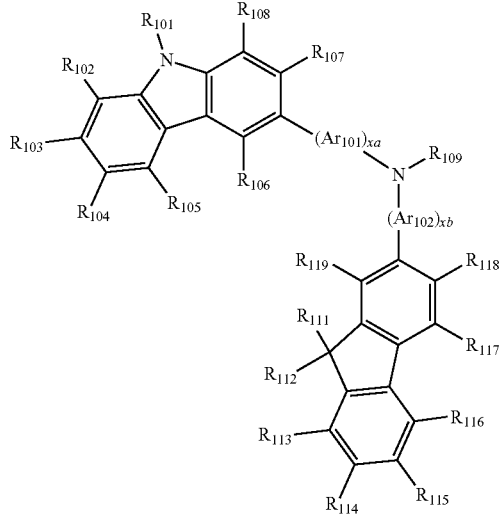
Formula 201

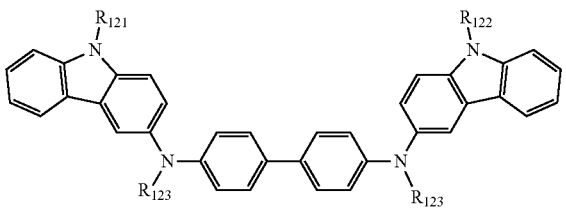
Formula 202

In Formula 201, $Ar_{101}$ and $Ar_{102}$ may each independently be:

a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group; or a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group, each substituted with one or more of deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, or a monovalent non-aromatic condensed heteropolycyclic group.

In Formula 201, xa and xb may each independently be an integer from 0 to 5, or 0, 1, or 2. In one or more embodiments, xa may be 1 and xb may be 0, but xa and xb are not limited thereto.

In Formulae 201 and 202, $R_{101}$ to $R_{108}$, $R_{111}$ to $R_{119}$ and $R_{121}$ to $R_{124}$ may each independently be:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, pentyl group, a hexyl group, or the like) or a $C_1$-$C_{10}$ alkoxy group (for example, a methoxy group, an ethoxy group, a propoxy group, a butoxy group, a pentoxy group, or the like);

a $C_1$-$C_{10}$ alkyl group, or a $C_1$-$C_{10}$ alkoxy group, each substituted with one or more of deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, or a phosphoric acid group or a salt thereof;

a phenyl group, a naphthyl group, an anthracenyl group, a fluorenyl group, or a pyrenyl group; or a phenyl group, a naphthyl group, an anthracenyl group, a fluorenyl group, or a pyrenyl group, each substituted with one or more of deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, or a $C_1$-$C_{10}$ alkoxy group, but embodiments of the present disclosure are not limited thereto.

In Formula 201, $R_{109}$ may be:

a phenyl group, a naphthyl group, an anthracenyl group, or a pyridinyl group; and a phenyl group, a naphthyl group, an anthracenyl group, or a pyridinyl group, each substituted with one or more of deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, or a pyridinyl group.

According to one or more embodiments, the compound represented by Formula 201 may be represented by Formula 201A below, but embodiments of the present disclosure are not limited thereto:

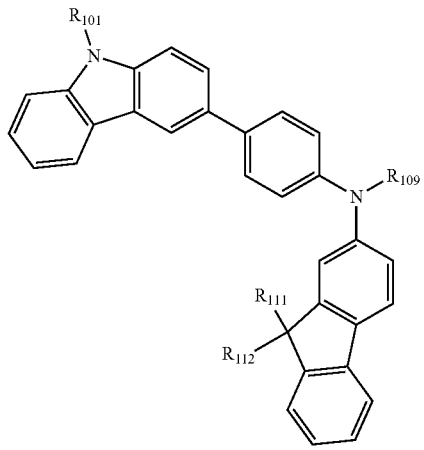

Formula 201A

In Formula 201A, $R_{101}$, $R_{111}$, $R_{112}$, and $R_{109}$ may be understood by referring to the description provided herein.

In one or more embodiments, the compound represented by Formula 201 and the compound represented by Formula 202 may include one of Compounds HT1 to HT20 illustrated below, but are not limited thereto:

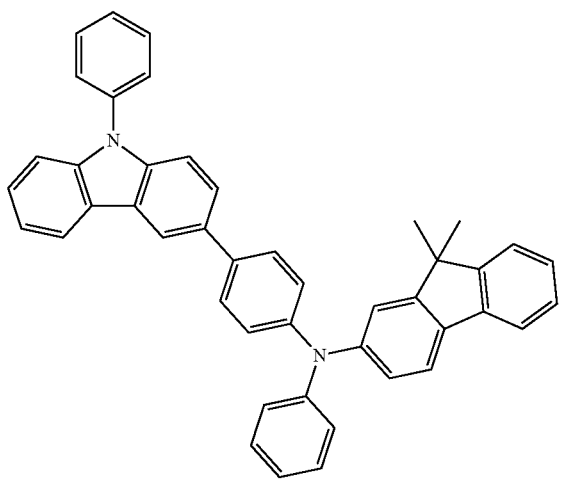

HT1

HT2
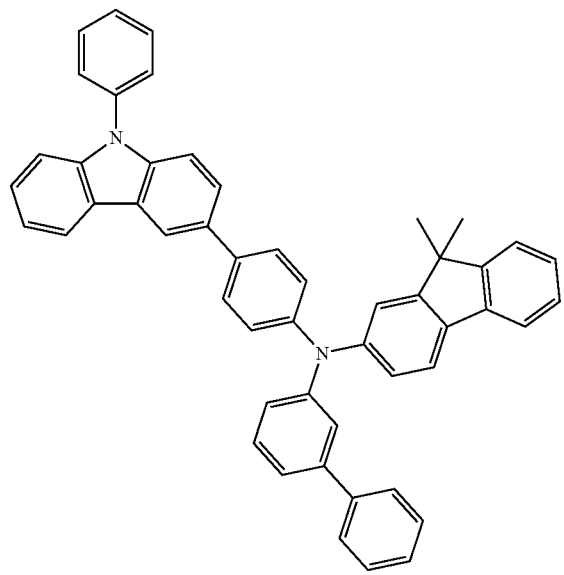
HT3
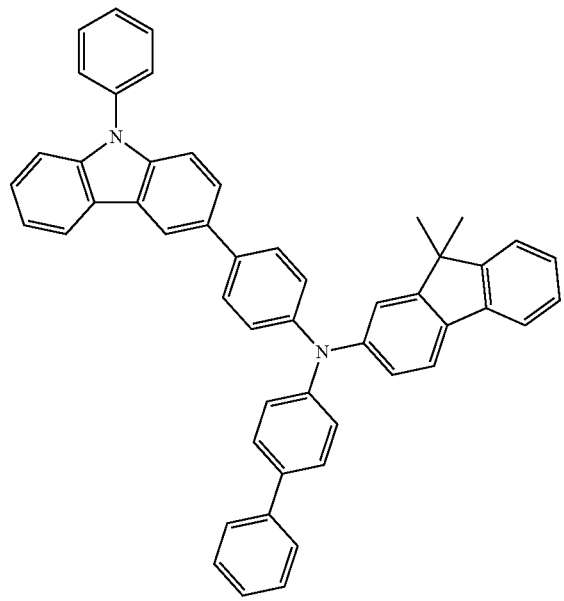
HT4
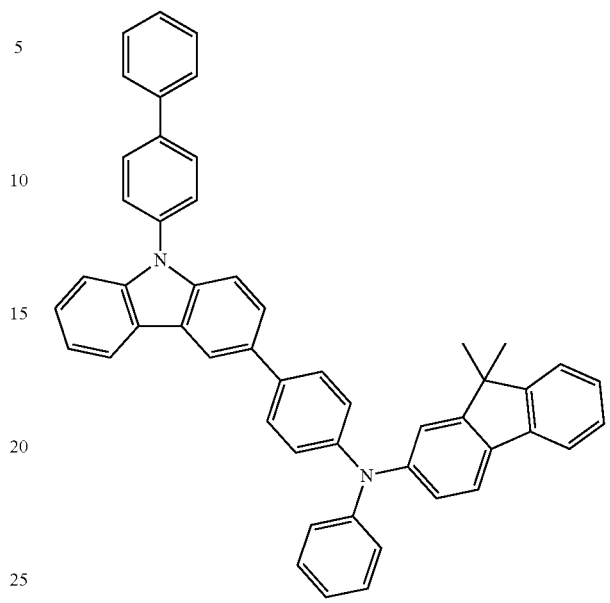
HT5
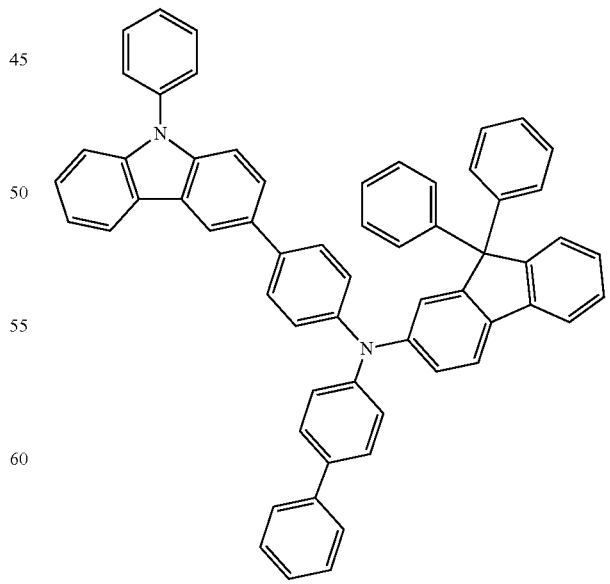

HT6
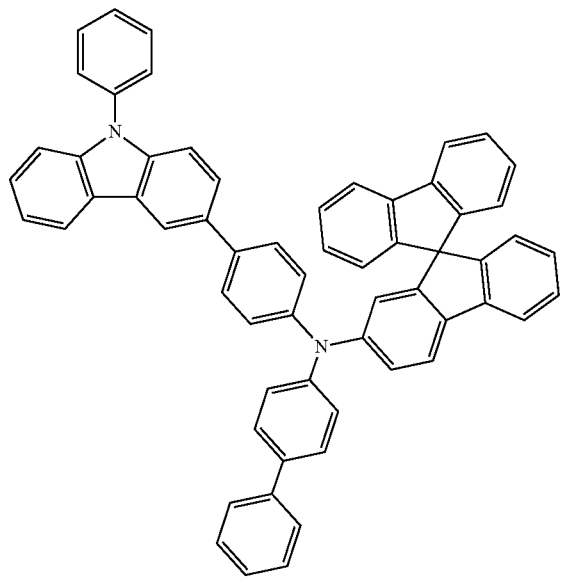
HT7
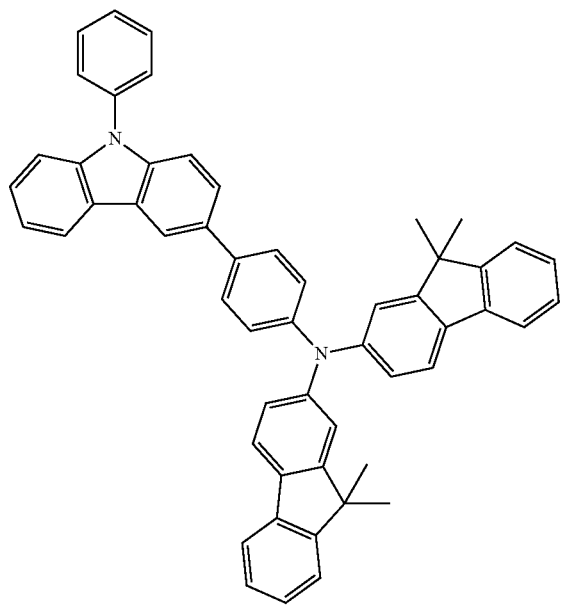
HT8
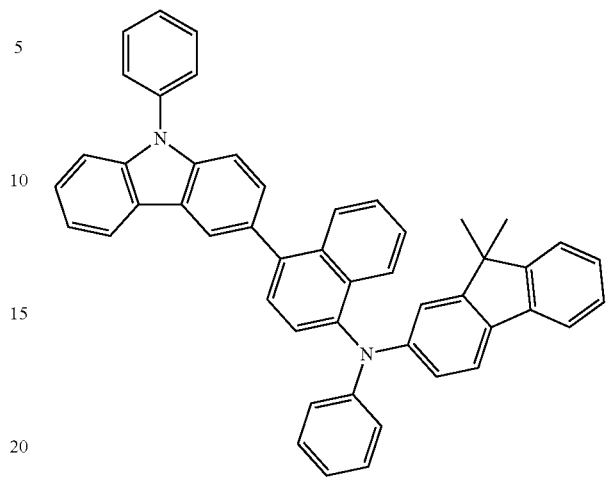
HT9
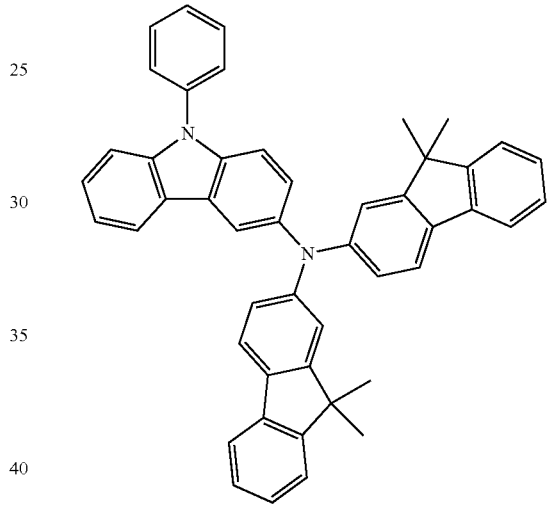
HT10
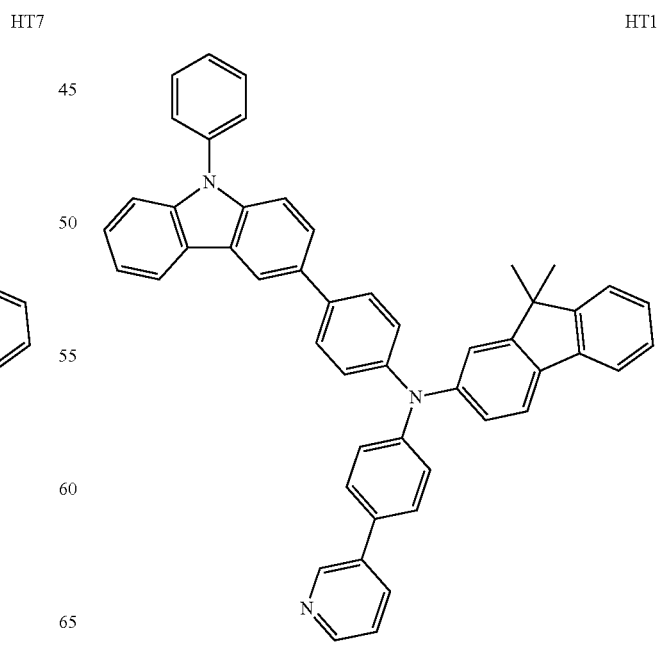

HT11
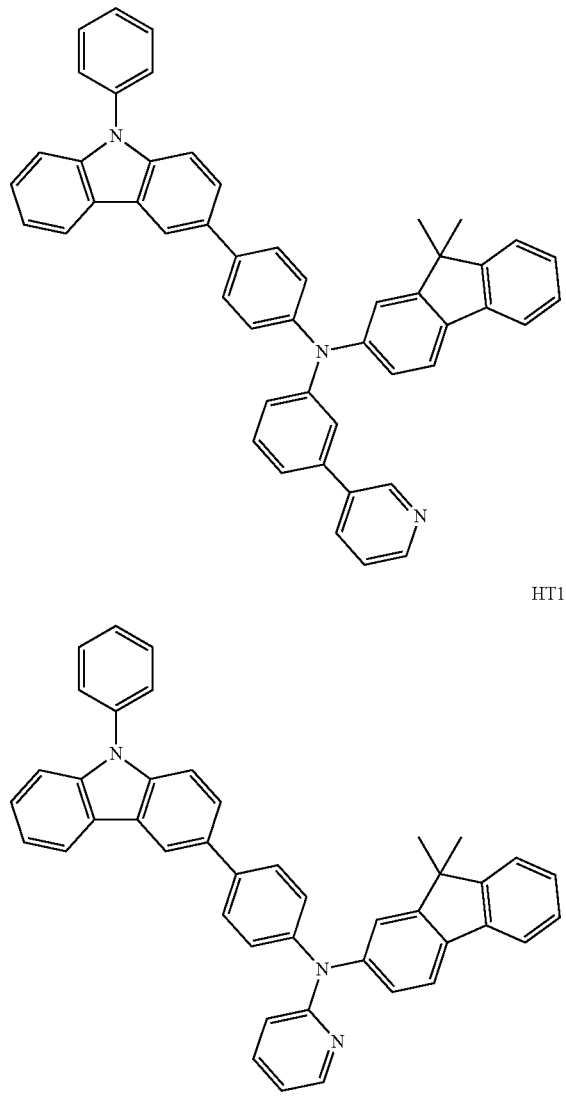
HT12
HT13
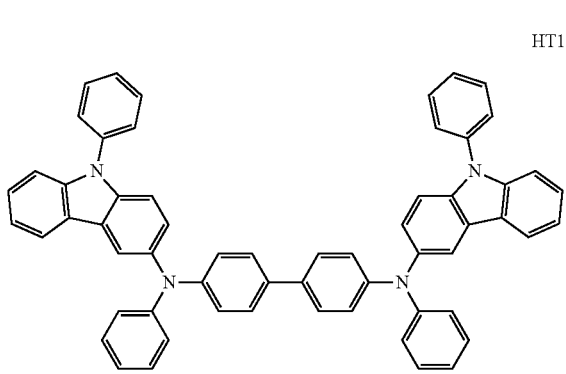
HT14
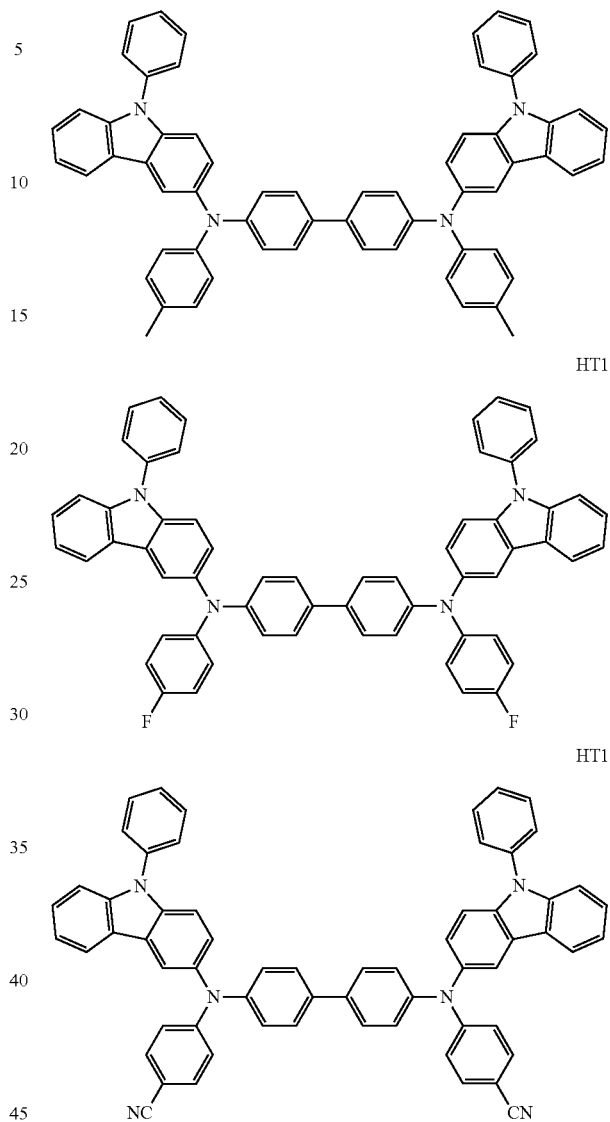
HT15
HT16
HT17

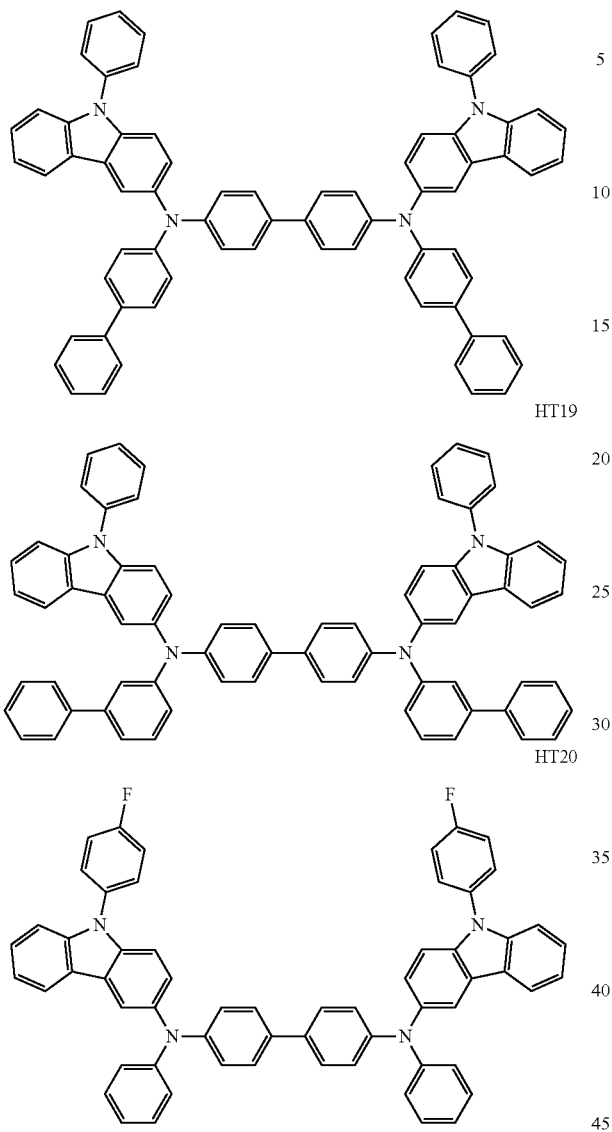

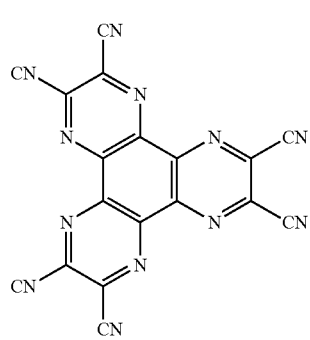

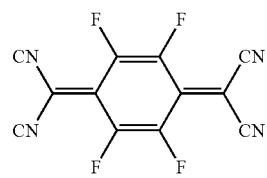

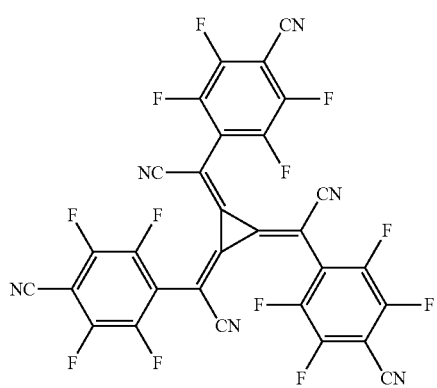

A thickness of the hole transport region may be in a range of about 100 Å to about 10,000 Å, for example, about 100 Å to about 1,000 Å. When the hole transport region includes at least one of a hole injection layer and a hole transport layer, a thickness of the hole injection layer may be in a range of about 100 Å to about 10,000 Å, for example, about 100 Å to about 1,000 Å, and a thickness of the hole transport layer may be in a range of about 50 Å to about 2,000 Å, for example, about 100 Å to about 1,500 Å. When the thicknesses of the hole transport region, the hole injection layer, and the hole transport layer are within these ranges, satisfactory hole transporting characteristics may be obtained without a substantial increase in driving voltage.

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant. The p-dopant may be one or more of a quinone derivative, a metal oxide, or a cyano group-containing compound, but embodiments of the present disclosure are not limited thereto. In one or more embodiments, non-limiting examples of the p-dopant are: a quinone derivative, such as tetracyanoquinonedimethane (TCNQ) or 2,3,5,6-tetrafluoro-tetracyano-1,4-benzoquinonedimethane (F4-TCNQ); a metal oxide, such as a tungsten oxide or a molybdenium oxide; and a cyano group-containing compound, such as Compound HT-D1 or Compound HT-D2 below, but are not limited thereto.

The hole transport region may further include a buffer layer.

The buffer layer may compensate for an optical resonance distance according to a wavelength of light emitted from the emission layer, thereby increasing efficiency of an organic light-emitting device.

The hole transport region may further include an electron blocking layer. The electron blocking layer may include a material available in the art, for example, mCP, but embodiments of the present disclosure are not limited.

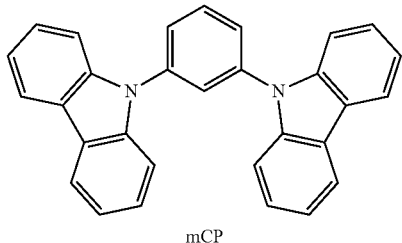 [SMILES: c1cc(-n2c3ccccc3c3ccccc32)cc(-n2c3ccccc3c3ccccc32)c1]

mCP

The thickness of the electron blocking layer may be about 50 Å to about 1,000 Å, for example about 70 Å to about 500 Å. When the thickness of the electron blocking layer is within the range described above, the electron blocking layer may have satisfactory electron blocking characteristics without a substantial increase in driving voltage.

Then, an emission layer may be formed on the hole transport region by vacuum deposition, spin coating, casting, LB deposition, or the like. When the emission layer is formed by vacuum deposition or spin coating, the deposition or coating conditions may be similar to those applied in forming the hole injection layer although the deposition or coating conditions may vary according to a material that is used to form the hole transport layer.

When the organic light-emitting device is a full-color organic light-emitting device, the emission layer may be patterned into a red emission layer, a green emission layer, and a blue emission layer. In one or more embodiments, due to a stacked structure including a red emission layer, a green emission layer, and/or a blue emission layer, the emission layer may emit white light.

The emission layer may include the organometallic compound represented by Formula 1.

In one or more embodiments, the emission layer may include only the organometallic compound represented by Formula 1.

When the emission layer includes a host and a dopant, an amount of the dopant may be in the range of about 0.01 parts by weight to about 20 parts by weight, based on 100 parts by weight of the emission layer. However, embodiments of the present disclosure are not limited thereto. When the amount of the dopant satisfies the range, it may be possible to realize emission without extinction phenomenon.

A thickness of the emission layer may be in a range of about 100 Å to about 1,000 Å, for example, about 200 Å to about 600 Å. When the thickness of the emission layer is within this range, excellent light-emission characteristics may be obtained without a substantial increase in driving voltage.

Then, an electron transport region may be located on the emission layer.

The electron transport region may include at least one of a hole blocking layer, an electron transport layer, and an electron injection layer.

For example, the electron transport region may have a hole blocking layer/electron transport layer/electron injection layer structure or an electron transport layer/electron injection layer structure, and the structure of the electron transport region is not limited thereto. The electron transport layer may have a single-layered structure or a multi-layered structure including two or more different materials.

Conditions for forming the hole blocking layer, the electron transport layer, and the electron injection layer which constitute the electron transport region may be understood by referring to the conditions for forming the hole injection layer.

When the electron transport region includes a hole blocking layer, the hole blocking layer may include, for example, at least one of BCP and Bphen, but embodiments of the present disclosure are not limited thereto.

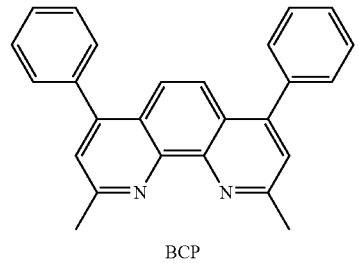

BCP

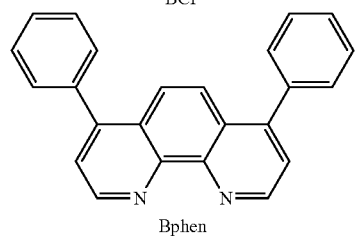

Bphen

A thickness of the hole blocking layer may be in a range of about 20 Å to about 1,000 Å, for example, about 30 Å to about 300 Å. When the thickness of the hole blocking layer is within these ranges, the hole blocking layer may have excellent hole blocking characteristics without a substantial increase in driving voltage.

The electron transport layer may further include at least one of BCP, Bphen, $Alq_3$, Balq, TAZ, or NTAZ.

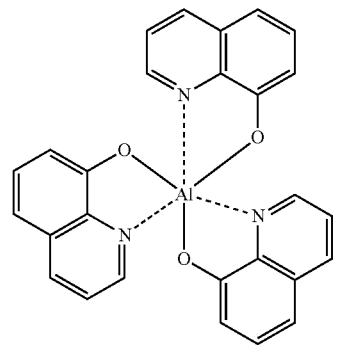

$Alq_3$

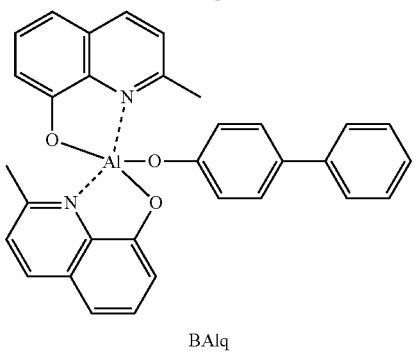

BAlq

-continued

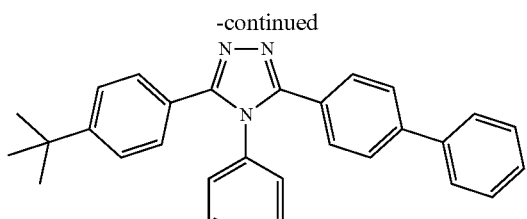

TAZ

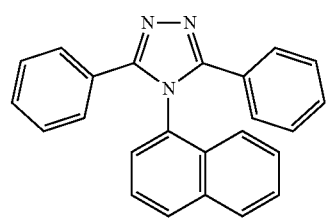

NTAZ

In one or more embodiments, the electron transport layer may include at least one of ET1, ET2, or ET3, but are not limited thereto:

ET1

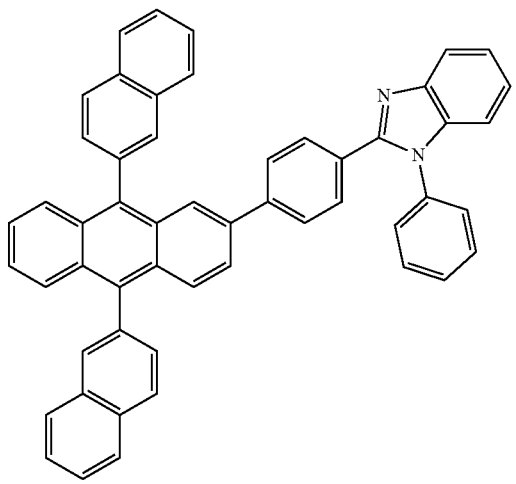

ET2

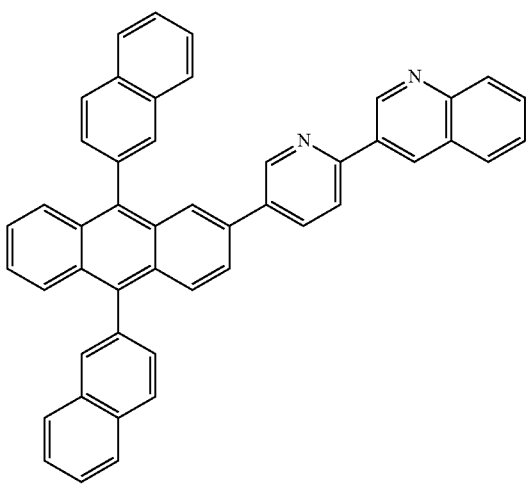

-continued

ET3

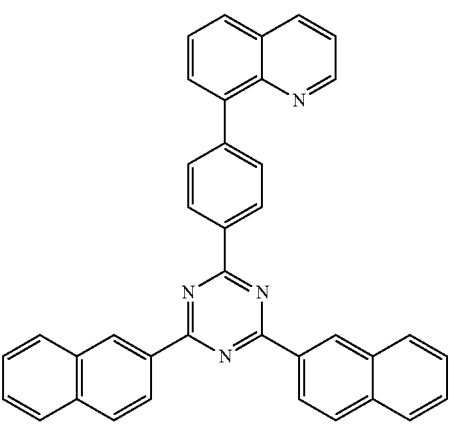

A thickness of the electron transport layer may be in a range of about 100 Å to about 1,000 Å, for example, about 150 Å to about 500 Å. When the thickness of the electron transport layer is within the range described above, satisfactory electron transport characteristics may be obtained without a substantial increase in driving voltage.

Also, the electron transport layer may further include, in addition to the materials described above, a metal-containing material.

The metal-containing material may include a Li complex. The Li complex may include, for example, Compound ET-D1 (lithium 8-hydroxyquinolate, LiQ) or ET-D2.

ET-D1

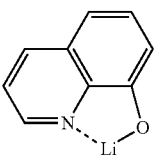

ET-D2

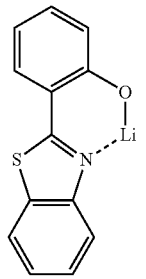

In one or more embodiments, the electron transport region may include an electron injection layer that promotes the flow of electrons from the second electrode 19 thereinto.

The electron injection layer may include at least one of LiQ, LiF, NaCl, CsF, $Li_2O$, or BaO.

A thickness of the electron injection layer may be in a range of about 1 Å to about 100 Å, and, for example, about 3 Å to about 90 Å. When the thickness of the electron injection layer is within the range described above, satisfactory electron injection characteristics may be obtained without a substantial increase in driving voltage.

The second electrode 19 is located on the organic layer 15. The second electrode 19 may be a cathode. A material for forming the second electrode 19 may be metal, a metal alloy, an electrically conductive compound, or a combination thereof, which have a relatively low work function. For example, lithium (Li), magnesium (Mg), aluminum (Al), aluminum-lithium (Al—Li), calcium (Ca), magnesium-indium (Mg—In), or magnesium-silver (Mg—Ag) may be used as the material for forming the second electrode 19. In one or more embodiments, to manufacture a top-emission type light-emitting device, a transmissive electrode formed using ITO or IZO may be used as the second electrode 19.

Hereinbefore, the organic light-emitting device has been described with reference to FIG. 1, but embodiments of the present disclosure are not limited thereto.

Electronic Apparatus

The organometallic compound represented by Formula 1 may be applied to various electronic apparatuses. Accordingly, according to another aspect, provided is an electronic apparatus including the organometallic compound.

The electronic apparatus may include various displays, light sources, lighting, computers, electronic dictionaries, medical devices, projectors, and image sensors.

In one or more embodiments, the electronic apparatus may include the organic light-emitting device as described above, and the organometallic compound may be included in the organic light-emitting device.

Definition of Terms

The term "$C_1$-$C_{60}$ alkyl group" as used herein refers to a linear or branched saturated aliphatic hydrocarbon monovalent group having 1 to 60 carbon atoms, and examples thereof include a methyl group, an ethyl group, a propyl group, an isobutyl group, a sec-butyl group, a tert-butyl group, a pentyl group, an isoamyl group, and a hexyl group. The term "$C_1$-$C_{60}$ alkylene group" as used herein refers to a divalent group having the same structure as the $C_1$-$C_{60}$ alkyl group.

The term "$C_1$-$C_{60}$ alkoxy group" used herein refers to a monovalent group represented by —$OA_{101}$ (wherein $A_{101}$ is the $C_1$-$C_{60}$ alkyl group), and examples thereof include a methoxy group, an ethoxy group, and an isopropyloxy group.

The term "$C_2$-$C_{60}$ alkenyl group" as used herein refers to a hydrocarbon group formed by substituting at least one carbon-carbon double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group formed by substituting at least one carbon-carbon triple bond in the middle or at the terminus of the $C_2$-$C_{60}$ alkyl group, and examples thereof include an ethynyl group and a propynyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon monocyclic group having 3 to 10 carbon atoms, and examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent monocyclic group having at least one heteroatom selected from N, O, P, Si, and S as a ring-forming atom and 1 to 10 carbon atoms, and examples thereof include a tetrahydrofuranyl group and a tetrahydrothiophenyl group. The term "$C_1$-$C_{10}$ heterocycloalkylene group" as used herein refers to a divalent group having the same structure as the $C_1$-$C_1$ heterocycloalkyl group.

The term "$C_3$-$C_{10}$ cycloalkenyl group" as used herein refers to a monovalent monocyclic group that has 3 to 10 carbon atoms and at least one carbon-carbon double bond in the ring thereof and no aromaticity, and examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group that has at least one heteroatom selected from N, O, P, Si, and S as a ring-forming atom, 1 to 10 carbon atoms, and at least one double bond in its ring. Examples of the $C_1$-$C_{10}$ heterocycloalkenyl group include a 2,3-dihydrofuranyl group and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms as ring atoms, and the term "$C_6$-$C_{60}$ arylene group" as used herein refers to a divalent group having a carbocyclic aromatic system having 6 to 60 carbon atoms as ring atoms. Examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the two or more rings may be fused to each other.

The term "$C_1$-$C_{60}$ heteroaryl group" as used herein refers to a monovalent group having an aromatic system that has at least one heteroatom selected from N, O, P, Si, and S as a ring-forming atom instead of a carbon atom, and 1 to 60 carbon atoms. The term "$C_1$-$C_{60}$ heteroarylene group" as used herein refers to a divalent group having an aromatic system that has at least one heteroatom selected from N, O, P, and S as a ring-forming atom instead of a carbon atom, and 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the two or more rings may be fused to each other.

The term "$C_6$-$C_{60}$ aryloxy group" as used herein refers to —$OA_{102}$ (wherein $A_{102}$ is the $C_6$-$C_{60}$ aryl group), and the term "$C_6$-$C_{60}$ arylthio group" as used herein refers to —$SA_{103}$ (wherein $A_{103}$ is the $C_6$-$C_{60}$ aryl group).

The term "monovalent non-aromatic condensed polycyclic group" used herein refers to a monovalent group in which two or more rings are condensed with each other, only carbon is used as a ring-forming atom (for example, the number of carbon atoms may be 8 to 60), and the whole molecule is a non-aromaticity group. Examples of the monovalent non-aromatic condensed polycyclic group include a fluorenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group having two or more rings condensed to each other, a heteroatom selected from N, O, P, Si, and S, other than carbon atoms (for example, having 1 to 60 carbon atoms), as a ring-forming atom, and non-aromaticity in its entire molecular structure. Examples of the monovalent non-aromatic condensed heteropolycyclic group include a carbazolyl group. The term "divalent non-aromatic condensed heteropolycyclic group" as used herein refers to a divalent group having the same structure as the monovalent non-aromatic condensed heteropolycyclic group.

The term "$R_{10a}$" as used herein refers to:

deuterium, $-CD_3$, $-CD_2H$, $-CDH_2$, $-F$, $-Cl$, $-Br$, $-I$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with one or more of deuterium, $-CD_3$, $-CD_2H$, $-CDH_2$, $-F$, $-Cl$, $-Br$, $-I$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, a monovalent non-aromatic condensed heteropolycyclic group, $-Si(Q_{11})(Q_{12})(Q_{13})$, $-Ge(Q_{11})(Q_{12})(Q_{13})$, $-N(Q_{14})(Q_{15})$, $-B(Q_{16})(Q_{17})$, $-P(=O)(Q_{18})(Q_{19})$, or $-P(Q_{18})(Q_{19})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each substituted with one or more of deuterium, $-CD_3$, $-CD_2H$, $-CDH_2$, $-F$, $-Cl$, $-Br$, $-I$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, a monovalent non-aromatic condensed heteropolycyclic group, $-Si(Q_{21})(Q_{22})(Q_{23})$, $Ge(Q_{21})(Q_{22})(Q_{23})$, $-N(Q_{24})(Q_{25})$, $-B(Q_{26})(Q_{27})$, $-P(=O)(Q_{28})(Q_{29})$, or $-P(Q_{28})(Q_{29})$; or $-Si(Q_{31})(Q_{32})(Q_{33})$, $-Ge(Q_{31})(Q_{32})(Q_{33})$, $-N(Q_{34})(Q_{35})$, $-B(Q_{36})(Q_{37})$, $-P(=O)(Q_{38})(Q_{39})$, or $-P(Q_{38})(Q_{39})$.

$Q_1$ to $Q_9$, $Q_{11}$ to $Q_{19}$, $Q_{21}$ to $Q_{29}$, and $Q_{31}$ to $Q_{39}$, which are used herein, may each independently be hydrogen, deuterium, $-F$, $-Cl$, $-Br$, $-I$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_1$ heterocycloalkyl group, a $C_3$-$C_{10}$ cycloalkenyl group, a $C_1$-$C_1$ heterocycloalkenyl group, a $C_6$-$C_{60}$ aryl group, a $C_1$-$C_{60}$ heteroaryl group, a monovalent non-aromatic condensed polycyclic group, or a monovalent non-aromatic condensed heteropolycyclic group.

The expressions * and *' used herein each indicate a binding site to a neighboring atom, unless otherwise stated.

The term "room temperature" used herein refers to a temperature of about 25° C.

Hereinafter, a compound and an organic light-emitting device according to embodiments are described in detail with reference to Synthesis Example and Examples. However, the organic light-emitting device is not limited thereto.

EXAMPLES

Compound Synthesis Example

Synthesis Example 1: Synthesis of Compound A

Compound A was synthesized according to the following reaction scheme.

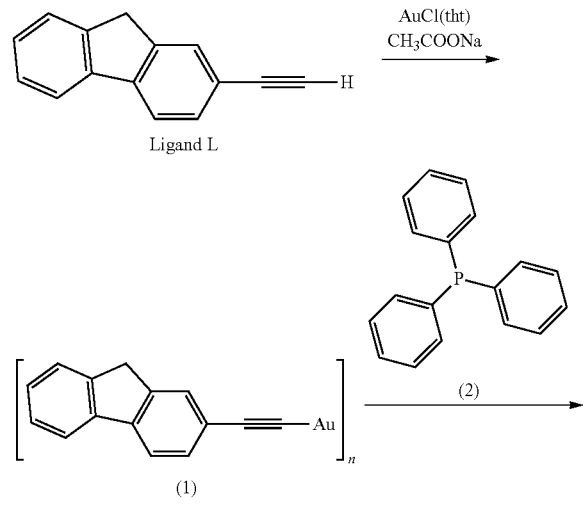

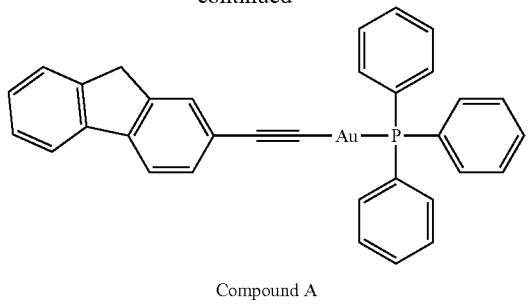

Compound A

Synthesis of Intermediate (1)

100 milligrams (mg) (0.53 millimoles (mmol)) of 2-ethynylfluorene (ligand L) was dissolved in 10 milliliters (mL) of a mixed solution containing tetrahydrofuran (THF) and methanol (MeOH) in a volume ratio of 1:1, and 169 mg (0.53 mmol) of chloro(tetrahydrothiophene)gold(I)(AuCl (tht)) and 86.2 mg (1.1 mmol) of sodium acetate were added thereto. When a brown precipitate was formed, the mixture was stirred for an hour. When the reaction was complete, a formed solid was subjected to filtration and separation to thereby obtain 167 mg (yield of 82%) of Intermediate (1).

ATR-FTIR (cm$^{-1}$): 1446 (C=C), 1997 (C≡C).

Synthesis of Compound A 13.5 mg (0.052 mmol) of triphenylphosphine was dissolved in 10 mL of dichloromethane (DCM), and 20 mg (0.052 mmol) of Intermediate (1) was added thereto. The mixture was stirred for an hour. When the reaction is complete, a solution was concentrated to reduce the volume to about half, n-hexane was added thereto to form a precipitate. A formed solid was subjected to filtration and separation and then recrystallized in a DCM/n-hexane condition, to thereby obtain 23.5 mg (yield of 70%) of Compound A.

Proton nuclear magnetic resonance spectroscopy ($^1$H NMR) (400 megahertz (MHz), CDCl$_3$): Chemical shift (δ) (parts per million, (ppm)): 3.86 (s, 2H, H$_2$), 7.27 (t, J=7.5 Hz, 1H, H$_4$), 7.35 (t, J=7.4 Hz, 1H, H$_5$), 7.42-7.62 (m, 17H, H$_3$+H$_7$+Ph), 7.67 (d, J=8.2 Hz, 1H, H$_8$), 7.69 (s, 1H, H$_1$), 7.73 (d, J=7.3 Hz, 1H, H$_6$). $^{31}$P{$^1$H} NMR (161.9 MHz, CDCl$_3$, ppm): δ 42.4 (s). Matrix asssiste laser desorption ionization time of flight mas spectrometry (MALDI-TOF MS) (+) m/z 648.0 ([M]$^+$, calcd. 648.1).

Synthesis Example 2: Synthesis of Compound B

Compound B was synthesized according to the following reaction scheme.

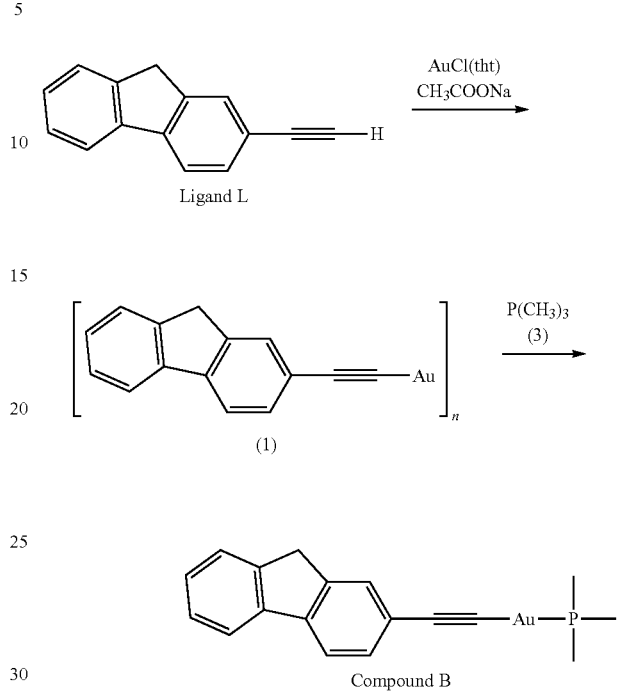

Compound B

Synthesis of Compound B 16.8 mg (yield of 73%) of Compound B was obtained using the method used in the synthesis of Compound A, except that 52 microliters (μL) (1 mole per liter (molar, M) solution in THF, 0.052 mmol) of trimethylphosphine was used instead of triphenylphosphine.

$^1$H NMR (400 MHz, CDCl$_3$): δ (ppm): 1.60 (d, J=10.4 Hz, 9H, P—CH$_3$), 3.87 (s, 2H, H$_2$), 7.28 (td, J=7.4, 1.2 Hz, 1H, H$_4$), 7.32-7.39 (m, 2H, H$_5$+H$_7$), 7.5 (s, 1H, H$_1$), 7.55 (dt, J=7.5, 1.0 Hz, 1H, H$_3$), 7.73 (dd, J=7.9, 0.7 Hz, H$_8$), 7.81 (dd, J=7.6, 1.2 Hz, 1H, H$_6$) $^{31}$P{$^1$H} NMR (161.9 MHz, CDCl$_3$, ppm): δ 1.8 (s). MALDI-TOF MS(+) m/z 462.0 ([M]$^+$, calcd. 462.0).

Synthesis Example 3: Synthesis of Compound 1

Compound 1 was synthesized according to the following reaction scheme.

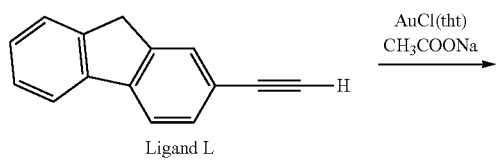

Ligand L

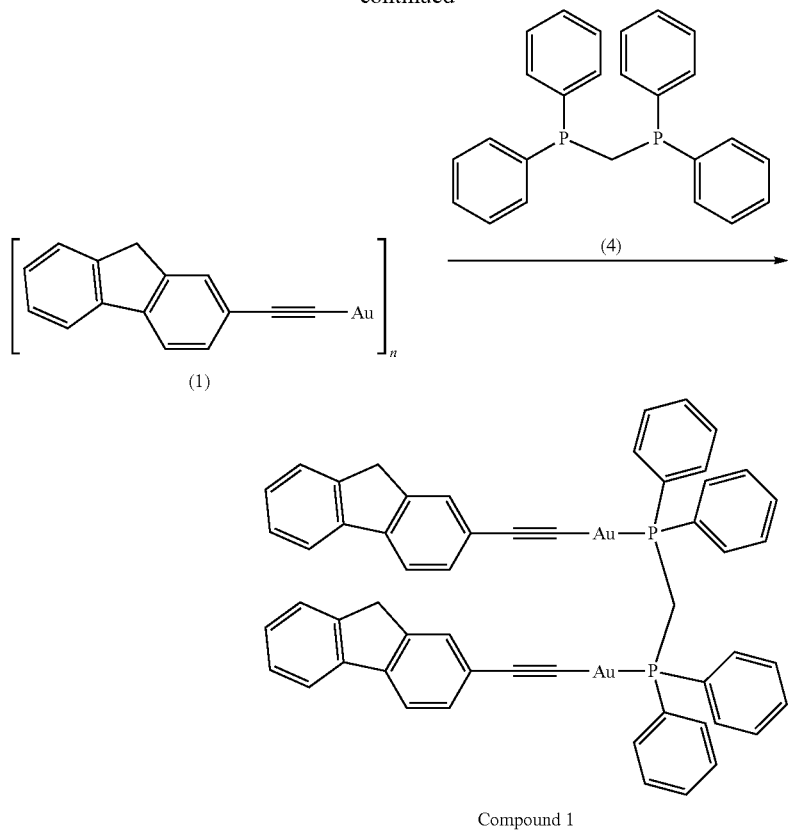

Compound 1

Synthesis of Compound 1

18.6 mg (yield of 62%) of Compound 1 was obtained using the method used in the synthesis of Compound A, except that 10.0 mg (0.026 mmol) of bis(diphenylphosphino)methane was used instead of triphenylphosphine.

$^1$H NMR (400 MHz, CDCl$_3$): δ 3.47 (s, 4H, H$_2$), 3.54 (t, J=10.8 Hz, 2H, H$_9$), 7.12 (t, J=7.3 Hz, 2H, H$_4$), 7.21 (d, J=6.96 Hz, 2H, H$_7$), 7.28 (t, J=7.1 Hz, 2H, H$_5$), 7.35 (d, J=7.7 Hz, 2H, H$_3$), 7.43 (s, 2H, H$_1$), 7.50-7.65 (m, 24H, H$_6$+H$_8$+Ph). $^{31}$P{$^1$H} NMR (161.9 MHz, CDCl$_3$, ppm): δ 31.7 (s). MALDI-TOF MS(+) m/z 1156.1 ([M]$^+$, calcd. 1156.2).

Synthesis Example 4: Synthesis of Compound 31

Compound 31 was synthesized according to the following reaction scheme.

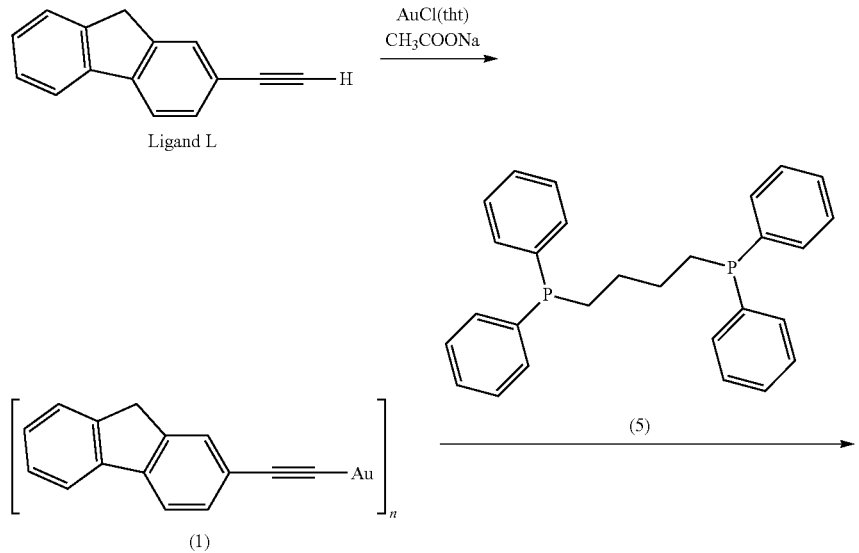

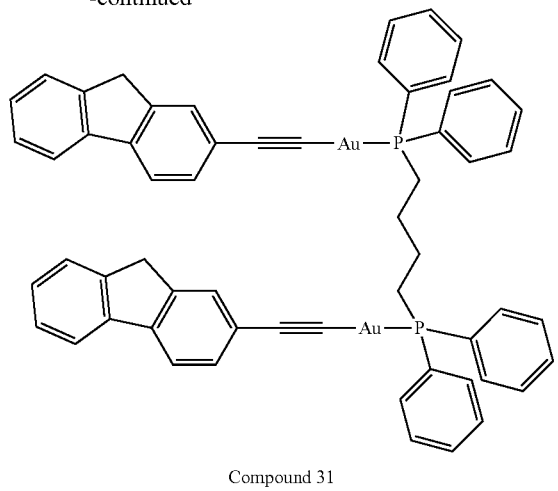

Compound 31

Synthesis of Compound 31

18.7 mg (yield of 60%) of Compound 31 was obtained using the method used in the synthesis of Compound A, except that 11.1 mg (0.026 mmol) of 1,4-bis(diphenylphosphino)butane was used instead of triphenylphosphine.

$^1$H NMR (400 MHz, CDCl$_3$): δ 1.68-1.78 (m, 4H, H$_{10}$), 2.30-2.40 (m, 4H, H$_9$), 3.79 (s, 4H, H$_2$), 7.20 (td, J=7.5, 1.2 Hz, 2H, H$_4$), 7.29 (t, J=7.5 Hz, 2H, H$_5$), 7.56-7.69 (m, 30H, H$_1$+H$_3$+H$_6$+H$_7$+H$_8$+Ph). $^{31}$P{$^1$H} NMR (161.9 MHz, CDCl$_3$, ppm): δ 37.3 (s). MALDI-TOF MS(+) m/z 1198.3 ([M]$^+$, calcd. 1198.2).

EVALUATION EXAMPLE

Evaluation Example 1: Evaluation of Optical Characteristics in Solution

(1) Preparation Example 1: Preparation of Acetonitrile Solution Sample

Ligand L and Compounds A, B, 1, and 31 were each dissolved in an acetonitrile solvent at a concentration of 1.0×10$^{-6}$ M to thereby prepare acetonitrile solution samples.

The following measurements were made at room temperature (about 25° C.).

Measurement of Absorption Spectrum

Figure 2:
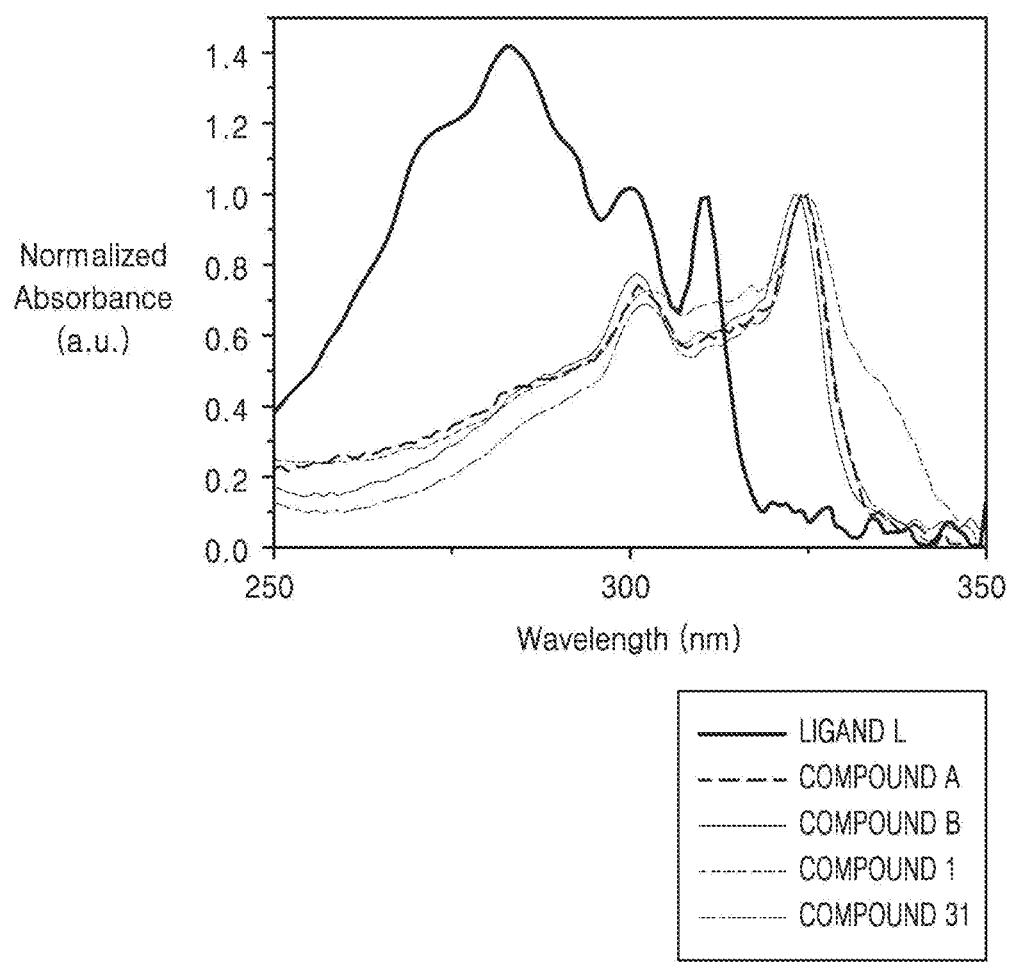
FIG. 2 are graphs of normalized absorption (arbitrary units, A.U.) versus wavelength (nanometers, nm) and show normalized absorption spectra of samples of acetonitrile solutions prepared in Preparation Example 1.

The prepared acetonitrile solution samples were each mounted on a UV-Vis spectrometer and absorbance was measured with respect to a wavelength range of 250 nm to 350 nm, and a normalized absorption spectrum is shown in FIG. 2.

Figure 3:
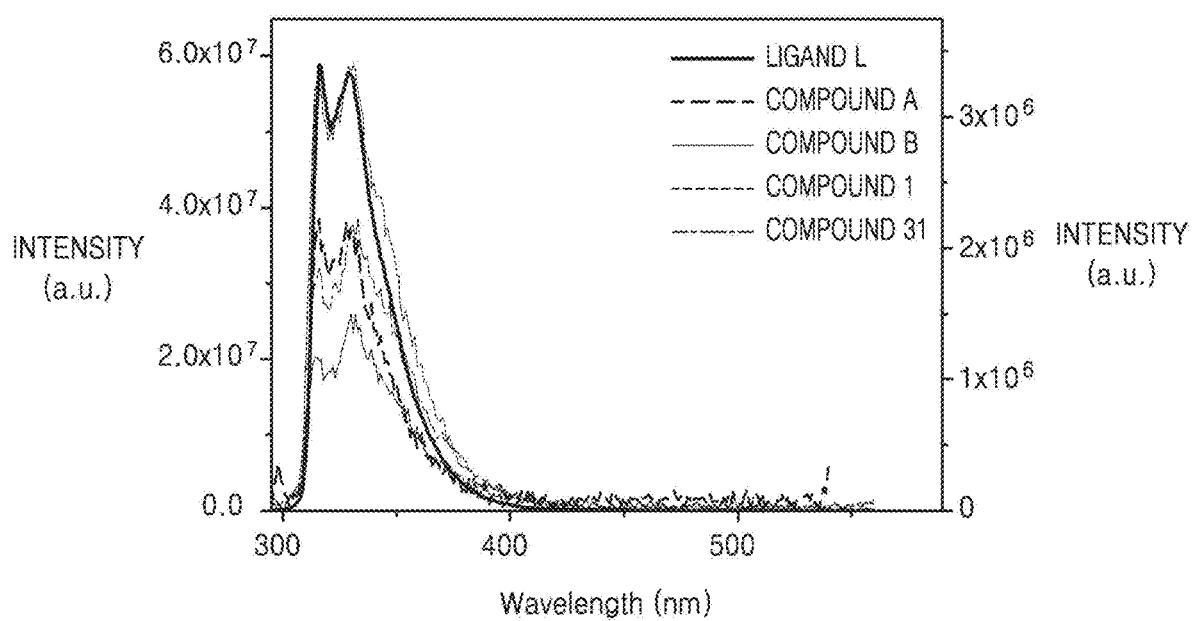
FIG. 3 are graphs of intensity (A.U.) versus wavelength (nm) and show normalized photoluminescence (PL) spectra of samples of acetonitrile solutions prepared in Preparation Example 1 in the presence of oxygen.

Measurement of Photoluminescence (PL) Spectrum (1) Measurement of Fluorescence Emission Wavelength A PL spectrum of each acetonitrile solution sample was measured by irradiating excitation light having an excitation wavelength ($λ_{exc}$) of 283 nm in the presence of oxygen, by using a PL measuring device. The normalized PL spectrum is shown in FIG. 3. In FIG. 3, left intensity (arbitrary units, A.U.) of a y-axis refers to emission intensity of Ligand L, and right intensity (arbitrary units, A.U.) of a y-axis refers to emission intensity of Compounds A, B, 1, and 31. In FIG. 3, although shapes of luminescence spectra of Ligand L and Compounds A, B, 1, and 31 are similar, Complexes A, B, 1, and 31 to which a metal is bound may have decreased fluorescence emission intensity. The fluorescence emission wavelength was determined from a wavelength value of a maximum emission peak of the normalized PL spectrum.

(2) Measurement of Phosphorescence Emission Wavelength

Figure 4:
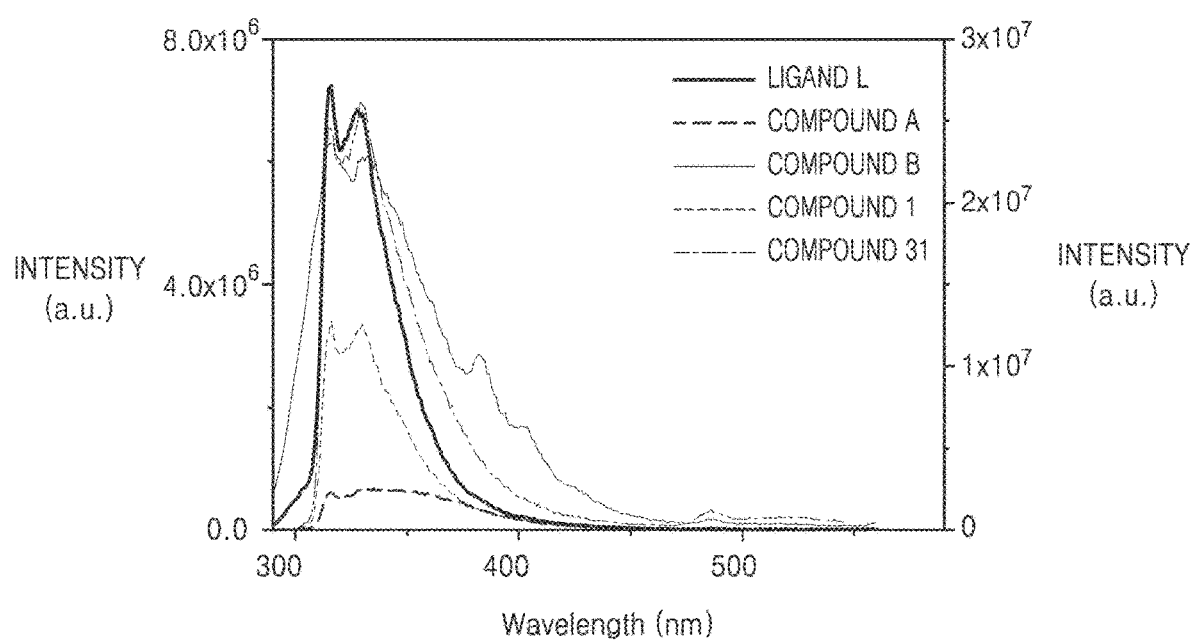
FIG. 4 are graphs of intensity (A.U.) versus wavelength (nm) and show normalized PL spectra of samples of acetonitrile solution prepared in Preparation Example 1 in the absence of oxygen.
Figure 5:
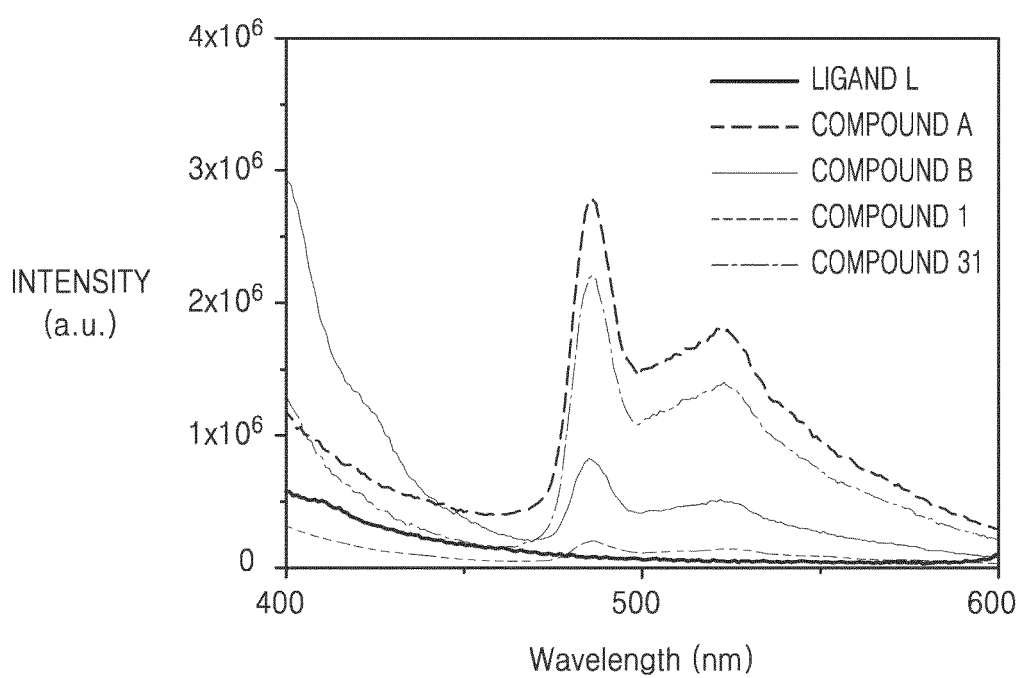
FIG. 5 are enlarged graphs of intensity (A.U.) versus wavelength (nm) and show a range of 400 nm to 600 nm of the PL spectra illustrated in FIG. 4.

After removal of oxygen according to a bubbling method in which a long injection needle is used to inject, for 10 minutes, dried nitrogen gas into an acetonitrile solution prepared for measurement, a PL spectrum of each acetonitrile solution sample was measured by irradiating excitation light having an excitation wavelength ($λ_{exc}$) of 325 nm under a condition in which oxygen is substantially not present. A normalized PL spectrum is shown in FIG. 4, and a range of 400 nm to 600 nm of the normalized PL spectrum is enlarged and shown in FIG. 5. In FIG. 4, left intensity (arbitrary units, A.U.) of a y-axis refers to emission intensity of Ligand L, and right intensity (arbitrary units, A.U.) of a y-axis refers to emission intensity of Compounds A, B, 1, and 31.

The normalized PL spectrum illustrated in FIG. 4 has a peak having a weak intensity in the vicinity of a wavelength of about 480 nm. Compounds A, B, 1, and 31 are interpreted to have a weak phosphorescence emission peak because phosphorescence emission intensity becomes strong under low oxygen concentration, for example, a substantially oxygen-free condition, or for example, an oxygen-free condition. The phosphorescence emission peak was determined from a wavelength value of a maximum emission peak of the PL spectrum illustrated in FIG. 5.

The maximum absorption wavelength, the molar extinction coefficient (s), the fluorescence emission wavelength, and the phosphorescence emission wavelength, which are determined from the normalized absorption spectrum and the normalized PL spectrum, are shown in Table 1.

TABLE 1

| Compound No. | Maximum absorption wavelength (nm) (ε(10$^4$ M$^{-1}$ · cm$^{-1}$)) | Fluorescence emission wavelength (nm) ($λ_{exc}$ = 283 nm) | Phosphorescence emission wavelength (nm) ($λ_{exc}$ = 325 nm) |
|---|---|---|---|
| Ligand L | 311 (2.32), 300 (2.37), 283 (3.28) | 315, 328 | — |
| Compound A | 325 (6.70), 302 (5.64) | 315, 330 | 486, 523 |
| Compound B | 325 (6.70), 302 (5.64) | 315, 330 | 486, 523 |
| Compound 1 | 325 (8.94), 304 (6.47) | 315, 330 | 486, 523 |
| Compound 31 | 325 (11.09), 303 (7.65) | 315, 330 | 486, 523 |

TABLE 1-continued

| Compound No. | Maximum absorption wavelength (nm) ($\epsilon(10^4 \text{ M}^{-1} \cdot \text{cm}^{-1})$) | Fluorescence emission wavelength (nm) ($\lambda_{exc}$ = 283 nm) | Phosphorescence emission wavelength (nm) ($\lambda_{exc}$ = 325 nm) |
|---|---|---|---|

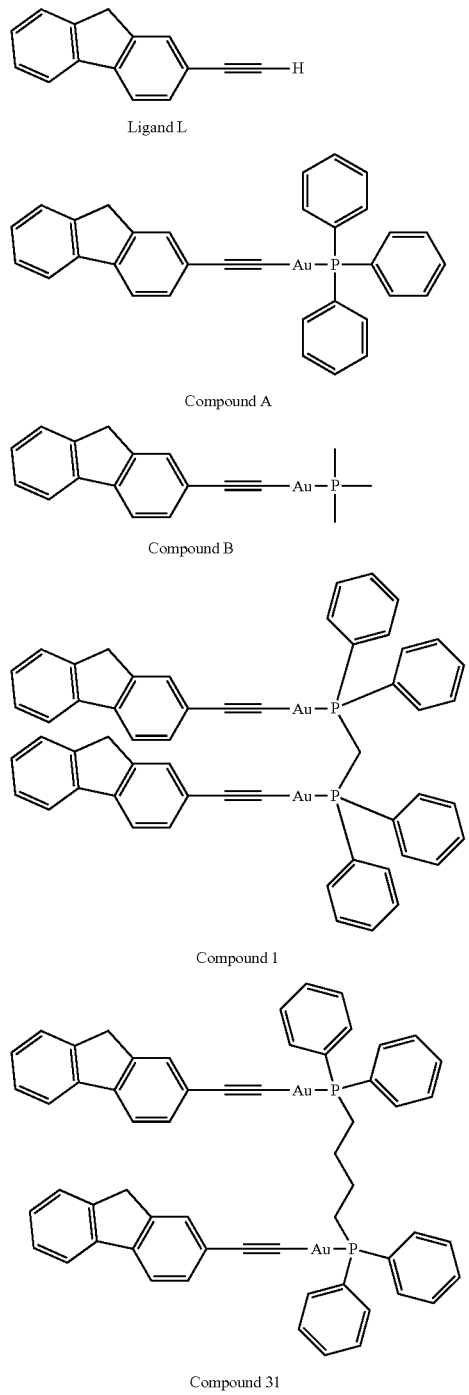

From Table 1, it was confirmed that Ligand L does not have phosphorescence emission characteristics, whereas Compounds A, B, 1, and 31 have phosphorescence emission characteristics at room temperature.

Evaluation Example 2: Measurement of Absolute Quantum Efficiency

With respect to each of the acetonitrile solution samples, the fluorescence quantum efficiency ($\Phi_{Fl}$) and the phosphorescence quantum efficiency (DUPh) under ambient atmosphere; and the fluorescence quantum efficiency and the phosphorescence quantum efficiency under nitrogen atmosphere were measured for each sample, and the results are shown in Table 2.

TABLE 2

| Sample | Ambient atmosphere | | Nitrogen atmosphere | |
|---|---|---|---|---|
| | $\Phi_{Fl}$ | $\Phi_{Ph}$ | $\Phi_{Fl}$ | $\Phi_{Ph}$ |
| Ligand L | 0.63 | 0 | 0.763 | 0 |
| Compound A | 0.021 | 0 | 0.021 | 0.019 |
| Compound B | 0.007 | 0.004 | 0.007 | 0.016 |
| Compound 1 | 0.005 | 0.001 | 0.005 | 0.043 |
| Compound 31 | 0.006 | 0.004 | 0.006 | 0.039 |

Evaluation Example 3: Evaluation of Optical Characteristics in Polymer Matrix (1) Preparation Example 2: Preparation of Polymethyl Methacrylate (PMMA) Thin Film Samples 200 mg/mL of PMMA was dissolved in 10 mL of chloroform to prepare a first solution, and 200 µg/mL of each of Ligand L and Compounds A, B, 1, and 31 were dissolved in 10 mL of chloroform to prepare a second solution.

1 mL of the first solution and 1 mL of the second solution were taken and mixed to prepare a polymer solution. The polymer solution was applied on a quartz substrate in a drop cast method and then a solvent was volatilized at room temperature to form a PMMA thin film, thereby preparing of a PMMA thin film sample.

(2) Preparation Example 3: Preparation of Cycloolefin Thin Film Sample

A cycloolefin thin film sample was prepared in the same manner as in Preparation Example 2, except that a cycloolefin resin (obtained as ZEONEX 480 from Nippon Zeon Co., Ltd.) was used instead of PMMA, and a second solution in which 100 µg/mL of each of Ligand L and Compounds A, B, 1, and 31 were dissolved was used.

Figure 6:
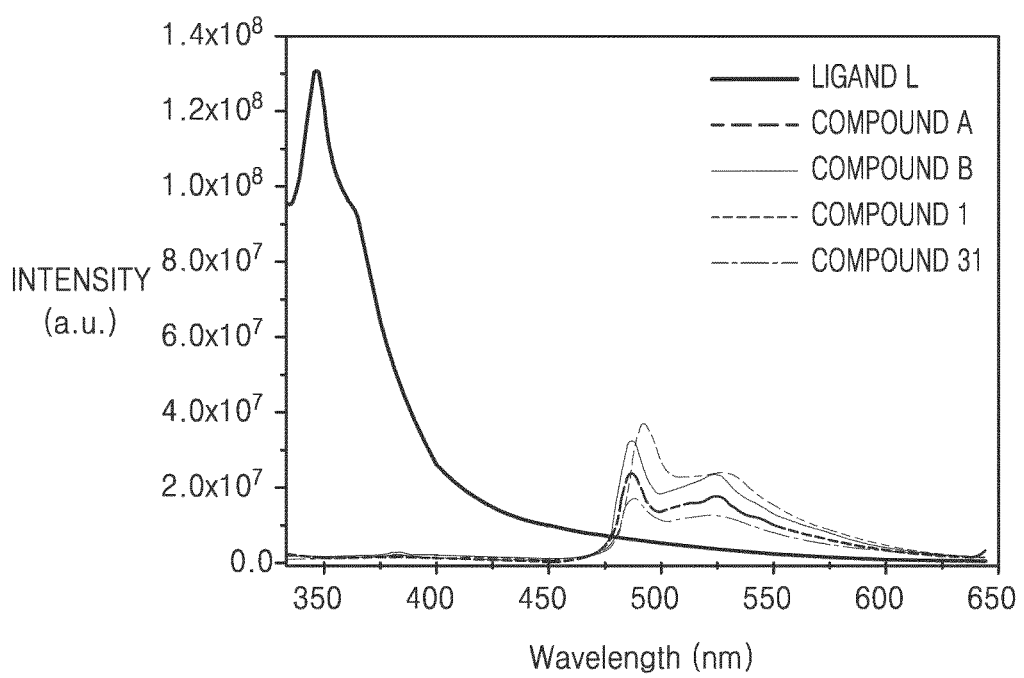
FIG. 6 are graphs of intensity (A.U.) versus wavelength (nm) and show PL spectra of samples of polymethyl methacrylate (PMMA) thin films prepared in Preparation Example 2.
Figure 7:
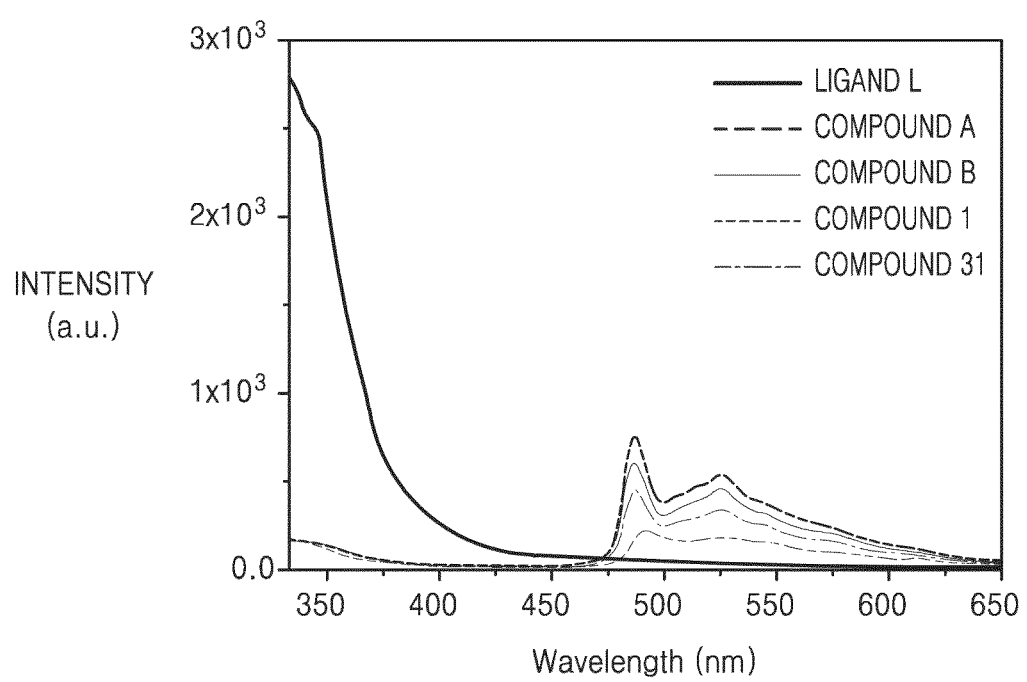
FIG. 7 are graphs of intensity (A.U.) versus wavelength (nm) and show PL spectra of samples of cycloolefin thin films prepared in Preparation Example 3.

The PL spectrum of the PMMA thin film sample measured by the PL measuring device and a PL spectrum of the cycloolefin thin film sample measured by the PL measuring device are shown in FIG. 6 and FIG. 7, respectively. When the PL was measured, the excitation wavelength ($\lambda_{exc}$) was 325 nm.

From FIGS. 6 and 7, it was confirmed that although a free ligand L exhibits fluorescence emission in a wavelength of about 350 nm, Compounds A, B, 1, and 31 complexed with gold atoms exhibit disappearance of fluorescence emission and appearance of fluorescence emission in a wavelength of about 475 nm and about 550 nm.

When a polymer matrix such as PMMA and cycloolefin are utilized, a non-luminescence path may be minimized due to an increase in a distance between sample molecules, and thus phosphorescence emission characteristics may be clearly confirmed during PL measurement.

Evaluation Example 4: Measurement of Phosphorescence Quantum Efficiency

With respect to the PMMA thin film sample and cycloolefin thin film sample, phosphorescence quantum efficiency was measured under an oxygen-free condition for each sample, and the results are shown in Table 3.

TABLE 3

| Sample | PMMA | Cycloolefin resin |
| --- | --- | --- |
| Ligand L | 0.00 | 0.00 |
| Compound A | 0.24 | 0.23 |
| Compound B | 0.25 | 0.23 |
| Compound 1 | 0.27 | 0.09 |
| Compound 31 | 0.25 | 0.17 |

Ligand L does not emit phosphorescent light at room temperature, whereas complexes, Compounds A, B, 1, and 31, exhibit a photoluminescence quantum yield (PLQY) of about 24% to 30% in a PMMA matrix and a PLQY of about 10% to 25% in a cycloolefin matrix. In one or more embodiments, Compounds 1 and 31 of the present invention emit strong room-temperature phosphorescent light having a PLQY of about 25% to about 27% in a PMMA matrix and a PLQY of about 10% to about 20% in a cycloolefin matrix.

The organometallic compound may have a pincer or closed-ring structure including a heavy atom and may emit phosphorescent light at room temperature due to photoluminescence, and thus may be applied to an organic light-emitting device or an image sensor. Also, because the organometallic compound has excellent room-temperature phosphorescence emission characteristics, a diagnostic composition having high diagnostic efficiency may be provided using the organometallic compound and the organometallic compound may be used for a therapy using light.

It should be understood that the exemplary embodiments described herein should be considered in a descriptive sense and not for purposes of limitation. Descriptions of features or aspects within each exemplary embodiment should typically be considered as available for other similar features or aspects in other exemplary embodiments. While one or more exemplary embodiments have been described with reference to the drawings, it will be understood by those of ordinary skill in the art that various changes in form and details may be made herein without departing from the spirit and scope as defined by the following claims.

What is claimed is:

1. An organic light-emitting device, comprising:

a first electrode;

a second electrode; and an organic layer disposed between the first electrode and the second electrode and including an emission layer, wherein the organic layer comprises at least one organometallic compound represented by Formula 1:

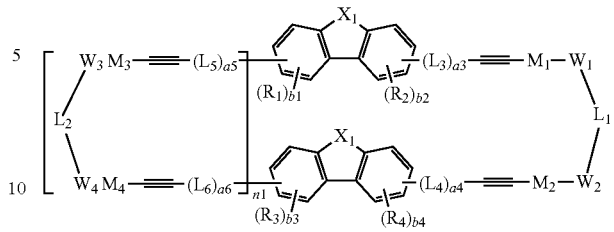

Formula 1 wherein, in Formula 1, $M_1$ to $M_4$ are each independently a first-row transition metal of the Periodic Table of Elements, a second-row transition metal of the Periodic Table of Elements, or a third-row transition metal of the Periodic Table of Elements, $X_1$ and $X_2$ are each independently $C(R_5)(R_6)$, $Si(R_5)(R_6)$, $N(R_5)$, O, S, Se, or Te, $W_1$ to $W_4$ are each independently $N(R_7)(R_8)$, $P(R_7)(R_8)$, $S(R_7)$, a $C_5$-$C_{60}$ carbocyclic group unsubstituted or substituted with at least one $R_{10a}$, or a $C_1$-$C_{60}$ heterocyclic group unsubstituted or substituted with at least one $R_{10a}$, $L_1$ to $L_6$ are each independently a $C_1$-$C_{30}$ alkylene group unsubstituted or substituted with at least one $R_{10a}$, a $C_5$-$C_{60}$ carbocyclic group unsubstituted or substituted with at least one $R_{10a}$, or a $C_1$-$C_{60}$ heterocyclic group unsubstituted or substituted with at least one $R_{10a}$, a3 to a6 are each independently an integer from 0 to 3, $R_1$ to $R_8$ are each independently hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{10}$ cycloalkyl group unsubstituted or substituted with at least one $R_{10a}$, a $C_1$-$C_{10}$ heterocycloalkyl group unsubstituted or substituted with at least one $R_{10a}$, a $C_3$-$C_{10}$ cycloalkenyl group unsubstituted or substituted with at least one $R_{10a}$, a $C_1$-$C_{10}$ heterocycloalkenyl group unsubstituted or substituted with at least one $R_{10a}$, a $C_6$-$C_{60}$ aryl group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, a $C_7$-$C_{60}$ arylalkyl group unsubstituted or substituted with at least one $R_{10a}$, a $C_1$-$C_{60}$ heteroaryl group unsubstituted or substituted with at least one $R_{10a}$, a $C_1$-$C_{60}$ heteroaryloxy group unsubstituted or substituted with at least one $R_{10a}$, a $C_1$-$C_{60}$ heteroarylthio group unsubstituted or substituted with at least one $R_{10a}$, a $C_2$-$C_{60}$ heteroarylalkyl group unsubstituted or substituted with at least one $R_{10a}$, a $C_2$-$C_{60}$ alkylheteroaryl group unsubstituted or substituted with at least one $R_{10a}$, a monovalent non-aromatic condensed polycyclic group unsubstituted or substituted with at least one $R_{10a}$, a monovalent non-aromatic condensed heteropolycyclic group unsubstituted or substituted with at least one $R_{10a}$, $-Si(Q_1)(Q_2)(Q_3)$, $-Ge(Q_1)(Q_2)(Q_3)$, $-N(Q_4)(Q_5)$, $-B(Q_6)(Q_7)$, $-P(=O)(Q_8)(Q_9)$, or $-P(Q_8)(Q_9)$, $R_7$ and $R_8$ are optionally connected to each other to form a $C_5$-$C_{60}$ carbocyclic group unsubstituted or substituted with at least one $R_{10a}$ or a $C_1$-$C_{60}$ heterocyclic group unsubstituted or substituted with at least one $R_{10a}$, b1 and b3 are each independently an integer from 1 to 4,
b2 and b4 are each independently an integer from 1 to 3,
n1 is 0 or 1,
provided that when n1 is 0, a group represented by:

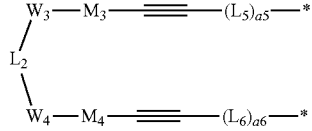

is not present, and $R_{10a}$ is:

deuterium, $-CD_3$, $-CD_2H$, $-CDH_2$, $-F$, $-Cl$, $-Br$, $-I$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with one or more of deuterium, $-CD_3$, $-CD_2H$, $-CDH_2$, $-F$, $-Cl$, $-Br$, $-I$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, a monovalent non-aromatic condensed heteropolycyclic group, $-Si(Q_{11})(Q_{12})(Q_{13})$, $-Ge(Q_{11})(Q_{12})(Q_{13})$, $-N(Q_{14})(Q_{15})$, $-B(Q_{16})(Q_{17})$, $-P(=O)(Q_{18})(Q_{19})$, or $-P(Q_{18})(Q_{19})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, or a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, or a monovalent non-aromatic condensed heteropolycyclic group, each substituted with at least one of deuterium, $-CD_3$, $-CD_2H$, $-CDH_2$, $-F$, $-Cl$, $-Br$, $-I$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, a monovalent non-aromatic condensed heteropolycyclic group, $-Si(Q_{21})(Q_{22})(Q_{23})$, $-Ge(Q_{21})(Q_{22})(Q_{23})$, $-N(Q_{24})(Q_{25})$, $-B(Q_{26})(Q_{27})$, $-P(=O)(Q_{28})(Q_{29})$, or $-P(Q_{28})(Q_{29})$; or $-Si(Q_{31})(Q_{32})(Q_{33})$, $-Ge(Q_{31})(Q_{32})(Q_{33})$, $-N(Q_{34})(Q_{35})$, $-B(Q_{36})(Q_{37})$, $-P(=O)(Q_{38})(Q_{39})$, or $-P(Q_{38})(Q_{39})$, wherein $Q_1$ to $Q_9$, $Q_{11}$ to $Q_{19}$, $Q_{21}$ to $Q_{29}$, and $Q_{31}$ to $Q_{39}$ are each independently hydrogen, deuterium, $-F$, $-Cl$, $-Br$, $-I$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, or a monovalent non-aromatic condensed heteropolycyclic group.

2. The organic light-emitting device of claim 1, wherein the first electrode is an anode,
the second electrode is a cathode,
the organic layer comprises a hole transport region between the first electrode and the emission layer and an electron transport region between the emission layer and the second electrode,
the hole transport region comprises a hole injection layer, a hole transport layer, an electron blocking layer and a buffer layer, and
the electron transport region comprises a hole blocking layer, an electron transport layer and an electron injection layer.

3. The organic light-emitting device of claim 1, wherein the emission layer comprises the at least one organometallic compound.

4. The organic light-emitting device of claim 1, wherein thickness of the emission layer is in a range of about 100 Å to about 1,000 Å.

5. The organic light-emitting device of claim 1, wherein the emission layer further comprises a host, and
the organometallic compound comprises a green phosphorescent dopant or a blue phosphorescent dopant.

6. The organic light-emitting device of claim 5, wherein an amount of the dopant is in the range of about 0.01 parts by weight to about 20 parts by weight, based on 100 parts by weight of the emission layer.

7. An electronic apparatus comprising at least one organometallic compound represented by Formula 1:

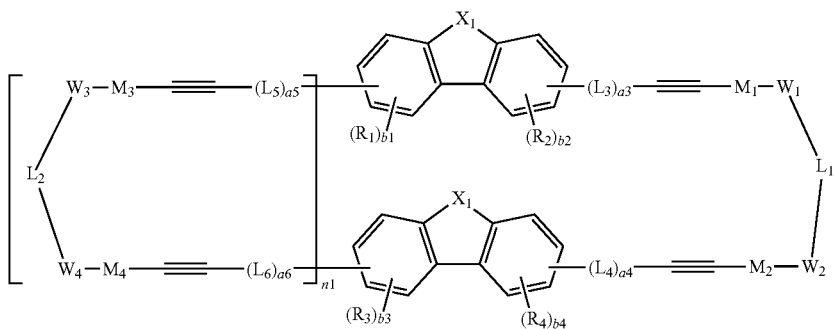

Formula 1 wherein, in Formula 1, $M_1$ to $M_4$ are each independently a first-row transition metal of the Periodic Table of Elements, a second-row transition metal of the Periodic Table of Elements, or a third-row transition metal of the Periodic Table of Elements, $X_1$ and $X_2$ are each independently $C(R_5)(R_6)$, $Si(R_5)(R_6)$, $N(R_5)$, O, S, Se, or Te, $W_1$ to $W_4$ are each independently $N(R_7)(R_8)$, $P(R_7)(R_8)$, $S(R_7)$, a $C_5$-$C_{60}$ carbocyclic group unsubstituted or substituted with at least one $R_{10a}$, or a $C_1$-$C_{60}$ heterocyclic group unsubstituted or substituted with at least one $R_{10a}$, $L_1$ to $L_6$ are each independently a $C_1$-$C_{30}$ alkylene group unsubstituted or substituted with at least one $R_{10a}$, a $C_5$-$C_{60}$ carbocyclic group unsubstituted or substituted with at least one $R_{10a}$, or a $C_1$-$C_{60}$ heterocyclic group unsubstituted or substituted with at least one $R_{10a}$, a3 to a6 are each independently an integer from 0 to 3, $R_1$ to $R_8$ are each independently hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{10}$ cycloalkyl group unsubstituted or substituted with at least one $R_{10a}$, a $C_1$-$C_{10}$ heterocycloalkyl group unsubstituted or substituted with at least one $R_{10a}$, a $C_3$-$C_{10}$ cycloalkenyl group unsubstituted or substituted with at least one $R_{10a}$, a $C_1$-$C_{10}$ heterocycloalkenyl group unsubstituted or substituted with at least one $R_{10a}$, a $C_6$-$C_{60}$ aryl group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, a $C_7$-$C_{60}$ arylalkyl group unsubstituted or substituted with at least one $R_{10a}$, a $C_1$-$C_{60}$ heteroaryl group unsubstituted or substituted with at least one $R_{10a}$, a $C_1$-$C_{60}$ heteroaryloxy group unsubstituted or substituted with at least one $R_{10a}$, a $C_1$-$C_{60}$ heteroarylthio group unsubstituted or substituted with at least one $R_{10a}$, a $C_2$-$C_{60}$ heteroarylalkyl group unsubstituted or substituted with at least one $R_{10a}$, a $C_2$-$C_{60}$ alkylheteroaryl group unsubstituted or substituted with at least one $R_{10a}$, a monovalent non-aromatic condensed polycyclic group unsubstituted or substituted with at least one $R_{10a}$, a monovalent non-aromatic condensed heteropolycyclic group unsubstituted or substituted with at least one $R_{10a}$, —Si$(Q_1)(Q_2)(Q_3)$, —Ge$(Q_1)(Q_2)(Q_3)$, —N$(Q_4)(Q_5)$, —B$(Q_6)(Q_7)$, —P(=O) $(Q_8)(Q_9)$, or —P$(Q_8)(Q_9)$, $R_7$ and $R_8$ are optionally connected to each other to form a $C_5$-$C_{60}$ carbocyclic group unsubstituted or substituted with at least one $R_{10a}$ or a $C_1$-$C_{60}$ heterocyclic group unsubstituted or substituted with at least one $R_{10a}$, b1 and b3 are each independently an integer from 1 to 4,
b2 and b4 are each independently an integer from 1 to 3,
n1 is 0 or 1,
provided that when n1 is 0, a group represented by:

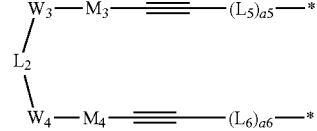

is not present, and $R_{10a}$ is:

deuterium, —CD$_3$, —CD$_2$H, —CDH$_2$, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with one or more of deuterium, —CD$_3$, —CD$_2$H, —CDH$_2$, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, a monovalent non-aromatic condensed heteropolycyclic group, —Si($Q_{11}$)($Q_{12}$)($Q_{13}$), —Ge($Q_{11}$)($Q_{12}$)($Q_{13}$), —N($Q_{14}$)($Q_{15}$), —B($Q_{16}$)($Q_{17}$), —P(=O)($Q_{18}$)($Q_{19}$), or —P($Q_{18}$)($Q_{19}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, or a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, or a monovalent non-aromatic condensed heteropolycyclic group, each substituted with at least one of deuterium, —$CD_3$, —$CD_2H$, —$CDH_2$, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, a monovalent non-aromatic condensed heteropolycyclic group, —Si($Q_{21}$)($Q_{22}$)($Q_{23}$), —Ge($Q_{21}$)($Q_{22}$)($Q_{23}$), —N($Q_{24}$)($Q_{25}$), —B($Q_{26}$)($Q_{27}$), —P(=O)($Q_{28}$)($Q_{29}$), or —P($Q_{28}$)($Q_{29}$); or —Si($Q_{31}$)($Q_{32}$)($Q_{33}$), —Ge($Q_{31}$)($Q_{32}$)($Q_{33}$), —N($Q_{34}$)($Q_{35}$), —B($Q_{36}$)($Q_{37}$), —P(=O)($Q_{38}$)($Q_{39}$), or —P($Q_{38}$)($Q_{39}$), wherein $Q_1$ to $Q_9$, $Q_{11}$ to $Q_{19}$, $Q_{21}$ to $Q_{29}$, and $Q_{31}$ to $Q_{39}$ are each independently hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, or a monovalent non-aromatic condensed heteropolycyclic group.

8. The electronic apparatus of claim 7, wherein the electronic apparatus comprises displays, light sources, lighting, computers, mobile phones, electronic dictionaries, medical devices, projectors, and image sensors.

* * * * *